(12) United States Patent
Hatakeyama et al.

(10) Patent No.: US 11,539,003 B2
(45) Date of Patent: Dec. 27, 2022

(54) POLYCYCLIC AROMATIC AMINO COMPOUND

(71) Applicants: Kwansei Gakuin Educational Foundation, Nishinomiya (JP); SK Materials JNC Co., Ltd., Gyeonggi-do (KR)

(72) Inventors: Takuji Hatakeyama, Hyogo (JP); Guofang Wang, Chiba (JP); Yasuyuki Sasada, Chiba (JP)

(73) Assignees: Kwansei Gakuin Educational Foundation, Hyogo (JP); SK Materials JNC Co., Ltd., Gyeonggi-do (KR)

( * ) Notice: Subject to any disclaimer, the term of this patent is extended or adjusted under 35 U.S.C. 154(b) by 661 days.

(21) Appl. No.: 16/469,374

(22) PCT Filed: Dec. 11, 2017

(86) PCT No.: PCT/JP2017/044361
§ 371 (c)(1),
(2) Date: Jun. 13, 2019

(87) PCT Pub. No.: WO2018/110497
PCT Pub. Date: Jun. 21, 2018

(65) Prior Publication Data
US 2020/0020859 A1      Jan. 16, 2020

(30) Foreign Application Priority Data

Dec. 16, 2016   (JP) .............................. JP2016-243946

(51) Int. Cl.
*H01L 51/00*       (2006.01)
*C07F 5/02*        (2006.01)
(Continued)

(52) U.S. Cl.
CPC ............ *H01L 51/008* (2013.01); *C07F 5/027* (2013.01); *C09K 11/06* (2013.01);
(Continued)

(58) Field of Classification Search
CPC ............... H01L 51/008; H01L 51/5012; H01L 51/5056; H01L 51/5072; H01L 51/5076;
(Continued)

(56) References Cited

U.S. PATENT DOCUMENTS

2007/0106103 A1   5/2007   Ikeda et al.
2012/0319052 A1  12/2012   Brocke et al.
(Continued)

FOREIGN PATENT DOCUMENTS

JP    2001-172232 A    6/2001
JP    2005-170911 A    6/2005
(Continued)

OTHER PUBLICATIONS

Hirai et al., "One-Step borylation of 1,3-Diaryloxybenzenes Towards Efficient Materials for Organic Light-Emitting Diodes," Angewandte Chemie International Edition, Sep. 18, 2015, 54:13581-13585.
(Continued)

*Primary Examiner* — Marla D McConnell
*Assistant Examiner* — Rebecca E Richardson
(74) *Attorney, Agent, or Firm* — Foley & Lardner LLP

(57) ABSTRACT

By providing a novel polycyclic aromatic amino compound having an amino substituent and having a plurality of aromatic rings linked via a boron atom, an oxygen atom, or the like, for example, as in the following formula, a selection range of a material for an organic EL element is widened. In addition, by using the novel polycyclic aromatic amino compound as a material for an organic electroluminescent element, an excellent organic EL element is provided (Continued)

US 11,539,003 B2

Page 2

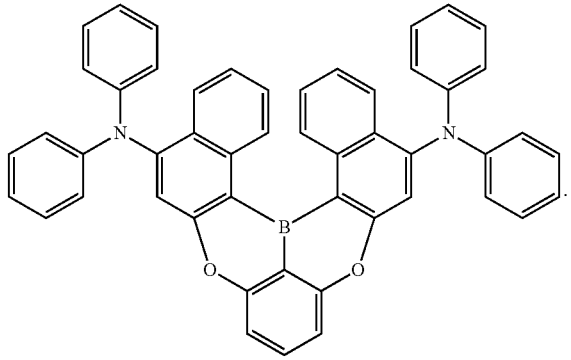

(1A-1)

15 Claims, 1 Drawing Sheet

(51) Int. Cl.
*C09K 11/06* (2006.01)
*H01L 51/50* (2006.01)
(52) U.S. Cl.
CPC .. *C09K 2211/1018* (2013.01); *H01L 51/5012* (2013.01); *H01L 51/5056* (2013.01); *H01L 51/5072* (2013.01); *H01L 51/5076* (2013.01); *H01L 51/5088* (2013.01); *H01L 51/5092* (2013.01)

(58) Field of Classification Search
CPC .. H01L 51/5088; H01L 51/5092; C07F 5/027; C09K 11/06; C09K 2211/1018
See application file for complete search history.

(56) References Cited

U.S. PATENT DOCUMENTS

2014/0027734 A1* 1/2014 Kwong ............... H01L 51/0058
257/40
2014/0058099 A1 2/2014 Wakamiya et al.
2015/0236274 A1* 8/2015 Hatakeyama ....... H01L 51/0052
257/40

FOREIGN PATENT DOCUMENTS

| JP | 2012-234873 A | 11/2012 |
|---|---|---|
| WO | WO-2004/061047 A2 | 7/2004 |
| WO | WO-2011/107186 A2 | 9/2011 |
| WO | WO-2012/118164 A1 | 9/2012 |
| WO | WO-2015/102118 A1 | 7/2015 |
| WO | WO-2016/143819 A1 | 9/2016 |

OTHER PUBLICATIONS

Database Registry, 2017, RN:2056877-28-0, RN:2056877-27-9, retrieved from SIN international (online) on Jan. 20, 2017, 1 page.
Hatakeyama, Takuji, "Development on high efficiency organic EL materials with multi-resonance effects as key," Polymer Preprints, 2017, vol. 66, 2 pages.
International Search Report dated Mar. 13, 2018, in PCT/JP2017/044361.
Decision to Grant a Patent dated Jul. 19, 2022 in KR 10-2019-7011911, with partial English translation.
Decision to Grant a Patent dated Jul. 4, 2022 in CN 201780076120.1.

* cited by examiner

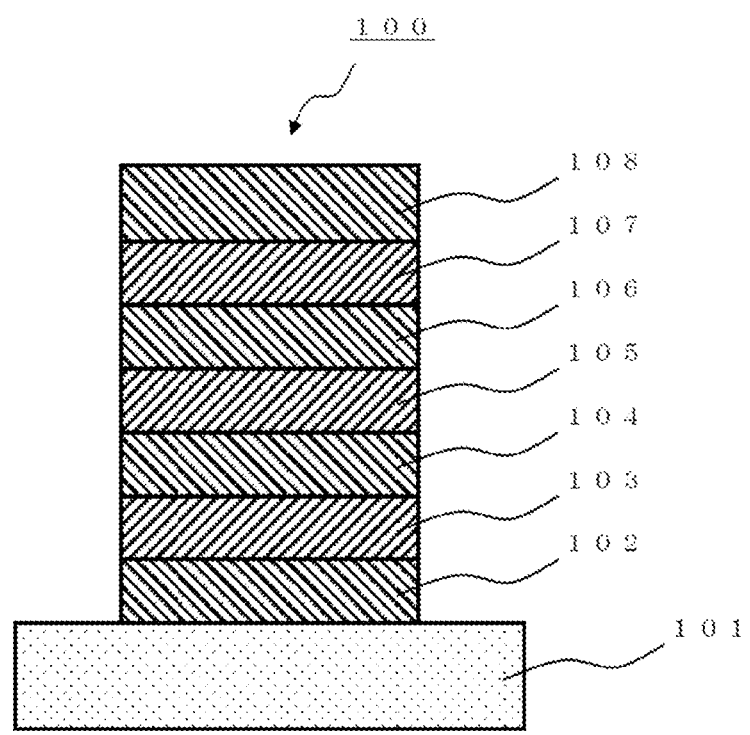

POLYCYCLIC AROMATIC AMINO COMPOUND

CROSS-REFERENCE TO RELATED APPLICATIONS

This application is the U.S. National Stage of PCT/JP2017/044361, filed Dec. 11, 2017, which claims priority to JP 2016-243946, filed Dec. 16, 2016.

TECHNICAL FIELD

The present invention relates to a polycyclic aromatic amino compound, and an organic electroluminescent element, an organic field effect transistor, and an organic thin film solar cell using the polycyclic aromatic amino compound, as well as a display apparatus and a lighting apparatus.

BACKGROUND ART

Conventionally, a display apparatus employing a luminescent element that is electroluminescent can be subjected to reduction of power consumption and thickness reduction, and therefore various studies have been conducted thereon. Furthermore, an organic electroluminescent element formed of an organic material has been studied actively because weight reduction and size expansion are easily achieved. Particularly, active research has been hitherto conducted on development of an organic material having luminescence characteristics for blue light which is one of the primary colors of light, and development of an organic material having charge transport capability for holes, electrons and the like (having a potential for serving as a semiconductor or a superconductor), irrespective of whether the organic material is a high molecular weight compound or a low molecular weight compound.

An organic EL element has a structure having a pair of electrodes composed of a positive electrode and a negative electrode, and a single layer or a plurality of layers which are disposed between the pair of electrodes and contain an organic compound. The layer containing an organic compound includes a light emitting layer, a charge transport/injection layer for transporting or injecting charges such as holes or electrons, and the like, and various organic materials suitable for these layers have been developed.

Regarding a materials for a light emitting layer, for example, a benzofluorene-based compound or the like has been developed (WO 2004/061047 A). Furthermore, regarding a hole transporting material, for example, a triphenylamine-based compound or the like has been developed (JP 2001-172232 A). Regarding an electron transport material, for example, an anthracene-based compound or the like has been developed (JP 2005-170911 A).

Furthermore, in recent years, a material obtained by improving a triphenylamine derivative has also been reported as a material to be used in an organic EL element and an organic thin film solar cell (WO 2012/118164 A). This material is characterized in that flatness thereof has been increased by linking aromatic rings constituting triphenylamine with reference to N,N'-diphenyl-N,N'-bis(3-methylphenyl)-1,1'-biphenyl-4,4'-diamine (TPD) which has been already put to practical use. In this literature, for example, evaluation of charge transporting characteristics of a NO-linked system compound (compound 1 of page 63) has been made. However, there is no description on a method for manufacturing a material other than the NO-linked system compound. When a different element to be linked is used, an overall electron state of a compound is different. Therefore, characteristics obtainable from a material other than the NO-linked system compound are not known. Examples of such a compound are also found elsewhere (WO 2011/107186 A and WO 2015/102118 A). For example, since a compound having a conjugated structure involving higher energy of triplet exciton (T1) can emit phosphorescent light having a shorter wavelength, the compound is useful as a material for a blue light emitting layer. There is also a demand for a novel compound having a conjugated structure with high T1 as an electron transport material or a hole transport material interposing a light emitting layer.

A host material for an organic EL element is generally a molecule in which a plurality of existing aromatic rings of benzene, carbazole, or the like is linked via a single bond, a phosphorus atom, or a silicon atom. This is because a large HOMO-LUMO gap required for a host material (band gap Eg in a thin film) is secured by linking many aromatic rings each having a relatively small conjugated system. Furthermore, a host material for an organic EL element using a phosphorescent material or a thermally activated delayed fluorescence material needs high triplet excitation energy ($E_T$). However, the triplet excitation energy ($E_T$) can be increased by localizing SOMO1 and SOMO2 in a triplet excited state (T1) by linking a donor-like or acceptor-like aromatic ring or substituent to a molecule, and thereby reducing an exchange interaction between the two orbitals. However, an aromatic ring having a small conjugated system does not have sufficient redox stability, and an element using a molecule obtained by linking existing aromatic rings as a host material does not have a sufficient lifetime. Meanwhile, a polycyclic aromatic compound having an extended π-conjugated system generally has excellent redox stability, but has a low HOMO-LUMO gap (band gap Eg in a thin film) and low triplet excitation energy ($E_T$). Therefore, the polycyclic aromatic amino compound has been considered to be unsuitable as a host material.

CITATION LIST

Patent Literature

Patent Literature 1: WO 2004/061047 A
Patent Literature 2: JP 2001-172232 A
Patent Literature 3: JP 2005-170911 A
Patent Literature 4: WO 2012/118164 A
Patent Literature 5: WO 2011/107186 A
Patent Literature 6: WO 2015/102118 A

SUMMARY OF INVENTION

Technical Problem

As described above, various materials to be used for an organic EL element have been developed. However, in order to widen a selection range of the material for an organic EL element, it is desired to develop a material formed of a compound different from a conventional compound. Particularly, organic EL characteristics obtainable from a material other than the NO-linked system compounds reported in Patent Literatures 1 to 4 and a manufacturing method thereof are not known.

Solution to Problem

The present inventors conducted intensive studies in order to solve the above problems. As a result, the present inventors have found a novel polycyclic aromatic amino compound having an amino substituent and having a plurality of aromatic rings linked via a boron atom, an oxygen atom, or the like, and have succeeded in manufacture thereof. In addition, the present inventors have found that an excellent organic EL element can be obtained by constituting an organic EL element by disposing a layer containing this polycyclic aromatic amino compound between a pair of electrodes, and have completed the present invention. That is, the present invention provides a polycyclic aromatic amino compound as described below, and further provides a material for an organic EL element containing the polycyclic aromatic amino compound as described below.

Item 1. A polycyclic aromatic amino compound represented by the following general formula (1A) or (1B):

General formula (1A)

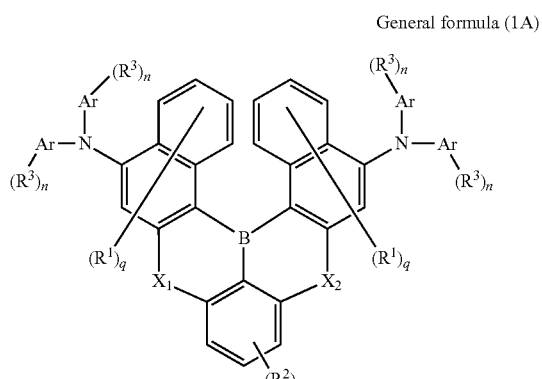

General formula (1B)

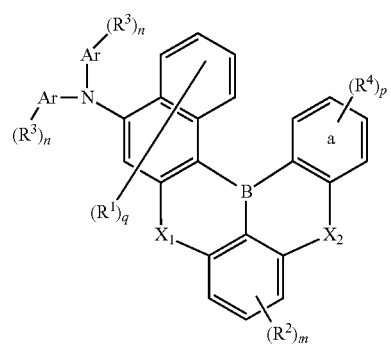

wherein in the above formula (1A) or (1B),

Ar's each independently represent an aryl or a heteroaryl, $R^1$ to $R^4$ each independently represent a hydrogen atom, an aryl, a heteroaryl, a diarylamino, a diheteroarylamino, an arylheteroarylamino, an alkyl, an alkoxy, a trialkylsilyl, an aryloxy, or cyano, and at least one hydrogen atom in these may be substituted by an aryl, a heteroaryl, a diarylamino, or an alkyl, in a case where there is a plurality of $R^4$'s, adjacent $R^4$'s may be bonded to each other to form an aryl ring or a heteroaryl ring together with ring a, at least one hydrogen atom in the ring thus formed may be substituted by an aryl, a heteroaryl, a diarylamino, a diheteroarylamino, an arylheteroarylamino, an alkyl, an alkoxy, a trialkylsilyl, an aryloxy, or cyano, and at least one hydrogen atom in these may be substituted by an aryl, a heteroaryl, a diarylamino, or an alkyl, in a case where $R^1$ and $R^3$ are adjacent to each other, these may be bonded by —O—, —S—, —C(—R)$_2$—, or a single bond, and R of the moiety —C(—R)$_2$— represents a hydrogen atom or an alkyl having 1 to 6 carbon atoms, m represents an integer of 0 to 3, n's each independently represent an integer of 0 to the maximum substitutable number to Ar, p represents an integer of 0 to 4, and q's each independently represent an integer of 0 to 5, $X^1$ and $X^2$ each independently represent O or N—R, R of the moiety N—R represents an aryl having 6 to 12 carbon atoms, a heteroaryl having 2 to 15 carbon atoms, or an alkyl having 1 to 6 carbon atoms, R in a case where $X^2$ represents the moiety N—R may be bonded to the ring a by —O—, —S—, —C(—R)$_2$—, or a single bond, and R of the moiety —C(—R)$_2$— represents a hydrogen atom or an alkyl having 1 to 6 carbon atoms, and at least one hydrogen atom in the compound represented by formula (1A) or (1B) may be substituted by a halogen atom or a deuterium atom.

Item 2. The polycyclic aromatic amino compound according to item 1, in which

Ar's each independently represent an aryl, $R^2$ to $R^4$ each independently represent a hydrogen atom, an aryl, a heteroaryl, a diarylamino, an alkyl, an alkoxy, a trialkylsilyl, or an aryloxy, and at least one hydrogen atom in these may be substituted by an aryl, a heteroaryl, or an alkyl, in a case where there is a plurality of $R^4$'s, adjacent $R^4$'s may be bonded to each other to form an aryl ring or a heteroaryl ring together with ring a, at least one hydrogen atom in the ring thus formed may be substituted by an aryl, a heteroaryl, an alkyl, an alkoxy, a trialkylsilyl, or an aryloxy, and at least one hydrogen atom in these may be substituted by an aryl, a heteroaryl, or an alkyl, m represents an integer of 0 to 3, n's each independently represent an integer of 0 to the maximum substitutable number to Ar, p represents an integer of 0 to 4, and q represents 0, and $X^1$ and $X^2$ each independently represent O or N—R, and R of the moiety N—R represents an aryl having 6 to 12 carbon atoms, a heteroaryl having 2 to 15 carbon atoms, or an alkyl having 1 to 6 carbon atoms.

Item 3. The polycyclic aromatic amino compound according to item 1, represented by the following general formula (1A') or (1B'):

General formula (1A')

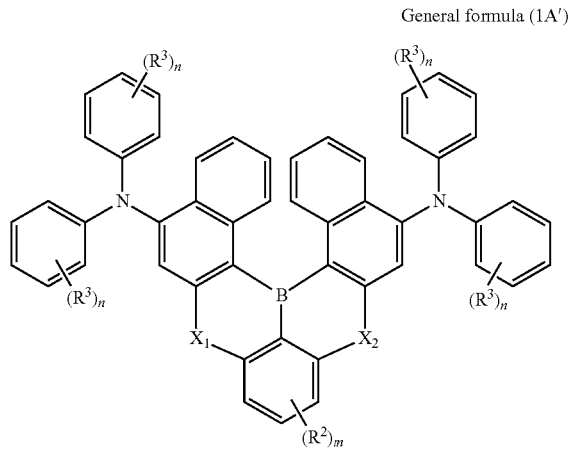

General formula (1B′)

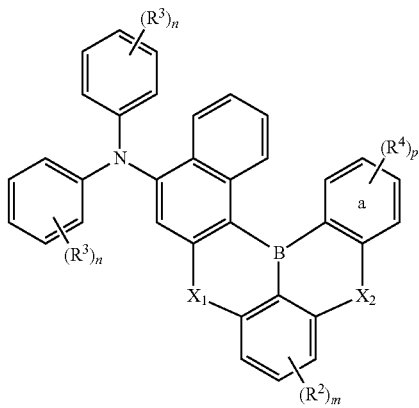

wherein in the above formula (1A′) or (1B′),

R² to R⁴ each independently represent a hydrogen atom, an aryl, a heteroaryl, a diarylamino, an alkyl, an alkoxy, a trialkylsilyl, or an aryloxy, and at least one hydrogen atom in these may be substituted by an aryl, a heteroaryl, or an alkyl, in a case where there is a plurality of R⁴'s, adjacent R⁴'s may be bonded to each other to form an aryl ring or a heteroaryl ring together with ring a, at least one hydrogen atom in the ring thus formed may be substituted by an aryl, a heteroaryl, an alkyl, an alkoxy, a trialkylsilyl, or an aryloxy, and at least one hydrogen atom in these may be substituted by an aryl, a heteroaryl, or an alkyl, m represents an integer of 0 to 3, n's each independently represent an integer of 0 to 5, and p represents an integer of 0 to 4, and X¹ and X² each independently represent O or N—R, and R of the moiety N—R represents an aryl having 6 to 12 carbon atoms, a heteroaryl having 2 to 15 carbon atoms, or an alkyl having 1 to 6 carbon atoms.

Item 4. The polycyclic aromatic amino compound according to item 1, represented by the following general formula (1A′):

General formula (1A′)

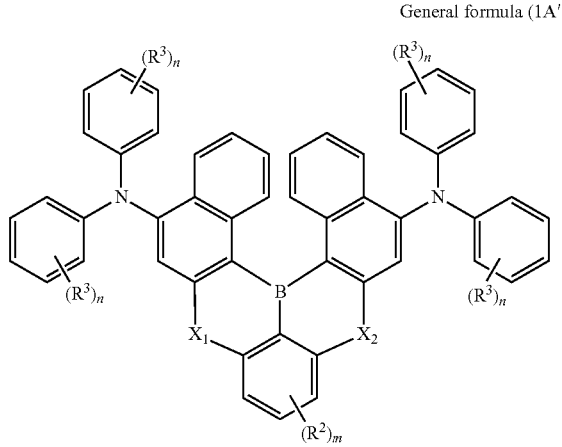

wherein in the above formula (1A′),

R² and R³ each independently represent a hydrogen atom, an aryl having 6 to 30 carbon atoms, a heteroaryl having 2 to 30 carbon atoms, a diarylamino having 6 to 30 carbon atoms, an alkyl having 1 to 24 carbon atoms, an alkoxy having 1 to 24 carbon atoms, a trialkylsilyl having an alkyl having 1 to 4 carbon atoms, or an aryloxy having 6 to 30 carbon atoms, and at least one hydrogen atom in these may be substituted by an aryl having 6 to 16 carbon atoms, a heteroaryl having 2 to 25 carbon atoms, or an alkyl having 1 to 18 carbon atoms, m represents an integer of 0 to 3, and n's each independently represent an integer of 0 to 5, and X¹ and X² each independently represent O or N—R, and R of the moiety N—R represents an aryl having 6 to 10 carbon atoms, a heteroaryl having 2 to 10 carbon atoms, or an alkyl having 1 to 4 carbon atoms.

Item 5. The polycyclic aromatic amino compound according to item 4, in which

R² and R³ each independently represent a hydrogen atom, an aryl having 6 to 30 carbon atoms, a heteroaryl having 2 to 30 carbon atoms, an alkyl having 1 to 24 carbon atoms, or a trialkylsilyl having an alkyl having 1 to 4 carbon atoms, m represents 0 or 1, and n's each independently represent 0 or 1, and X¹ and X² each independently represent O or N—R, and R of the moiety N—R represents an aryl having 6 to 10 carbon atoms, a heteroaryl having 2 to 10 carbon atoms, or an alkyl having 1 to 4 carbon atoms.

Item 6.

The polycyclic aromatic amino compound according to item 1, represented by the following formula (1A-1), (1A-153), (1A-173), or (1B-92).

(1A-1)

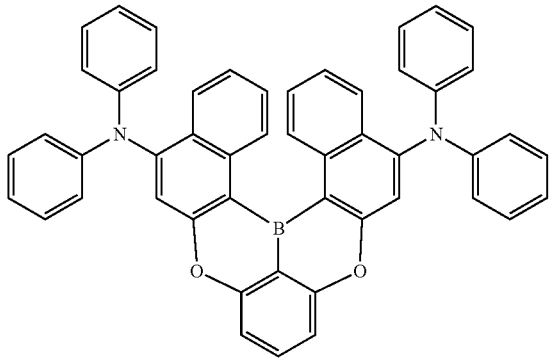

(1A-153)

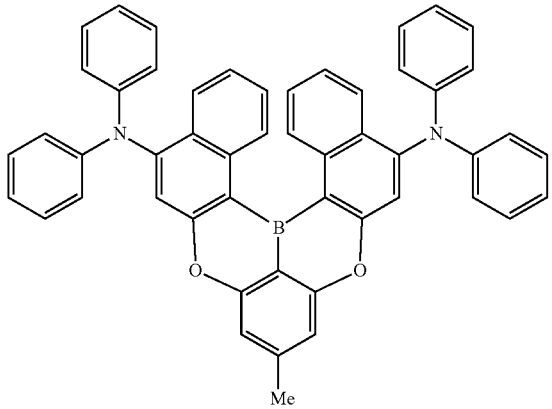

(1A-173)

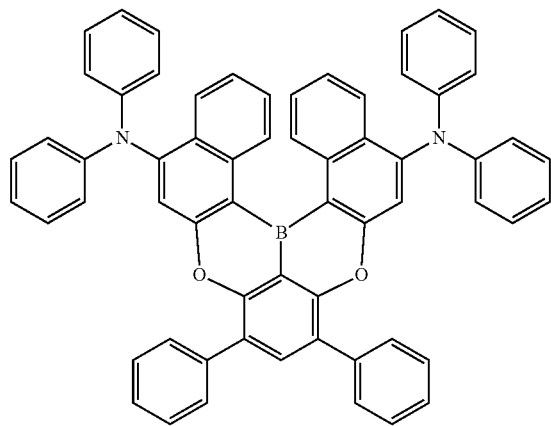

(1B-92)

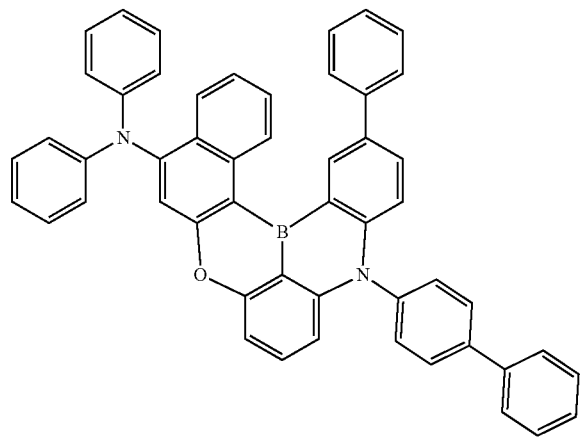

Item 7. A material for an organic device, comprising the polycyclic aromatic amino compound according to any one of items 1 to 6.

Item 8. The material for an organic device according to item 7, in which the material for an organic device is a material for an organic electroluminescent element, a material for an organic field effect transistor, or a material for an organic thin film solar cell.

Item 9. The material for an organic electroluminescent element according to item 8, in which the material for an organic electroluminescent element is a material for a light emitting layer.

Item 10. The material for an organic electroluminescent element according to item 8, in which the material for an organic electroluminescent element is a material for an electron injection layer or a material for an electron transport layer.

Item 11. The material for an organic electroluminescent element according to item 8, in which the material for an organic electroluminescent element is a material for a hole injection layer or a material for a hole transport layer.

Item 12. An organic electroluminescent element comprising: a pair of electrodes composed of a positive electrode and a negative electrode; and a light emitting layer disposed between the pair of electrodes and containing the material for a light emitting layer according to item 9.

Item 13. An organic electroluminescent element comprising: a pair of electrodes composed of a positive electrode and a negative electrode; a light emitting layer disposed between the pair of electrodes; and an electron injection layer and/or an electron transport layer disposed between the negative electrode and the light emitting layer and containing the material for an electron injection layer and/or the material for an electron transport layer according to item 10.

Item 14. An organic electroluminescent element comprising: a pair of electrodes composed of a positive electrode and a negative electrode; a light emitting layer disposed between the pair of electrodes; and a hole injection layer and/or a hole transport layer disposed between the positive electrode and the light emitting layer and containing the material for a hole injection layer and/or the material for a hole transport layer according to item 11.

Item 15. The organic electroluminescent element according to any one of items 12 to 14, further comprising an electron transport layer and/or an electron injection layer disposed between the negative electrode and the light emitting layer, in which at least one of the electron transport layer and the electron injection layer contains at least one selected from the group consisting of a quinolinol-based metal complex, a pyridine derivative, a phenanthroline derivative, a borane derivative, and a benzimidazole derivative.

Item 16. The organic electroluminescent element according to item 15, in which the electron transport layer and/or the electron injection layer further include/includes at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

Item 17. A display apparatus comprising the organic electroluminescent element according to any one of items 12 to 16.

Item 18. A lighting apparatus comprising the organic electroluminescent element according to any one of items 12 to 16.

Advantageous Effects of Invention

A preferable embodiment of the present invention can provide a novel polycyclic aromatic amino compound that can be used as, for example, a material for an organic EL element, and can provide an excellent organic EL element by using this polycyclic aromatic amino compound.

Specifically, the present inventors have found that a polycyclic aromatic amino compound having an amino substituent and having aromatic rings linked via a hetero element such as boron, oxygen, or nitrogen has a large HOMO-LUMO gap (band gap Eg in a thin film) and high triplet excitation energy ($E_T$). It is considered that this is because a decrease in the HOMO-LUMO gap that comes along with extension of a conjugated system is suppressed due to low aromaticity of a 6-membered ring containing a hetero element, and SOMO1 and SOMO2 in a triplet excited state (T1) are localized by electronic perturbation of the hetero element. In addition, due to localization of SOMO1 and SOMO2 in the triplet excited state (T1), the polycyclic aromatic amino compound containing a hetero element according to the present invention reduces an exchange interaction between the two orbitals, thereby reduces an energy difference between the triplet excited state (T1) and a singlet excited state (S1), exhibits thermally activated delayed fluorescence, and therefore is also useful as a fluorescent material for an organic EL element. In addition, a material having high triplet excitation energy ($E_T$) is also useful as an electron transport layer or a hole transport layer of a phosphorescence organic EL element or an organic EL element using thermally activated delayed fluorescence. Furthermore, these polycyclic aromatic amino compounds can arbitrarily shift energy of HOMO and LUMO by introducing a substituent, and therefore can optimize an ionization potential or electron affinity depending on a peripheral material.

BRIEF DESCRIPTION OF DRAWINGS

The FIGURE is a schematic cross-sectional view illustrating an organic EL element according to the present embodiment.

DESCRIPTION OF EMBODIMENTS

1. Polycyclic Aromatic Amino Compound

An invention of the present application is a polycyclic aromatic amino compound represented by the following general formula (1A) or (1B). In addition, the invention of the present application is preferably a polycyclic aromatic amino compound represented by the following general formula (1A') or (1B').

General formula (1A') or (1B') is obtained by limiting Ar to a phenyl group, and appropriately limiting the substituents of $R^1$ to $R^4$ and m, n, p, and q as the number thereof in general formula (1A) or (1B).

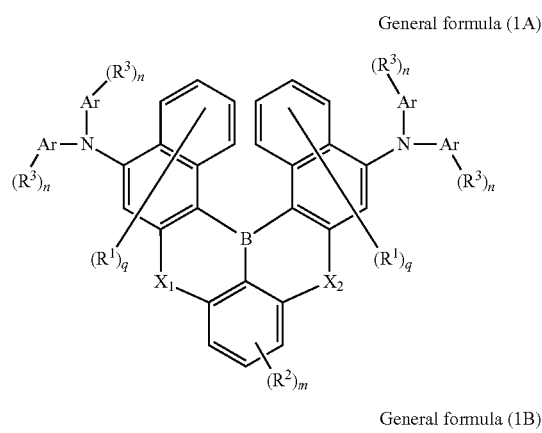

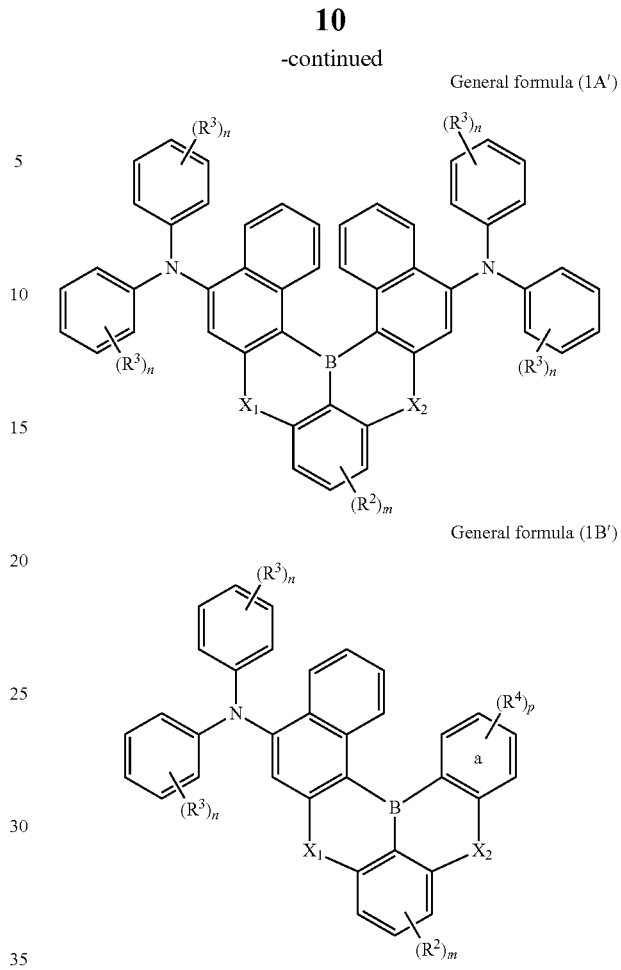

Ar's each independently represent an aryl or a heteroaryl.

Examples of the aryl include an aryl having 6 to 30 carbon atoms. An aryl having 6 to 16 carbon atoms is preferable, an aryl having 6 to 12 carbon atoms is more preferable, and an aryl having 6 to 10 carbon atoms is particularly preferable.

Specific examples of the aryl include phenyl which is a monocyclic system; biphenylyl which is a bicyclic system; naphthyl which is a fused bicyclic system; terphenylyl (m-terphenylyl, o-terphenylyl, or p-terphenylyl) which is a tricyclic system; acenaphthylenyl, fluorenyl, phenalenyl, and phenanthrenyl which are fused tricyclic systems; triphenylenyl, pyrenyl, and naphthacenyl which are fused tetracyclic systems; and perylenyl and pentacenyl which are fused pentacyclic systems.

Examples of the heteroaryl include a heteroaryl having 2 to 30 carbon atoms. A heteroaryl having 2 to 25 carbon atoms is preferable, a heteroaryl having 2 to 20 carbon atoms is more preferable, a heteroaryl having 2 to 15 carbon atoms is still more preferable, and a heteroaryl having 2 to 10 carbon atoms is particularly preferable. Examples of the heteroaryl include a heterocyclic ring containing 1 to 5 heteroatoms selected from an oxygen atom, a sulfur atom, and a nitrogen atom in addition to a carbon atom as a ring-constituting atom.

Specific examples of the heteroaryl include a pyrrolyl, an oxazolyl, an isoxazolyl, a thiazolyl, an isothiazolyl, an imidazolyl, an oxadiazolyl, a thiadiazolyl, a triazolyl, a tetrazolyl, a pyrazolyl, a pyridyl, a pyrimidinyl, a pyridazinyl, a pyrazinyl, a triazinyl, an indolyl, an isoindolyl, a 1H-indazolyl, a benzoimidazolyl, a benzoxazolyl, a benzo-thiazolyl, a 1H-benzotriazolyl, a quinolyl, an isoquinolyl, a cinnolyl, a quinazolyl, a quinoxalinyl, a phthalazinyl, a naphthyridinyl, a purinyl, a pteridinyl, a carbazolyl, an acridinyl, a phenoxathiinyl, a phenoxazinyl, a phenothiazinyl, a phenazinyl, an indolizinyl, a furyl, a benzofuranyl, an isobenzofuranyl, a dibenzofuranyl, a thienyl, a benzo[b] thienyl, a dibenzothienyl, a furazanyl, an oxadiazolyl, a thianthrenyl, a naphthobenzofuranyl, and a naphthobenzothienyl.

$R^1$ to $R^4$ each independently represent a hydrogen atom, an aryl, a heteroaryl, a diarylamino, a diheteroarylamino, an arylheteroarylamino, an alkyl, an alkoxy, a trialkylsilyl, an aryloxy, or cyano, and at least one hydrogen atom in these may be substituted by an aryl, a heteroaryl, a diarylamino, or an alkyl.

The above description for Ar can be cited for the aryl and the heteroaryl as $R^1$ to $R^4$.

The diarylamino, the diheteroarylamino, and the arylheteroarylamino as $R^1$ to $R^4$ are an amino group substituted with two aryl groups, an amino group substituted with two heteroaryl groups, and an amino group substituted with one aryl group and one heteroaryl group, respectively. The above description for Ar can also be cited for the aryl and the heteroaryl herein.

The alkyl as $R^1$ to $R^4$ may be either linear or branched, and examples thereof include a linear alkyl having 1 to 24 carbon atoms and a branched alkyl having 3 to 24 carbon atoms. An alkyl having 1 to 18 carbon atoms (branched alkyl having 3 to 18 carbon atoms) is preferable, an alkyl having 1 to 12 carbon atoms (branched alkyl having 3 to 12 carbon atoms) is more preferable, an alkyl having 1 to 6 carbon atoms (branched alkyl having 3 to 6 carbon atoms) is still more preferable, and an alkyl having 1 to 4 carbon atoms (branched alkyl having 3 or 4 carbon atoms) is particularly preferable.

Specific examples of the alkyl include methyl, ethyl, n-propyl, isopropyl, n-butyl, isobutyl, s-butyl, t-butyl, n-pentyl, isopentyl, neopentyl, t-pentyl, n-hexyl, 1-methylpentyl, 4-methyl-2-pentyl, 3,3-dimethylbutyl, 2-ethylbutyl, n-heptyl, 1-methylhexyl, n-octyl, t-octyl, 1-methylheptyl, 2-ethylhexyl, 2-propylpentyl, n-nonyl, 2,2-dimethylheptyl, 2,6-dimethyl-4-heptyl, 3,5,5-trimethylhexyl, n-decyl, n-undecyl, 1-methyldecyl, n-dodecyl, n-tridecyl, 1-hexylheptyl, n-tetradecyl, n-pentadecyl, n-hexadecyl, n-heptadecyl, n-octadecyl, and n-eicosyl.

Examples of the alkoxy as $R^1$ to $R^4$ include a linear alkoxy having 1 to 24 carbon atoms and a branched alkoxy having 3 to 24 carbon atoms. An alkoxy having 1 to 18 carbon atoms (branched alkoxy having 3 to 18 carbon atoms) is preferable, an alkoxy having 1 to 12 carbon atoms (branched alkoxy having 3 to 12 carbon atoms) is more preferable, an alkoxy having 1 to 6 carbon atoms (branched alkoxy having 3 to 6 carbon atoms) is still more preferable, and an alkoxy having 1 to 4 carbon atoms (branched alkoxy having 3 or 4 carbon atoms) is particularly preferable.

Specific examples of the alkoxy include methoxy, ethoxy, propoxy, isopropoxy, butoxy, isobutoxy, s-butoxy, t-butoxy, pentyloxy, hexyloxy, heptyloxy, and octyloxy.

Examples of the trialkylsilyl as $R^1$ to $R^4$ include a group in which three hydrogen atoms of a silyl group are each independently substituted by an alkyl, and examples of the alkyl include those described in the section of the alkyl as $R^1$ to $R^4$. A preferable alkyl for substitution is an alkyl having 1 to 4 carbon atoms, and specific examples thereof include methyl, ethyl, propyl, i-propyl, butyl, sec-butyl, t-butyl, and cyclobutyl.

Specific examples of the trialkylsilyl include a trimethylsilyl, a triethylsilyl, a tripropylsilyl, a tri-i-propylsilyl, a tributylsilyl, a tri sec-butylsilyl, a tri-t-butylsilyl, an ethyl dimethylsilyl, a propyldimethylsilyl, an i-propyldimethylsilyl, a butyldimethylsilyl, a sec-butyldimethylsilyl, a t-butyldimethylsilyl, a methyldiethylsilyl, a propyldiethylsilyl, an i-propyldiethylsilyl, a butyldiethylsilyl, a sec-butyl diethylsilyl, a t-butyldiethylsilyl, a methyldipropylsilyl, an ethyldipropylsilyl, a butyldipropylsilyl, a sec-butyldipropylsilyl, a t-butyldipropylsilyl, a methyl di-i-propylsilyl, an ethyl di-i-propylsilyl, a butyl di-i-propylsilyl, a sec-butyl di-i-propylsilyl, and a t-butyl di-i-propylsilyl.

The aryloxy as $R^1$ to $R^4$ is a group in which a hydrogen of a hydroxyl group is substituted by an aryl, and the above description for Ar can be cited for the aryl herein.

At least one hydrogen atom in $R^1$ to $R^4$ may be substituted by an aryl, a heteroaryl, a diarylamino, or an alkyl, and the above description can also be cited for these substituents.

In a case where there is a plurality of $R^4$'s in general formulas (1B) and (1B'), adjacent $R^4$'s may be bonded to each other to form an aryl ring or a heteroaryl ring together with ring a, at least one hydrogen atom in the ring thus formed may be substituted by an aryl, a heteroaryl, a diarylamino, a diheteroarylamino, an arylheteroarylamino, an alkyl, an alkoxy, a trialkylsilyl, an aryloxy, or cyano, and at least one hydrogen atom in these may be substituted by an aryl, a heteroaryl, a diarylamino, or an alkyl.

Here, the above description can be cited for a substituent (an aryl, a heteroaryl, a diarylamino, a diheteroarylamino, an arylheteroarylamino, an alkyl, an alkoxy, a trialkylsilyl, or an aryloxy) in the ring thus formed and a further substituent to the substituent (an aryl, a heteroaryl, a diarylamino, or an alkyl).

The case where the substituents $R^4$'s are adjacent to each other means a case where adjacent carbon atoms are substituted by two substituents $R^4$'s on ring a (benzene ring). The polycyclic aromatic amino compound represented by general formula (1B) or (1B') changes a ring structure constituting the compound (ring a is changed to ring a') depending on a bonding form between substituents on ring a as indicated by the following general formulas (1B-a') and (1B'-a').

General formula (1B-a')

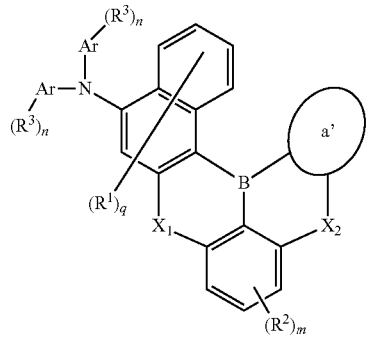

General formula (1B'-a')

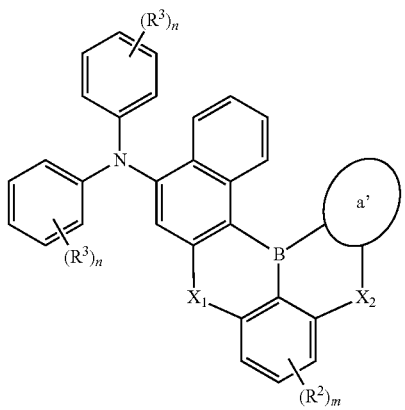

A compound represented by the above general formula (1B-a') or (1B'-a') corresponds, for example, to a compound represented by formulas (1B-21) to (1B-36), (1B-41), (1B-42), or (1B-46), listed as a specific compound described later. That is, the compound represented by the above general formula (1B-a') or (1B'-a') is a compound having ring a' formed by fusing a benzene ring or the like to a benzene ring which is ring a, and the fused ring a' thus formed is a naphthalene ring or the like. Examples thereof further include a carbazole ring (including a carbazole ring in which a hydrogen atom on an N atom is substituted by the above alkyl or aryl), an indole ring (including an indole ring in which a hydrogen atom on an N atom is substituted by the above alkyl or aryl), a dibenzofuran ring, and a dibenzothiophene ring formed by fusing an indole ring, a pyrrole ring, a benzofuran ring, and a benzothiophene ring to a benzene ring which is ring a, respectively.

In a case where $R^1$ and $R^3$ in general formulas (1A) and (1B) are adjacent to each other, $R^1$ and $R^3$ may be bonded to each other by —O—, —S—, —C(—R)$_2$—, or a single bond, and R of the moiety —C(—R)$_2$— represents a hydrogen atom or an alkyl having 1 to 6 carbon atoms (particularly an alkyl having 1 to 4 carbon atoms (for example, methyl or ethyl)).

For example, as illustrated below, the case where $R^1$ and $R^3$ are adjacent to each other means a case where substitution by $R^3$ occurs adjacent to a bonding position to a N (nitrogen) atom in Ar (phenyl), and substitution by $R^1$ occurs adjacent (second position or eighth position) to a bonding position (first position) to a N (nitrogen) atom in a naphthalene structure. These two substituents may be bonded as described above.

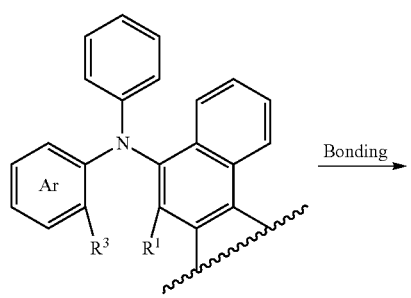

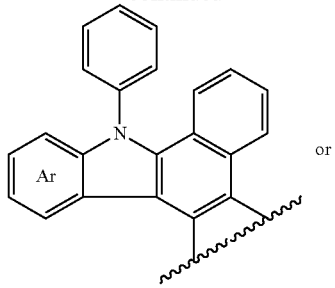

or

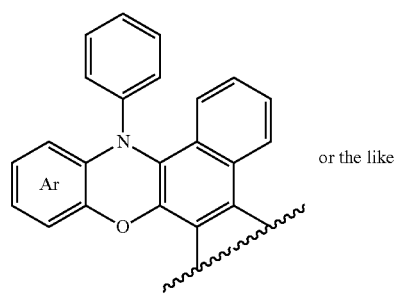

or the like

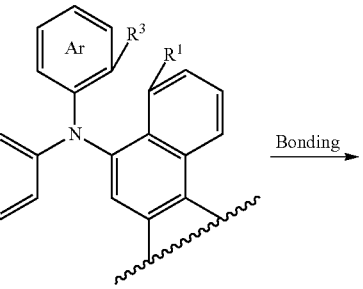

Bonding

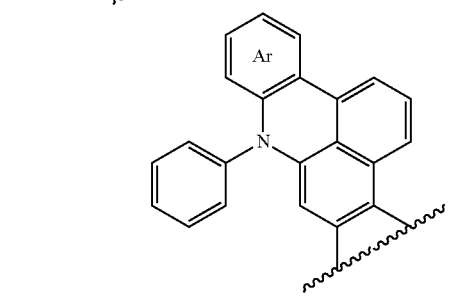

or the like m represents an integer of 0 to 3, n's each independently represent an integer of 0 to the maximum substitutable number to Ar, p represents an integer of 0 to 4, and q's each independently represent an integer of 0 to 5.

m represents preferably an integer of 0 to 2, more preferably 0 or 1, still more preferably 0. n's each independently represent preferably an integer of 0 to 5, more preferably an integer of 0 to 3, particularly preferably an integer of 0 to 2, further preferably 0 or 1, most preferably 0. p represents preferably an integer of 0 to 2, more preferably an integer of 0 or 1, particularly preferably 0. q's each independently represent preferably 0 to 2, particularly preferably 0 or 1, further preferably 0.

$X^1$ and $X^2$ each independently represent O or N—R, and R of the moiety N—R represents an aryl having 6 to 12 carbon atoms, a heteroaryl having 2 to 15 carbon atoms, or an alkyl having 1 to 6 carbon atoms.

The above description for Ar and $R^1$ to $R^4$ can be cited for the aryl, the heteroaryl, and the alkyl as R of the moiety N—R.

In a case where $X^2$ in general formulas (1B) and (1B') represents the moiety N—R, R may be bonded to the ring a by —O—, —S—, —C(—R)$_2$—, or a single bond, and R of the moiety —C(—R)$_2$— represents a hydrogen atom or an alkyl having 1 to 6 carbon atoms (particularly an alkyl having 1 to 4 carbon atoms (for example, methyl or ethyl)).

The above description for $R^1$ to $R^4$ can be cited for the alkyl as R of the moiety —C(—R)$_2$—. The definition that "R of the moiety N—R is bonded to the ring a by —)—, —S—, —C(—R)$_2$—, or a single bond" can be expressed by a compound having a ring structure in which $X^2$ is incorporated into fused ring a", represented by the following general formula (1B-a") or (1B'-a"). That is, the compound is, for example, a compound having ring a" formed by fusing another ring to a benzene ring which is ring a in general formula (1B) or (1B') so as to incorporate $X^2$. The fused ring a" thus formed is, for example, a phenoxazine ring, a phenothiazine ring, or an acridine ring.

General formula (1B-a")

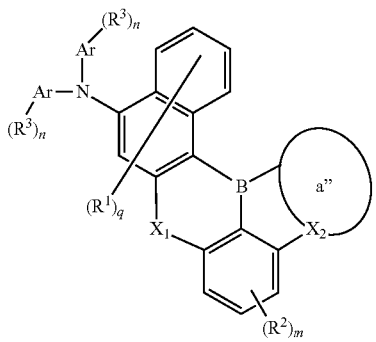

General formula (1B'-a")

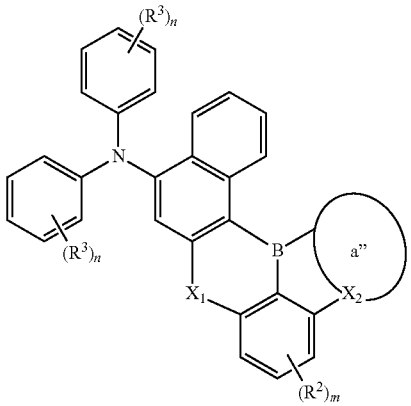

At least one hydrogen atom in a compound represented by general formula (1A) or (1B) may be substituted by a halogen atom or a deuterium atom.

The halogen is fluorine, chlorine, bromine, or iodine, is preferably fluorine or chlorine, and more preferably fluorine.

The polycyclic aromatic amino compound according to the present invention can be used as a material for an organic device. Examples of the organic device include an organic electroluminescent element, an organic field effect transistor, and an organic thin film solar cell. Particularly, in the organic electroluminescent element, a compound in which $X^1$ and $X^2$ each represent N—R, a compound in which $X^1$ and $X^2$ each represent O, a compound in which $X^1$ represents O and $X^2$ represents N—R, and a compound in which $X^1$ represents N—R and $X^2$ represents O are preferably used as a dopant material for a light emitting layer, a compound in which $X^1$ represents O and $X^2$ represents N—R, a compound in which $X^1$ represents N—R and $X^2$ represents O, and a compound in which $X^1$ and $X^2$ each represent O are preferably used as a host material for a light emitting layer, and a compound in which and $X^1$ and $X^2$ each represent O is preferably used as an electron transport material.

More specific examples of the polycyclic aromatic amino compound of the present invention include compounds represented by the following formulas (1A-1) to (1A-286), compounds represented by the following formulas (1B-1) to 1A-226), and compounds represented by the following formulas (1B-231) to (1A-296). In each structural formula, "Me" represents a methyl group, "iPr" represents an isopropyl group, "tBu" represents a t-butyl group, "SiMe$_3$" represents a trimethylsilyl group, and "CN" represents a cyano group.

(1A-1)

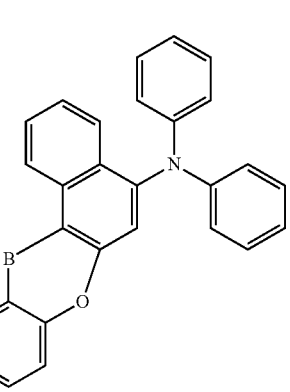

-continued
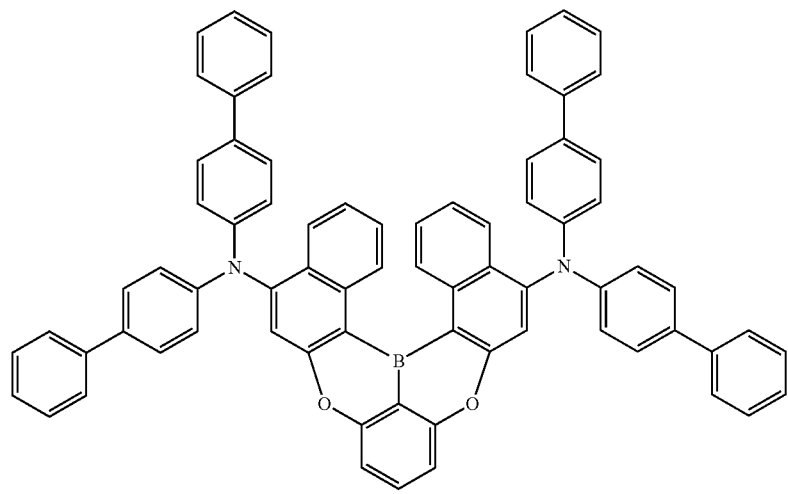
(1A-2)
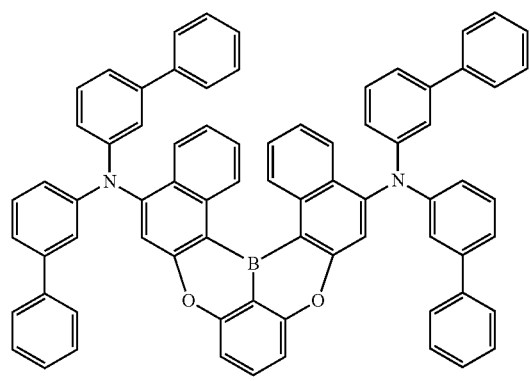
(1A-3)
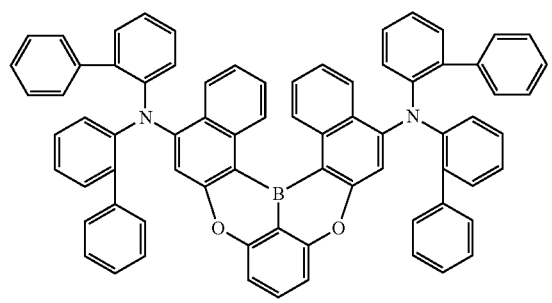
(1A-4)
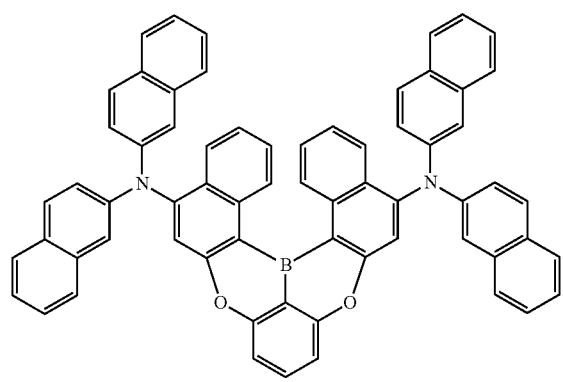
(1A-5)
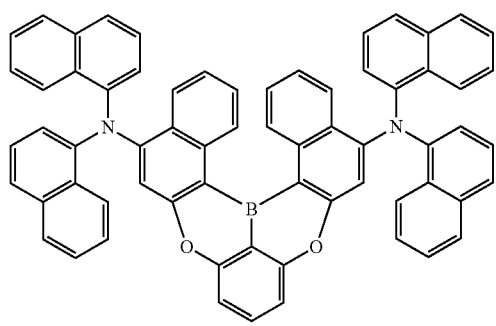
(1A-6)

(1A-11)
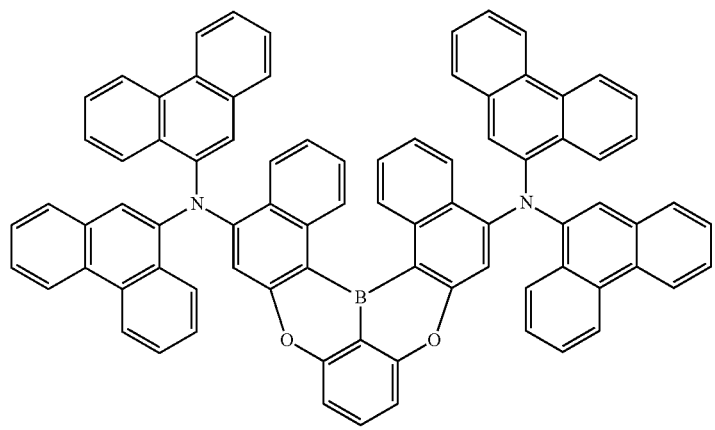
(1A-12)
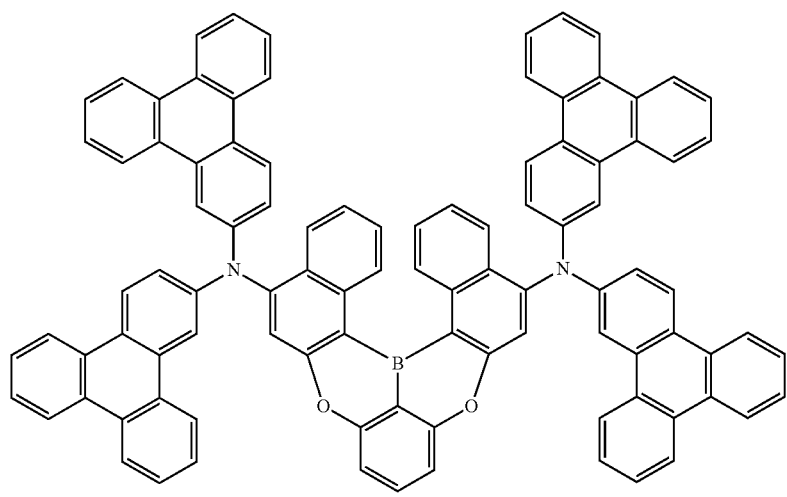
(1A-13)
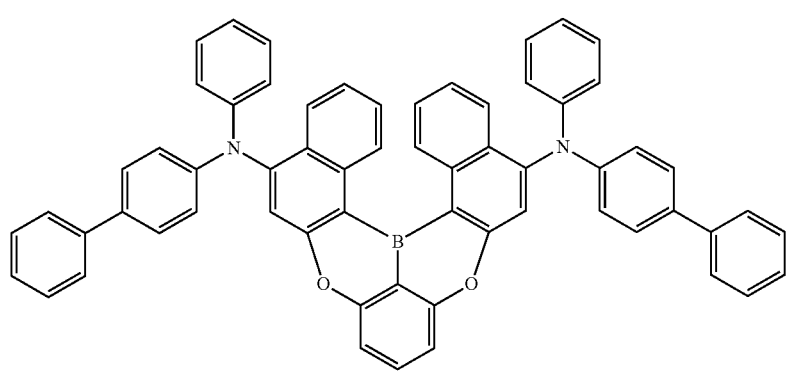

-continued
(1A-14)
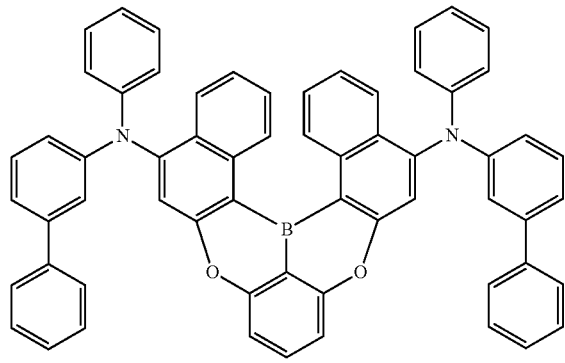
(1A-15)
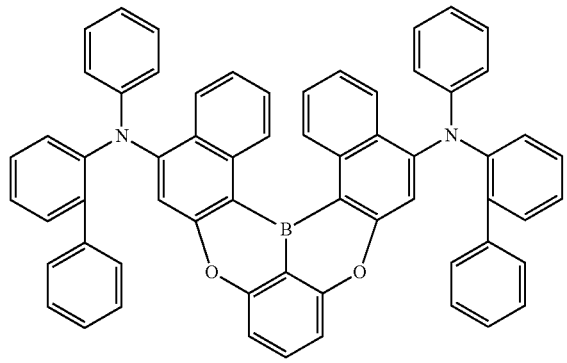
(1A-16)
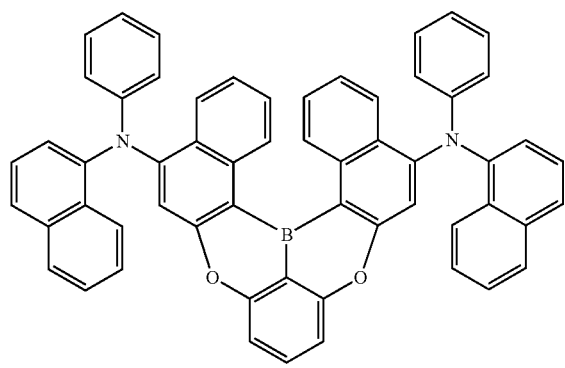
(1A-21)
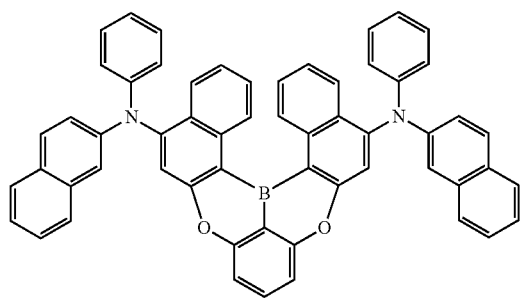
(1A-22)
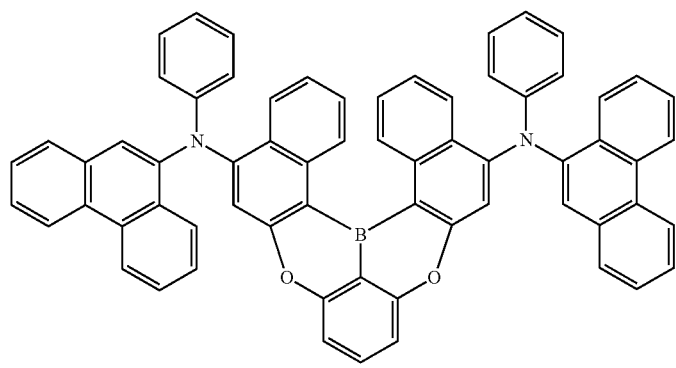
(1A-23)
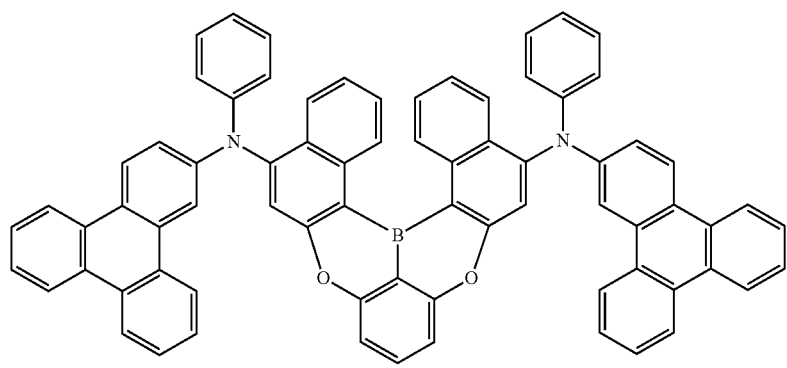

(1A-24)
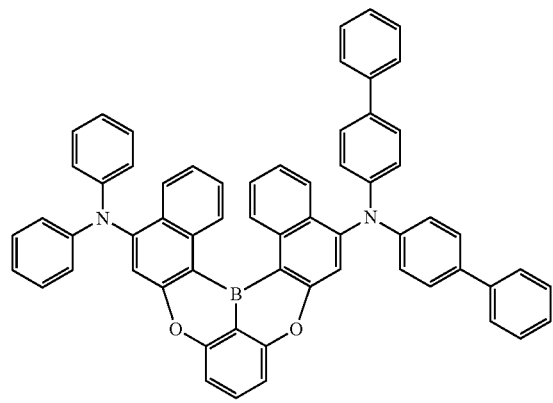
(1A-25)
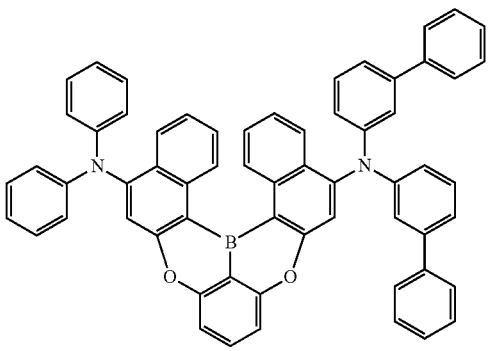
(1A-26)
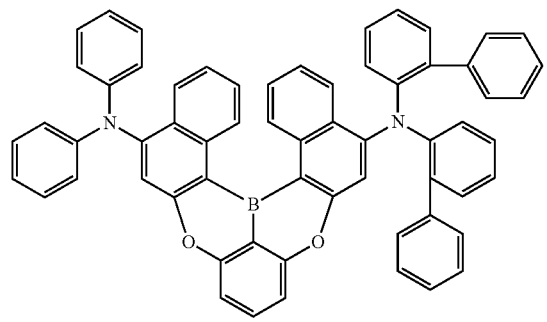
(1A-31)
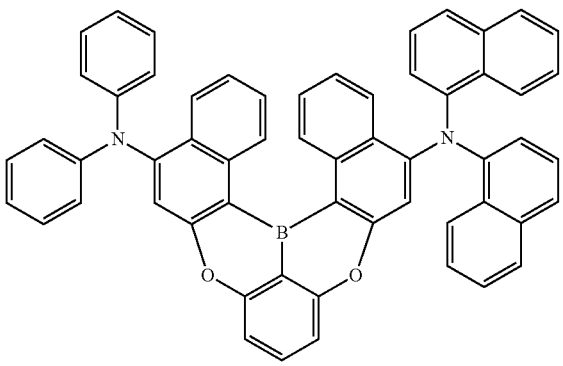
(1A-32)
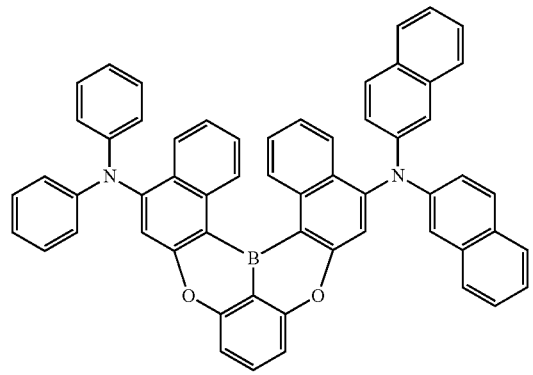
(1A-33)
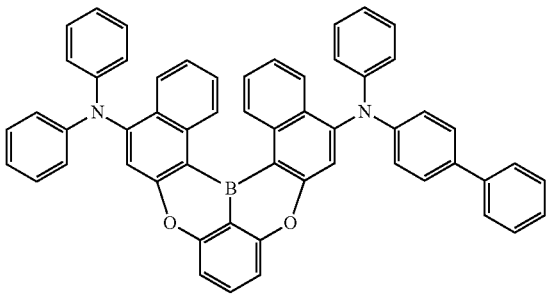
(1A-34)
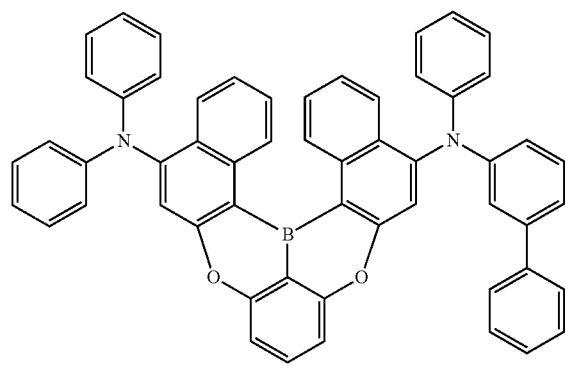
(1A-35)
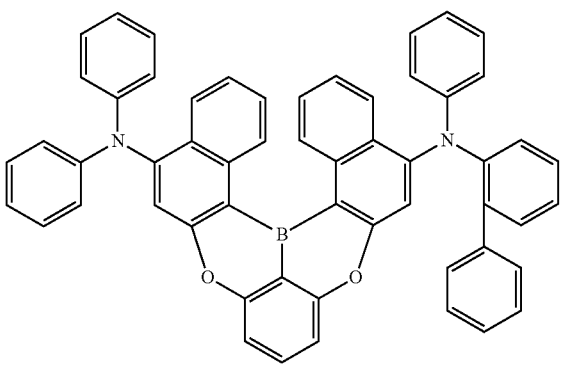

-continued
(1A-36)
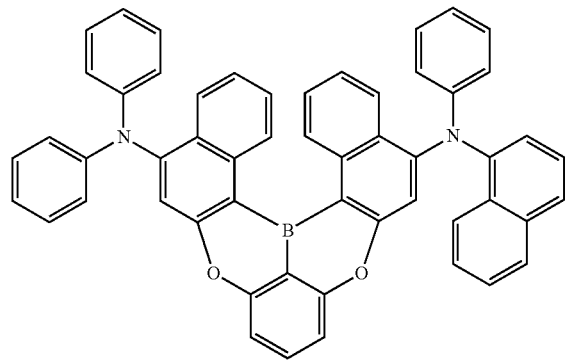
(1A-41)
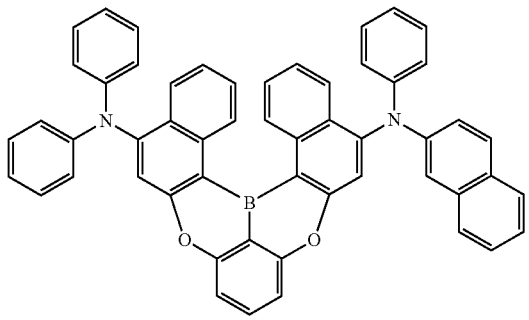
(1A-42)
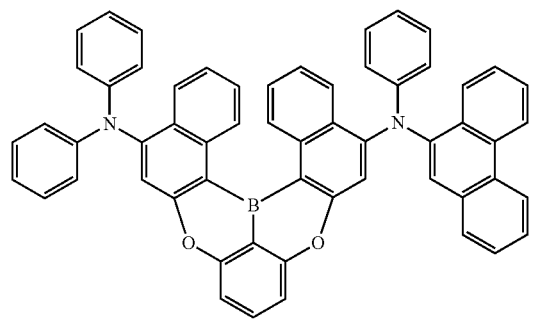
(1A-43)
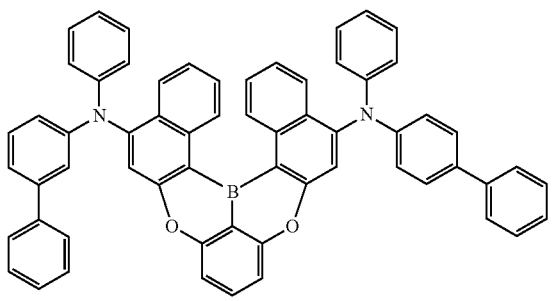
(1A-44)
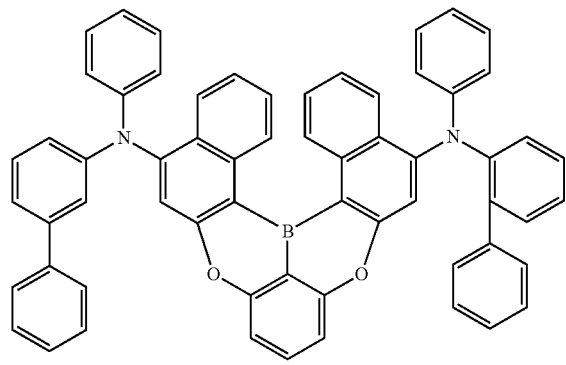
(1A-45)
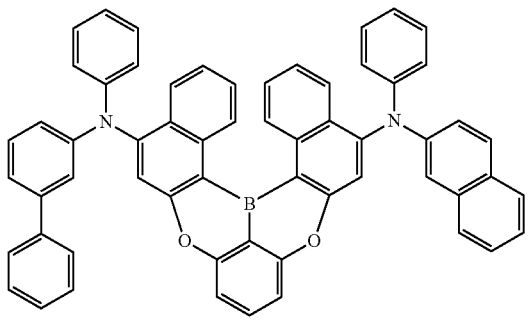
(1A-46)
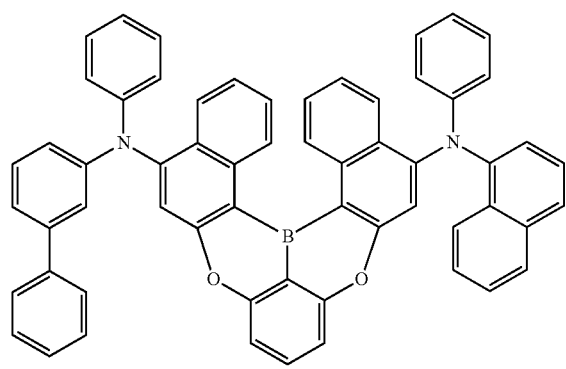

(1A-51)
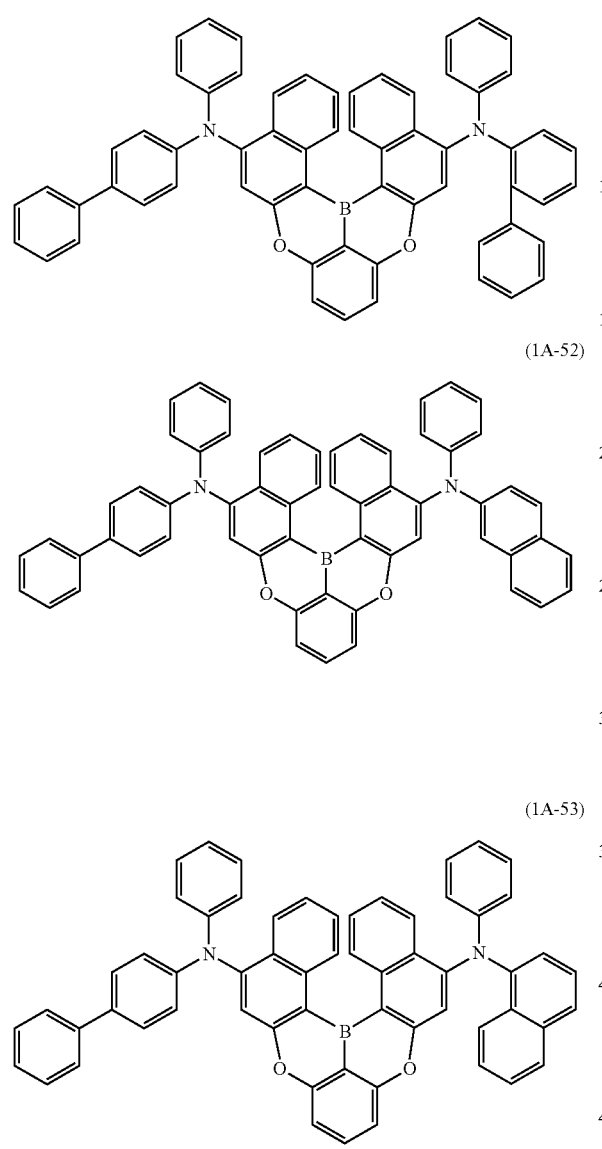
(1A-52)
(1A-53)
(1A-54)
(1A-55)
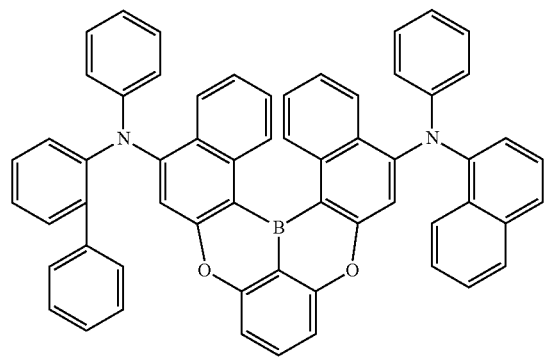
(1A-56)
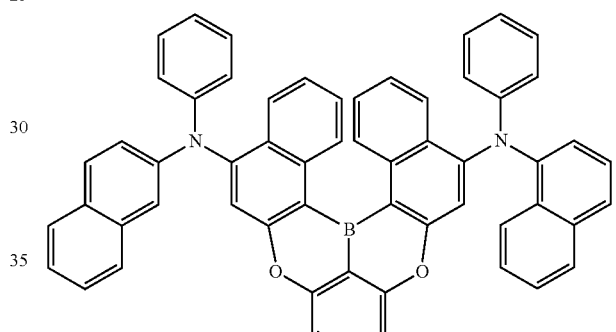
(1A-61)
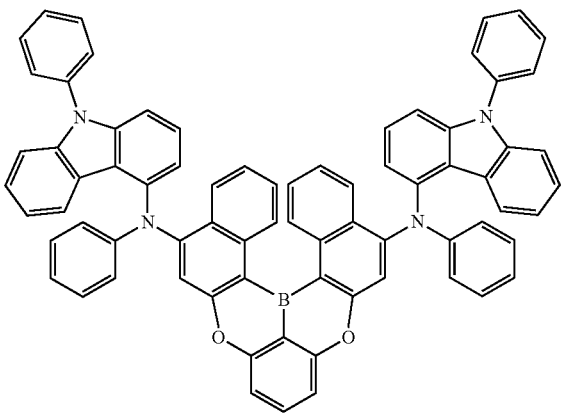

-continued
(1A-62)
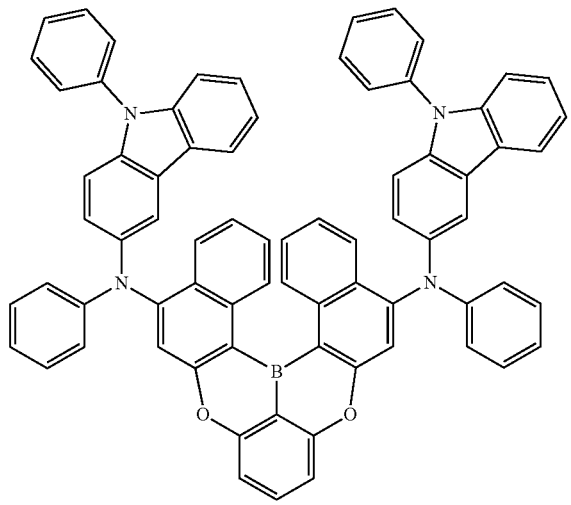
(1A-63)
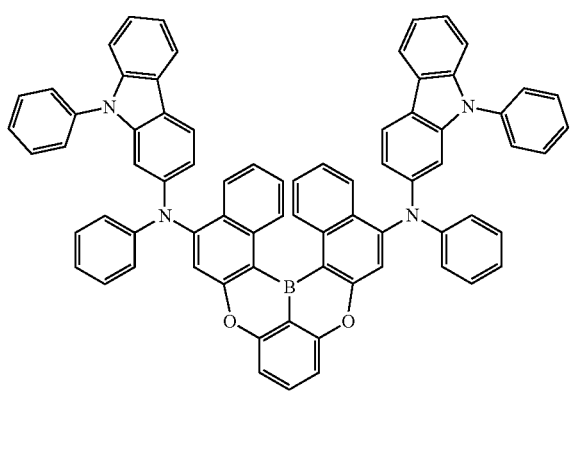
(1A-64)
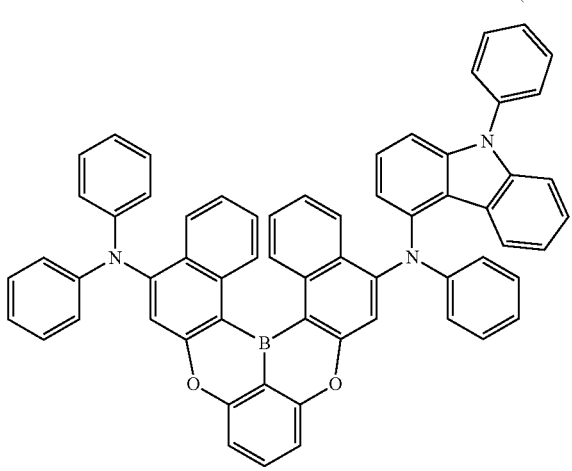
-continued
(1A-65)
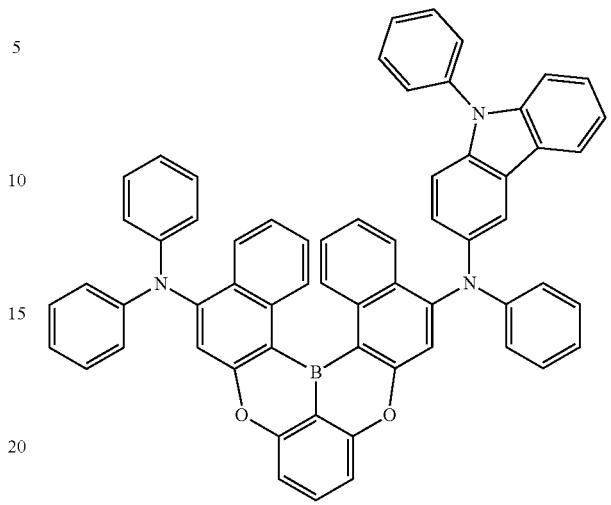
(1A-66)
(1A-71)

(1A-72)
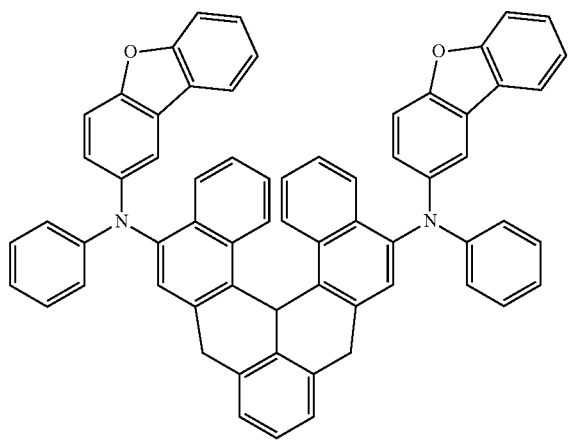
(1A-73)
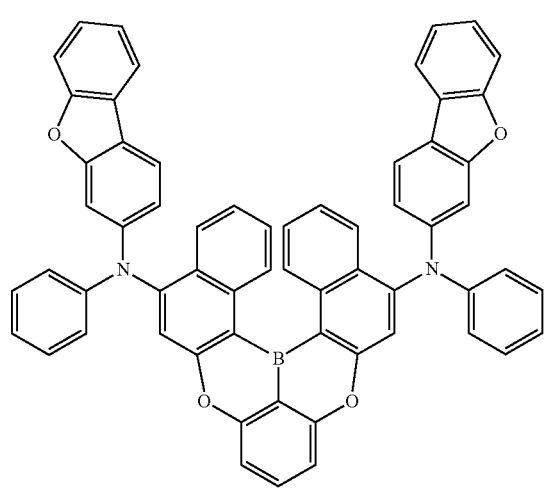
(1A-74)
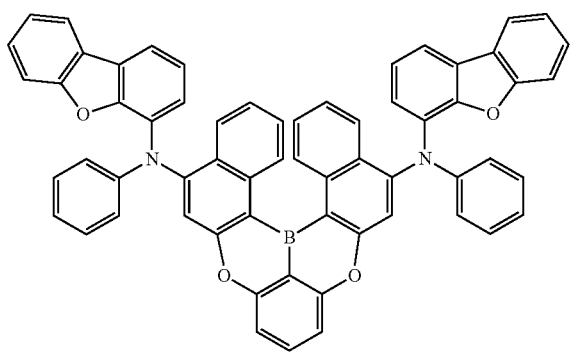
(1A-75)
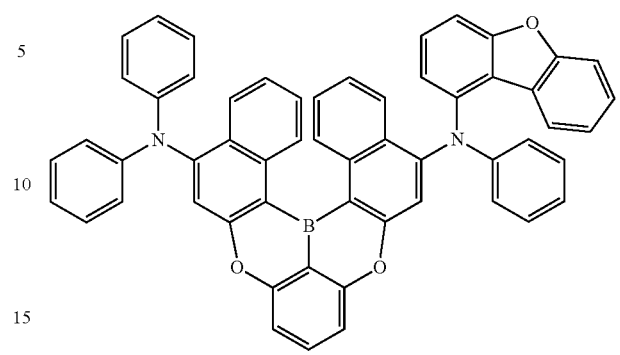
(1A-76)
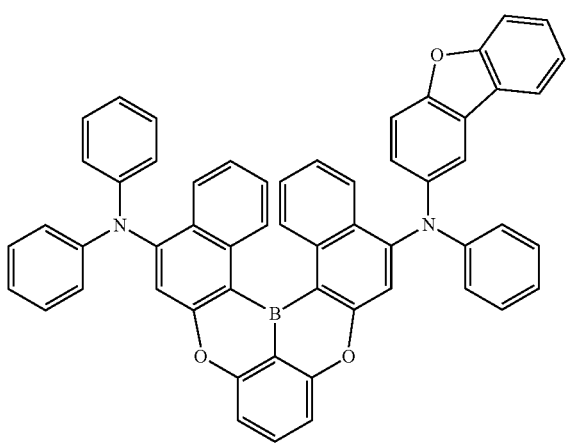
(1A-81)
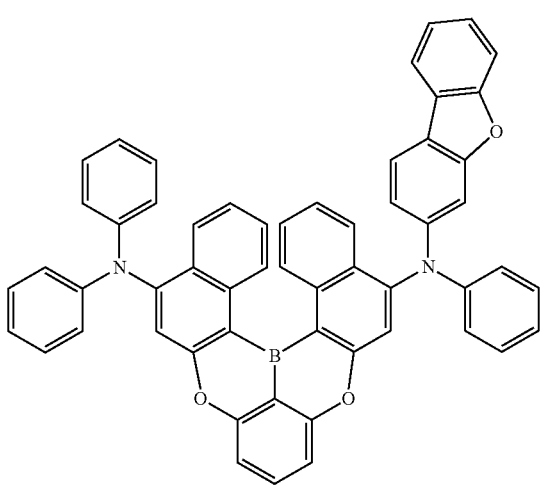

(1A-82)
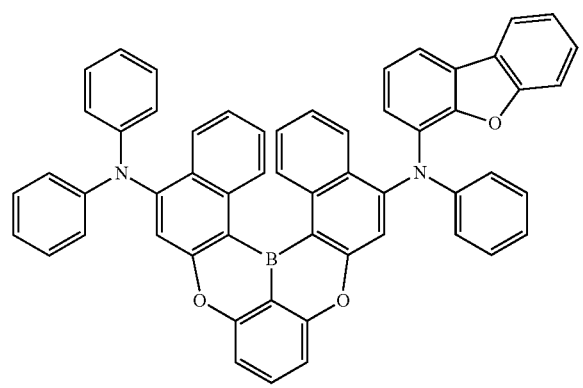
(1A-85)
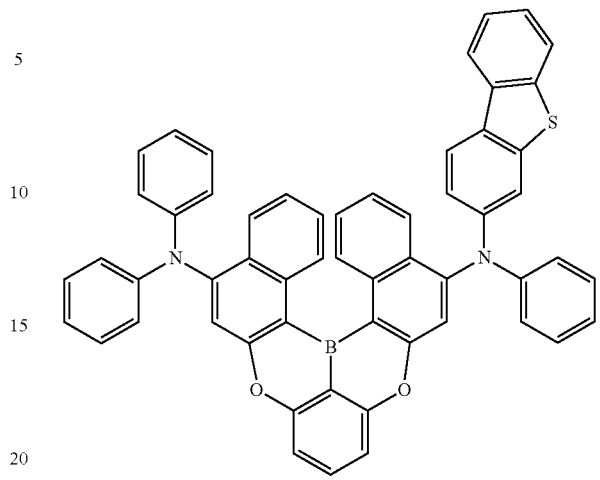
(1A-83)
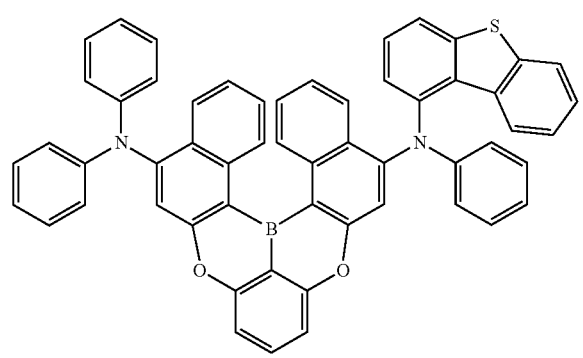
(1A-86)
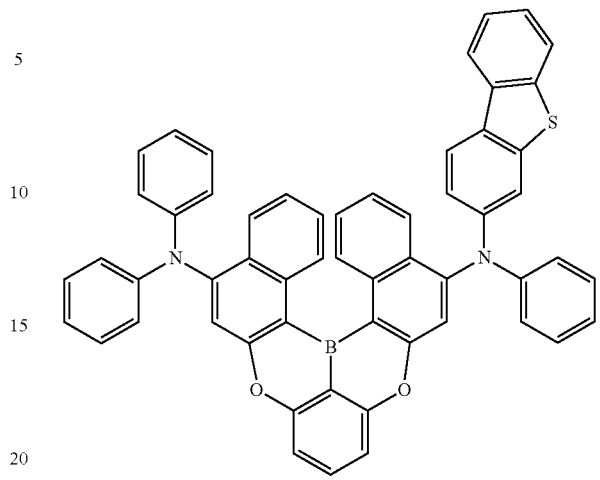
(1A-91)
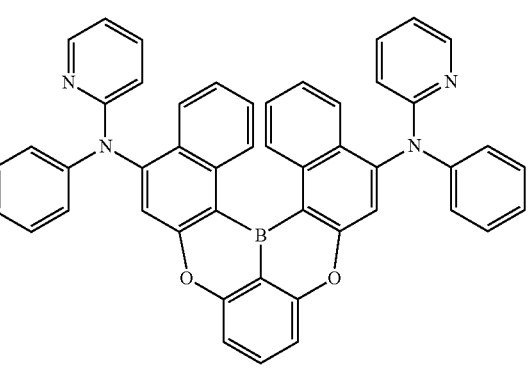
(1A-84)
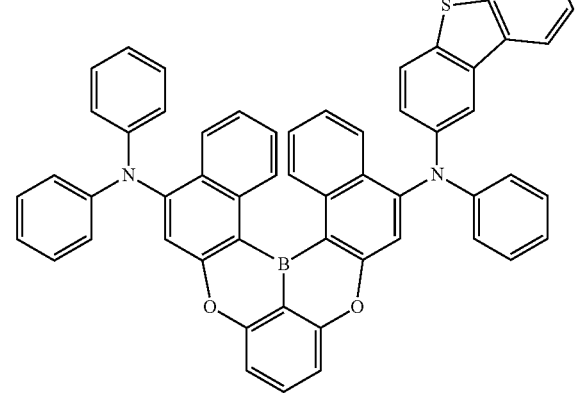
(1A-92)
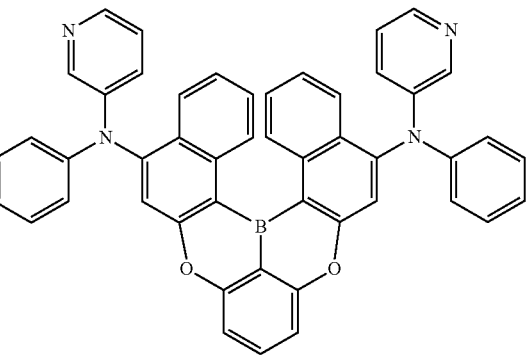

-continued
(1A-93)
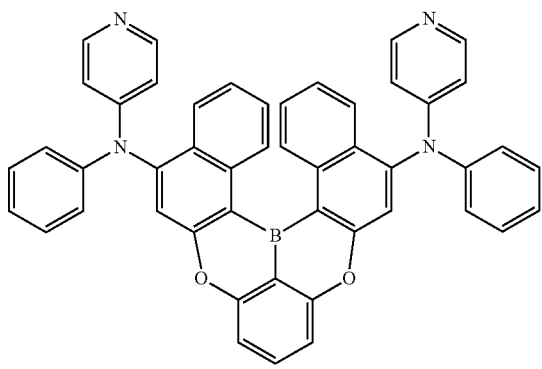
(1A-94)
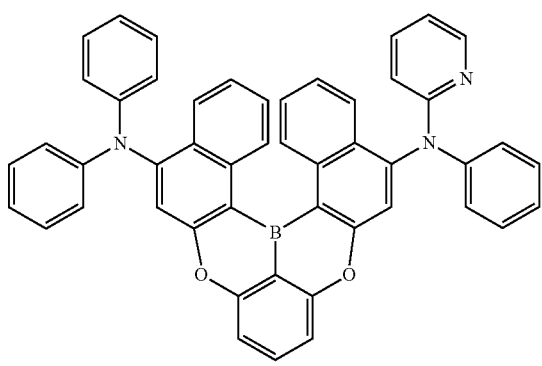
(1A-95)
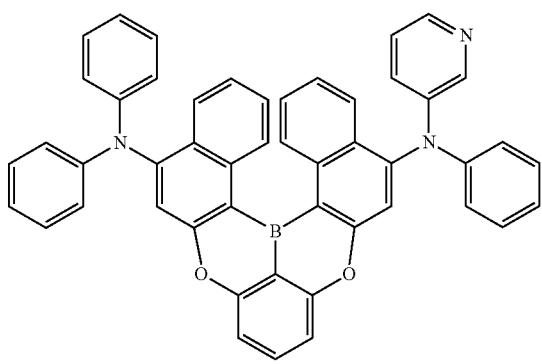
(1A-96)
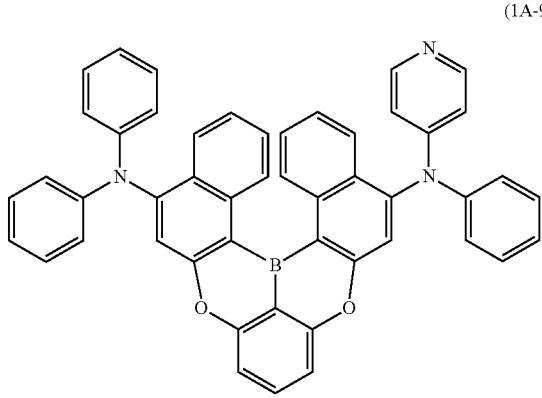
-continued
(1A-101)
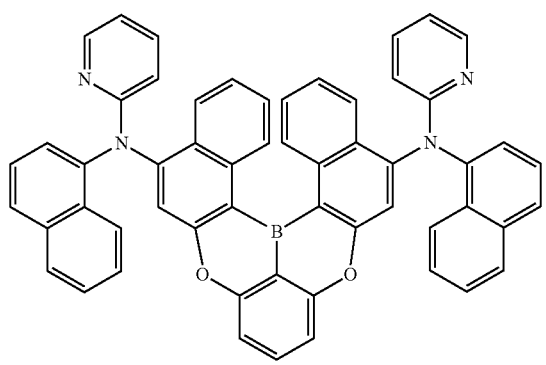
(1A-102)
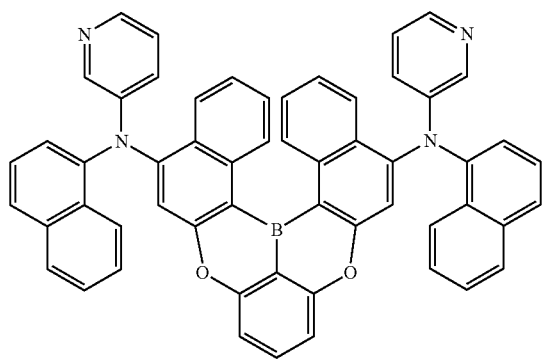
(1A-103)
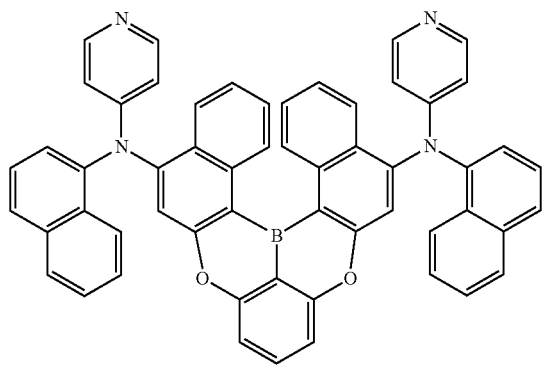
(1A-104)
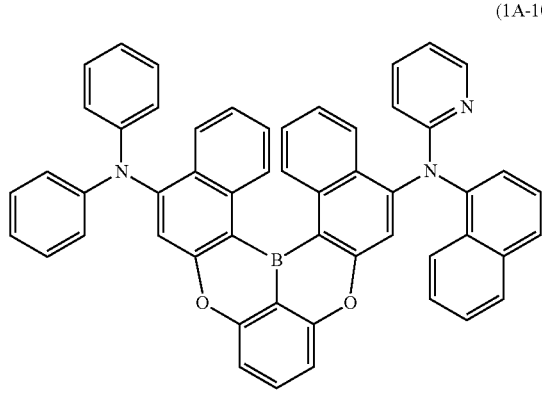

(1A-105)
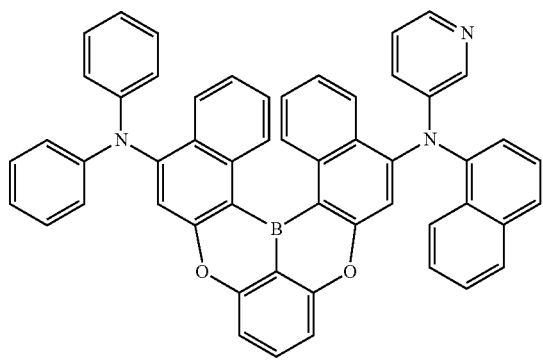
(1A-106)
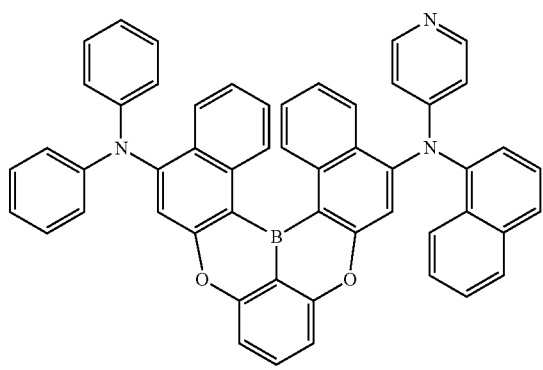
(1A-111)
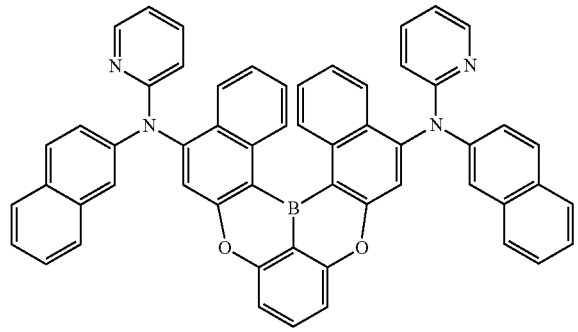
(1A-112)
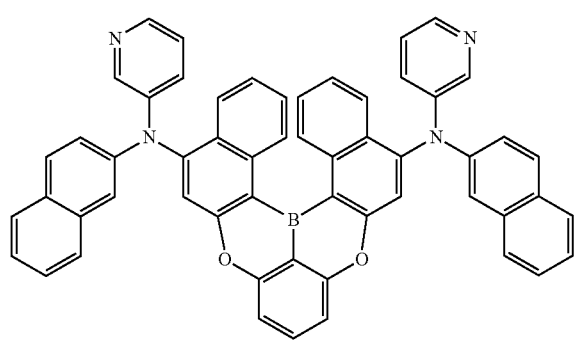
(1A-113)
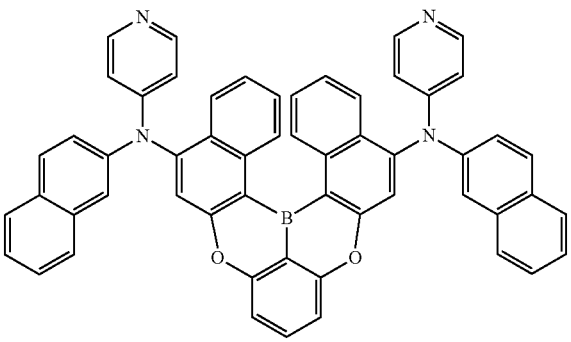
(1A-114)
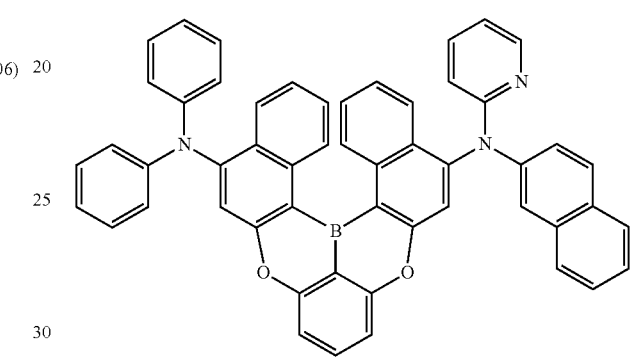
(1A-115)
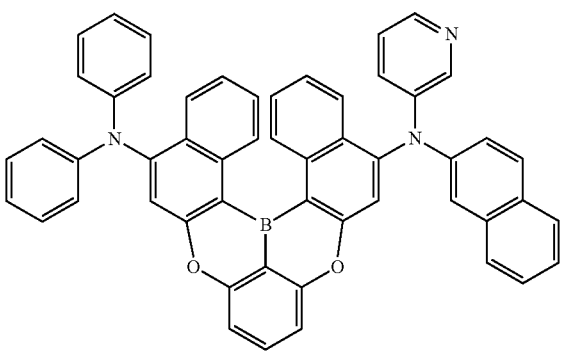
(1A-116)
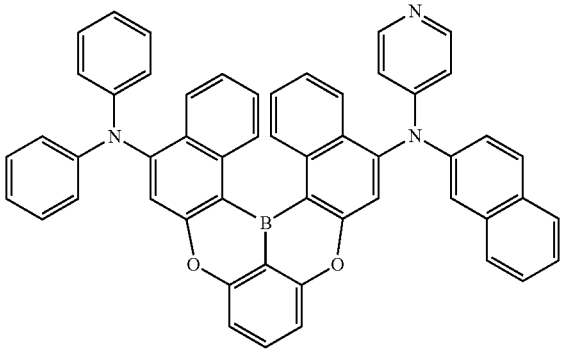

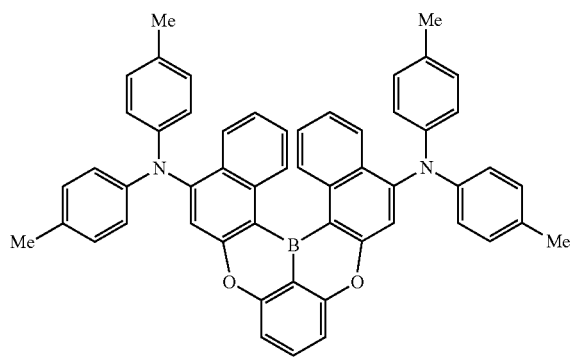
(1A-121)
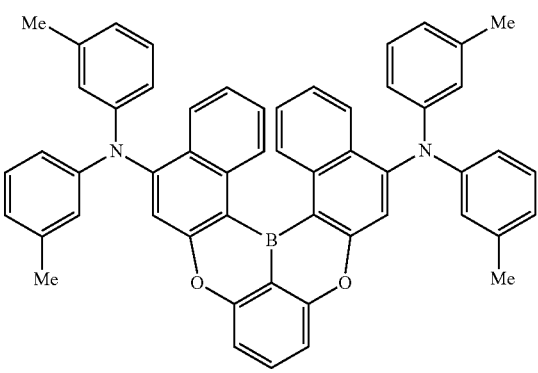
(1A-122)
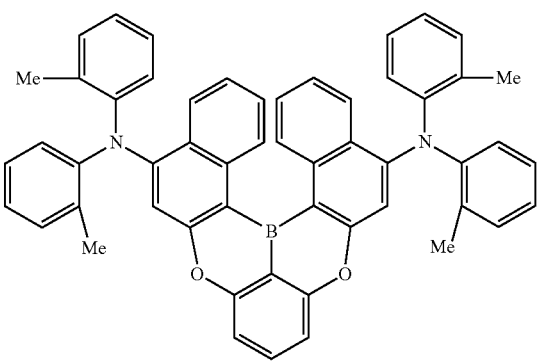
(1A-123)
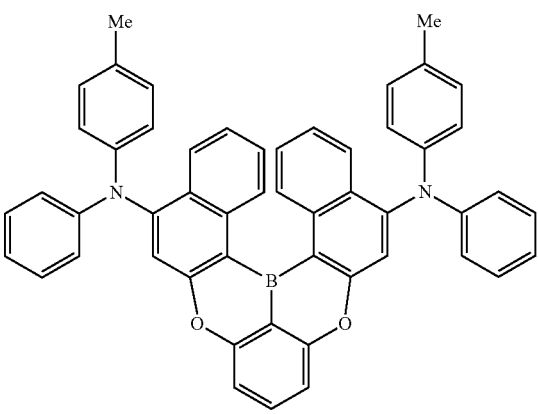
(1A-124)
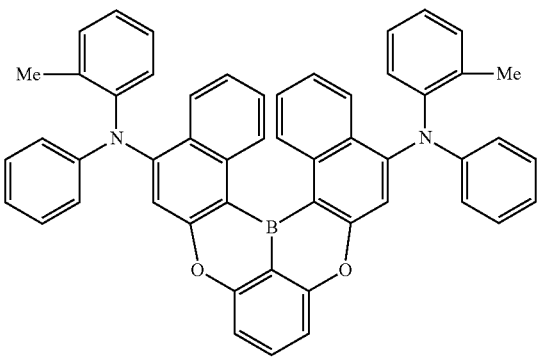
(1A-125)
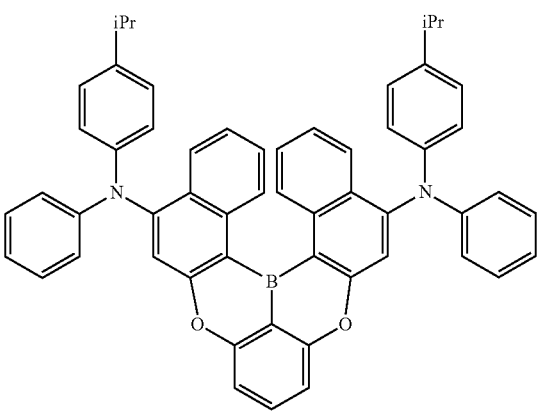
(1A-126)
(1A-131)
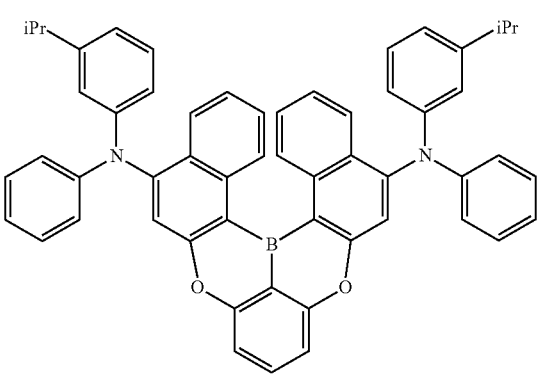
(1A-132)

(1A-133)
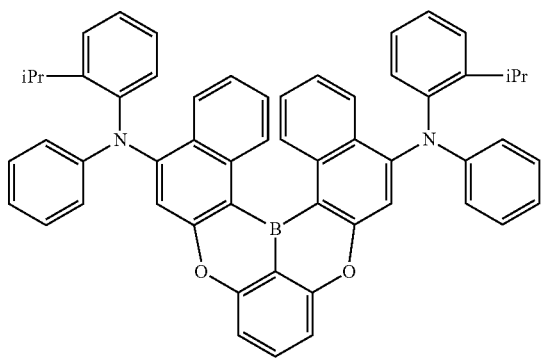
(1A-134)
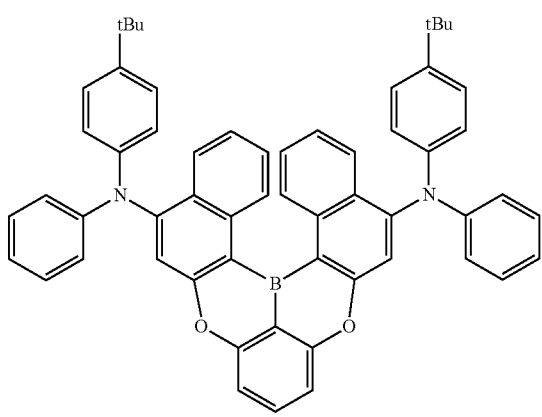
(1A-135)
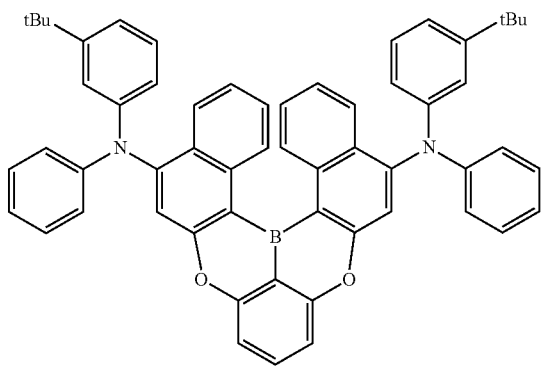
(1A-136)
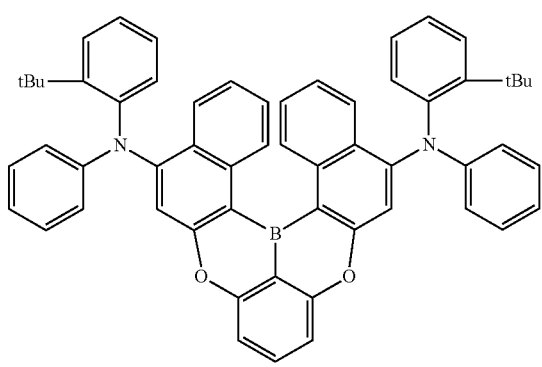
(1A-141)
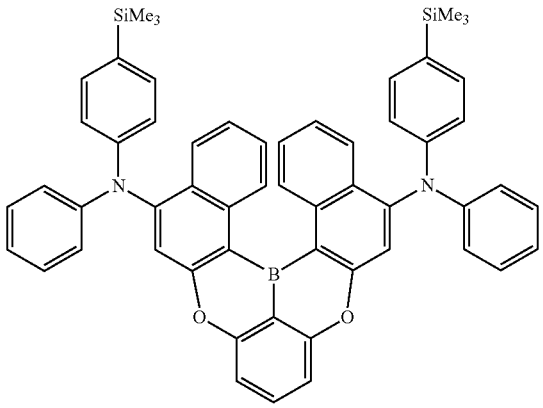
(1A-142)
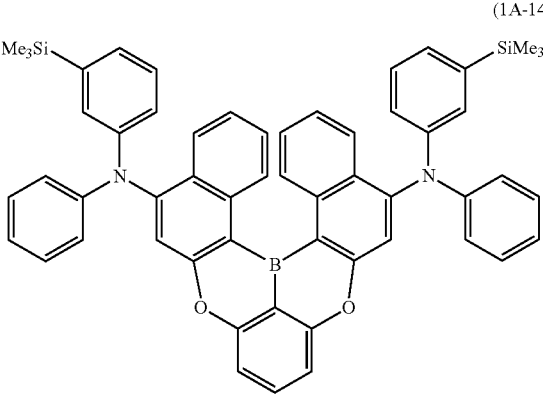
(1A-143)
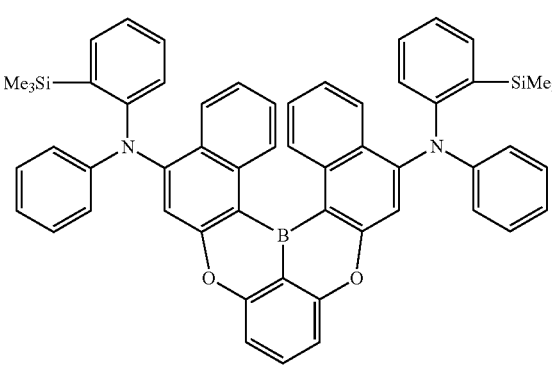
(1A-144)
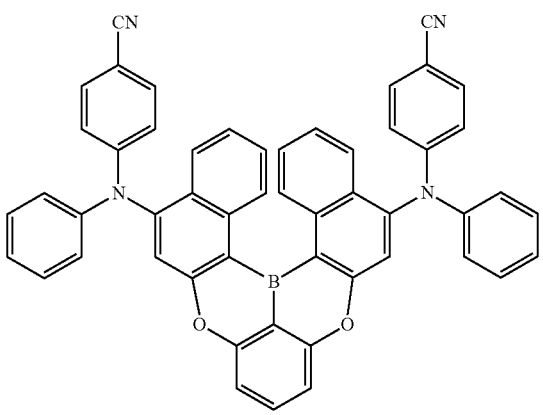

-continued
(1A-145)
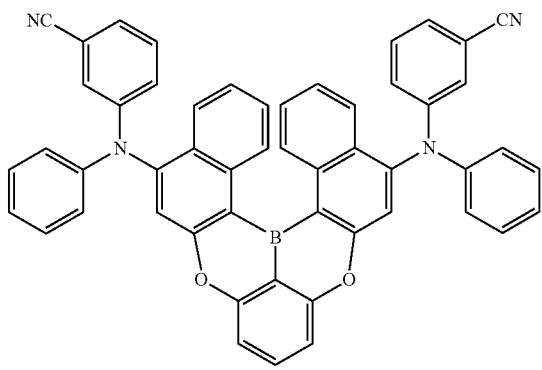
(1A-146)
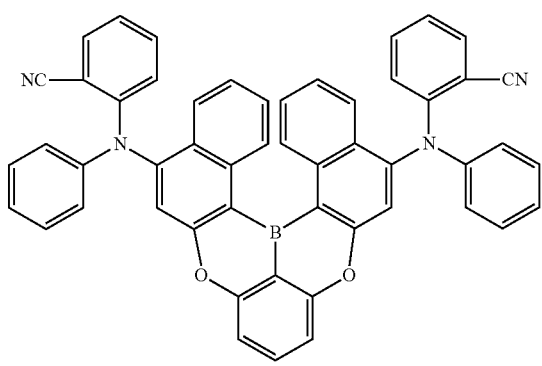
(1A-151)
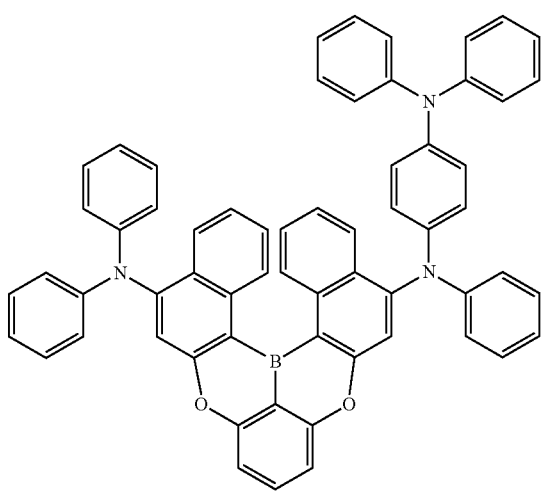
(1A-152)
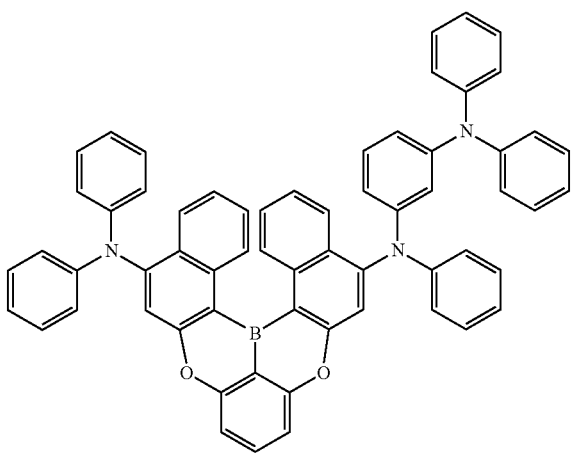
(1A-153)
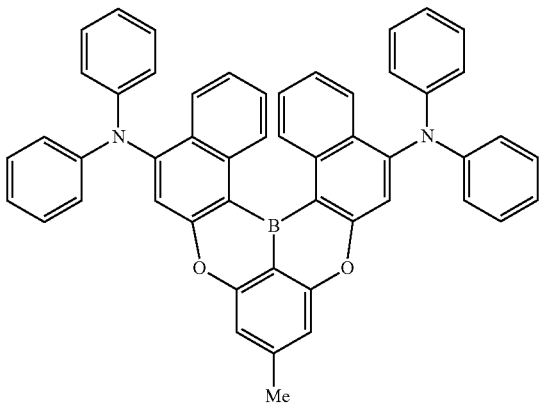
(1A-154)
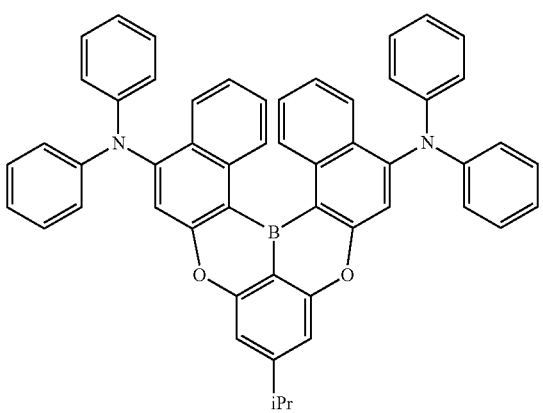

(1A-155)
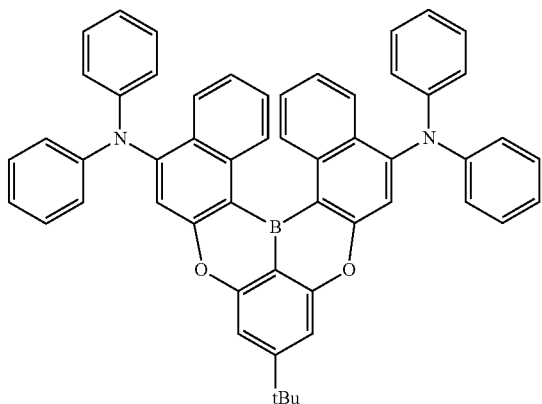
(1A-156)
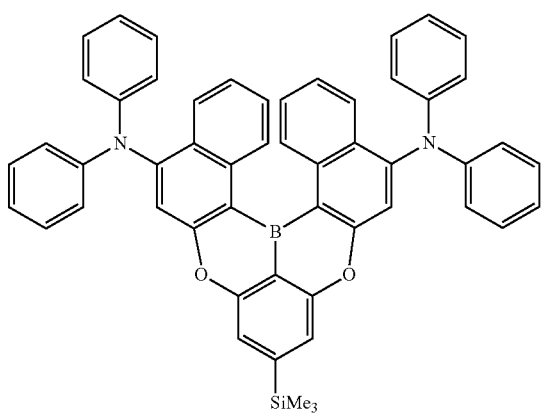
(1A-161)
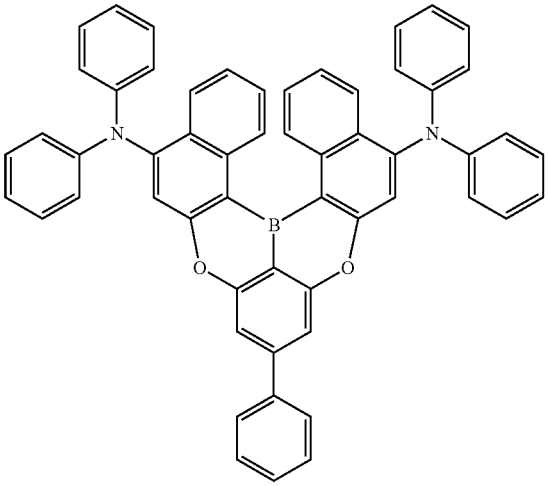
(1A-162)
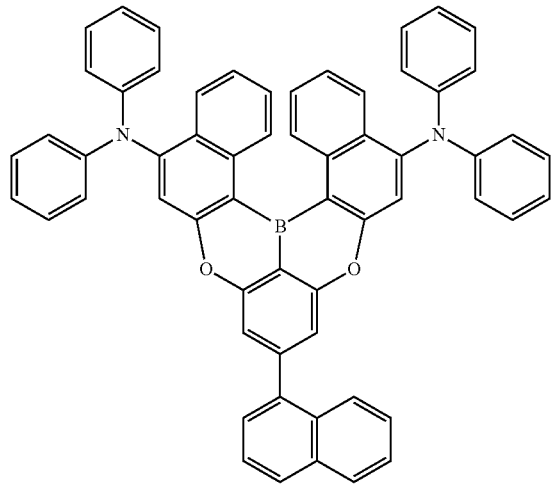
(1A-163)
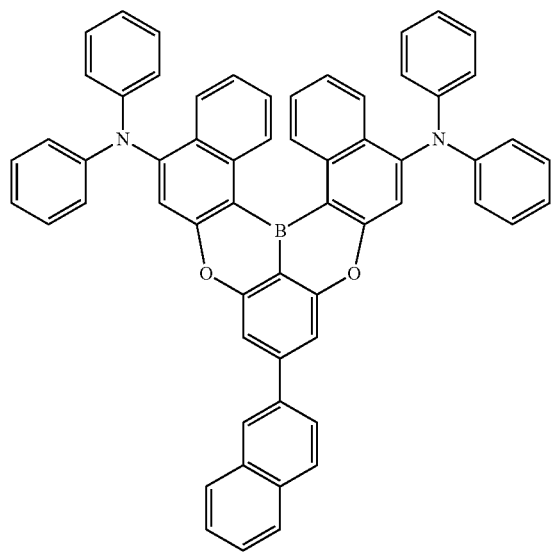
(1A-164)
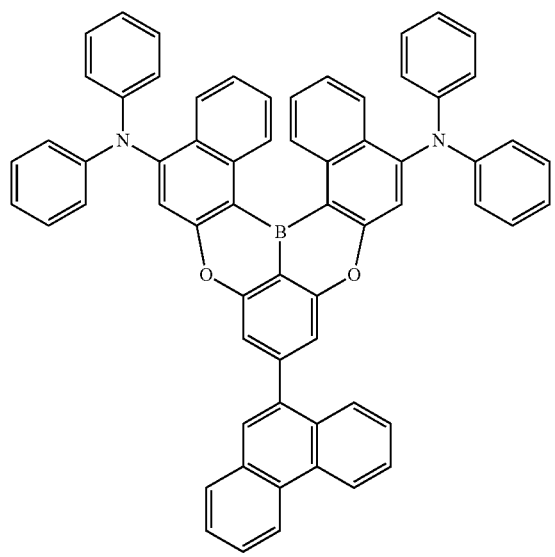

(1A-165)
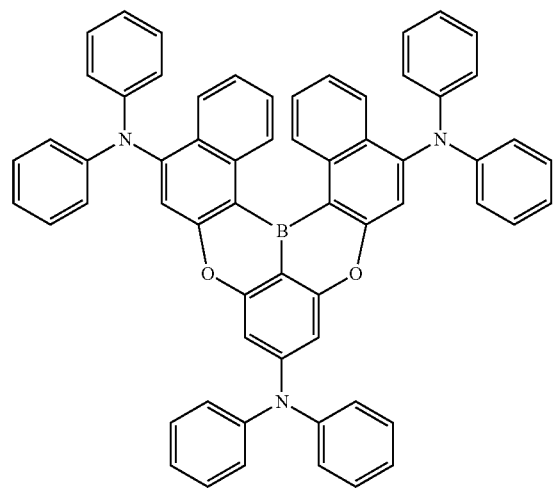
(1A-172)
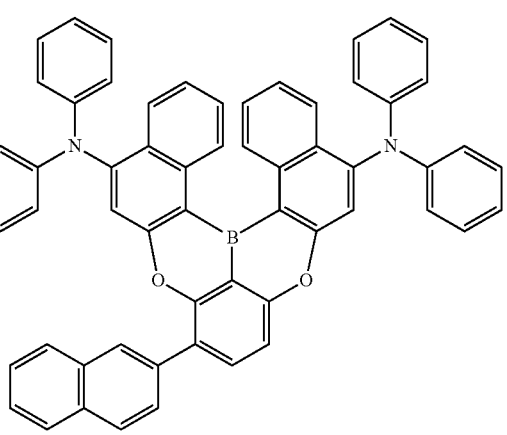
(1A-166)
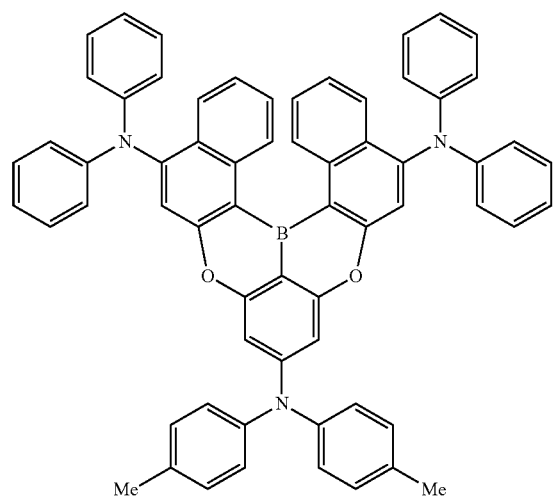
(1A-173)
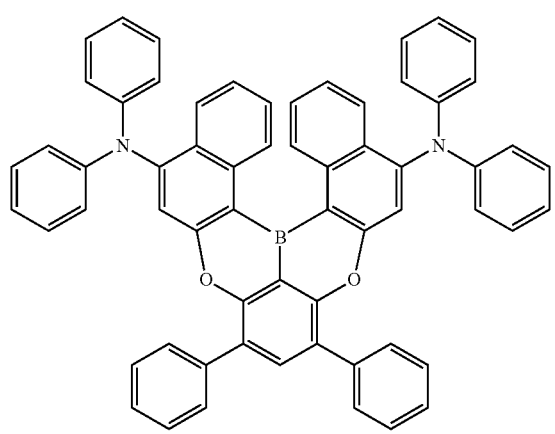
(1A-171)
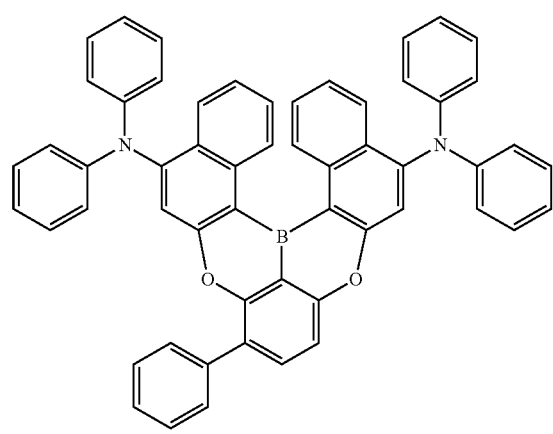
(1A-174)
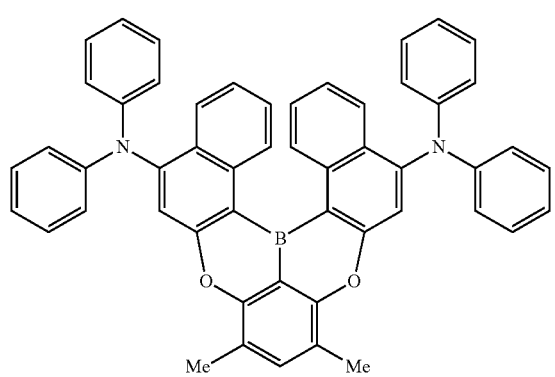

(1A-175)
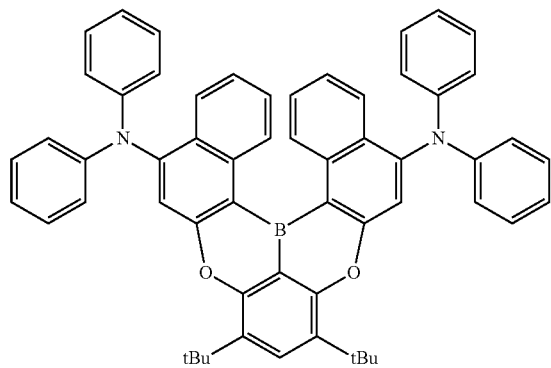
(1A-176)
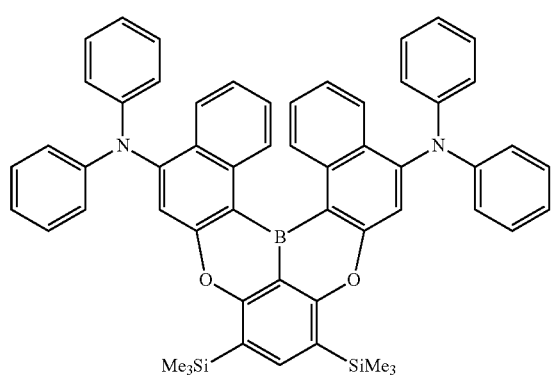
(1A-181)
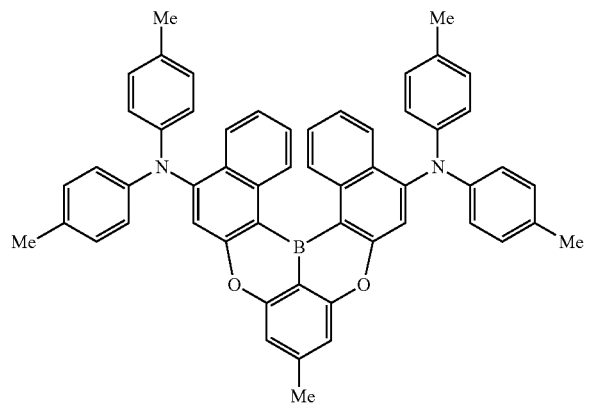
(1A-182)
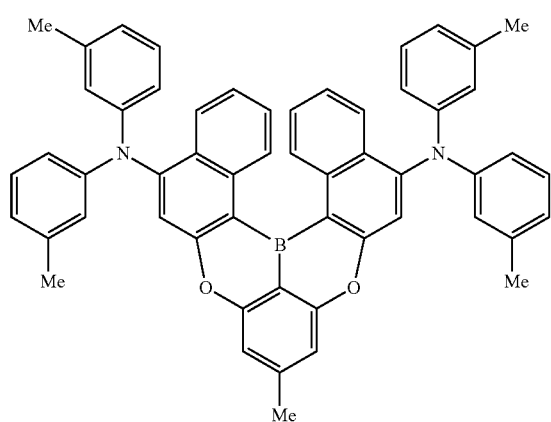
(1A-183)
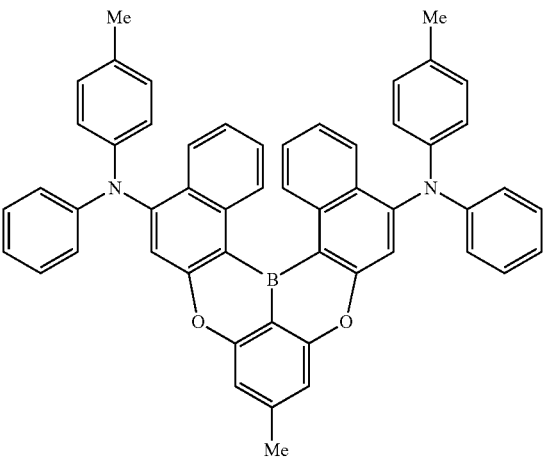
(1A-184)
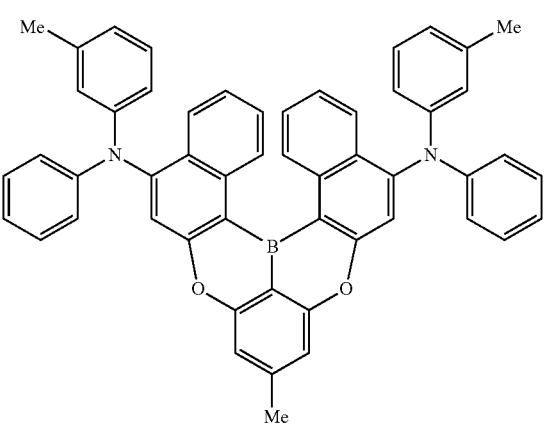
(1A-185)
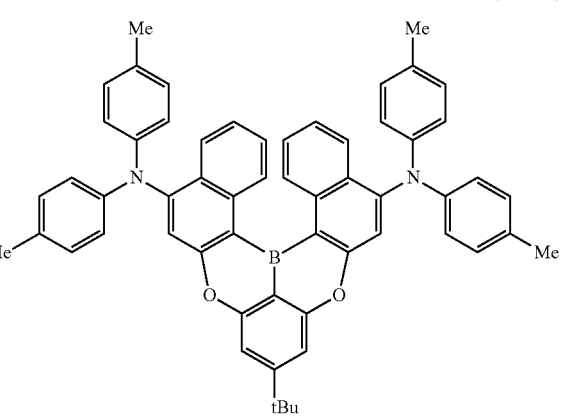

(1A-186)
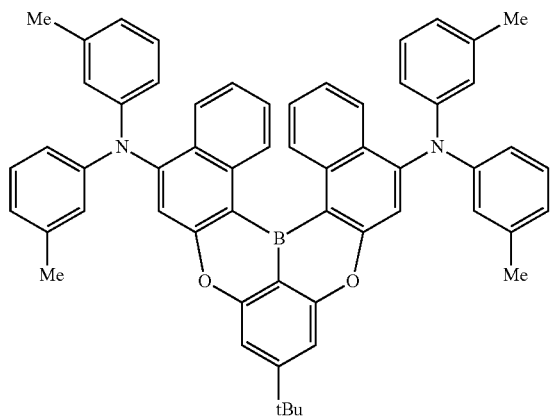
(1A-193)
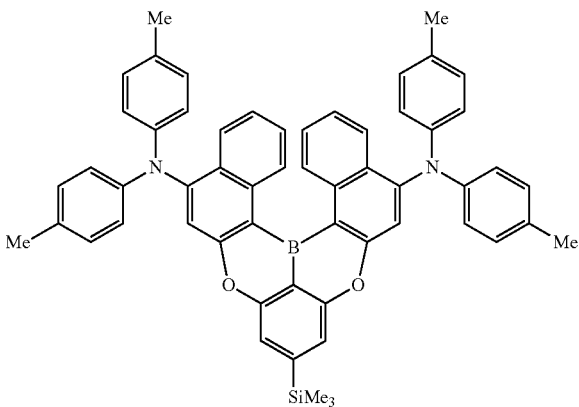
(1A-191)
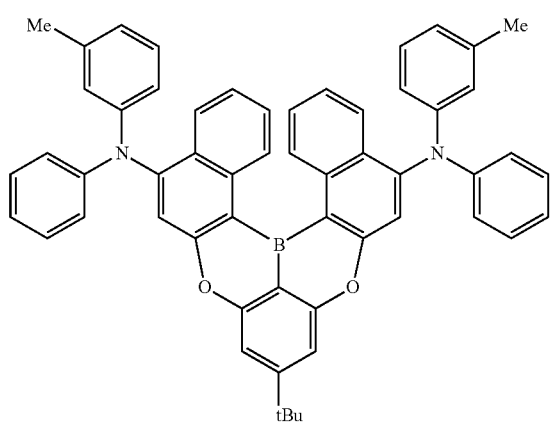
(1A-194)
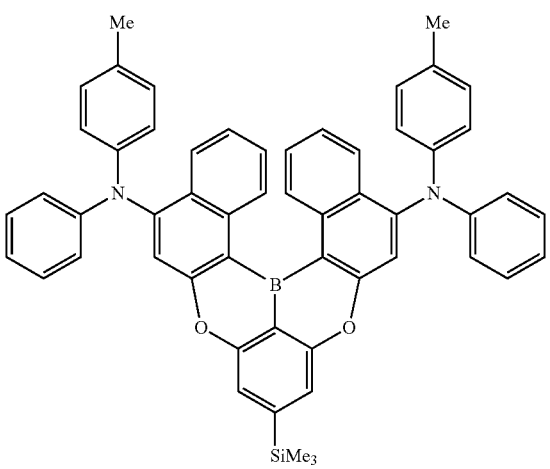
(1A-192)
(1A-195)

(1A-196)
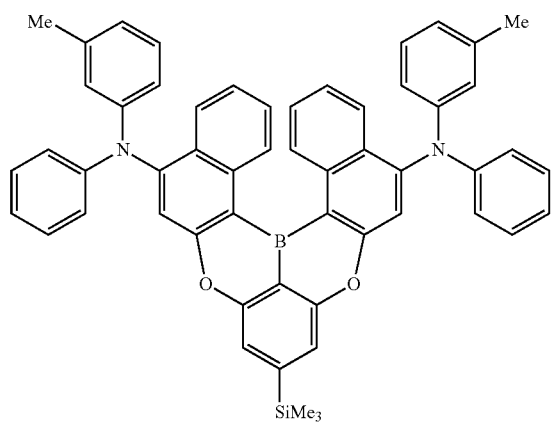
(1A-201)
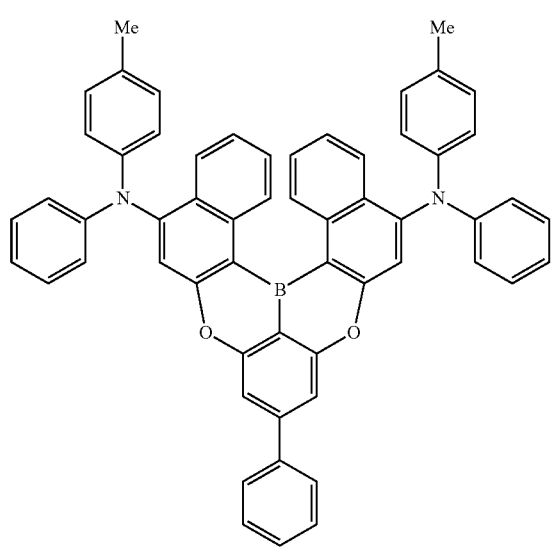
(1A-202)
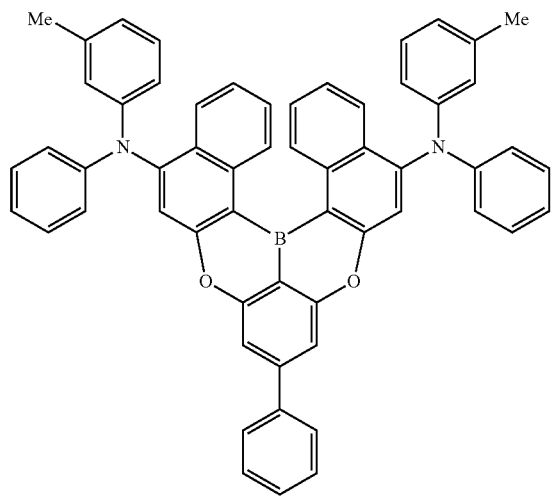
(1A-203)
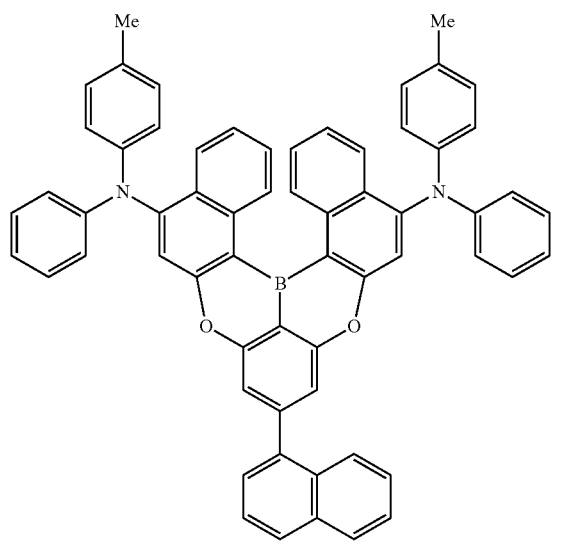
(1A-204)
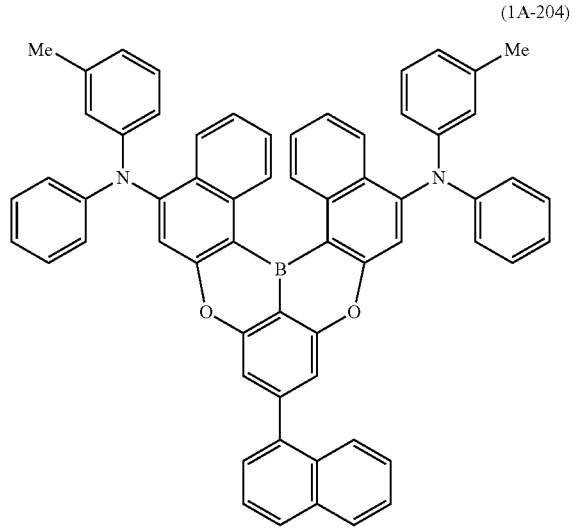
(1A-205)
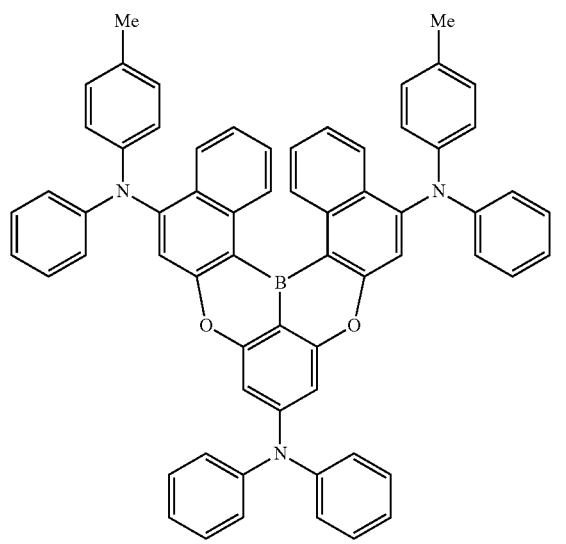

(1A-206)
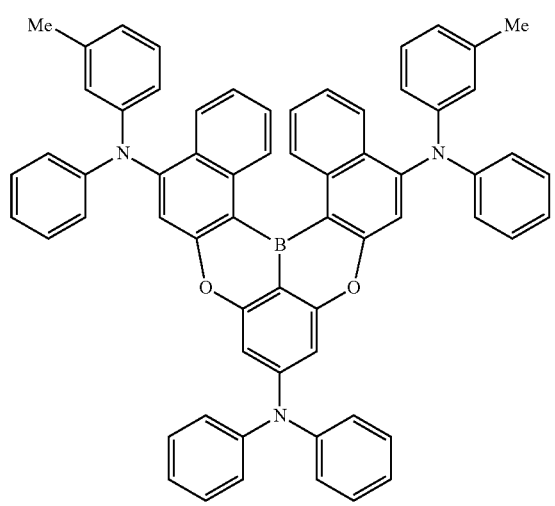
(1A-211)
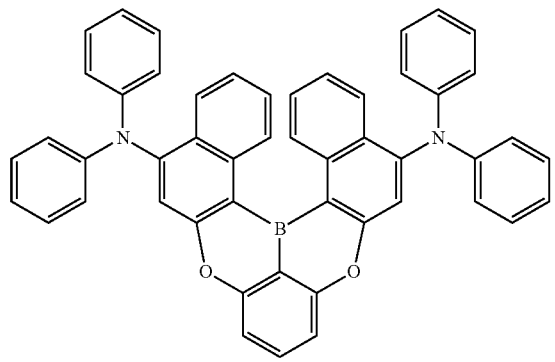
(1A-212)
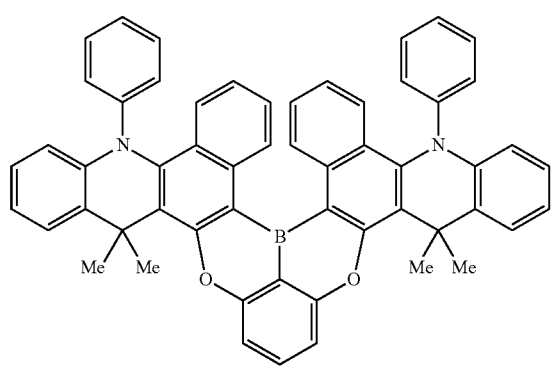
(1A-213)
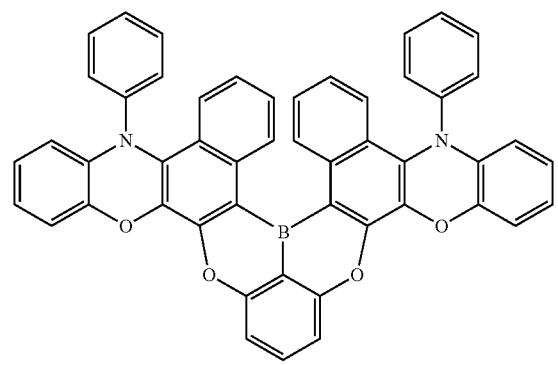
(1A-214)
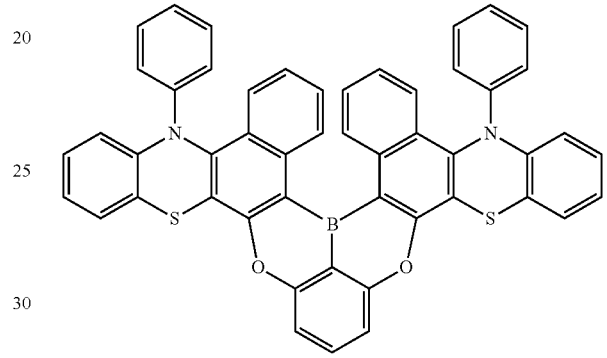
(1A-215)
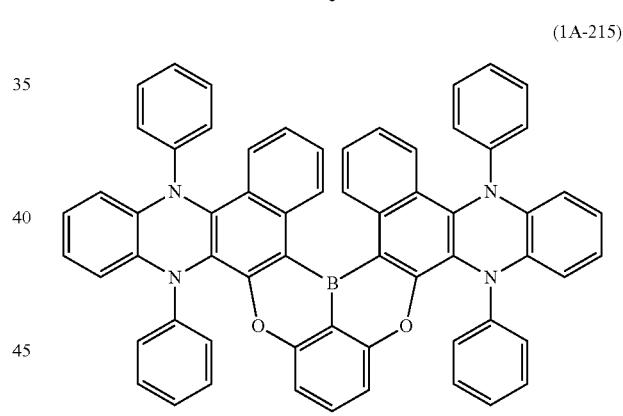
(1A-216)
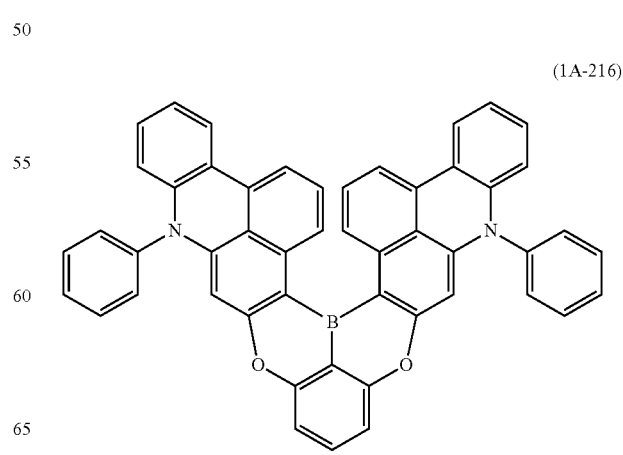

-continued
(1A-221)
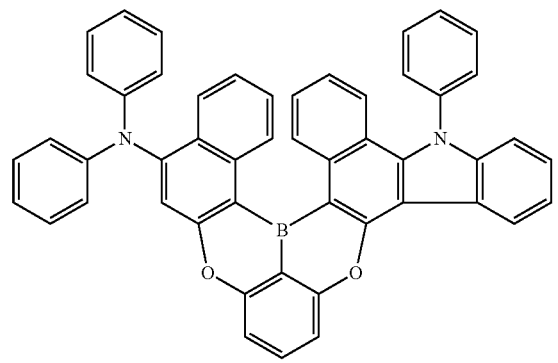
(1A-222)
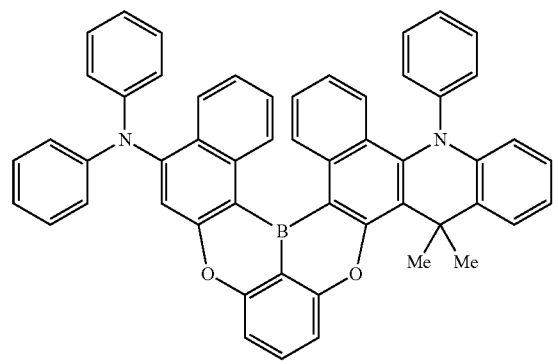
(1A-223)
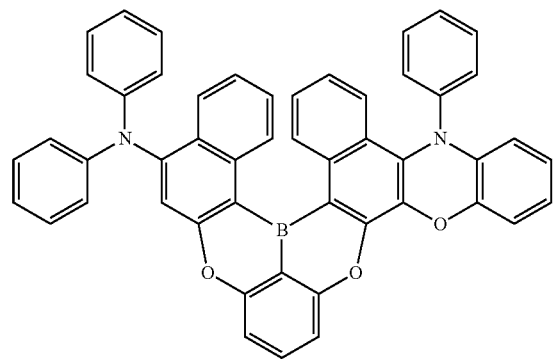
(1A-224)
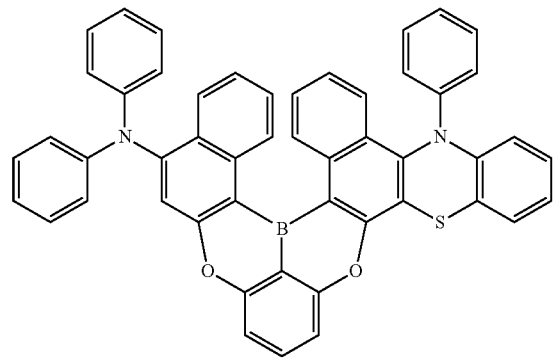
(1A-225)
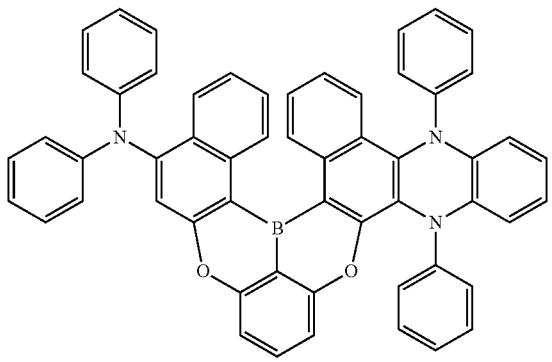
(1A-226)
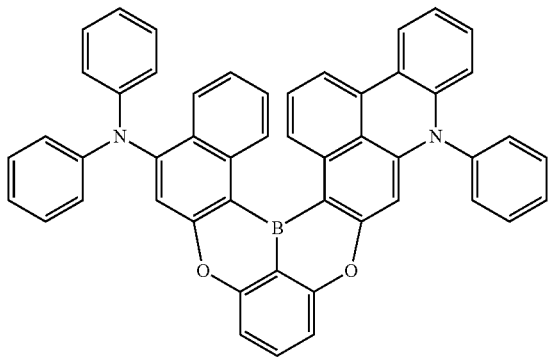
(1A-231)
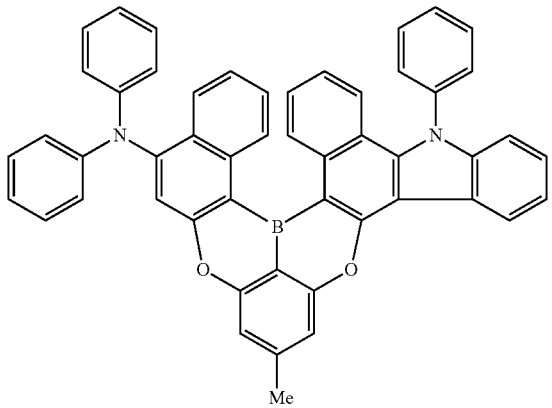
(1A-232)
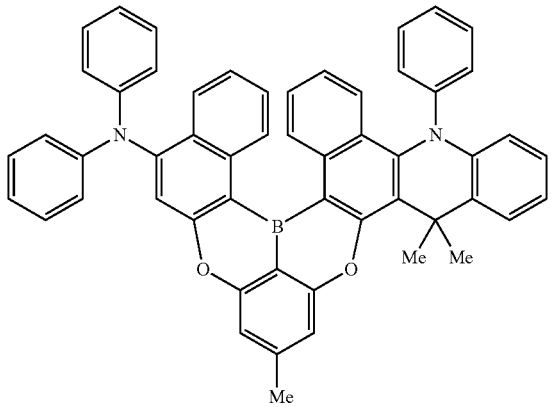

(1A-233)
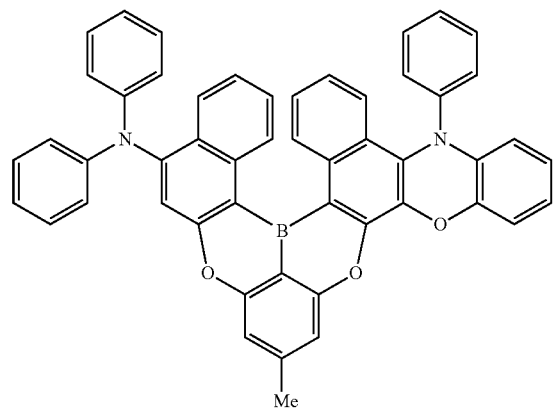
(1A-236)
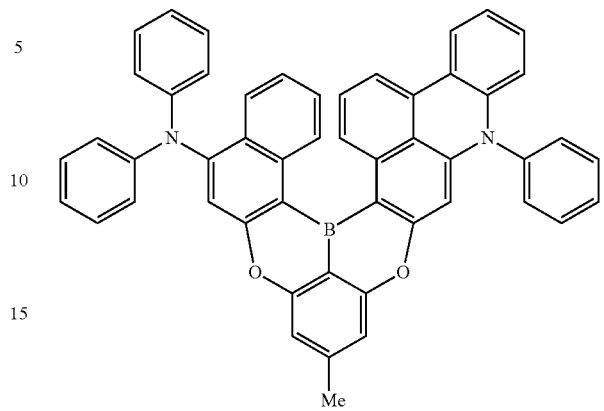
(1A-234)
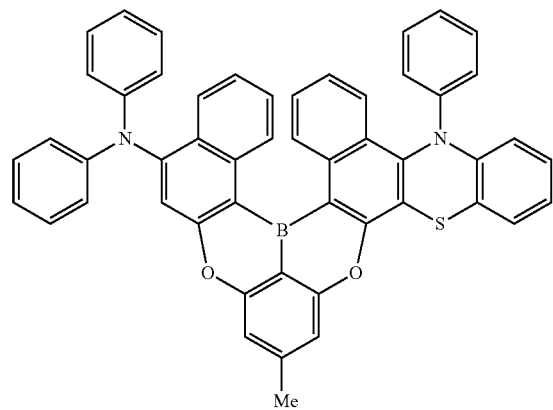
(1A-241)
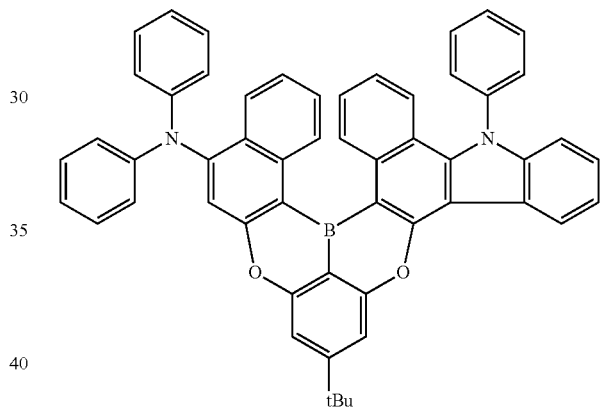
(1A-235)
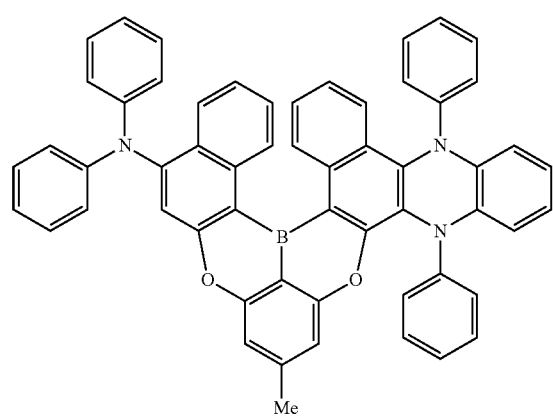
(1A-242)
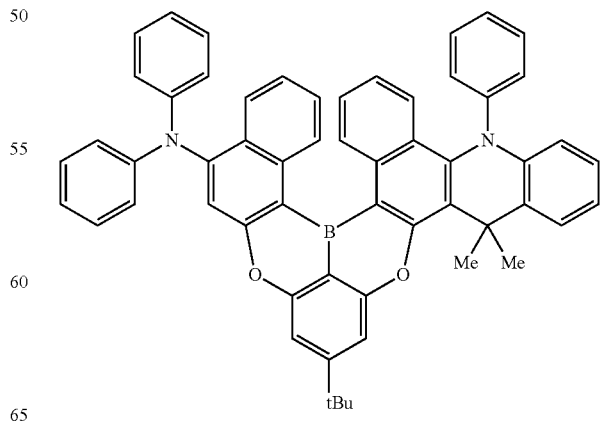

(1A-243)
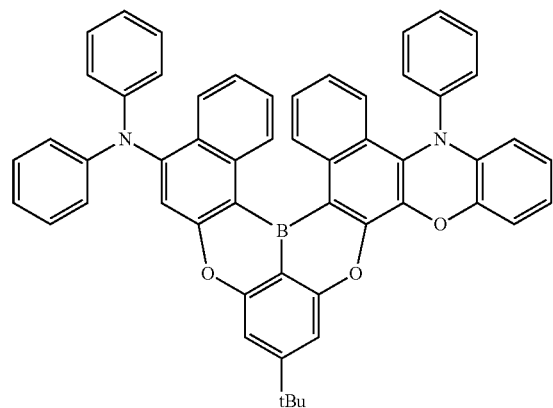
(1A-246)
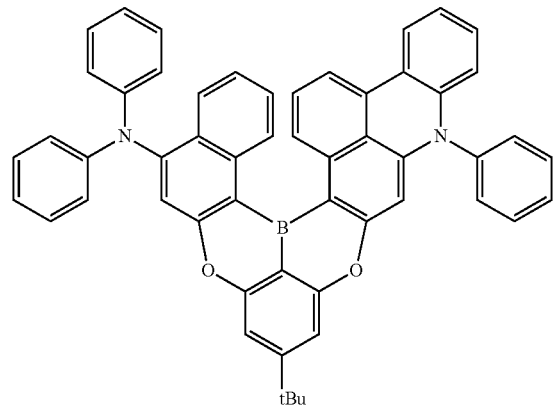
(1A-244)
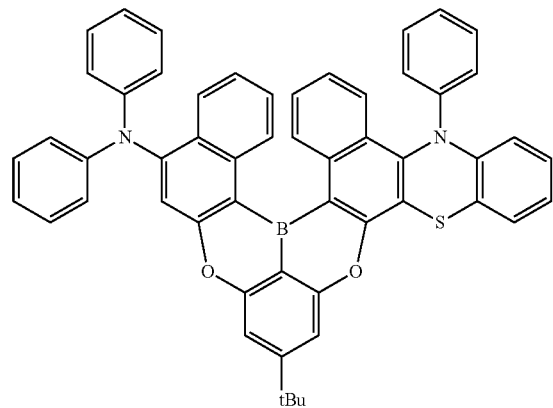
(1A-251)
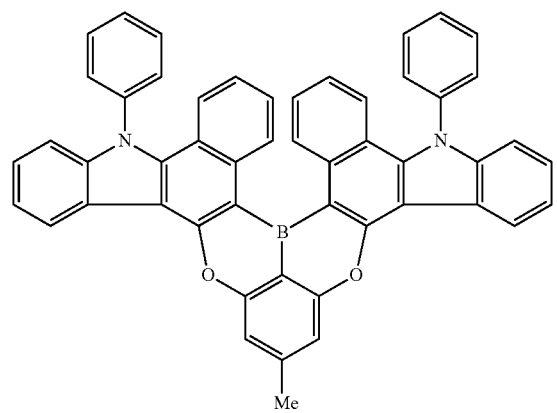
(1A-245)
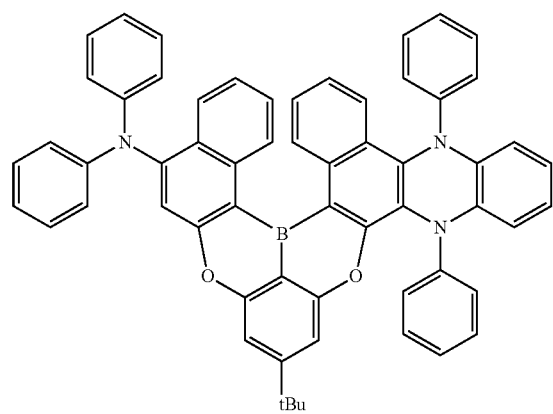
(1A-252)
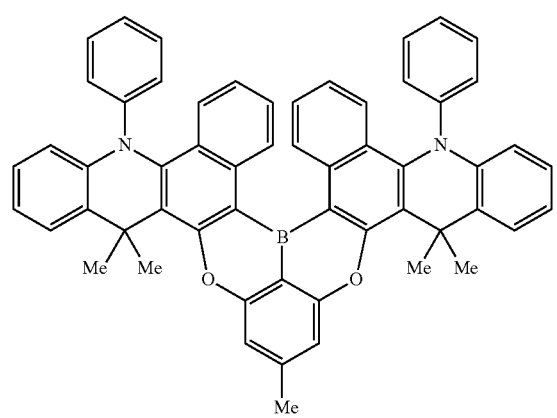

(1A-253)
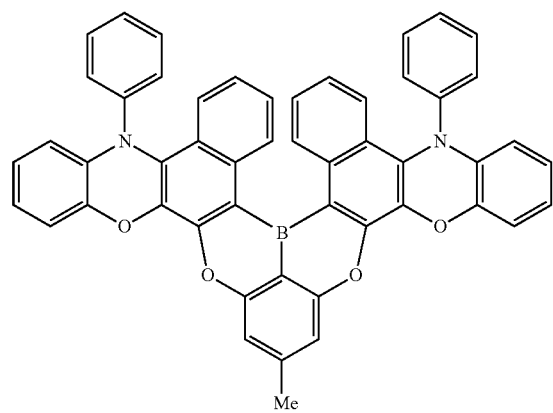
(1A-256)
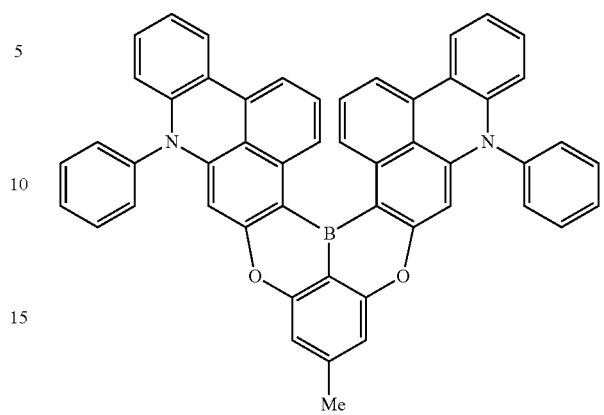
(1A-254)
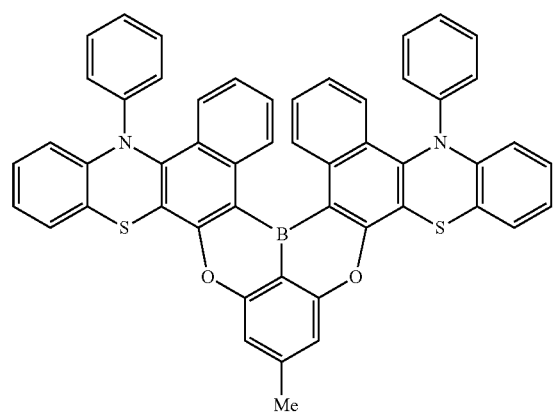
(1A-261)
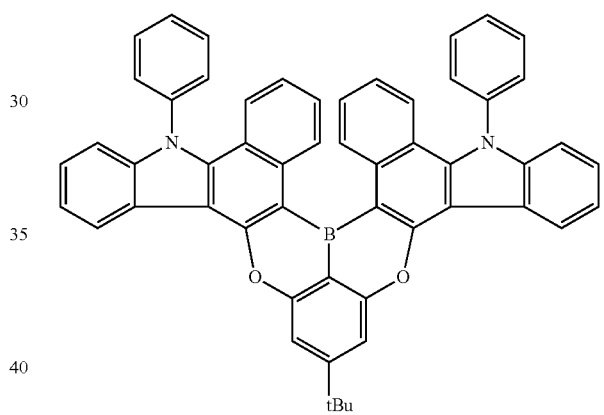
(1A-255)
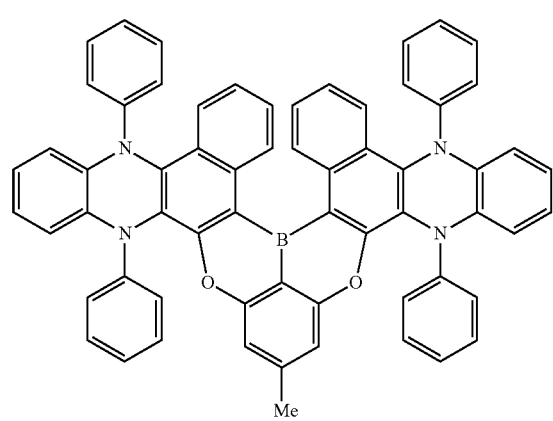
(1A-262)
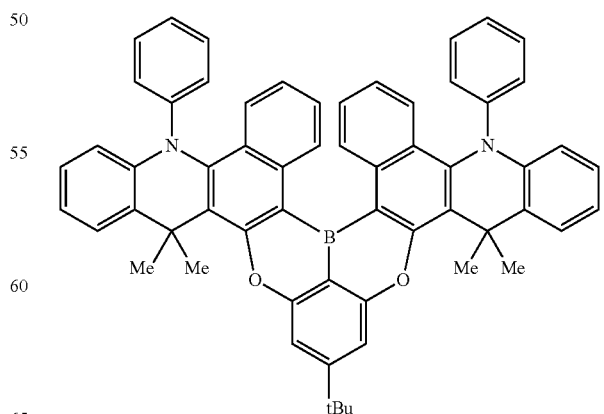

(1A-263)
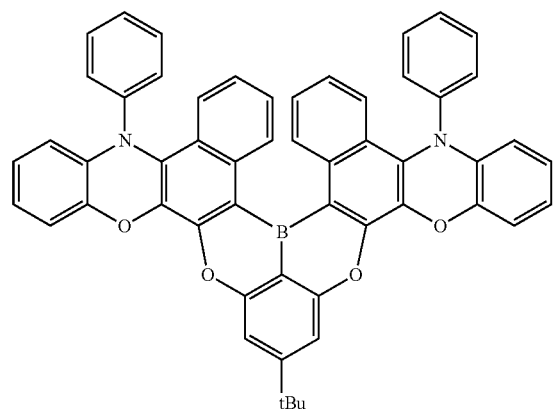
(1A-266)
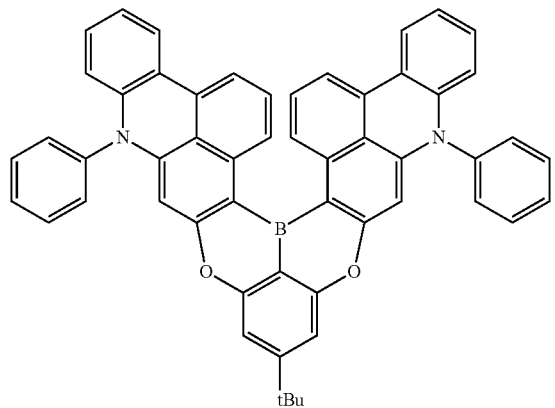
(1A-264)
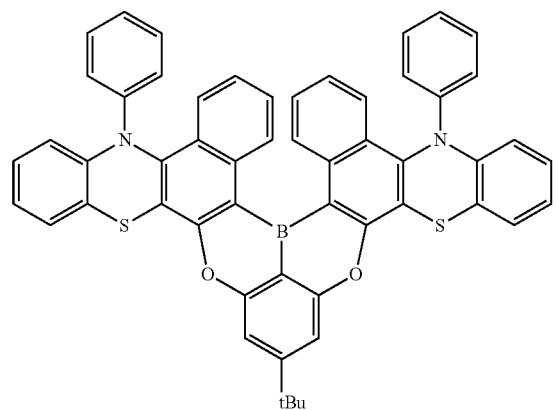
(1A-271)
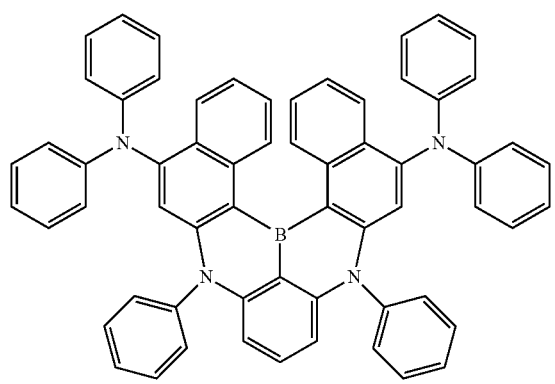
(1A-265)
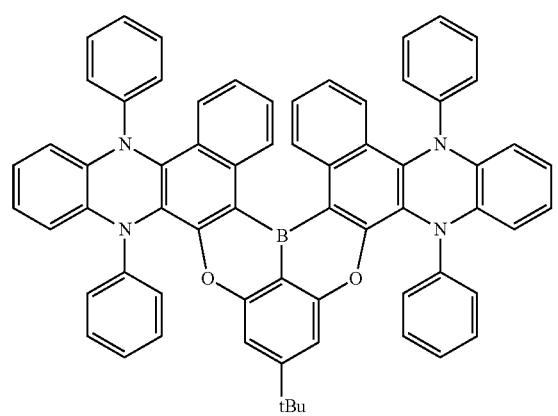
(1A-272)
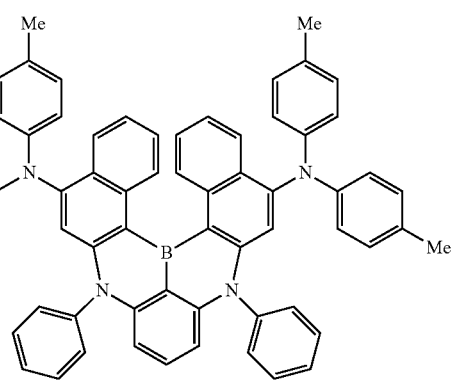

(1A-273)
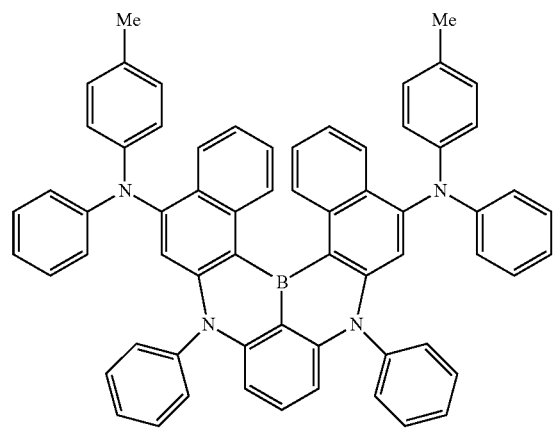
(1A-276)
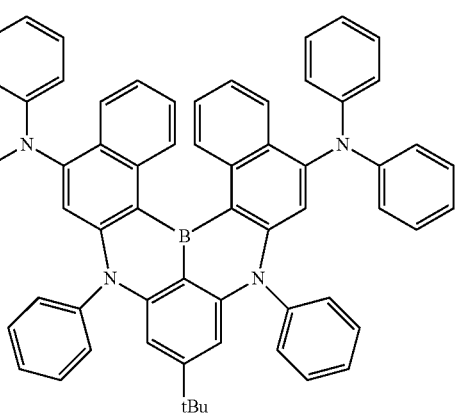
(1A-274)
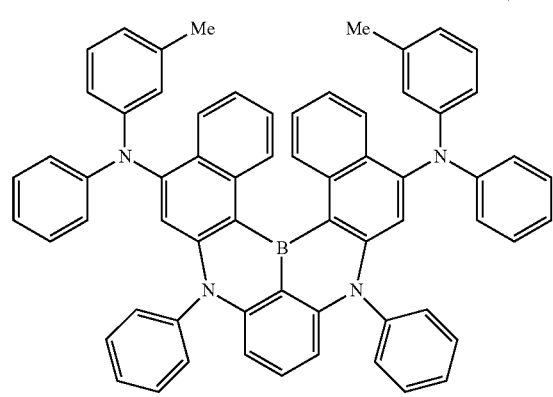
(1A-281)
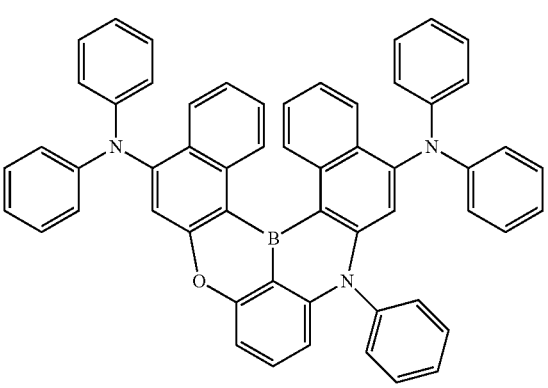
(1A-275)
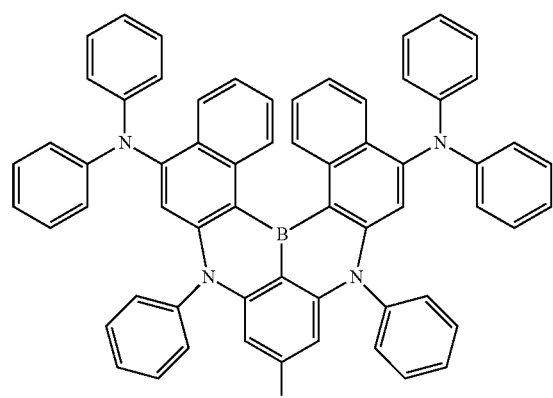
(1A-282)
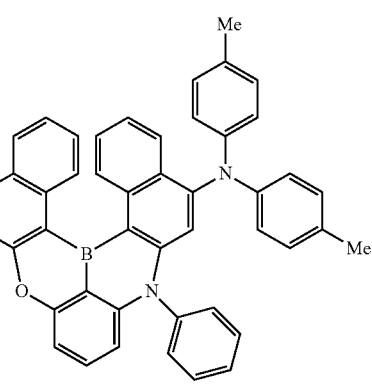

(1A-283)
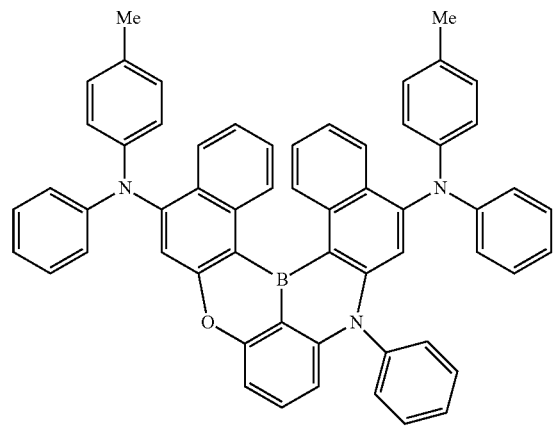
(1A-284)
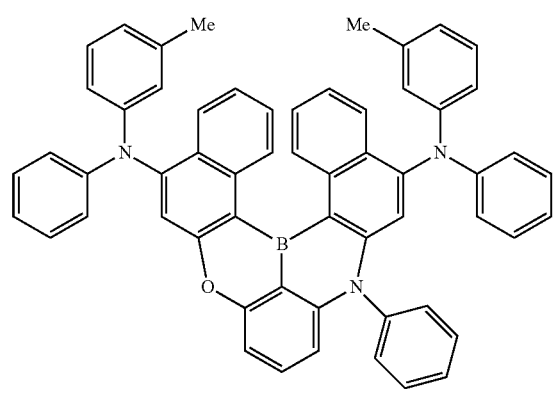
(1A-285)
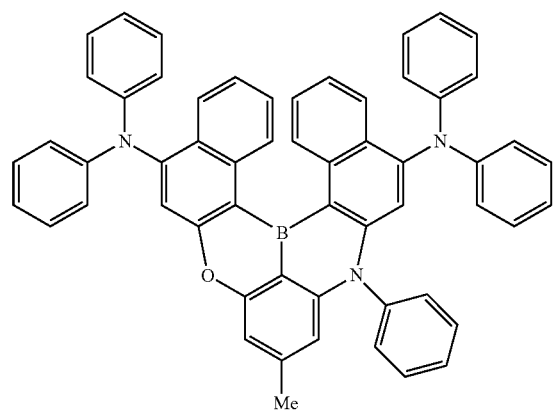
(1A-286)
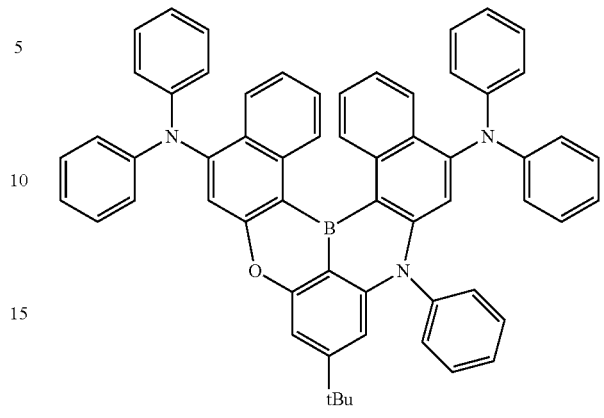
(1B-1)
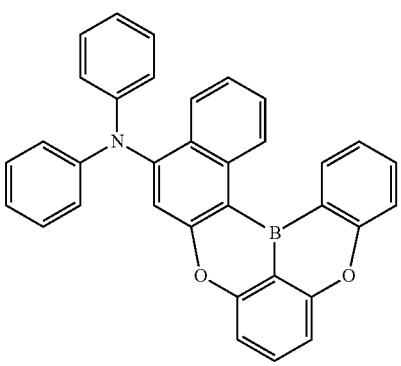
(1B-2)
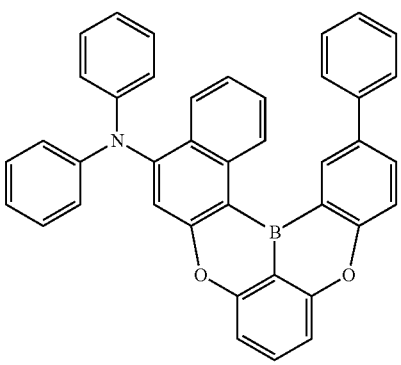
(1B-3)
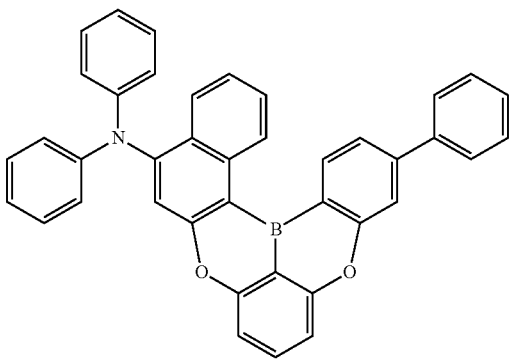

(1B-4)
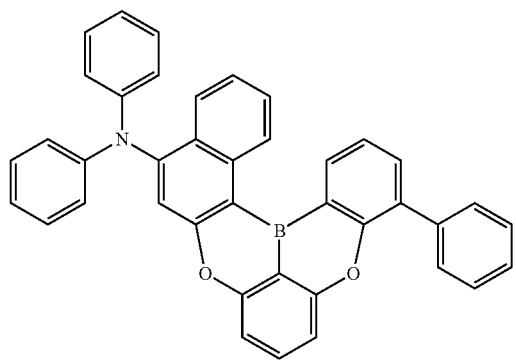
(1B-5)
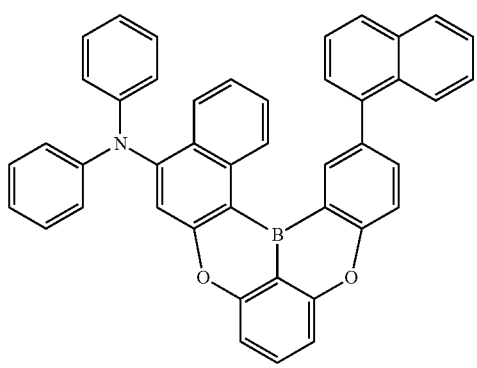
(1B-6)
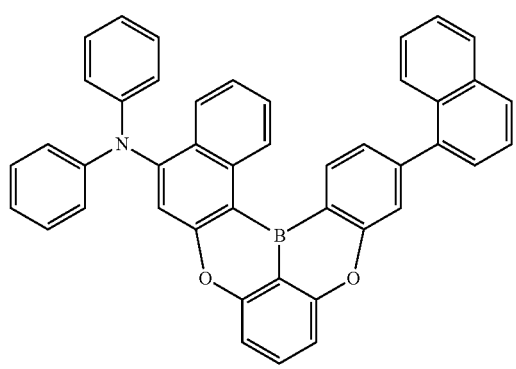
(1B-11)
(1B-12)
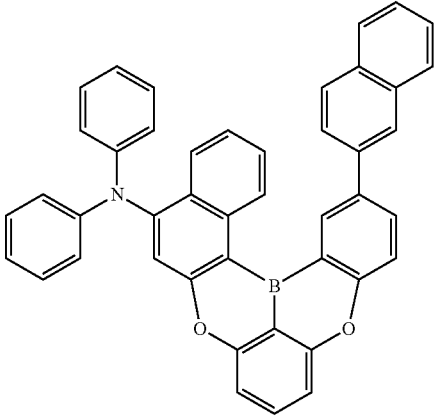
(1B-13)
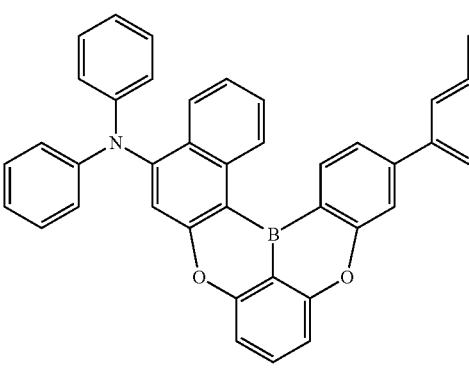
(1B-14)
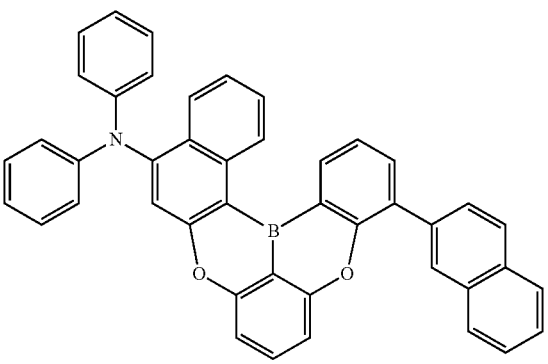
(1B-15)
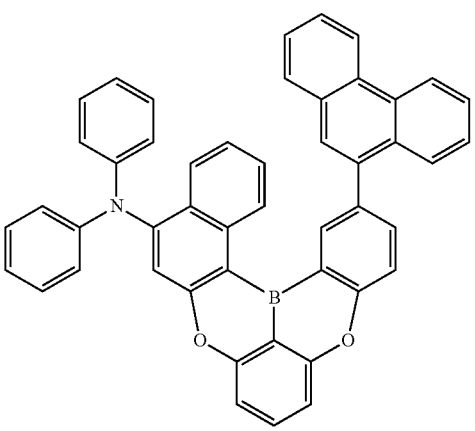

-continued
(1B-16)
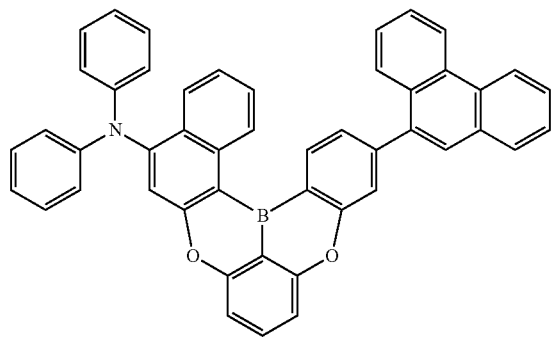
(1B-24)
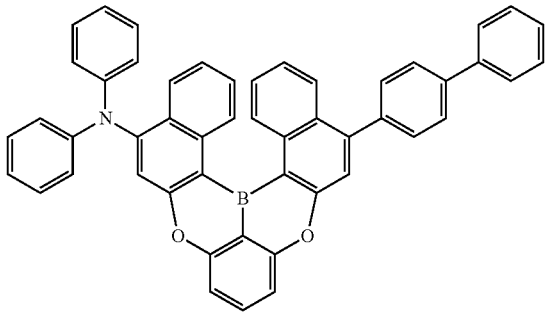
(1B-21)
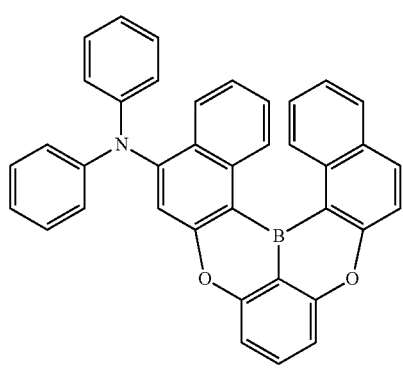
(1B-25)
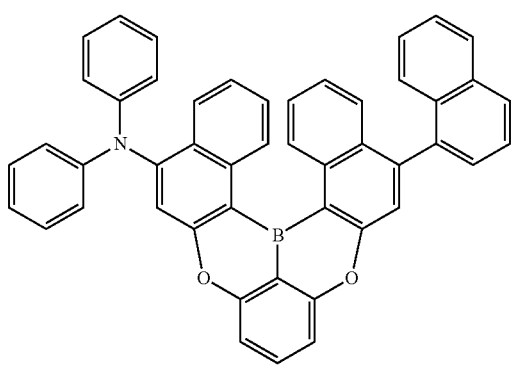
(1B-22)
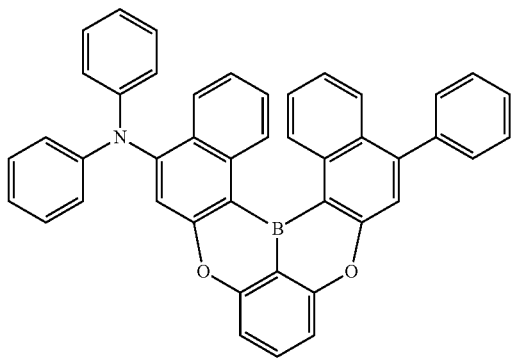
(1B-26)
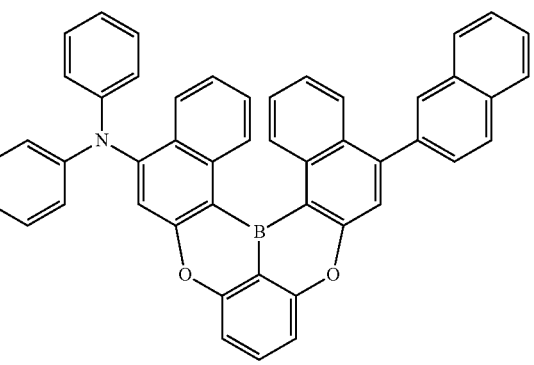
(1B-23)
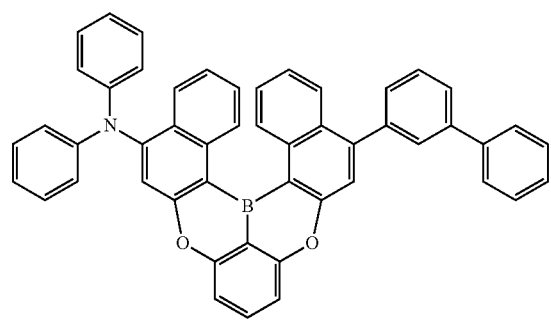
(1B-31)
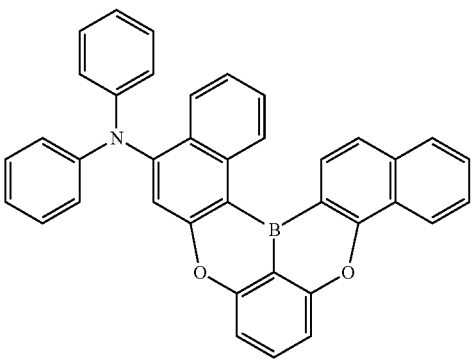

(1B-32)
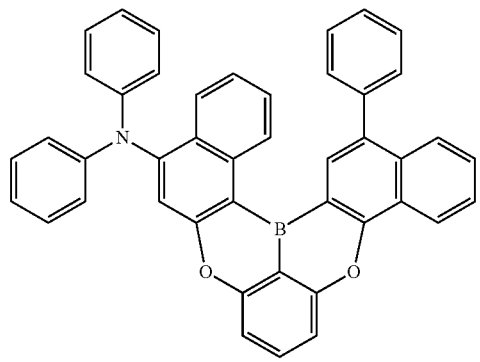
(1B-33)
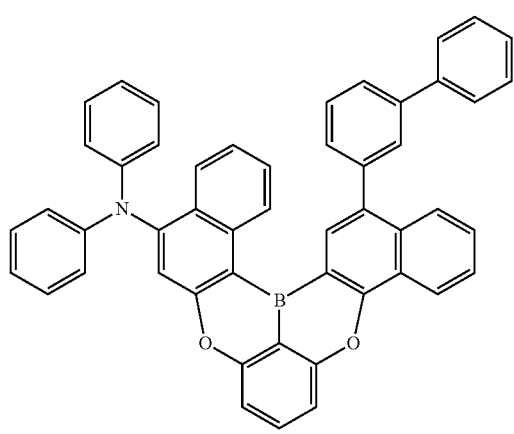
(1B-34)
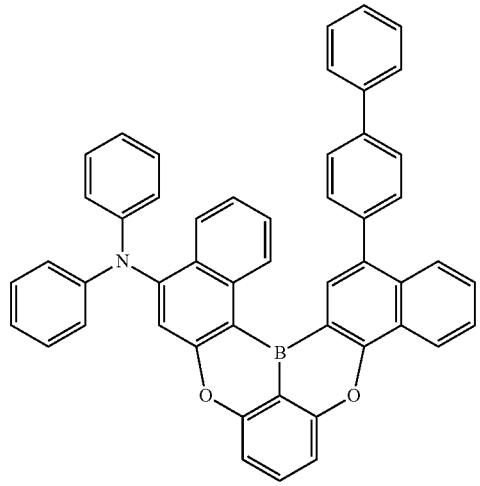
(1B-35)
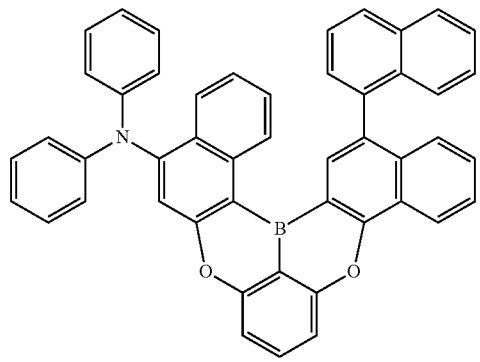
(1B-36)
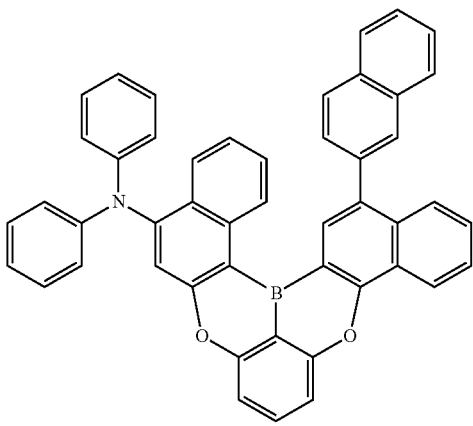
(1B-41)
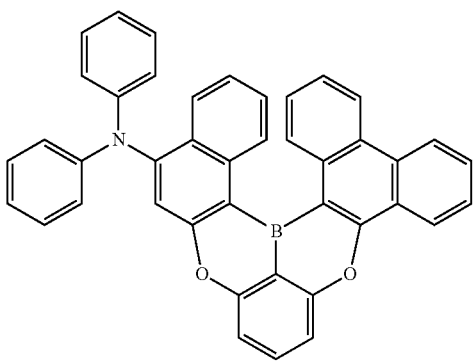
(1B-42)
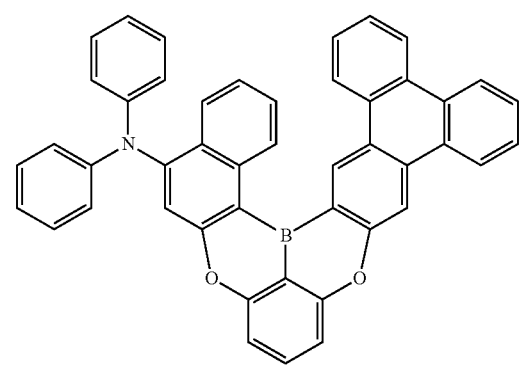
(1B-43)
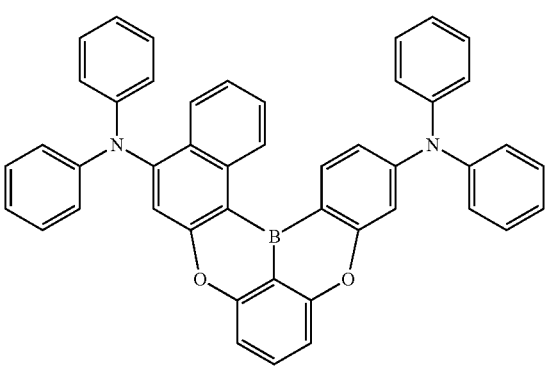

-continued
(1B-44)
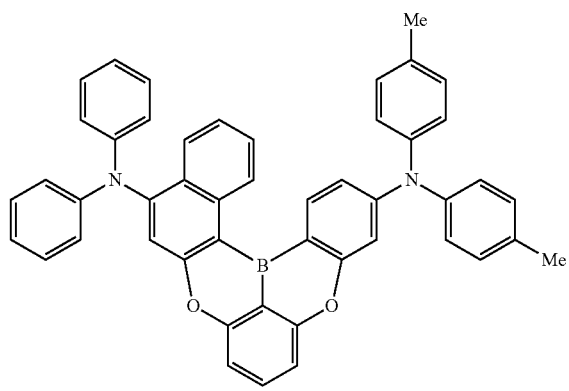
(1B-51)
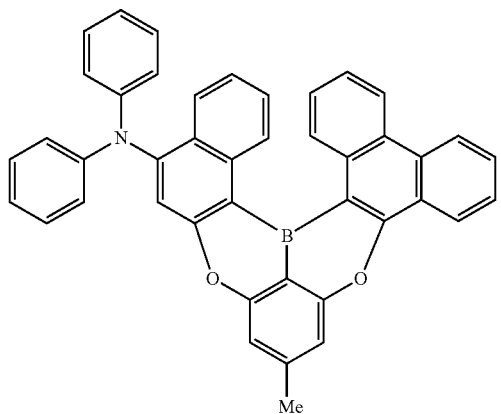
(1B-45)
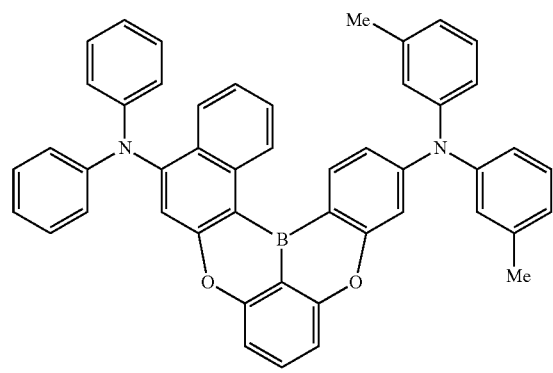
(1B-52)
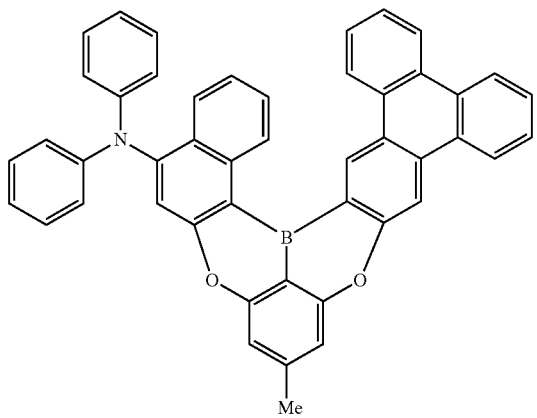
(1B-46)
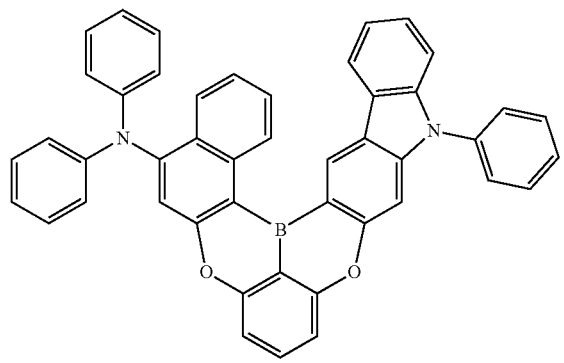
(1B-53)
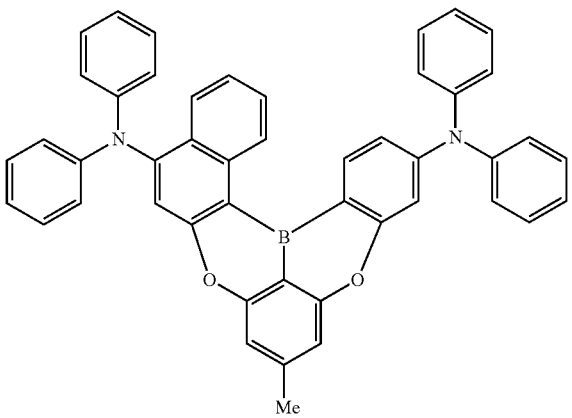

(1B-54)
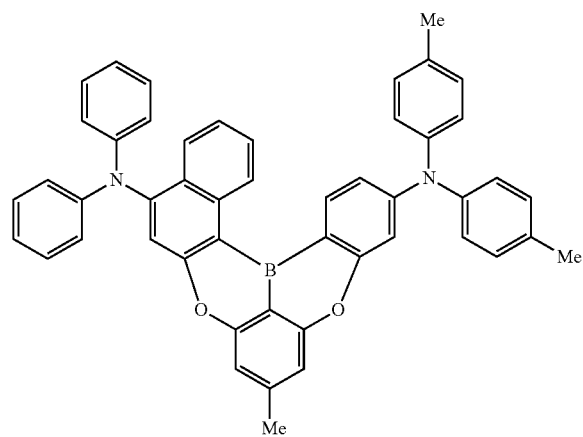
(1B-61)
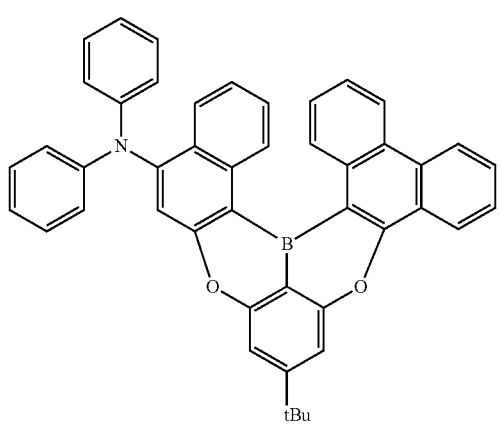
(1B-55)
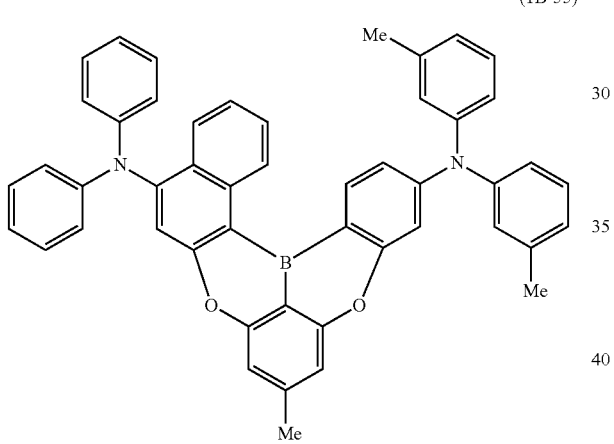
(1B-62)
(1B-56)
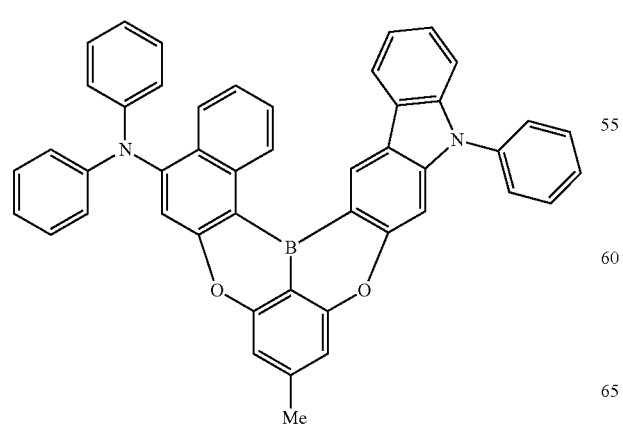
(1B-63)
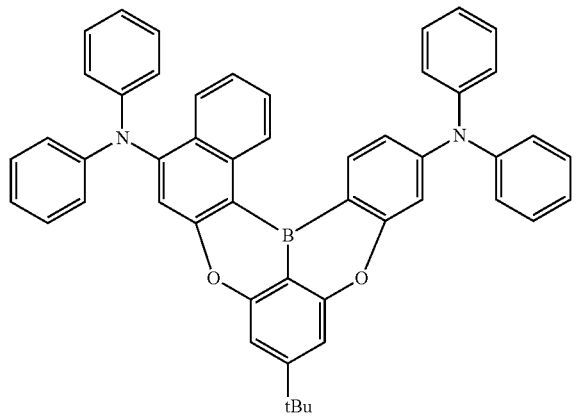

-continued
(1B-64)
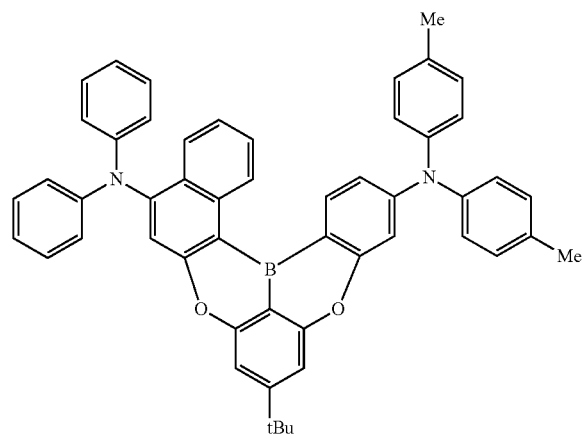
(1B-71)
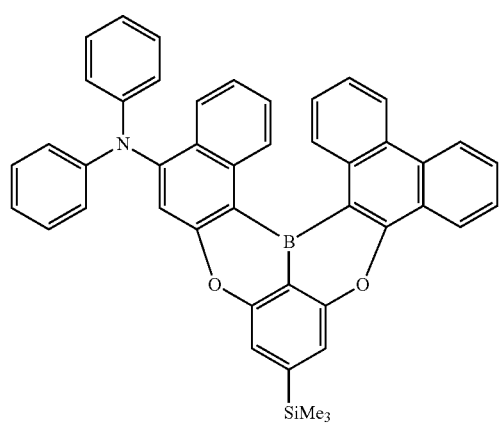
(1B-65)
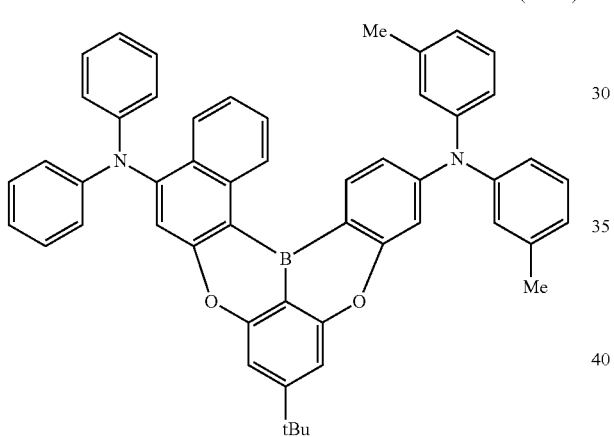
(1B-72)
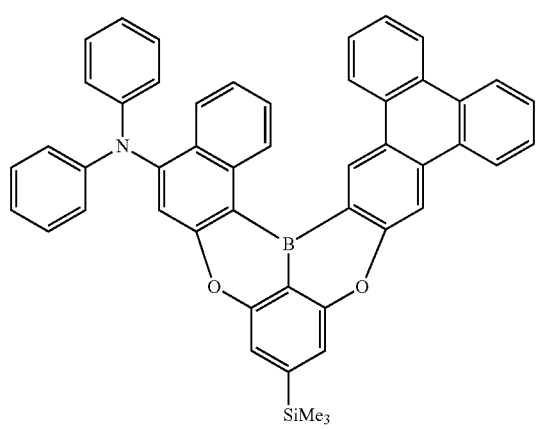
(1B-66)
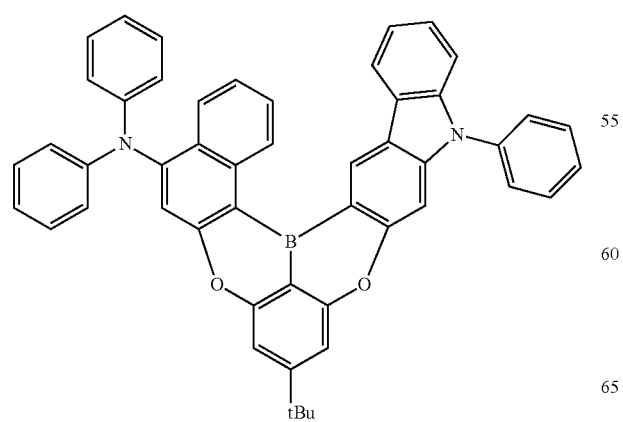
(1B-73)
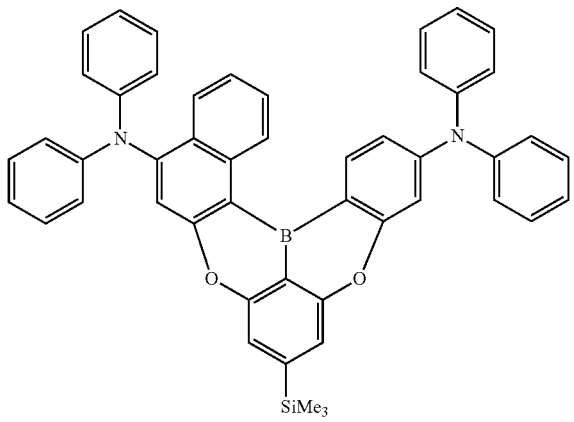

(1B-74)
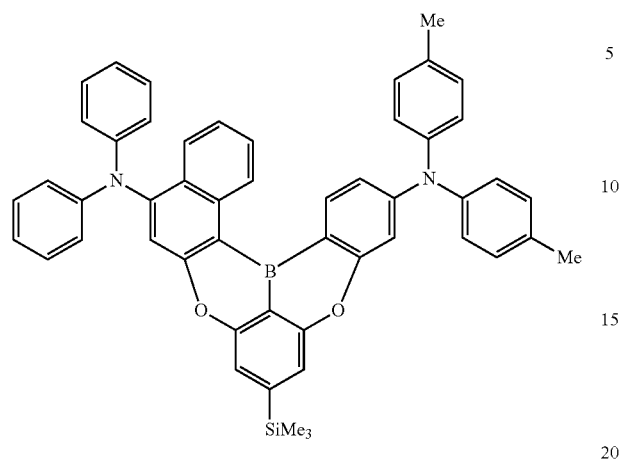
(1B-81)
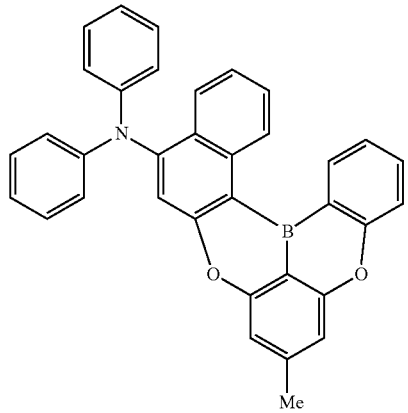
(1B-75)
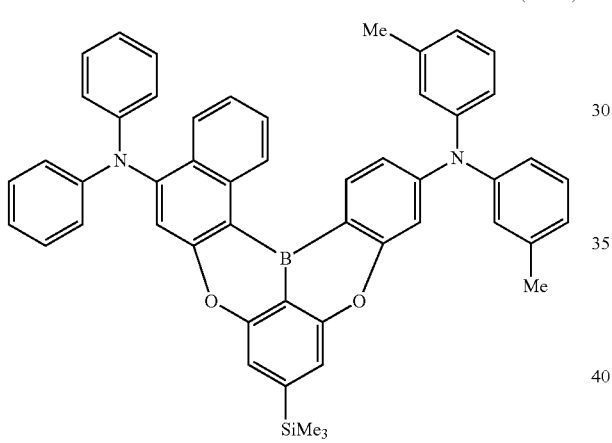
(1B-82)
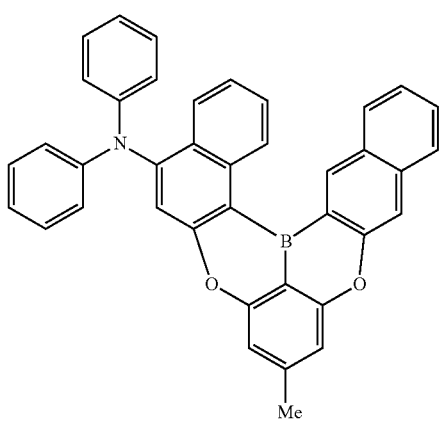
(1B-76)
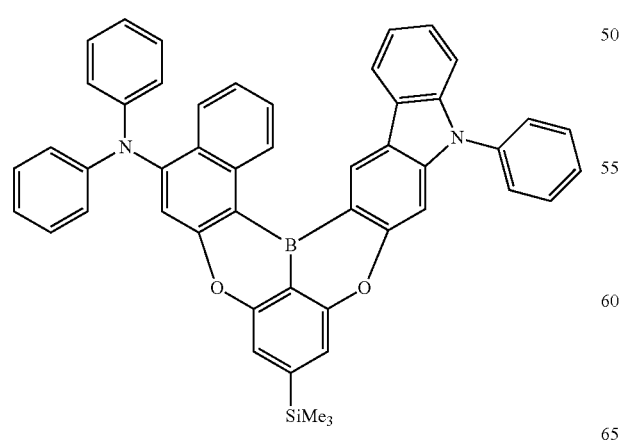
(1B-83)
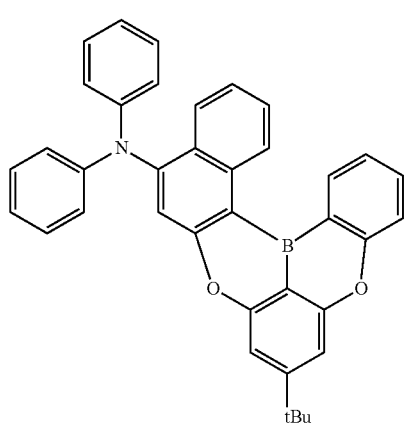

(1B-84)
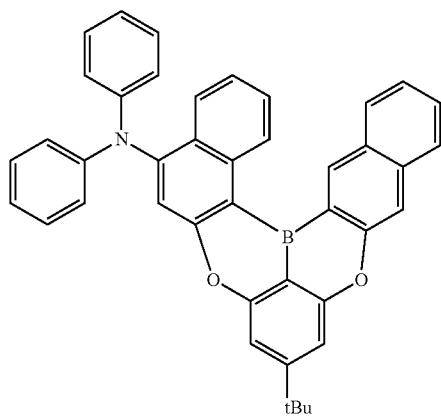
(1B-91)
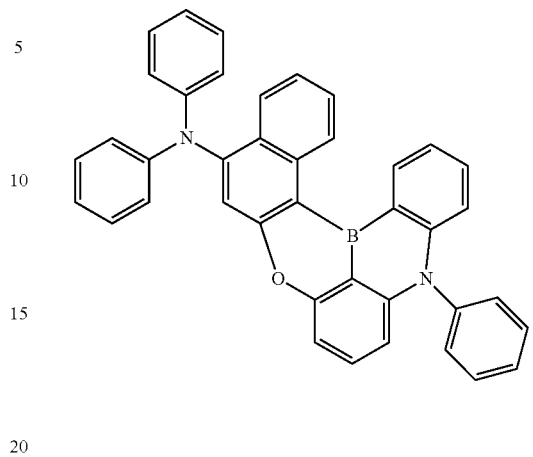
(1B-85)
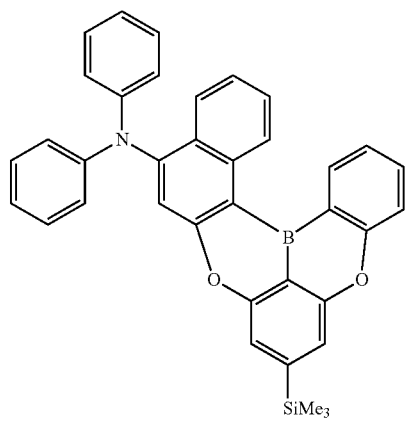
(1B-92)
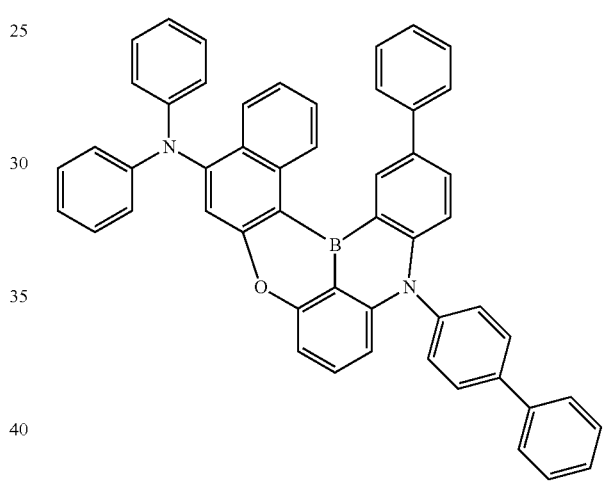
(1B-86)
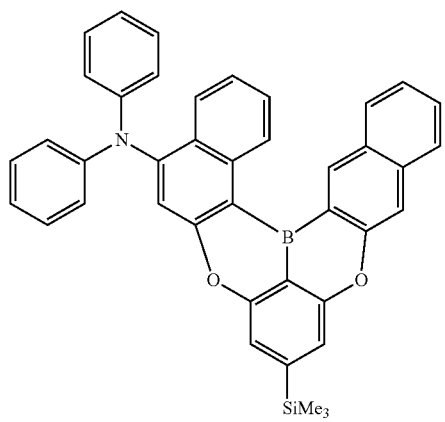
(1B-93)
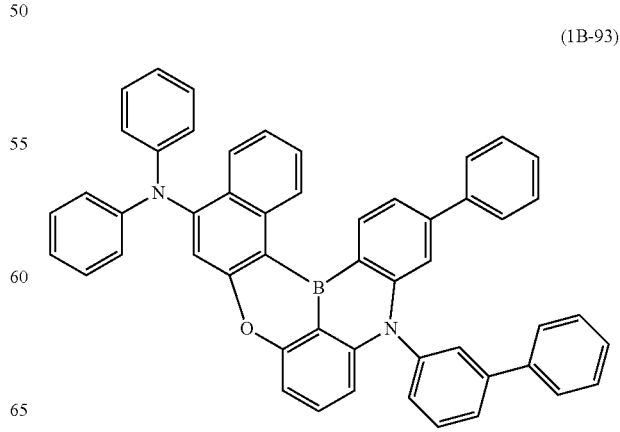

(1B-94)
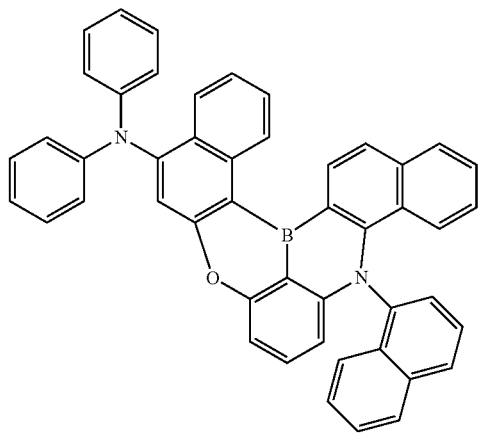
(1B-95)
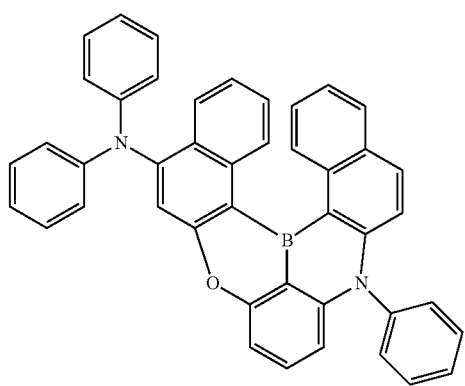
(1B-96)
(1B-101)
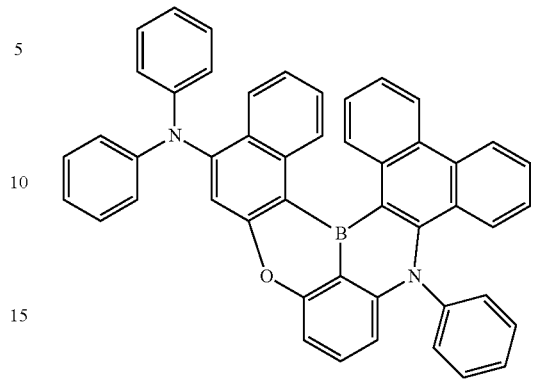
(1B-102)
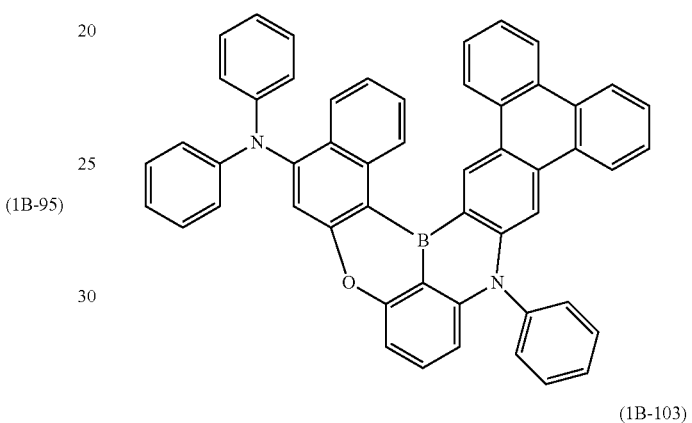
(1B-103)
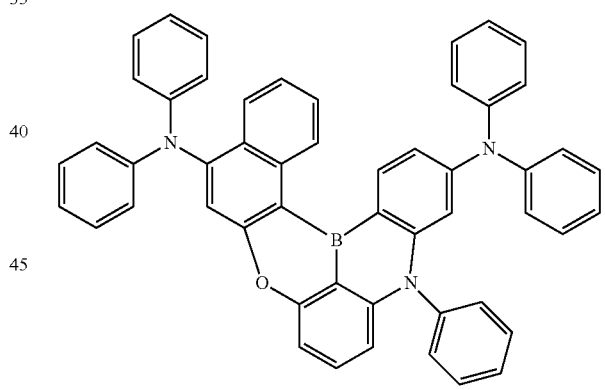
(1B-104)
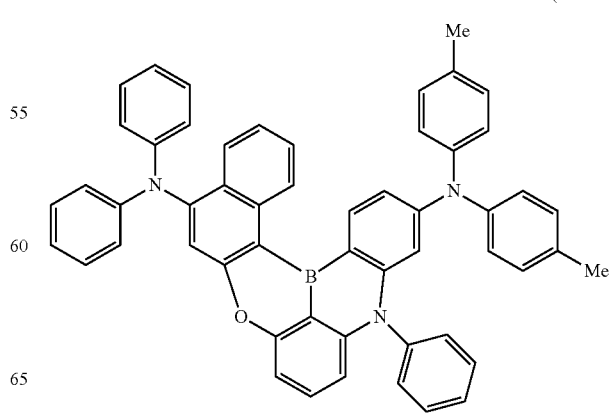

(1B-105)
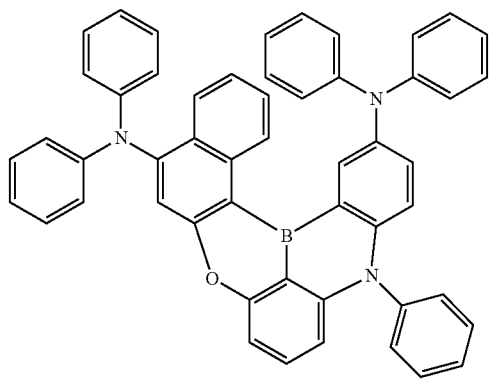
(1B-112)
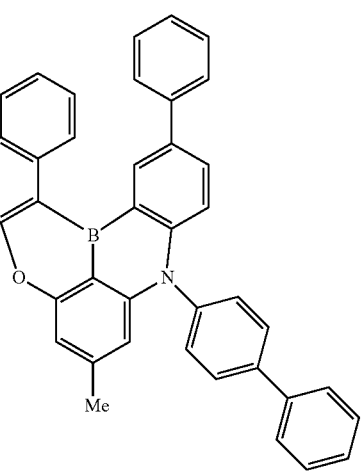
(1B-106)
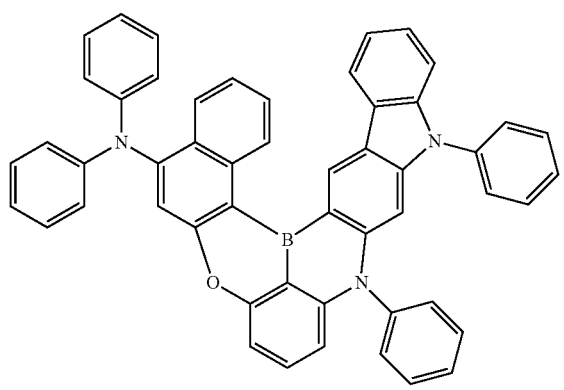
(1B-113)
(1B-111)
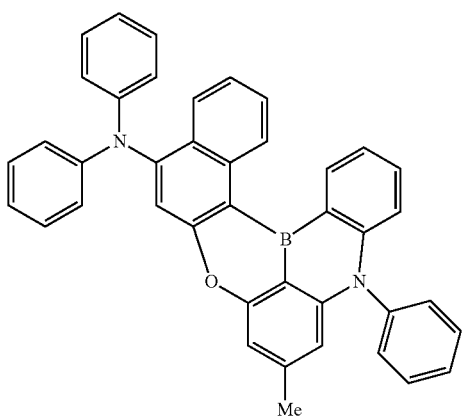
(1B-114)
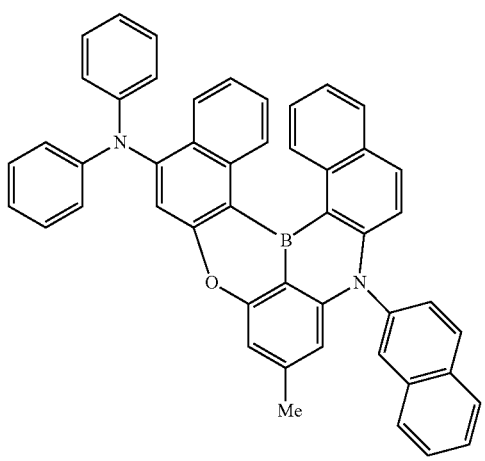

(1B-115)
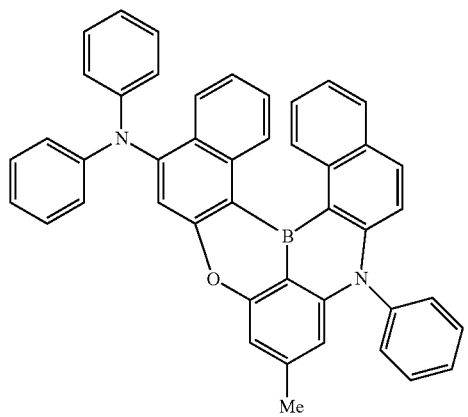
(1B-122)
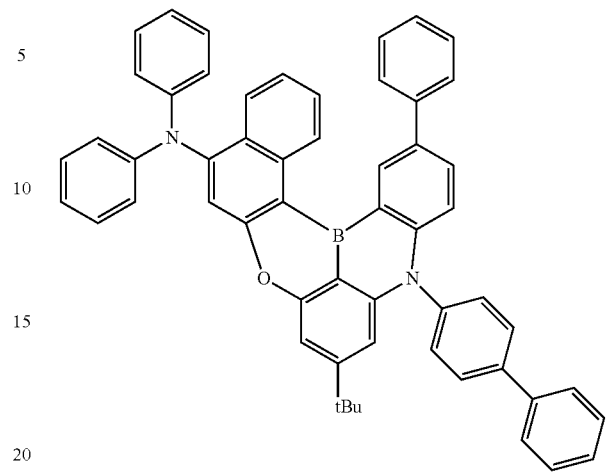
(1B-116)
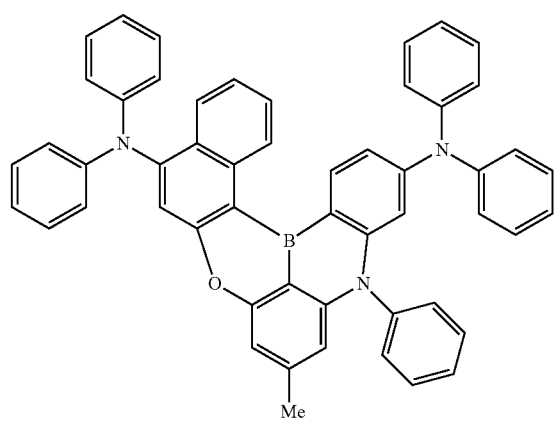
(1B-123)
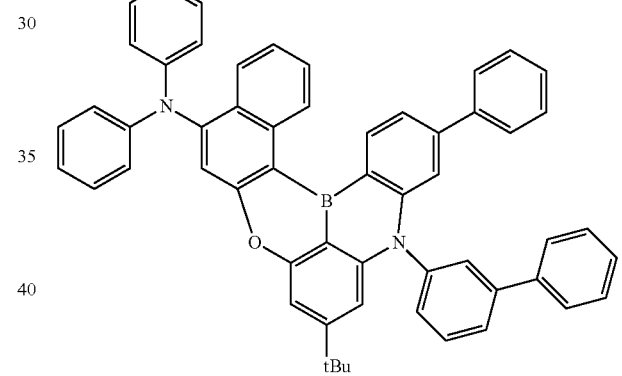
(1B-121)
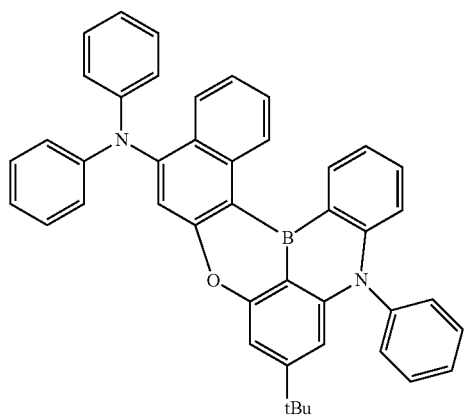
(1B-124)
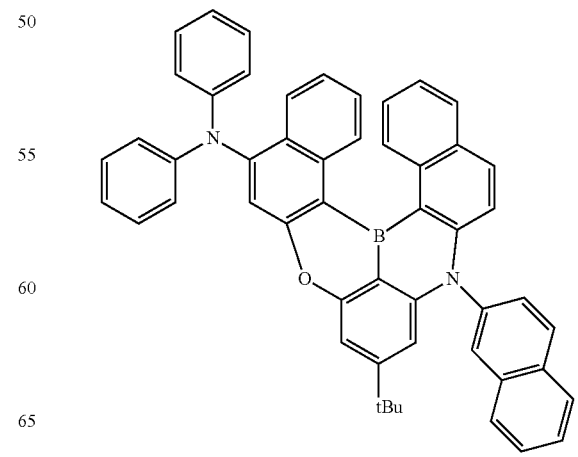

(1B-125)
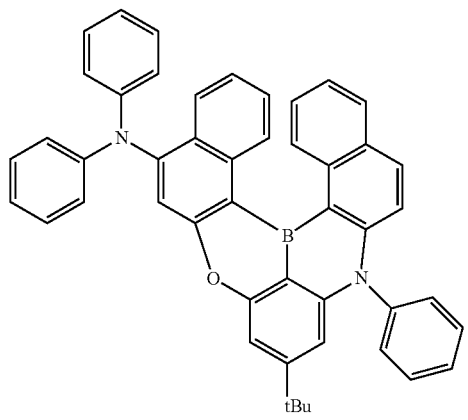
(1B-132)
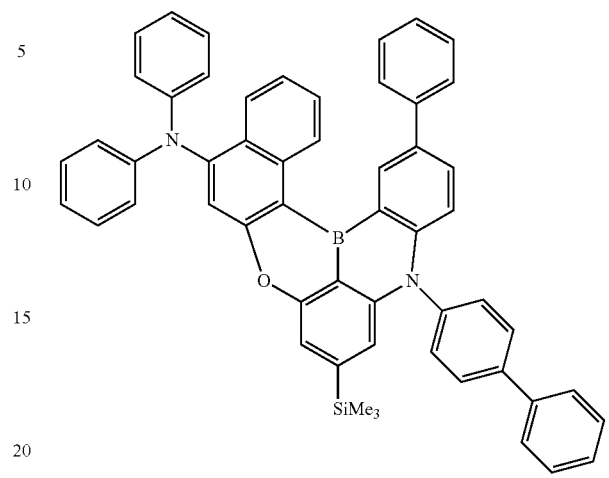
(1B-126)
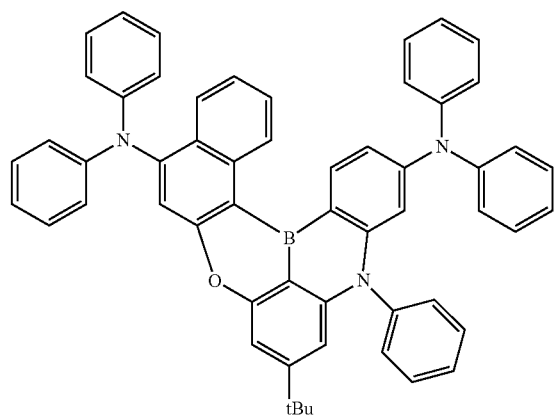
(1B-133)
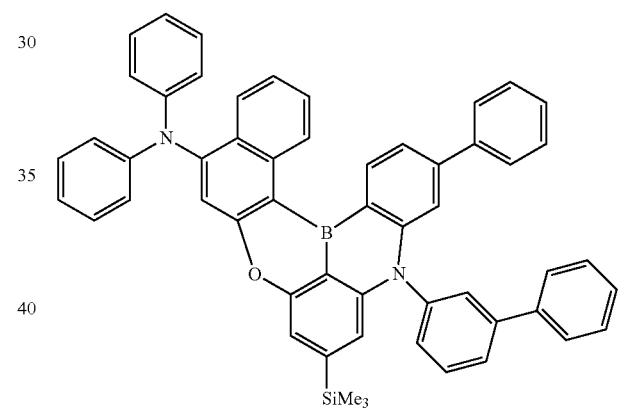
(1B-131)
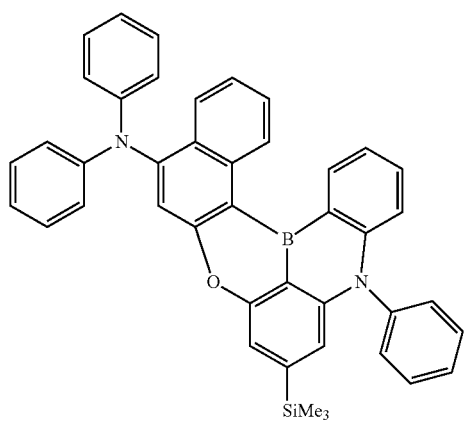
(1B-134)
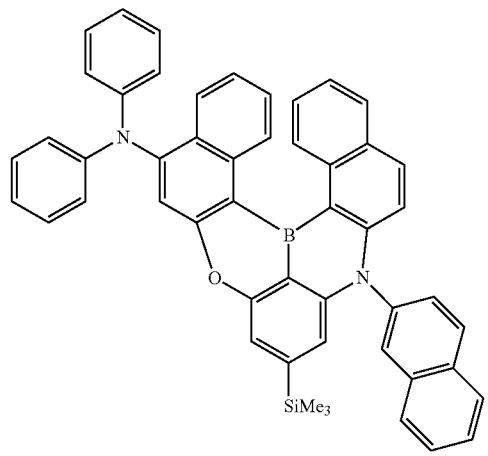

(1B-135)
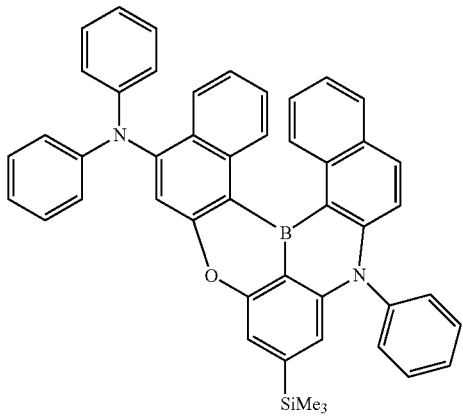
(1B-136)
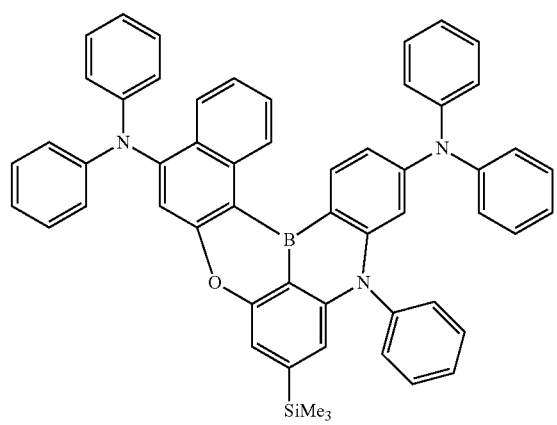
(1B-141)
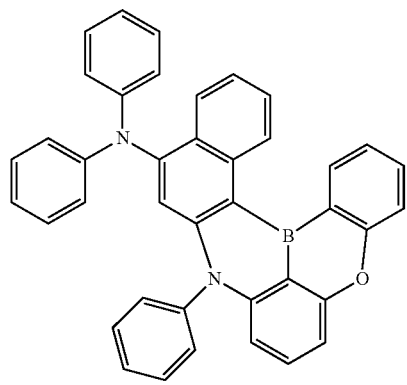
(1B-142)
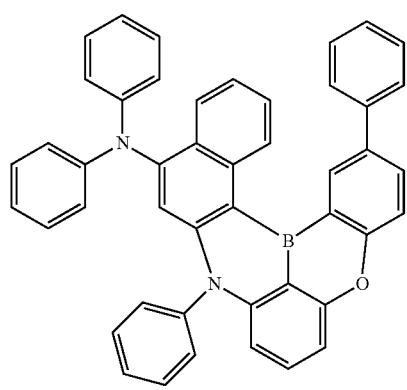
(1B-143)
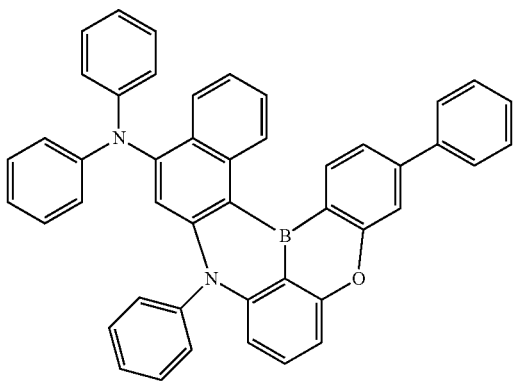
(1B-144)
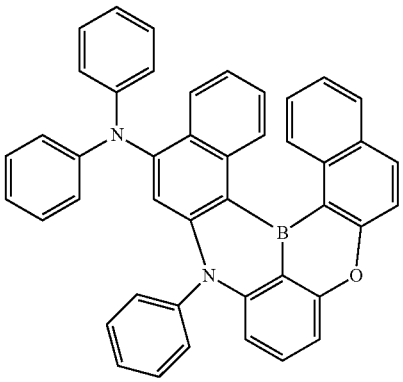
(1B-145)
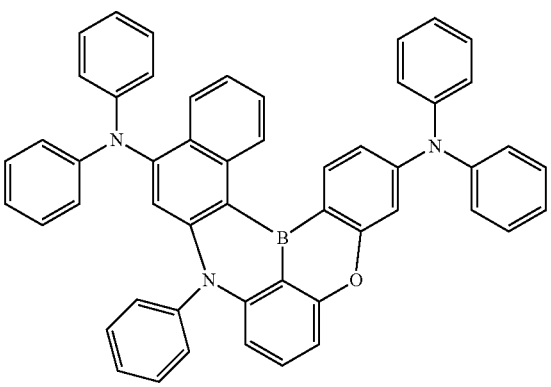
(1B-146)
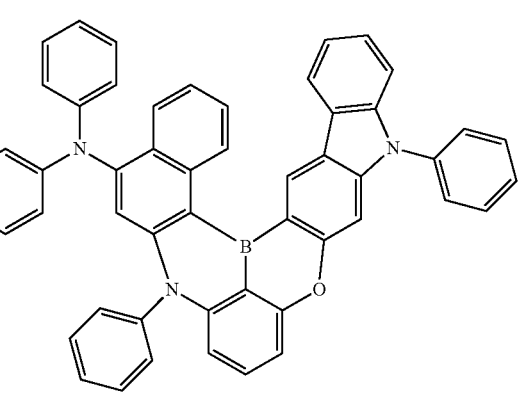

(1B-151)
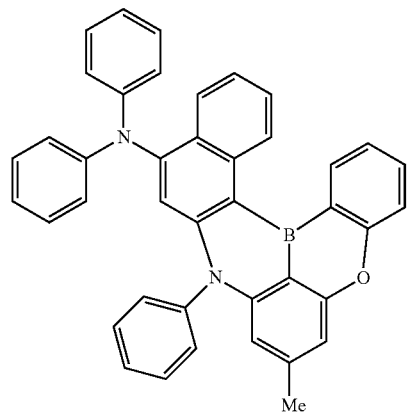
(1B-154)
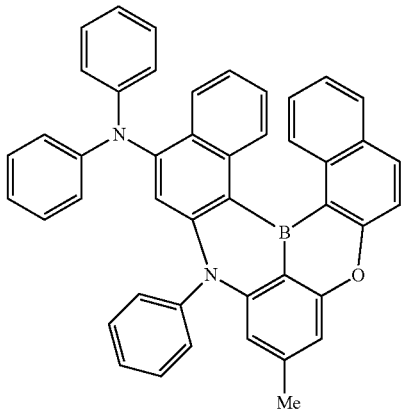
(1B-152)
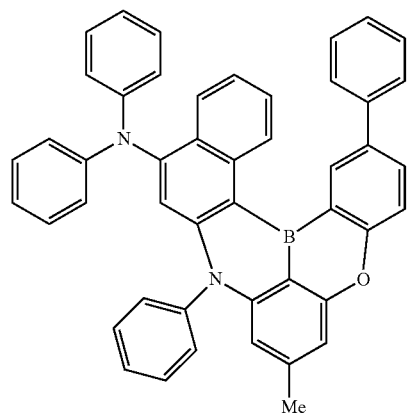
(1B-155)
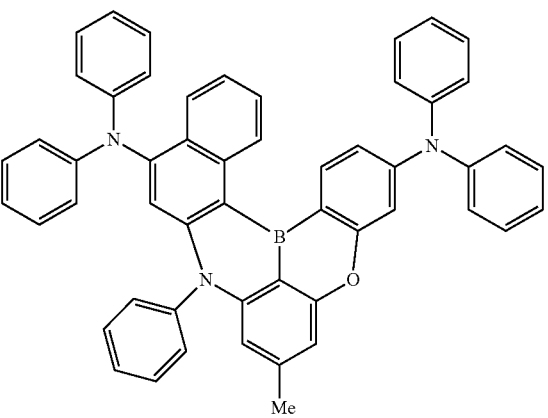
(1B-153)
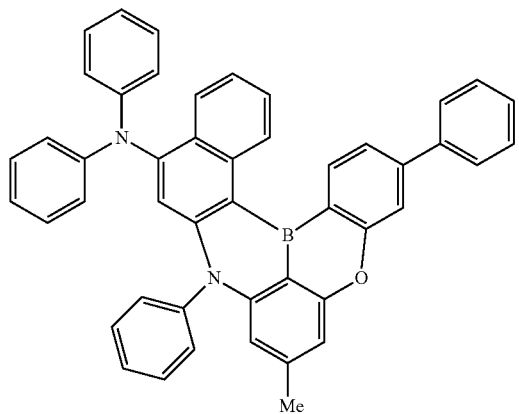
(1B-156)
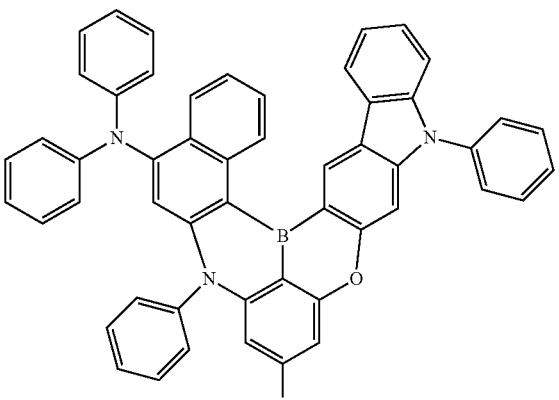

(1B-161)
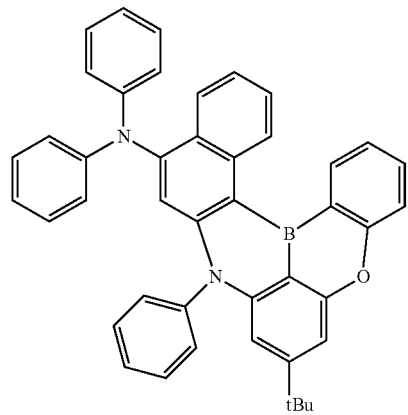
(1B-164)
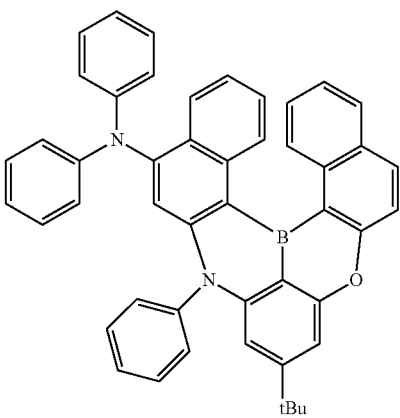
(1B-162)
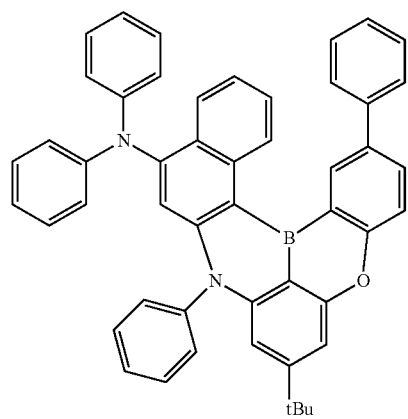
(1B-165)
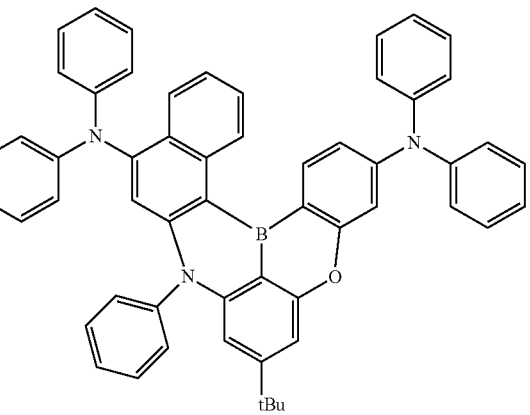
(1B-163)
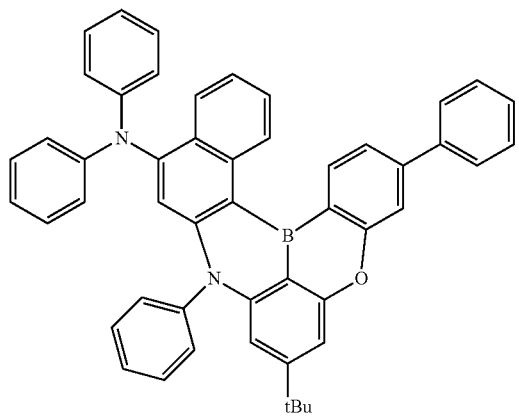
(1B-166)
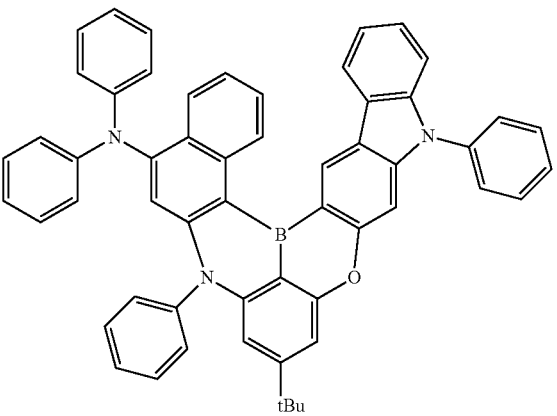

(1B-171)
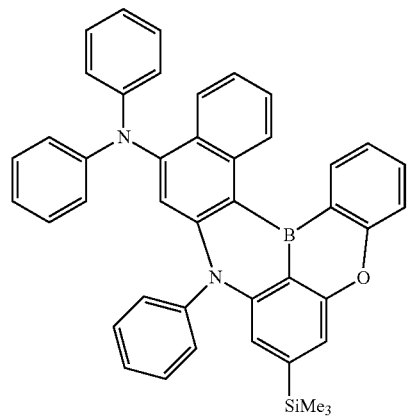
(1B-172)
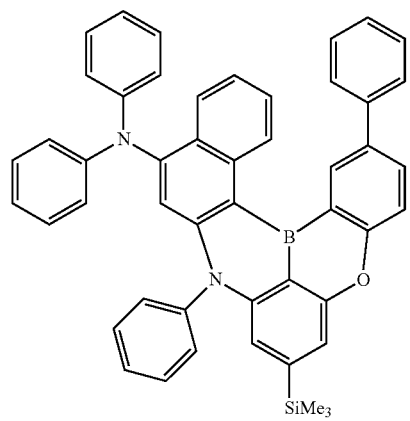
(1B-173)
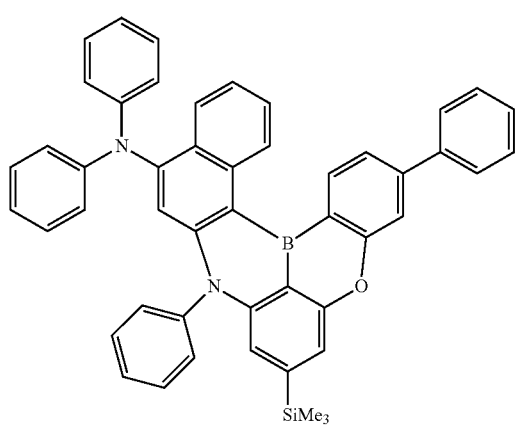
(1B-174)
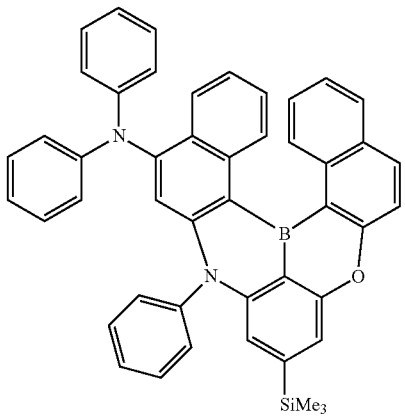
(1B-175)
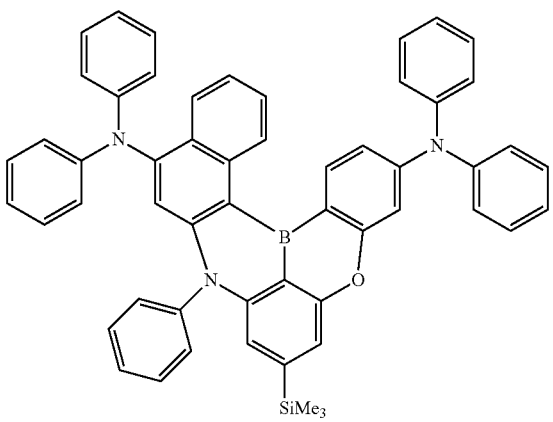
(1B-176)
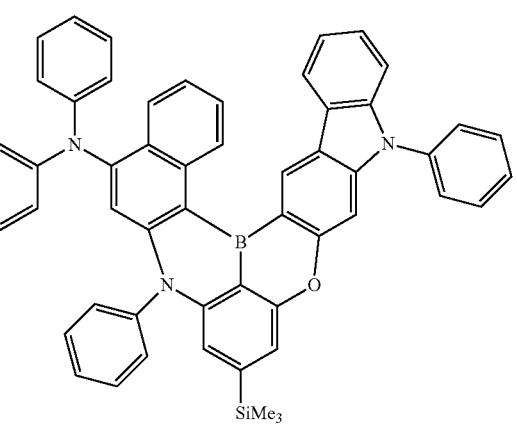

(1B-181)
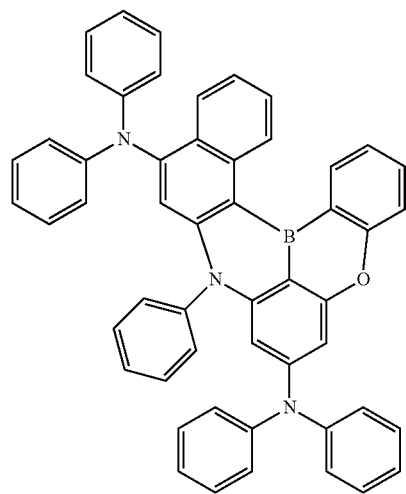
(1B-182)
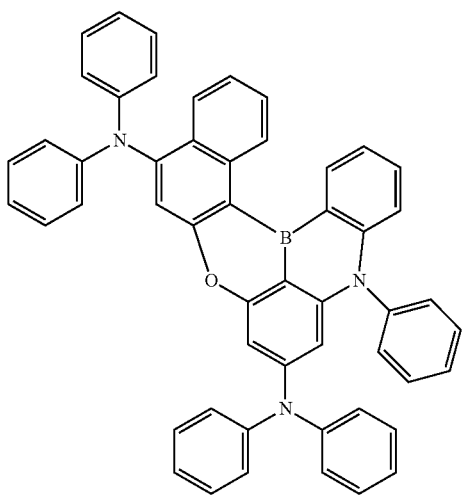
(1B-183)
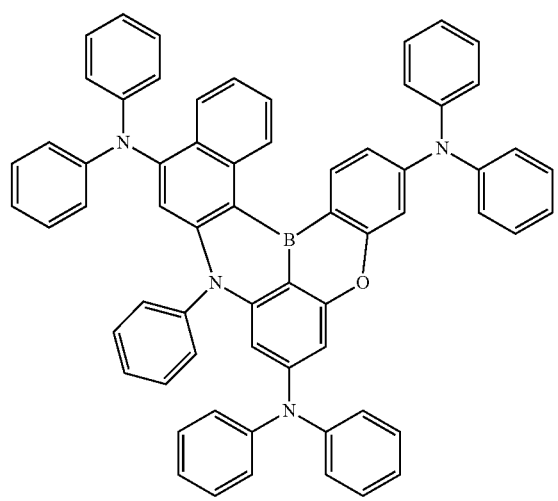
(1B-184)
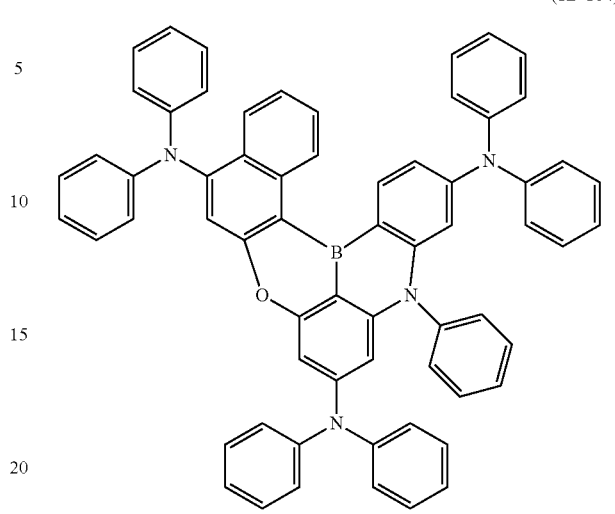
(1B-185)
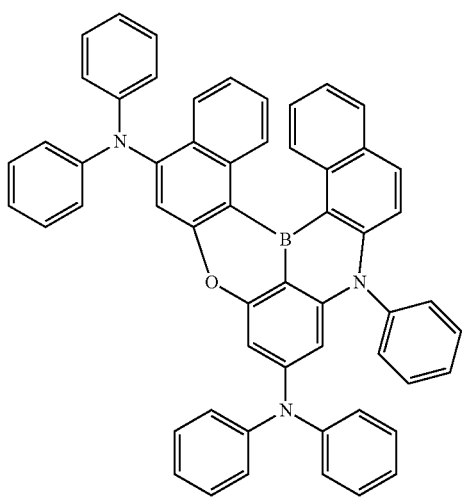
(1B-186)
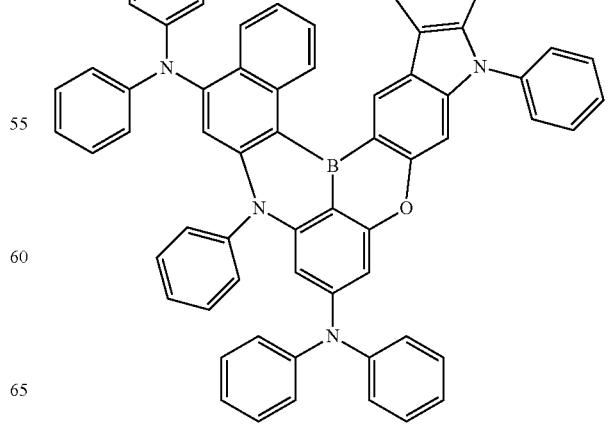

(1B-191)
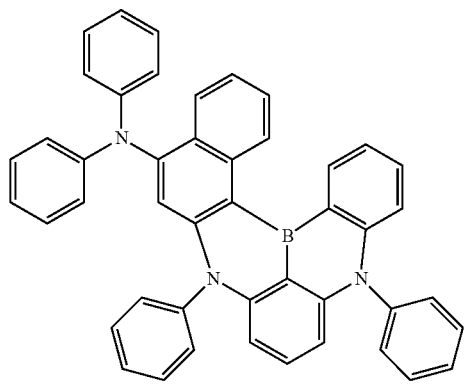
(1B-192)
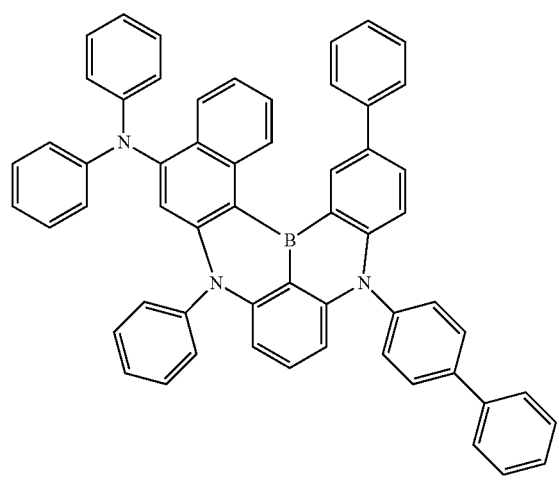
(1B-193)
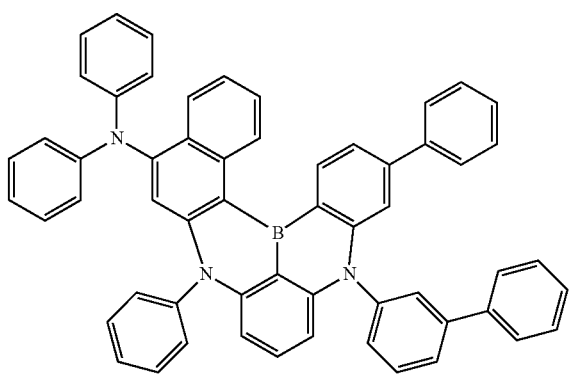
(1B-194)
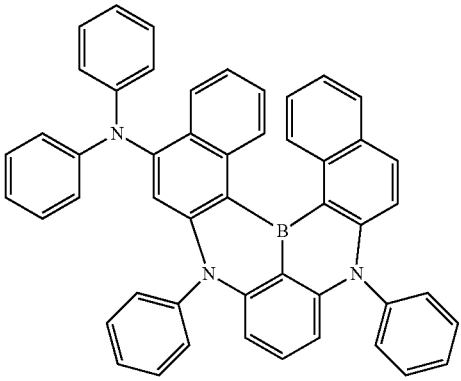
(1B-195)
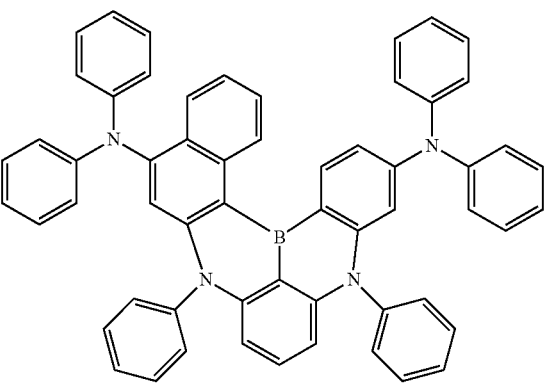
(1B-196)
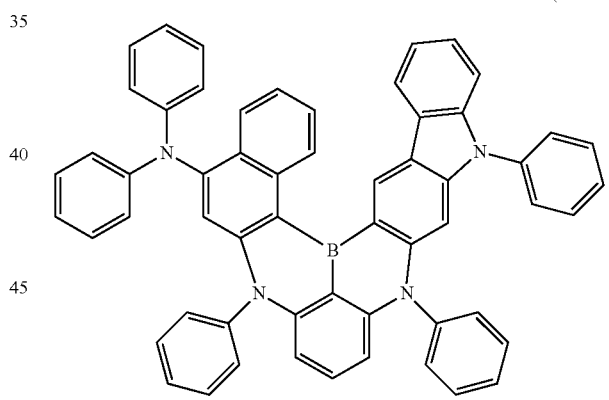
(1B-201)
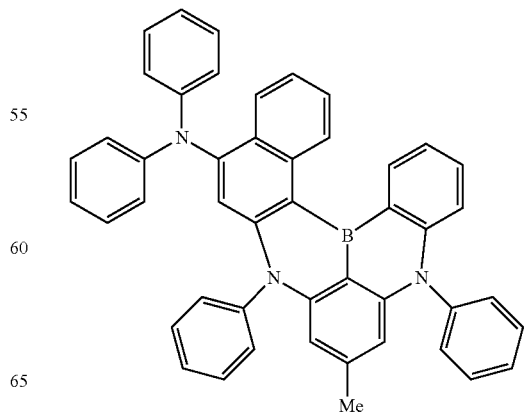

(1B-202)
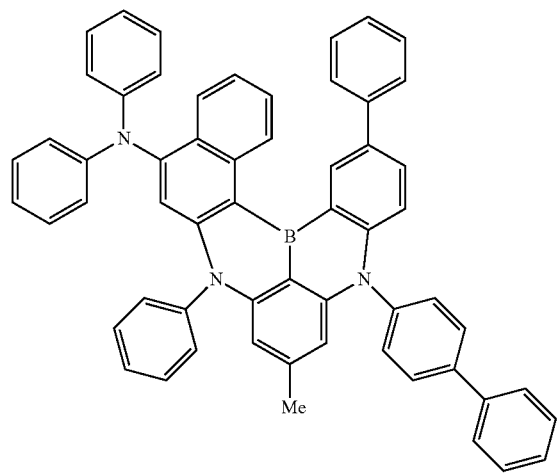
(1B-205)
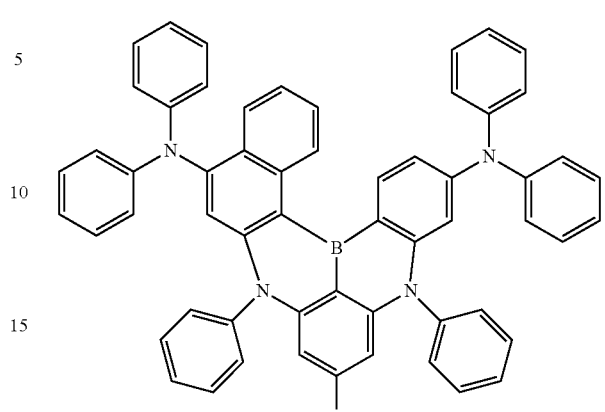
(1B-203)
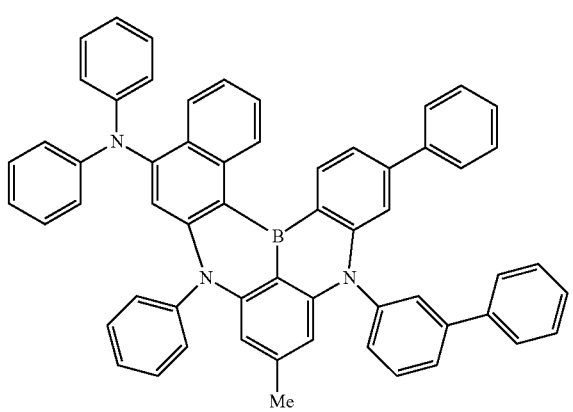
(1B-206)
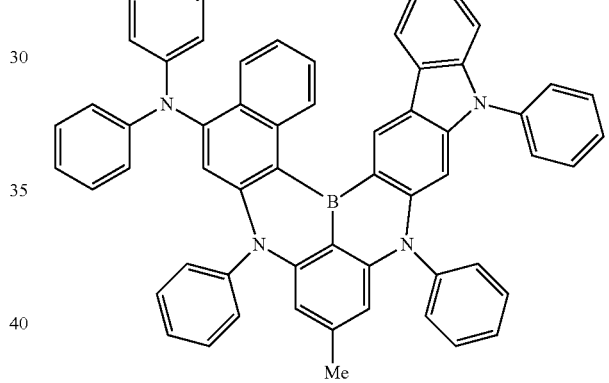
(1B-204)
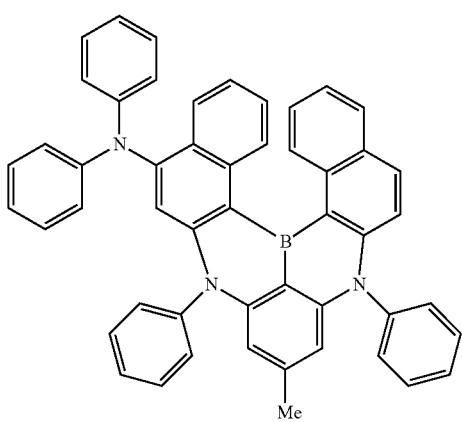
(1B-211)
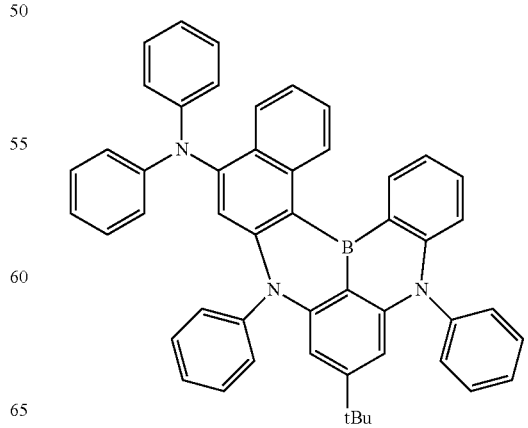

(1B-212)
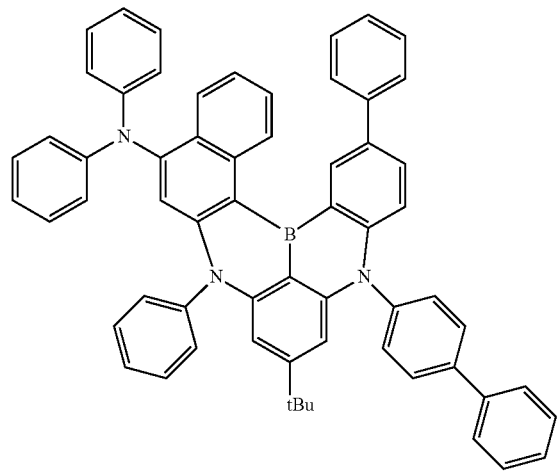
(1B-215)
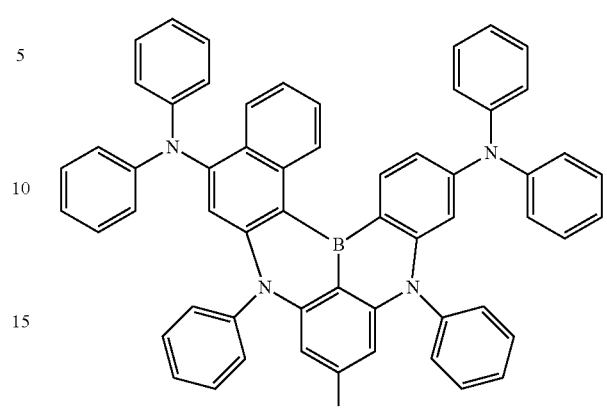
(1B-213)
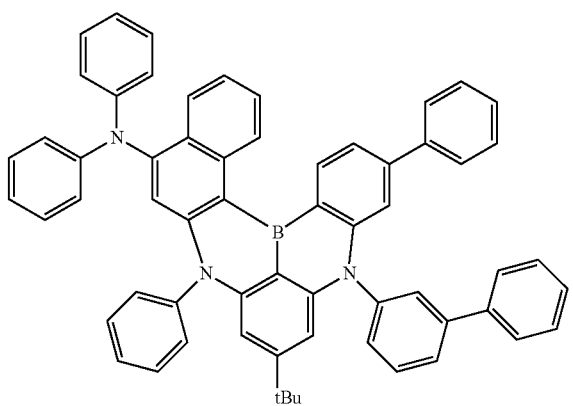
(1B-216)
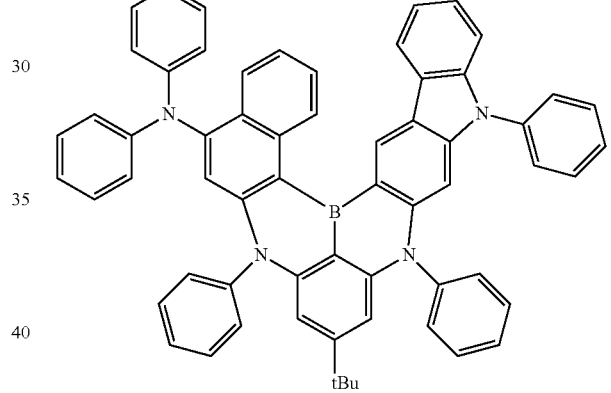
(1B-214)
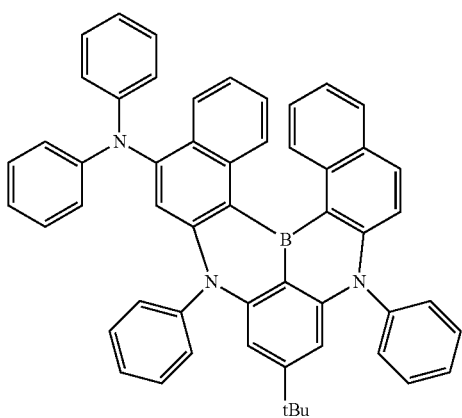
(1B-221)
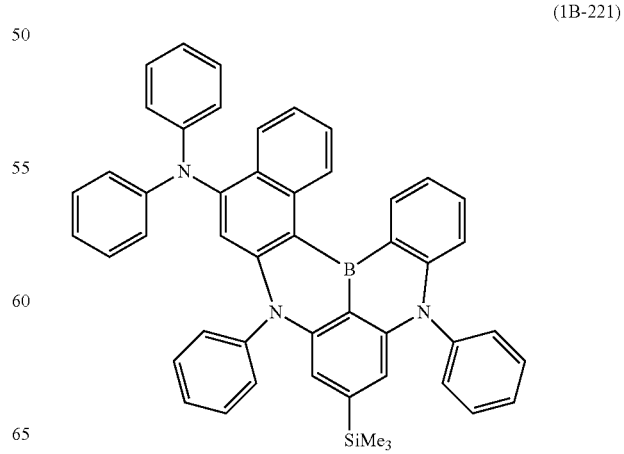

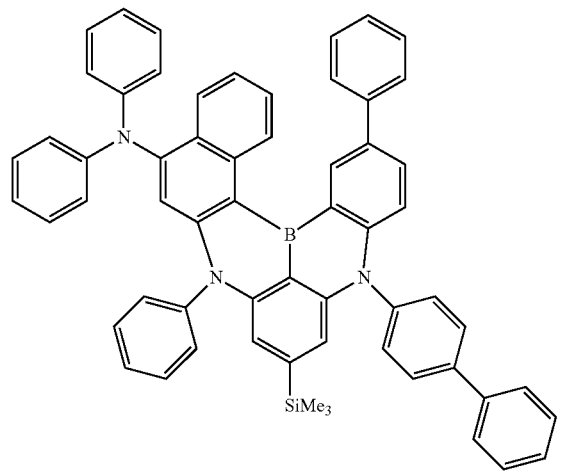
(1B-222)
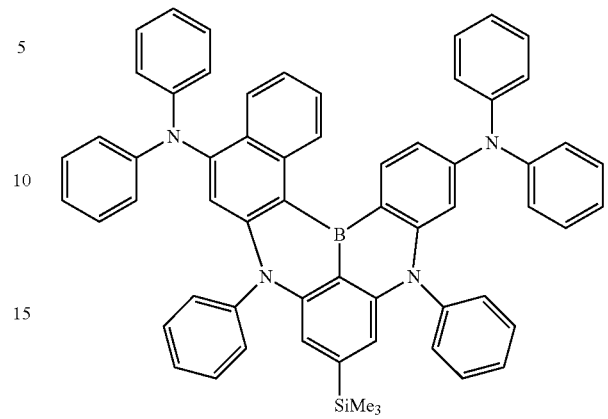
(1B-225)
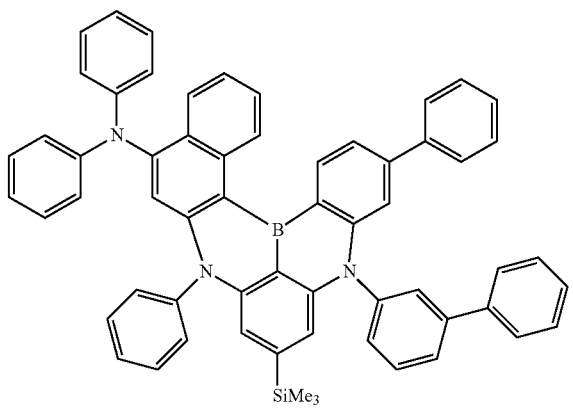
(1B-223)
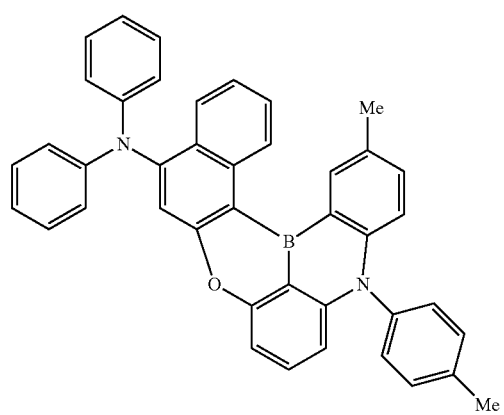
(1B-226)
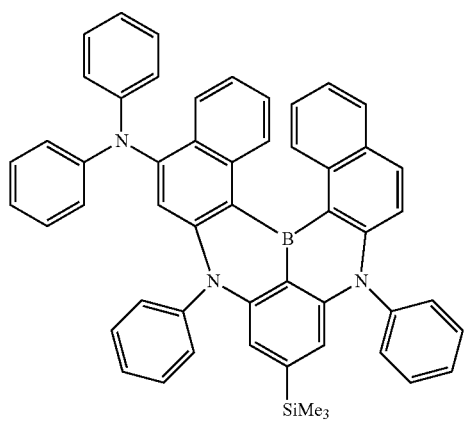
(1B-224)
(1B-231)

(1B-232)
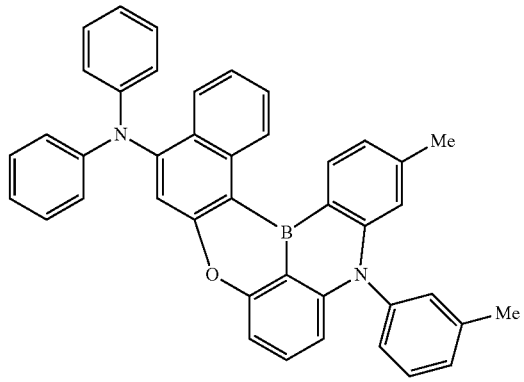
(1B-233)
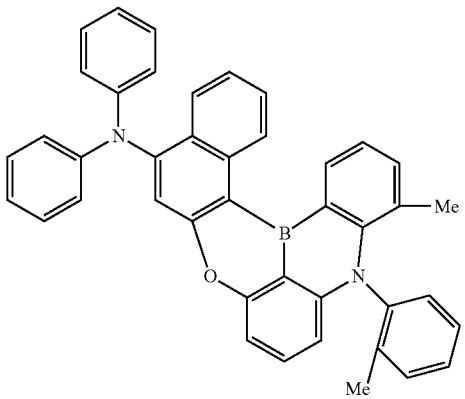
(1B-234)
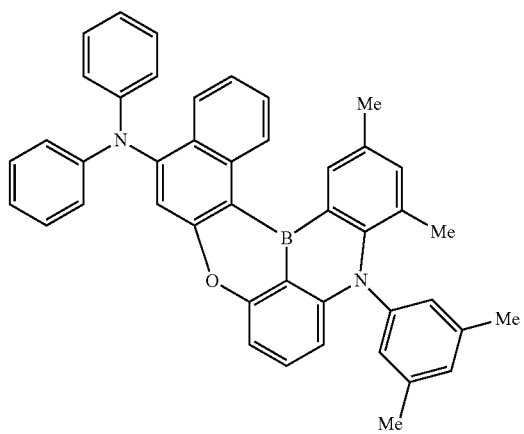
(1B-235)
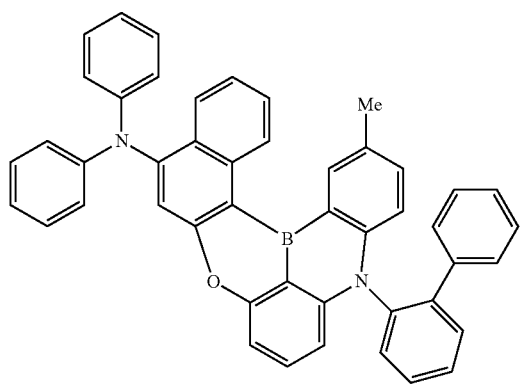
(1B-236)
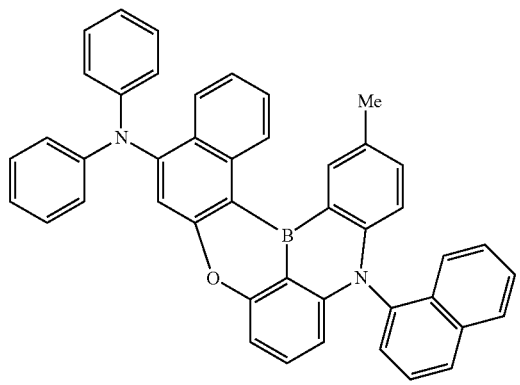
(1B-241)
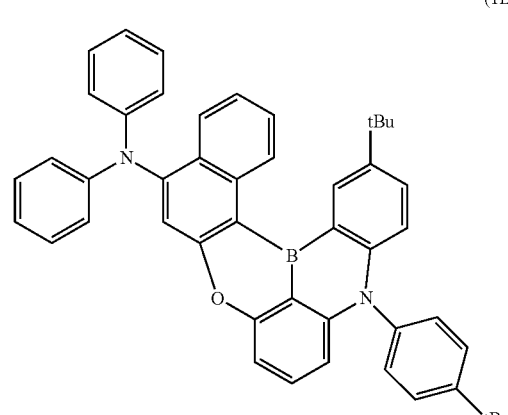
(1B-242)
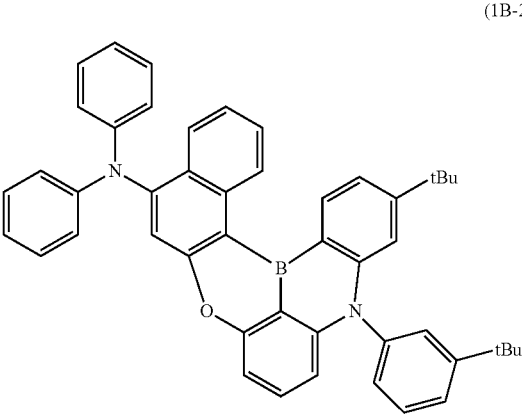
(1B-243)
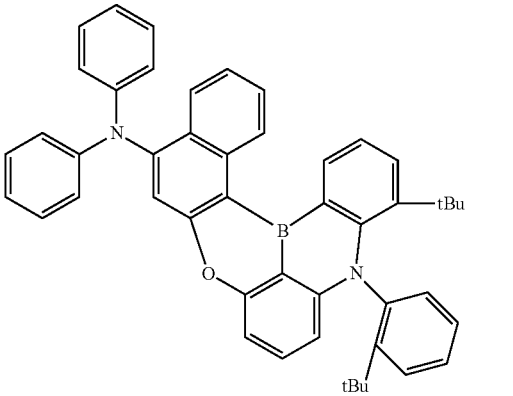

(1B-244)
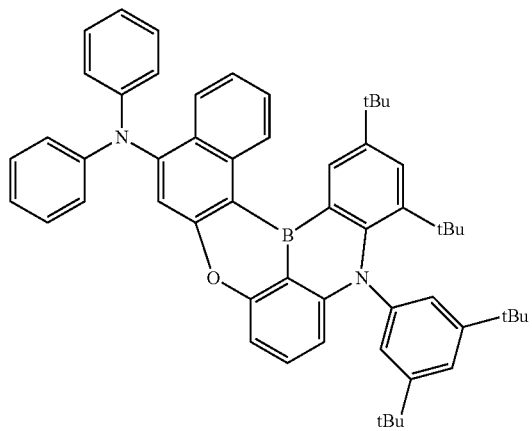
(1B-245)
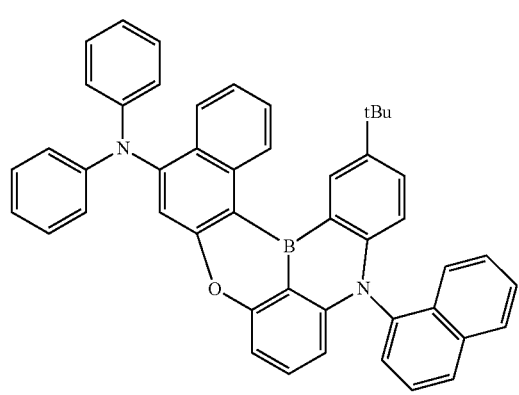
(1B-246)
(1B-251)
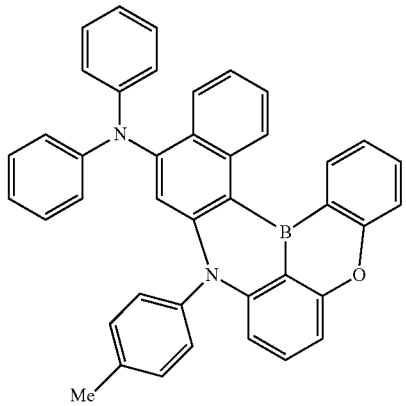
(1B-252)
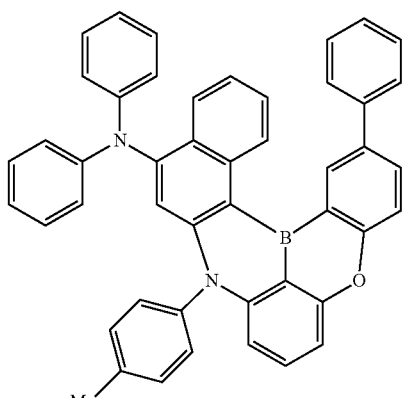
(1B-253)
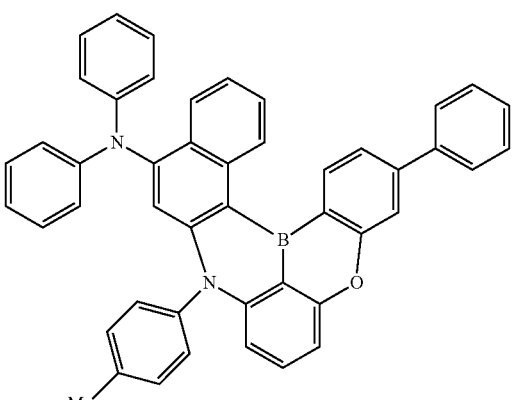
(1B-254)
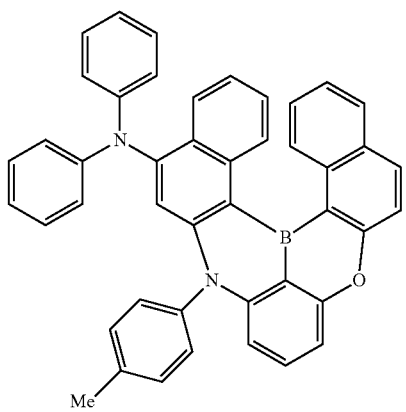

-continued
(1B-255)
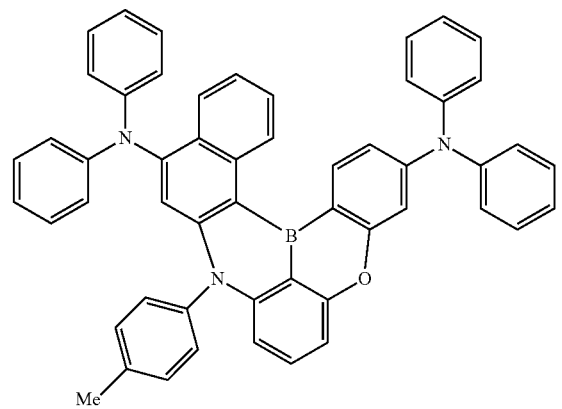
(1B-256)
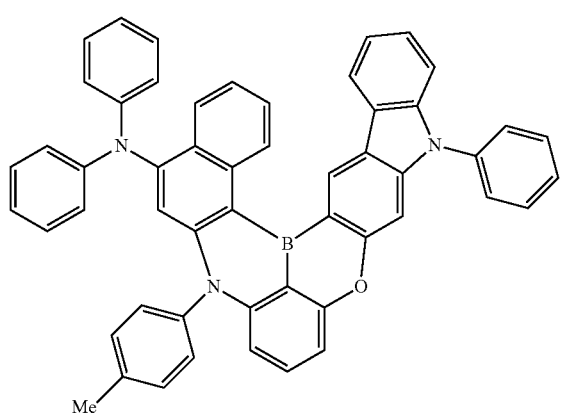
(1B-261)
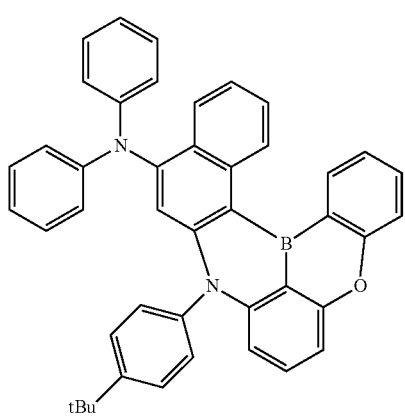
-continued
(1B-262)
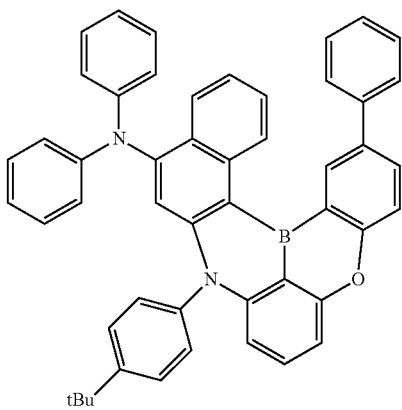
(1B-263)
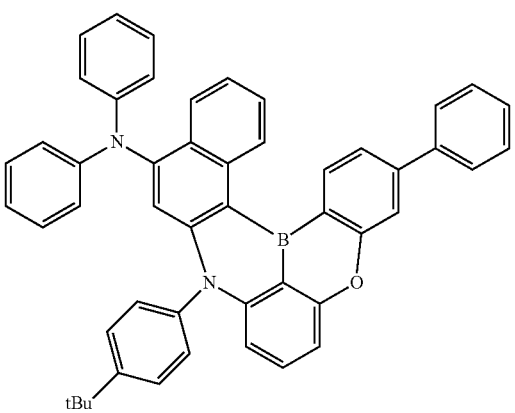
(1B-264)

(1B-265)
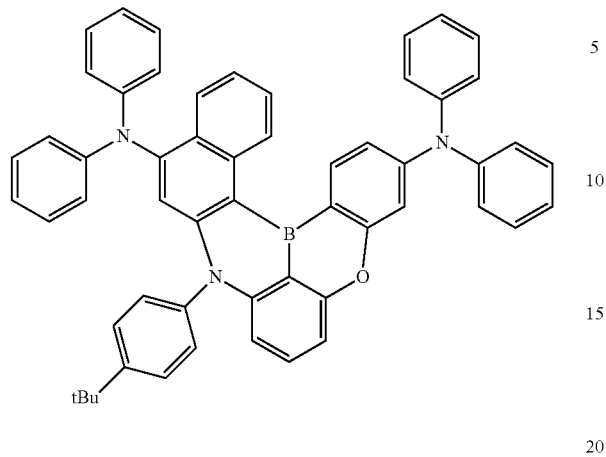
(1B-272)
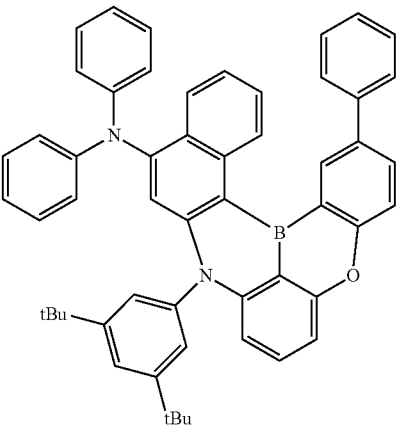
(1B-266)
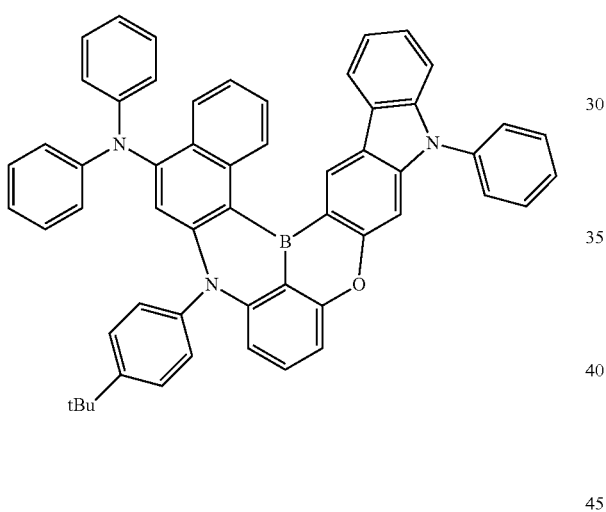
(1B-273)
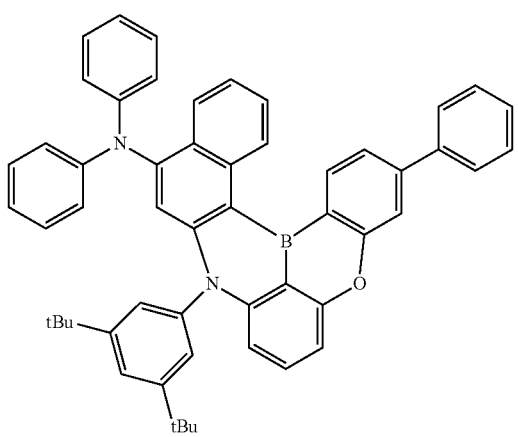
(1B-271)
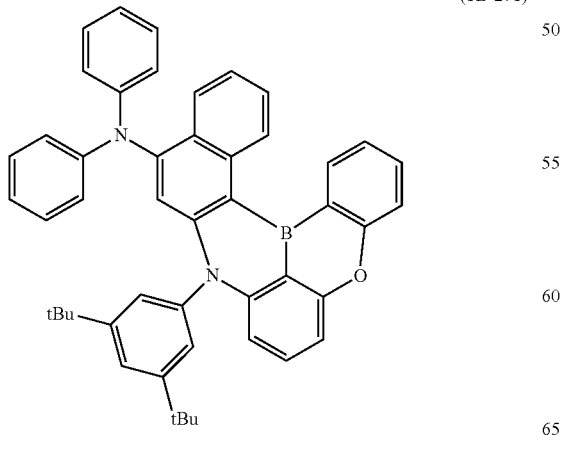
(1B-274)
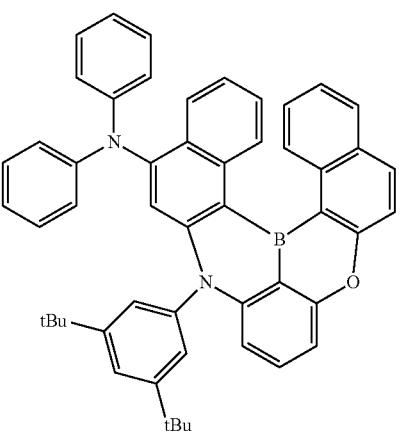

(1B-275)
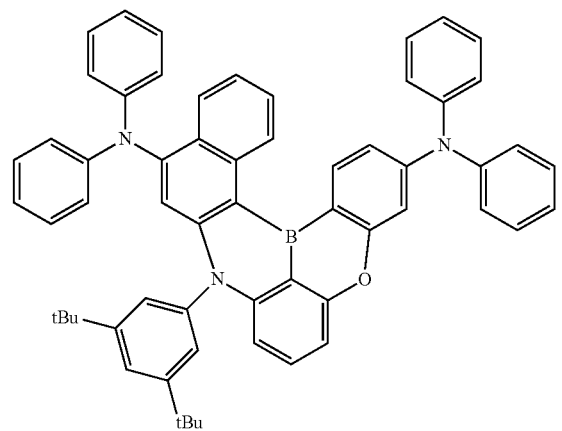
(1B-276)
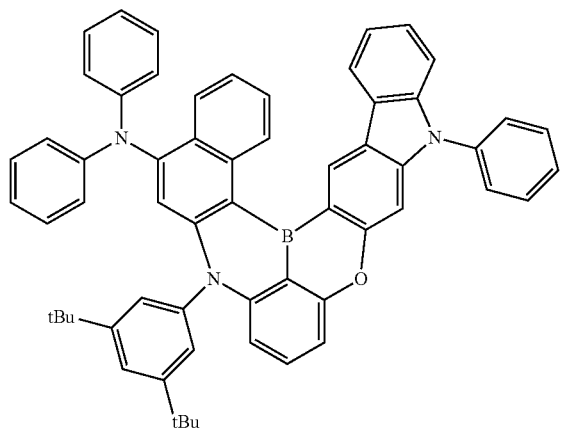
(1B-281)
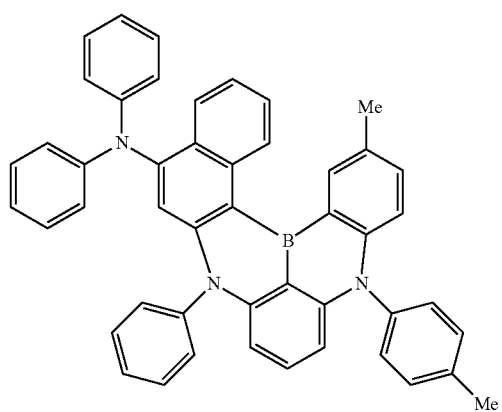
(1B-282)
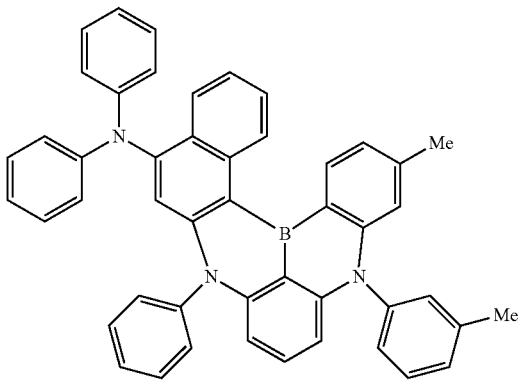
(1B-283)
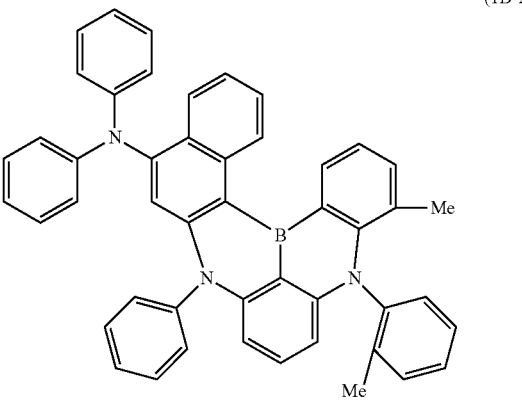
(1B-284)
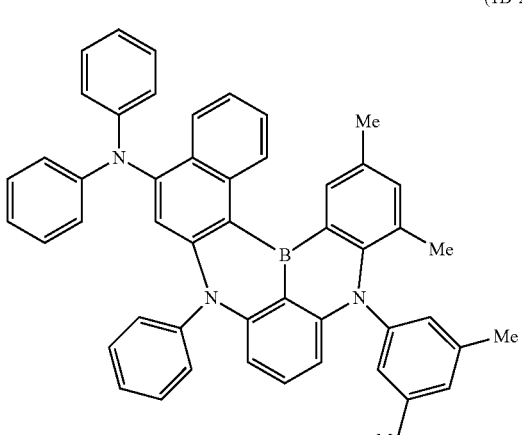
(1B-285)
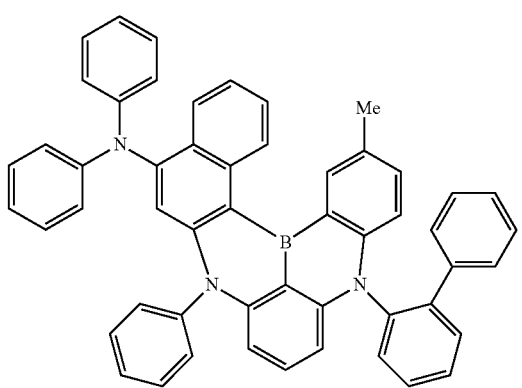

-continued (1B-286)

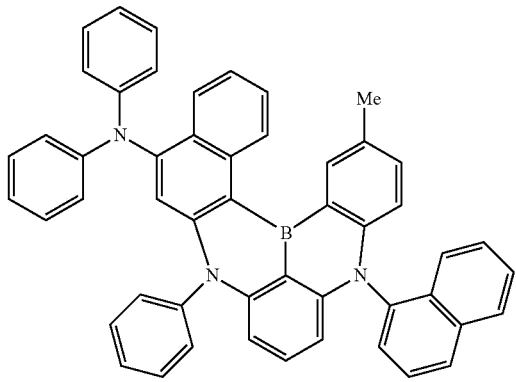

(1B-291)

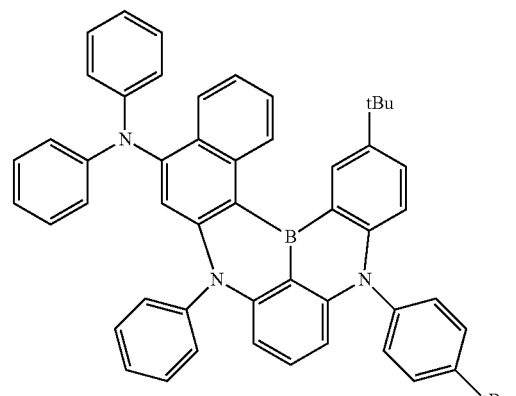

(1B-292)

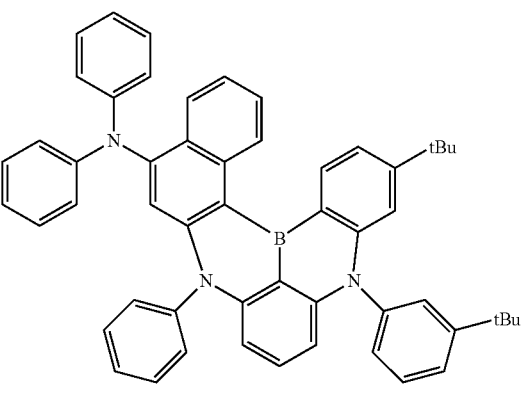

(1B-293)

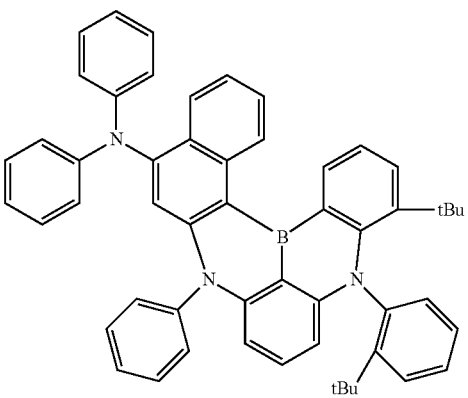

-continued (1B-294)

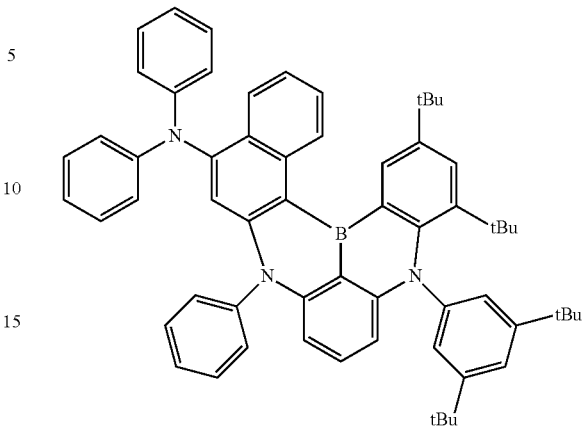

(1B-295)

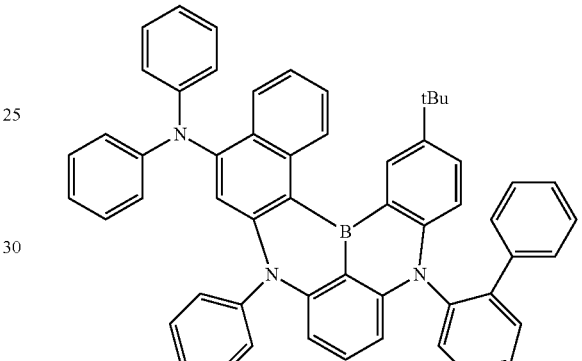

(1B-296)

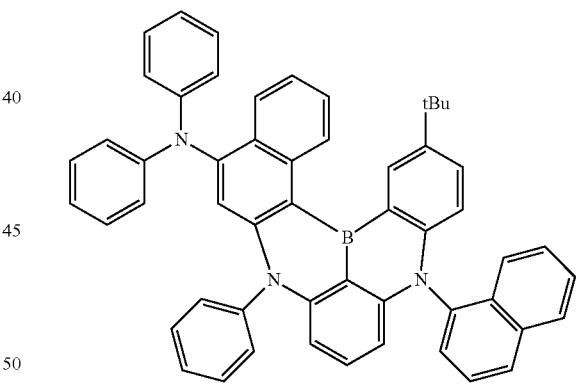

By introducing a phenyloxy group, a carbazolyl group, or a diphenylamino group into a para-position with respect to a B (boron) atom in ring a, the polycyclic aromatic amino compound represented by general formula (1B) or (1B') according to the present invention can be expected to increase T1 energy (increase by about 0.01 to 0.1 eV). Particularly, by introducing a phenyloxy group into a para-position with respect to a B (boron) atom, the HOMO on a benzene ring which is ring a is more localized to a meta-position with respect to the boron atom, and the LUMO is localized to an ortho-position and a para-position with respect to the boron atom. Therefore, an increase in the T1 energy can be particularly expected.

2. Method for Manufacturing Polycyclic Aromatic Amino Compound

Regarding a polycyclic aromatic amino compound represented by general formulas (1A) or (1B), basically, first, two naphthalene-based compounds are bonded in a case of general formula (1A), and one naphthalene-based compound and ring a are bonded via a bonding group (group containing $X^1$ or $X^2$) in a case of general formula (1B) to manufacture an intermediate (first reaction). Thereafter, two naphthalene-based compounds are bonded in a case of general formula (1A), and one naphthalene-based compound and ring a are bonded via a bonding group (group containing B: boron atom) in a case of general formula (1B) to manufacture a final product (second reaction). In the first reaction, for example, in a case of an etherification reaction, a general reaction such as a nucleophilic substitution reaction, or an Ullmann reaction can be utilized, and in a case of an amination reaction, a general reaction such as a Buchwald-Hartwig reaction can be utilized. In the second reaction, a Tandem Hetero-Friedel-Crafts reaction (a continuous aromatic electrophilic substitution reaction; hereinafter, the same) can be utilized. Note that the definitions of Ar, $R^1$ to $R^4$, $X^1$, $X^2$, m, n, p, and q in the following schemes are the same as those in formula (1A) or (1B).

The second reaction is a reaction for introducing B (boron atom) that bonds two naphthalene-based compounds or bonds one naphthalene-based compound and ring a, as illustrated in the following schemes (1) and (2). A case where $X^1$ and $X^2$ represent oxygen atoms will be exemplified below. First, a hydrogen atom between $X^1$ and $X^2$ is ortho-metalated with n-butyllithium, sec-butyllithium, t-butyllithium, or the like. Subsequently, boron trichloride, boron tribromide, or the like is added thereto to perform lithium-boron metal exchange, and then a Brønsted base such as N,N-diisopropylethylamine is added thereto to induce a Tandem Bora-Friedel-Crafts reaction. Thus, an intended product can be obtained. In the second reaction, a Lewis acid such as aluminum trichloride may also be added in order to accelerate the reaction.

Scheme (1)

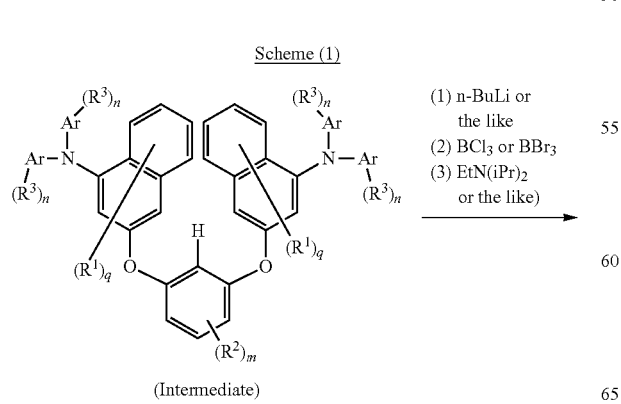

(Intermediate)

(1) n-BuLi or the like
(2) BCl$_3$ or BBr$_3$
(3) EtN(iPr)$_2$ or the like

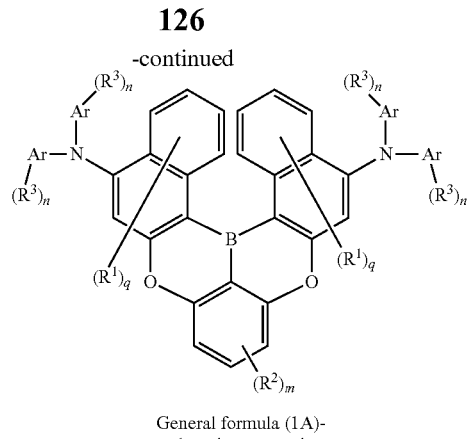

General formula (1A)-based compound

Scheme (2)

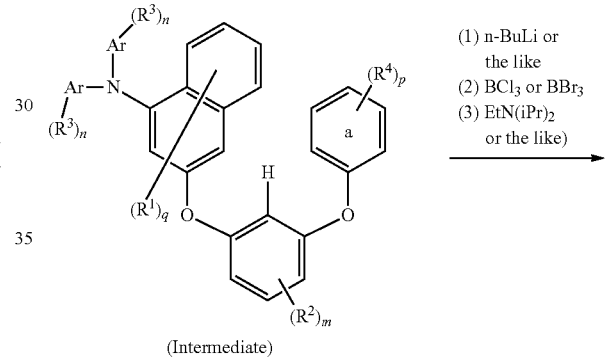

(Intermediate)

(1) n-BuLi or the like
(2) BCl$_3$ or BBr$_3$
(3) EtN(iPr)$_2$ or the like

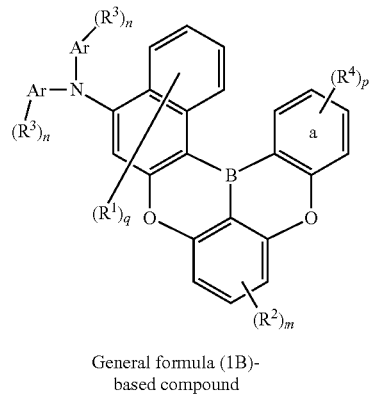

General formula (1B)-based compound

In the above schemes, a lithium atom is introduced into a desired position by ortho-metalation. However, a lithium atom can also be introduced into a desired position by introducing a bromine atom or the like into a position into which it is desired to introduce a lithium atom and performing halogen-metal exchange as in the following schemes (3) and (4).

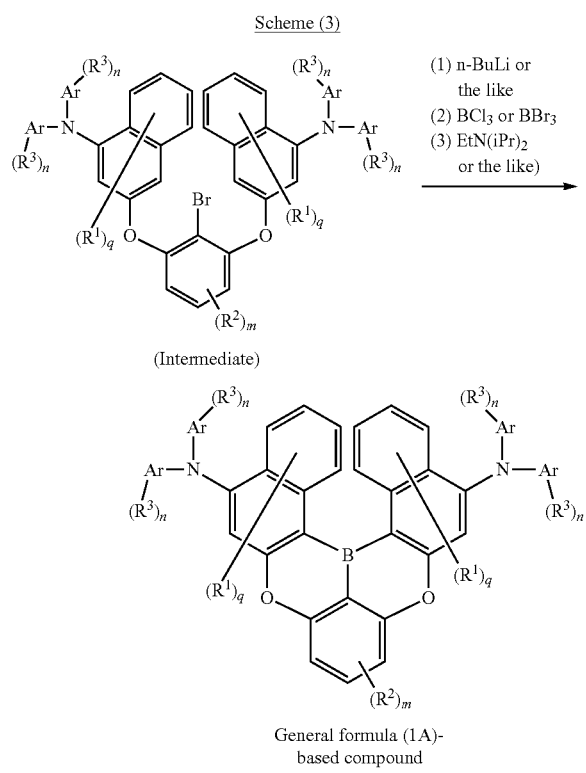

Scheme (3)

(Intermediate)

General formula (1A)-based compound

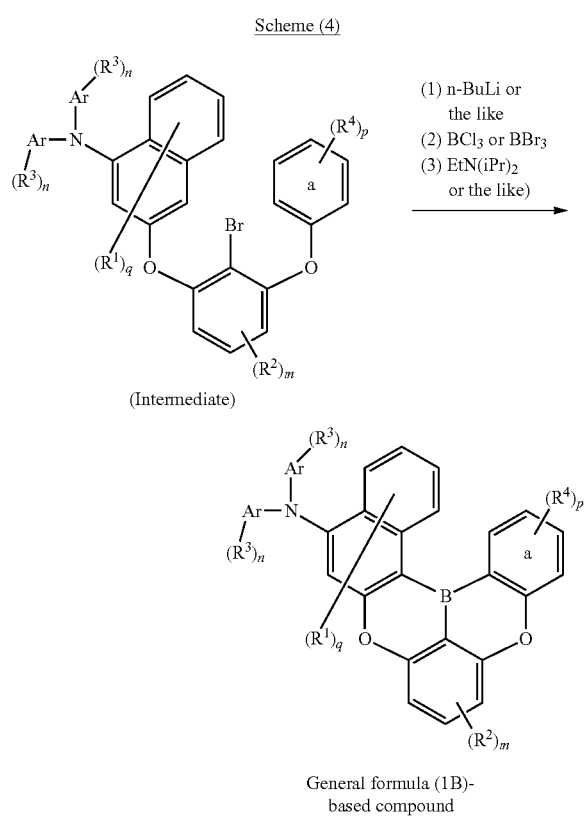

Scheme (4)

(Intermediate)

General formula (1B)-based compound

According to this method, an intended product can also be synthesized even in a case where ortho-metalation cannot be performed due to an influence of a substituent, and the method is useful.

By appropriately selecting the above described synthesis method and appropriately selecting a raw material to be used, a polycyclic aromatic amino compound having a substituent at a desired position and having $X^1$ and $X^2$ representing oxygen atoms can be synthesized.

Next, a case where $X^1$ and $X^2$ represent nitrogen atoms will be exemplified in the following schemes (5) and (6). Similarly to the case where $X^1$ and $X^2$ represent oxygen atoms, first, a hydrogen atom between $X^1$ and $X^2$ is ortho-metalated with n-butyllithium or the like. Subsequently, boron tribromide or the like is added thereto to induce lithium-boron metal exchange, and then a Brønsted base such as N,N-diisopropylethylamine is added thereto to induce a Tandem Bora-Friedel-Crafts reaction. Thus, an intended product can be obtained. Here, a Lewis acid such as aluminum trichloride may also be added in order to accelerate the reaction.

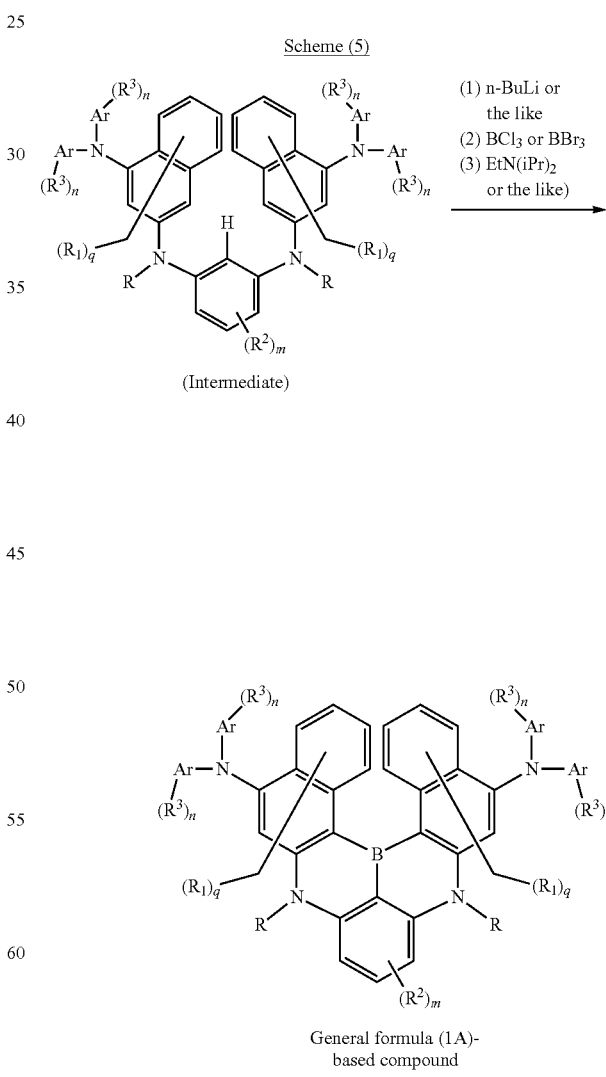

Scheme (5)

(Intermediate)

General formula (1A)-based compound

Scheme (6)

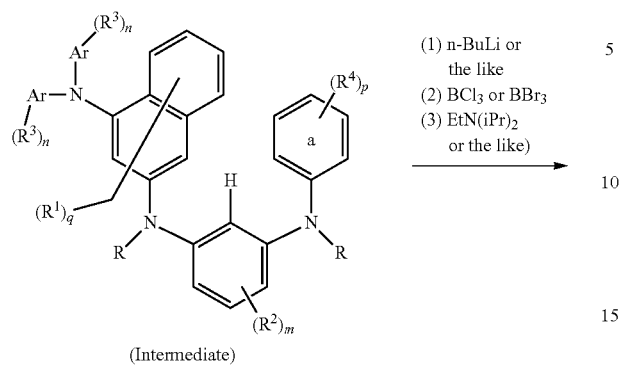

(Intermediate)

(1) n-BuLi or the like
(2) BCl$_3$ or BBr$_3$
(3) EtN(iPr)$_2$ or the like)

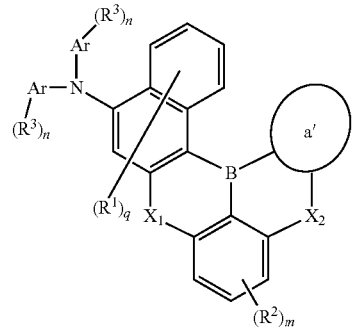

General formula (1B-a')-based compound

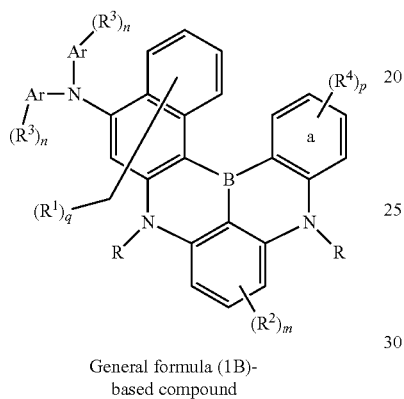

General formula (1B)-based compound

Scheme (8)

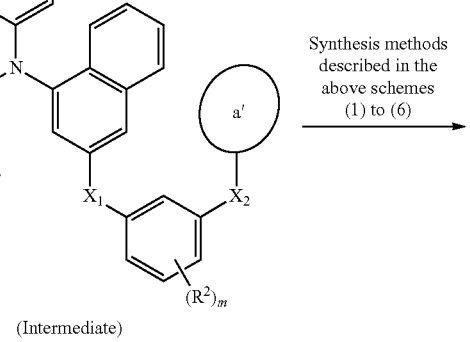

(Intermediate)

Synthesis methods described in the above schemes (1) to (6)

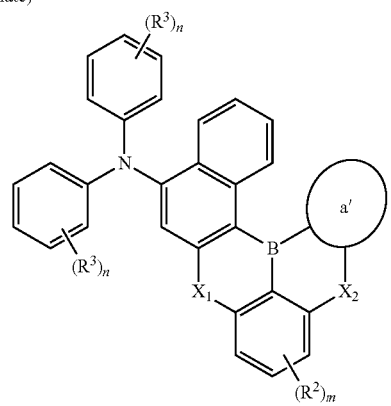

General formula (1B'-a')-based compound

Specific examples of a solvent used in the above reactions include toluene, t-butylbenzene, and xylene.

In a case where there is a plurality of R$^4$'s in general formulas (1B) and (1B'), adjacent R$^4$'s may be bonded to each other to form an aryl ring or a heteroaryl ring together with ring a. Therefore, the polycyclic aromatic amino compound represented by general formula (1B) or (1B') changes a ring structure constituting the compound depending on a bonding form between substituents on ring a as indicated by general formulas (1B-a') and (1B'-a') in the following schemes (7) and (8). These compounds can be synthesized by applying the synthesis methods illustrated in the above schemes (1) to (6) to intermediates illustrated in the following schemes (7) and (8).

Scheme (7)

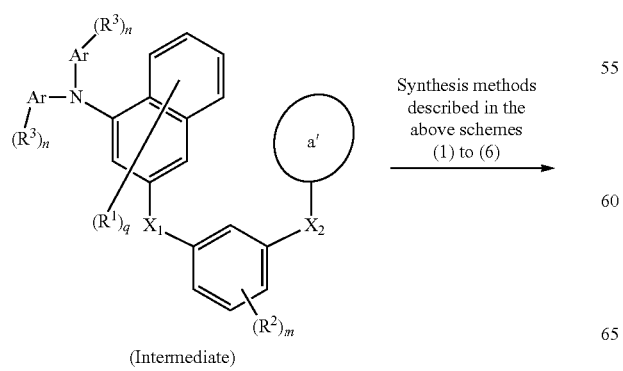

(Intermediate)

Synthesis methods described in the above schemes (1) to (6)

Ring a' in the above general formulas (1B-a') and (1B'-a') represents an aryl ring or a heteroaryl ring formed by bonding adjacent R$^4$'s together with ring a.

The definition that "R of the moiety N—R is bonded to the ring a by —O—, —S—, —C(—R)$_2$—, or a single bond" in general formula (1B) or (1B') can be expressed by a compound having a ring structure in which X$^2$ is incorporated into fused ring a'', represented by general formula (1B-a'') or (1B'-a'') in the following scheme (9) or (10). These compounds can be synthesized by applying the synthesis methods illustrated in the above schemes (1) to (6) to an intermediate illustrated in the following scheme (9) or (10).

Scheme (9)

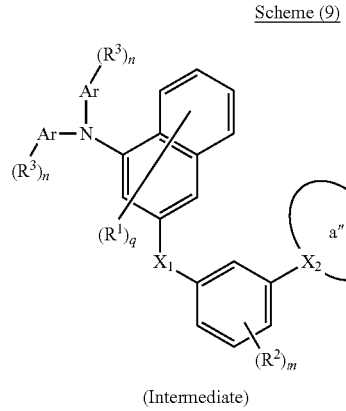

(Intermediate)

Synthesis methods described in the above schemes (1) to (6) →

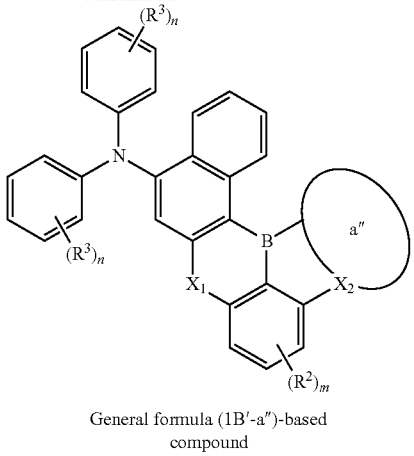

General formula (1B′-a″)-based compound

General formula (1B-a″)-based compound

Scheme (10)

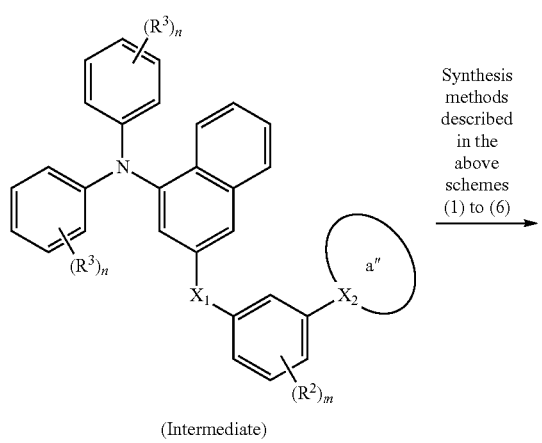

(Intermediate)

Synthesis methods described in the above schemes (1) to (6) →

In the synthesis methods of the above schemes (1) to (10), there is illustrated an example of performing a Tandem Hetero-Friedel-Crafts reaction by ortho-metalating a hydrogen atom (or a halogen atom) between $X^1$ and $X^2$ with butyllithium or the like before adding boron trichloride, boron tribromide, or the like. However, the reaction can also be caused to proceed by adding boron trichloride, boron tribromide, or the like without performing ortho-metalation using butyllithium or the like.

Incidentally, examples of an ortho-metalation reagent used for the schemes (1) to (10) include: an alkyllithium such as methyllithium, n-butyllithium, sec-butyllithium, or t-butyllithium; and an organic alkali compound such as lithium diisopropylamide, lithium tetramethylpiperidide, lithium hexamethyldisilazide, or potassium hexamethyldisilazide.

Incidentally, examples of a metal exchanging reagent for metal-B (boron) used for the schemes (1) to (10) include: a halide of B such as a trifluoride of B, a trichloride of B, a tribromide of B, or a triiodide of B; an aminated halide of B such as $ClPN(NEt_2)_2$; an alkoxylated product of B; and an aryloxylated product of B.

Note that examples of a Brønsted base used for the schemes (1) to (10) include N,N-diisopropylethylamine, triethylamine, 2,2,6,6-tetramethylpiperidine, 1,2,2,6,6-pentamethylpiperidine, N,N-dimethylaniline, N,N-dimethyltoluidine, 2,6-lutidine, sodium tetraphenylborate, potassium tetraphenylborate, triphenylborane, tetraphenylsilane, $Ar_4BNa$, $Ar_4BK$, $Ar_3B$, and $Ar_4Si$ (wherein Ar represents an aryl such as phenyl).

Examples of a Lewis acid used for the schemes (1) to (10) include $AlCl_3$, $AlBr_3$, $AlF_3$, $BF_3 \cdot OEt_2$, $BCl_3$, $BBr_3$, $GaCl_3$, $GaBr_3$, $InCl_3$, $InBr_3$, $In(OTf)_3$, $SnCl_4$, $SnBr_4$, $AgOTf$, $ScCl_3$, $Sc(OTf)_3$, $ZnCl_2$, $ZnBr_2$, $Zn(OTf)_2$, $MgCl_2$, $MgBr_2$, $Mg(OTf)_2$, $LiOTf$, $NaOTf$, $KOTf$, $Me_3SiOTf$, $Cu(OTf)_2$, $CuCl_2$, $YCl_3$, $Y(OTf)_3$, $TiCl_4$, $TiBr_4$, $ZrCl_4$, $ZrBr_4$, $FeCl_3$, $FeBr_3$, $CoCl_3$, and $CoBr_3$.

In the above schemes (1) to (10), a Brønsted base or a Lewis acid may be used in order to accelerate the Tandem Hetero Friedel-Crafts reaction. However, in a case where a halide of B such as a trifluoride of B, a trichloride of B, a tribromide of B, or a triiodide of B is used, an acid such as hydrogen fluoride, hydrogen chloride, hydrogen bromide, or hydrogen iodide is generated along with progress of an aromatic electrophilic substitution reaction. Therefore, it is effective to use a Brønsted base that captures an acid. Meanwhile, in a case where an aminated halide of B or an alkoxylated product of B is used, an amine or an alcohol is generated along with progress of an aromatic electrophilic substitution reaction. Therefore, in many cases, it is not necessary to use a Brønsted base. However, leaving ability of an amino group or an alkoxy group is low, and therefore it is effective to use a Lewis acid that accelerates leaving thereof.

The polycyclic aromatic amino compound of the present invention also includes a compound in which at least a portion of hydrogen atoms have been substituted by deuterium atoms or substituted by halogen atoms such as fluorine atoms or chlorine atoms. However, these compounds can be synthesized in a similar manner to the above by using a raw material that has been deuterated, fluorinated, or chlorinated at a desired site.

The polycyclic aromatic amino compound according to the present invention can be used as a material for an organic device. Examples of the organic device include an organic electroluminescent element, an organic field effect transistor, and an organic thin film solar cell.

3. Organic Electroluminescent Element

The polycyclic aromatic amino compound according to the present invention can be used as, for example, a material for an organic electroluminescent element. Hereinafter, an organic EL element according to the present embodiment will be described in detail based on the drawings. The FIGURE is a schematic cross-sectional view illustrating the organic EL element according to the present embodiment.

<Structure of organic electroluminescent element>

An organic electroluminescent element 100 illustrated in the FIGURE includes a substrate 101; a positive electrode 102 disposed on the substrate 101; a hole injection layer 103 disposed on the positive electrode 102; a hole transport layer 104 disposed on the hole injection layer 103; a light emitting layer 105 disposed on the hole transport layer 104; an electron transport layer 106 disposed on the light emitting layer 105; an electron injection layer 107 disposed on the electron transport layer 106; and a negative electrode 108 disposed on the electron injection layer 107.

Note that the organic electroluminescent element 100 may have a configuration, by reversing the manufacturing order, including, for example, the substrate 101; the negative electrode 108 disposed on the substrate 101; the electron injection layer 107 disposed on the negative electrode 108; the electron transport layer 106 disposed on the electron injection layer 107; the light emitting layer 105 disposed on the electron transport layer 106; the hole transport layer 104 disposed on the light emitting layer 105; the hole injection layer 103 disposed on the hole transport layer 104; and the positive electrode 102 disposed on the hole injection layer 103.

Not all of the above layers are essential, and the configuration includes the positive electrode 102, the light emitting layer 105, and the negative electrode 108 as a minimum constituent unit, while the hole injection layer 103, the hole transport layer 104, the electron transport layer 106, and the electron injection layer 107 are optionally disposed layers. Each of the above layers may be constituted by a single layer or a plurality of layers.

A form of layers constituting the organic electroluminescent element may include, in addition to the above configuration form of "substrate/positive electrode/hole injection layer/hole transport layer/light emitting layer/electron transport layer/electron injection layer/negative electrode", configuration forms of "substrate/positive electrode/hole transport layer/light emitting layer/electron transport layer/electron injection layer/negative electrode", "substrate/positive electrode/hole injection layer/light emitting layer/electron transport layer/electron injection layer/negative electrode", "substrate/positive electrode/hole injection layer/hole transport layer/light emitting layer/electron injection layer/negative electrode", "substrate/positive electrode/hole injection layer/hole transport layer/light emitting layer/electron transport layer/negative electrode", "substrate/positive electrode/light emitting layer/electron transport layer/electron injection layer/negative electrode", "substrate/positive electrode/hole transport layer/light emitting layer/electron injection layer/negative electrode", "substrate/positive electrode/hole transport layer/light emitting layer/electron transport layer/negative electrode", "substrate/positive electrode/hole injection layer/light emitting layer/electron injection layer/negative electrode", "substrate/positive electrode/hole injection layer/light emitting layer/electron transport layer/negative electrode", "substrate/positive electrode/light emitting layer/electron transport layer/negative electrode", and "substrate/positive electrode/light emitting layer/electron injection layer/negative electrode".

<Substrate in Organic Electroluminescent Element>

The substrate 101 serves as a support of the organic electroluminescent element 100, and usually, quartz, glass, a metal, a plastic, and the like are used. The substrate 101 is formed into a plate shape, a film shape, or a sheet shape depending on a purpose, and for example, a glass plate, a metal plate, a metal foil, a plastic film, and a plastic sheet are used. Among these examples, a glass plate and a plate made of a transparent synthetic resin such as polyester, polymethacrylate, polycarbonate, or polysulfone are preferable. For a glass substrate, soda lime glass, alkali-free glass, and the like are used. The thickness is only required to be a thickness sufficient for maintaining mechanical strength. Therefore, the thickness is only required to be 0.2 mm or more, for example. An upper limit value of the thickness is, for example, 2 mm or less, and preferably 1 mm or less. Regarding a material of glass, glass having fewer ions eluted from glass is desirable, and therefore alkali-free glass is preferable. However, soda lime glass which has been subjected to barrier coating with $SiO_2$ or the like is also commercially available, and therefore this soda lime glass can be used. The substrate 101 may have a gas barrier film such as a dense silicon oxide film on at least one surface in order to enhance a gas barrier property. Particularly in a case of using a plate, a film, or a sheet made of a synthetic resin having a low gas barrier property as the substrate 101, it is preferable to dispose a gas barrier film.

<Positive Electrode in Organic Electroluminescent Element>

The positive electrode 102 plays a role of injecting holes into the light emitting layer 105. Incidentally, in a case where the hole injection layer 103 and/or the hole transport layer 104 are/is disposed between the positive electrode 102 and the light emitting layer 105, holes are injected into the light emitting layer 105 through these layers.

Examples of a material forming the positive electrode 102 include an inorganic compound and an organic compound. Examples of the inorganic compound include a metal (aluminum, gold, silver, nickel, palladium, chromium, and the like), a metal oxide (indium oxide, tin oxide, indium-tin oxide (ITO), indium-zinc oxide (IZO), and the like), a metal halide (copper iodide and the like), copper sulfide, carbon black, ITO glass, and Nesa glass. Examples of the organic compound include an electrically conductive polymer including polythiophene such as poly(3-methylthiophene), polypyrrole, and polyaniline. In addition, a material can be appropriately selected for use from among substances used as the positive electrode of an organic electroluminescent element.

A resistance of a transparent electrode is not limited because it is only required to be able to supply a sufficient current for emission of a light emitting element, but is desirably low from a viewpoint of power consumption of the light emitting element. For example, an ITO substrate having a resistance of 300Ω/□ or less functions as an element electrode. However, a substrate having a resistance of about 10Ω/□ can be also supplied at present, and therefore it is particularly desirable to use a low resistance product having a resistance of, for example, 100 to 5Ω/□, preferably 50 to 5Ω/□. The thickness of ITO can be arbitrarily selected according to a resistance value, but usually, a thickness of 50 to 300 nm is often used.

<Hole Injection Layer and Hole Transport Layer in Organic Electroluminescent Element>

The hole injection layer 103 plays a role of efficiently injecting holes migrating from the positive electrode 102 into the light emitting layer 105 or the hole transport layer 104. The hole transport layer 104 plays a role of efficiently transporting holes injected from the positive electrode 102 or holes injected from the positive electrode 102 through the hole injection layer 103 to the light emitting layer 105. The hole injection layer 103 and the hole transport layer 104 are each formed by laminating and mixing one or more kinds of hole injection/transport materials, or by a mixture of a hole injection/transport material and a polymer binder. The layers may also be formed by adding an inorganic salt such as iron(III) chloride to a hole injection/transport material.

A hole injection/transport substance needs to efficiently inject/transport holes from the positive electrode between electrodes to which an electric field is applied, and desirably has high hole injection efficiency and transports injected holes efficiently. For this purpose, the hole injection/transport substance is preferably formed of a substance having low ionization potential, large hole mobility, and excellent stability, and hardly generating impurities that serve as traps at the time of manufacturing and at the time of use.

As a material forming the hole injection layer 103 and the hole transport layer 104, a polycyclic aromatic amino compound represented by the above general formula (1A) or (1B) can be used. In a photoconductive material, any compound can be selected for use from among compounds that have been conventionally used as a charge transport material for holes, a p-type semiconductor, and known compounds used for a hole injection layer and a hole transport layer of an organic electroluminescent element.

Specific examples thereof include a heterocyclic compound including a carbazole derivative (N-phenylcarbozole, polyvinylcarbazole, and the like), a biscarbazole derivative such as bis(N-arylcarbazole) or bis(N-alkylcarbazole), a triarylamine derivative (a polymer having an aromatic tertiary amino in a main chain or a side chain, 1,1-bis(4-di-p-tolylaminophenyl)cyclohexane, N,N'-diphenyl-N,N'-di(3-methylphenyl)-4,4'-diaminobiphenyl, N,N'-diphenyl-N,N'-dinaphthyl-4,4'-diaminobiphenyl, N,N'-diphenyl-N,N'-di(3-methylphenyl)-4,4'-diphenyl-1,1'-diamine, N,N'-dinaphthyl-N,N'-diphenyl-4,4'-dphenyl-1,1'-diamine, $N^4,N^{4'}$-diphenyl-$N^4,N^{4'}$-bis(9-phenyl-9H-carbazol-3-yl)-[1,1'-biphenyl]-4,4'-diamine, $N^4,N^4,N^{4'},N^{4'}$-tetra[1,1'-biphenyl]-4-yl)-[1,1'-biphenyl]-4,4'-diamine, a triphenylamine derivative such as 4,4',4''-tris(3-methylphenyl(phenyl)amino)triphenylamine, a starburst amine derivative, and the like), a stilbene derivative, a phthalocyanine derivative (non-metal, copper phthalocyanine, and the like), a pyrazoline derivative, a hydrazone-based compound, a benzofuran derivative, a thiophene derivative, an oxadiazole derivative, a quinoxaline derivative (for example, 1,4,5,8,9,12-hexaazatriphenylene-2,3,6,7,10,11-hexacarbonitrile, and the like), and a porphyrin derivative, and a polysilane. As a polymer-based compound, a polycarbonate, a styrene derivative, a polyvinylcarbazole, a polysilane and the like, which have the above-mentioned monomers in side chains, are preferable. However, there is no particular limitation as long as a compound can form a thin film necessary for manufacturing a light emitting element, can inject holes from a positive electrode, and can transport holes.

It is also known that electroconductivity of an organic semiconductor is strongly affected by doping of the material. Such an organic semiconductor matrix substance is formed of a compound having a good electron-donating property, or a compound having a good electron-accepting property. For doping with an electron-donating substance, a strong electron acceptor such as tetracyanoquinonedimethane (TCNQ) or 2,3,5,6-tetrafluorotetracyano-1,4-benzoquinonedimethane (F4TCNQ) is known (see, for example, "M. Pfeiffer, A. Beyer, T. Fritz, K. Leo, Appl. Phys. Lett., 73(22), 3202-3204 (1998)" and "J. Blochwitz, M. Pheiffer, T. Fritz, K. Leo, Appl. Phys. Lett., 73(6), 729-731 (1998)"). These compounds generate so-called holes by an electron transfer process in an electron-donating type base substance (hole transport substance). Electroconductivity of the base substance changes fairly significantly depending on the number and mobility of the holes. Known examples of a matrix substance having a hole transport characteristic include a benzidine derivative (TPD and the like), a starburst amine derivative (TDATA and the like), and a specific metal phthalocyanine (particularly, zinc phthalocyanine (ZnPc) and the like) (JP 2005-167175 A).

<Light Emitting Layer in Organic Electroluminescent Element>

The light emitting layer 105 emits light by recombining a hole injected from the positive electrode 102 and an electron injected from the negative electrode 108 between electrodes to which an electric field is applied. A material forming the light emitting layer 105 may be any compound as long as being excited by recombination of holes and electrons and emitting light (light emitting compound), and is preferably a compound that can form a stable thin film shape, and exhibits strong light emission (fluorescence) efficiency in a solid state. In the present invention, the polycyclic aromatic amino compound represented by the above general formula (1A) or (1B) can be used as the material for a light emitting layer.

The light emitting layer may be formed of a single layer or a plurality of layers, which is formed of a material for a light emitting layer (a host material and a dopant material). Each of the host material and the dopant material may be formed of a single kind, or a combination of a plurality of kinds. The dopant material may be included in the host material wholly or partially. As a doping method, a co-deposition method with the host material can be used. Alternatively, the dopant material may be mixed in advance with the host material, and then deposition may be performed simultaneously.

The amount of use of the host material may vary depending on the kind of the host material, and only needs to be determined according to characteristics of the host material. The reference of the amount of use of the host material is preferably 50 to 99.999% by weight, more preferably 80 to 99.95% by weight, and still more preferably 90 to 99.9% by weight with respect to the total amount of a material for a light emitting layer. The polycyclic aromatic amino compound represented by the above general formula (1A) or (1B) can also be used as the host material.

The amount of use of the dopant material may vary depending on the kind of the dopant material, and only needs to be determined according to characteristics of the dopant material. The reference of the amount of use of the dopant is preferably from 0.001 to 50% by weight, more preferably from 0.05 to 20% by weight, and still more preferably from 0.1 to 10% by weight with respect to the total amount of a material for a light emitting layer. The amount of use in the above range is preferable, for example, from a viewpoint that a concentration quenching phenomenon can be prevented. The polycyclic aromatic amino compound represented by the above general formula (1A) or (1B) can also be used as the dopant material.

Examples of the host material that can be used in combination with the polycyclic aromatic amino compound represented by the above general formula (1A) or (1B) include a fused ring derivative that has been traditionally known as a luminous body, such as anthracene or pyrene, a bisstyryl derivative such as a bisstyrylanthracene derivative or a distyrylbenzene derivative, a tetraphenylbutadiene derivative, a cyclopentadiene derivative, a fluorene derivative, and a benzofluorene derivative.

The dopant material that can be used in combination with the polycyclic aromatic amino compound represented by the above general formula (1A) or (1B) is not particularly limited, and an existing compound can be used. The dopant material can be selected from among various materials depending on a desired color of emitted light. Specific examples thereof include a fused ring derivative such as phenanthrene, anthracene, pyrene, tetracene, pentacene, perylene, naphthopyrene, dibenzopyrene, rubrene, or chrysene, a benzoxazole derivative, a benzothiazole derivative, a benzimidazole derivative, a benzotriazole derivative, an oxazole derivative, an oxadiazole derivative, a triazole derivative, an imidazole derivative, a thiadiazole derivative, a triazole derivative, a pyrazoline derivative, a stilbene derivative, a thiophene derivative, a tetraphenylbutadiene derivative, a cyclopentadiene derivative, a bisstyryl derivative such as a bisstyrylanthracene derivative or a distyrylbenzene derivative (JP 1-245087 A), a bisstyrylarylene derivative (JP 2-247278 A), a diazaindacene derivative, a furan derivative, a benzofuran derivative, an isobenzofuran derivative such as phenylisobenzofuran, dimesitylisobenzofuran, di(2-methylphenyl)isobenzofuran, di(2-trifluoromethylphenyl)isobenzofuran, or phenylisobenzofuran, a dibenzofuran derivative, a coumarin derivative such as a 7-dialkylaminocoumarin derivative, a 7-piperidinocoumarin derivative, a 7-hydroxycoumarin derivative, a 7-methoxycoumarin derivative, a 7-acetoxycoumarin derivative, a 3-benzothiazolylcoumarin derivative, a 3-benzimidazolylcoumarin derivative, or a 3-benzoxazolylcoumarin derivative, a dicyanomethylenepyran derivative, a dicyanomethylenethiopyran derivative, a polymethine derivative, a cyanine derivative, an oxobenzoanthracene derivative, a xanthene derivative, a rhodamine derivative, a fluorescein derivative, a pyrylium derivative, a carbostyryl derivative, an acridine derivative, an oxazine derivative, a phenylene oxide derivative, a quinacridone derivative, a quinazoline derivative, a pyrrolopyridine derivative, a furopyridine derivative, a 1,2,5-thiadiazolopyrene derivative, a pyromethene derivative, a perinone derivative, a pyrrolopyrrole derivative, a squarylium derivative, a violanthrone derivative, a phenazine derivative, an acridone derivative, a deazaflavine derivative, a fluorene derivative, and a benzofluorene derivative.

When the materials are exemplified for each emission color, examples of blue to bluish green dopant materials include an aromatic hydrocarbon compound and a derivative thereof, such as naphthalene, anthracene, phenanthrene, pyrene, triphenylene, perylene, fluorene, indene, or chrysene; an aromatic heterocyclic compound and a derivative thereof, such as furan, pyrrole, thiophene, silole, 9-silafluorene, 9,9'-spirobisilafluorene, benzothiophene, benzofuran, indole, dibenzothiophene, dibenzofuran, imidazopyridine, phenanthroline, pyrazine, naphthyridine, quinoxaline, pyrrolopyridine, or thioxanthene, a distyrylbenzene derivative, a tetraphenylbutadiene derivative, a stilbene derivative, an aldazine derivative, a coumarin derivative, an azole derivative such as imidazole, triazole, thiadiazole, carbazole, oxazole, oxadiazole, or triazole and a metal complex thereof, and an aromatic amine derivative represented by N,N'-diphenyl-N,N'-di(3-methylphenyl)-4,4'-diphenyl-1,1'-diamine.

Examples of green to yellow dopant materials include a coumarin derivative, a phthalimide derivative, a naphthalimide derivative, a perinone derivative, a pyrrolopyrrole derivative, a cyclopentadiene derivative, an acridone derivative, a quinacridone derivative, and a naphthacene derivative such as rubrene. Furthermore, suitable examples thereof include compounds obtained by introducing a substituent capable of making a wavelength longer, such as an aryl, a heteroaryl, an arylvinyl, an amino, or cyano, into the above compounds exemplified as the blue to bluish green dopant material.

Furthermore, examples of orange to red dopant materials include a naphthalimide derivative such as bis(diisopropylphenyl) perylene tetracarboxylic acid imide, a perinone derivative, a rare earth complex containing acetylacetone, benzoylacetone, or phenanthroline as a ligand, such as an Eu complex, 4-(dicyanomethylene)-2-methyl-6-(p-dimethylaminostyryl)-4H-pyran and an analogue thereof, a metal phthalocyanine derivative such as magnesium phthalocyanine or aluminum chlorophthalocyanine, a rhodamine compound, a deazaflavine derivative, a coumarin derivative, a quinacridone derivative, a phenoxazine derivative, an oxazine derivative, a quinazoline derivative, a pyrrolopyridine derivative, a squarylium derivative, a violanthrone derivative, a phenazine derivative, a phenoxazone derivative, and a thiadiazolopyrene derivative. Furthermore, suitable examples thereof include compounds obtained by introducing a substituent capable of making a wavelength longer, such as an aryl, a heteroaryl, an arylvinyl, an amino, or cyano, into the above compounds exemplified as blue to bluish green and green to yellow dopant materials.

In addition, dopants can be appropriately selected for use from among compounds described in "Kagaku Kogyo (Chemical Industry)", June 2004, p. 13, and reference documents described therein.

Among the dopant materials described above, particularly, an amine having a stilbene structure, a perylene derivative, a borane derivative, an aromatic amine derivative, a coumarin derivative, a pyran derivative, and a pyrene derivative are preferable.

An amine having a stilbene structure is represented by, for example, the following formula:

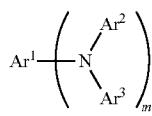

In the formula, Ar¹ represents an m-valent group derived from an aryl having 6 to 30 carbon atoms, and Ar² and Ar³ each independently represent an aryl having 6 to 30 carbon atoms, in which at least one of Ar¹ to Ar³ has a stilbene structure, Ar¹ to Ar³ may be substituted by an aryl, a heteroaryl, an alkyl, a trisubstituted silyl (silyl trisubstituted by an aryl and/or an alkyl), or cyano, and m represents an integer of 1 to 4.

The amine having a stilbene structure is more preferably a diaminostilbene represented by the following formula:

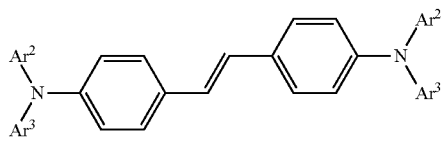

In the formula, Ar² and Ar³ each independently represent an aryl having 6 to 30 carbon atoms, and Ar² and Ar³ may be substituted by an aryl, a heteroaryl, an alkyl, a trisubstituted silyl (silyl trisubstituted by an aryl and/or an alkyl), or cyano.

Specific examples of the aryl having 6 to 30 carbon atoms include phenyl, naphthyl, acenaphthylenyl, fluorenyl, phenalenyl, phenanthrenyl, anthryl, fluoranthenyl, triphenylenyl, pyrenyl, chrysenyl, naphthacenyl, perylenyl, stilbenyl, distyrylphenyl, distyrylbiphenylyl, and Specific examples of the amine having a stilbene structure include N,N,N',N'-tetra(4-biphenylyl)-4,4'-diaminostilbene, N,N,N',N'-tetra(1-naphthyl)-4,4'-diaminostilbene, N,N,N', N'-tetra(2-naphthyl)-4,4'-diaminostilbene, N,N'-di(2-naphthyl)-N,N'-diphenyl-4,4'-diaminostilbene, N,N'-di(9-phenanthryl)-N,N'-diphenyl-4,4'-diaminostilbene, 4,4'-bis [4''-bis(diphenylamino)styryl]-biphenyl, 1,4-bis[4'-bis(diphenylamino)styryl]-benzene, 2,7-bis[4'-bis(diphenylamino)styryl]-9,9-dimethylfluorene, 4,4'-bis(9-ethyl-3-carbazovinylene)-biphenyl, and 4,4'-bis(9-phenyl-3-carbazovinylene)-biphenyl.

Amines having a stilbene structure described in JP 2003-347056 A, JP 2001-307884 A, and the like may also be used.

Examples of the perylene derivative include 3,10-bis(2,6-dimethylphenyl)perylene, 3,10-bis(2,4,6-trimethylphenyl) perylene, 3,10-diphenylperylene, 3,4-diphenylperylene, 2,5,8,11-tetra-t-butylperylene, 3,4,9,10-tetraphenylperylene, 3-(1'-pyrenyl)-8,11-di(t-butyl)perylene, 3-(9'-anthryl)-8,11-di(t-butyl)perylene, and 3,3'-bis(8,11-di(t-butyl)perylenyl).

Perylene derivatives described in JP 11-97178 A, JP 2000-133457 A, JP 2000-26324 A, JP 2001-267079 A, JP 2001-267078 A, JP 2001-267076 A, JP 2000-34234 A, JP 2001-267075 A, JP 2001-217077 A, and the like may also be used.

Examples of the borane derivative include 1,8-diphenyl-10-(dimesitylboryl)anthracene, 9-phenyl-10-(dimesitylboryl)anthracene, 4-(9'-anthryl)dimesitylborylnaphthalene, 4-(10'-phenyl-9'-anthryl)dimesitylborylnaphthalene, 9-(dimesitylboryl)anthracene, 9-(4'-biphenylyl)-10-(dimesitylboryl)anthracene, and 9-(4'-(N-carbazolyl)phenyl)-10-(dimesitylboryl)anthracene.

A borane derivative described in WO 2000/40586 A or the like may also be used.

The aromatic amine derivative is represented by, for example, the following formula:

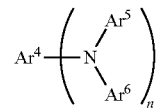

In the formula, Ar⁴ represents an n-valent group derived from an aryl having 6 to 30 carbon atoms, Ar⁵ and Ar⁶ each independently represent an aryl having 6 to 30 carbon atoms, Ar⁴ to Ar⁶ may be substituted by an aryl, a heteroaryl, an alkyl, a trisubstituted silyl (silyl trisubstituted by an aryl and/or an alkyl), or cyano, and n represents an integer of 1 to 4.

Particularly, Ar⁴ is a divalent group derived from anthracene, chrysene, fluorene, benzofluorene, or pyrene, Ar⁵ and Ar⁶ each independently represent an aryl having 6 to 30 carbon atoms, Ar⁴ to Ar⁶ may be substituted by an aryl, a heteroaryl, a trisubstituted silyl (silyl trisubstituted by an aryl and/or an alkyl), or cyano, and n represents 2.

Specific examples of the aryl having 6 to 30 carbon atoms include phenyl, naphthyl, acenaphthylenyl, fluorenyl, phenalenyl, phenanthryl, triphenylenyl, pyrenyl, naphthacenyl, perylenyl, and pentacenyl.

Examples of a chrysene-based aromatic amine derivative include N,N,N',N'-tetraphenylchrysene-6,12-diamine, N,N, N',N'-tetra(p-tolyl)chrysene-6,12-diamine, N,N,N',N'-tetra (m-tolyl)chrysene-6,12-diamine, N,N,N',N'-tetrakis(4-isopropylphenyl)chrysene-6,12-diamine, N,N,N',N'-tetra (naphthalen-2-yl)chrysene-6,12-dimine, N,N'-diphenyl-N, N'-di(p-tolyl)chrysesne-6,12-diamine, N,N'-diphenyl-N,N'-bis(4-ethylphenyl)chrysene-6,12-diamine, N,N'-diphenyl-N,N'-bis(4-ethylphenyl)chrysene-6,12-diamine, N,N'-diphenyl-N,N'-bis(4-isopropylphenyl)chrysene-6,12-diamine, N,N'-diphenyl-N,N'-bis(4-t-butylphenyl)chrysene-6,12-diamine, and N,N'-bis(4-isopropylphenyl)-N,N'-di(p-tolyl)chrysene-6,12-diamine.

Examples of a pyrene-based aromatic amine derivative include N,N,N',N'-tetraphenylpyrene-1,6-diamine, N,N,N', N'-tetra(p-tolyl)pyrene-1,6-diamine, N,N,N',N'-tetra(m-tolyl)pyrene-1,6-diamine, N,N,N',N'-tetrakis(4-isopropyophenyl)pyrene-1,6-diamine, N,N,N',N'-tetrakis(3,4-dimethylphenyl)pyrene-1,6-diamine, N,N'-diphenyl-N,N'-di (p-tolyl)pyrene-1,6-diamine, N,N'-diphenyl-N,N'-bis(4-ethylphenyl)pyrene-1,6-diamine, N,N'-diphenyl-N,N'-bis(4-ethylphenyl)pyrene-1,6-diamine, N,N'-diphenyl-N,N'-bis(4-isopropylphenyl)pyrene-1,6-diamine, N,N'-diphenyl-N,N'-bis(4-t-butylphenyl)pyrene-1,6-diamine, N,N'-bis(4-isopropylphenyl)-N,N'-di(p-tolyl)pyrene-1,6-diamine, N,N, N',N'-tetrakis(3,4-dimethylphenyl)-3,8-diphenylpyrene-1,6-diamine, N,N,N,N-tetraphenylpyrene-1,8-diamine, N,N'-bis (biphenyl-4-yl)-N,N'-diphenylpyrene-1,8-diamine, and N¹,N⁶-diphenyl-N¹,N⁶-bis(4-trimethylsilanyl-phenyl)-1H, 8H-pyrene-1,6-diamine.

Examples of an anthracene-based aromatic amine derivative include N,N,N,N-tetraphenylanthracene-9,10-diamine, N,N,N',N'-tetra(p-tolyl)anthracene-9,10-diamine, N,N,N', N'-tetra(m-tolyl)anthracene-9,10-diamine, N,N,N',N'-tetrakis(4-isopropylphenyl)anthracene-9,10-diamine, N,N'-diphenyl-N,N'-di(p-tolyl)anthracene-9,10-diamine, N,N'-diphenyl-N,N'-di(m-tolyl)anthracene-9,10-diamine, N,N'-diphenyl-N,N'-bis(4-ethylphenyl)anthracene-9,10-diamine, N,N'-diphenyl-N,N'-bis(4-ethylphenyl)anthracene-9,10-diamine, N,N'-diphenyl-N,N'-bis(4-isopropylphenyl)anthracene-9,10-diamine, N,N'-diphenyl-N,N'-bis(4-t-butylphenyl)anthracene-9,10-diamine, N,N'-bis(4-isopropylphenyl)-N,N'-di(p-tolyl)anthracene-9,10-diamine, 2,6-di-t-butyl-N,N,N',N'-tetra(p-tolyl)anthracene-9,10-diamine, 2,6-di-t-butyl-N,N'-diphenyl-N,N'-bis(4-isopropylphenyl) anthracene-9,10-diamine, 2,6-di-t-butyl-N,N'-bis(4-isopropylphenyl)-N,N'-di(p-tolyl)anthracene-9,10-diamine, 2,6-dicyclohexyl-N,N'-bis(4-isopropylphenyl)-N,N'-di(p-tolyl)anthracene-9,10-diamine, 2,6-dicyclohexyl-N,N'-bis(4-isopropylphenyl)-N,N'-bis(4-t-butylphenyl)anthracene-9,10-diamine, 9,10-bis(4-diphenylaminophenyl)anthracene, 9,10-bis(4-di(1-naphthylamino)phenyl)anthracene, 9,10-bis(4-di(2-naphthylamino)phenyl)anthracene, 10-di-p-tolylamino-9-(4-di-p-tolylamino-1-naphthyl)anthracene, 10-diphenylamino-9-(4-diphenylamino-1-naphthyl) anthracene, and 10-diphenylamino-9-(6-diphenylamino-2-naphthyl)anthracene.

Other examples include [4-(4-diphenylaminophenyl) naphthalen-1-yl]-diphenylamine, [6-(4-diphenylaminophenyl)naphthalen-2-yl]-diphenylamine, 4,4'-bis[4-diphenylaminonaphthalen-1-yl]biphenyl, 4,4'-bis[6-diphenylaminonaphthalen-2-yl]biphenyl, 4,4"-bis[4-diphenylaminonaphthalen-1-yl]-p-terphenyl, and 4,4"-bis [6-diphenylaminonaphthalen-2-yl]-p-terphenyl.

An aromatic amine derivative described in JP 2006-156888 A or the like may also be used.

Examples of the coumarin derivative include coumarin-6 and coumarin-334.

Coumarin derivatives described in JP 2004-43646 A, JP 2001-76876 A, JP 6-298758 A, and the like may also be used.

Examples of the pyran derivative include DCM and DCJTB described below.

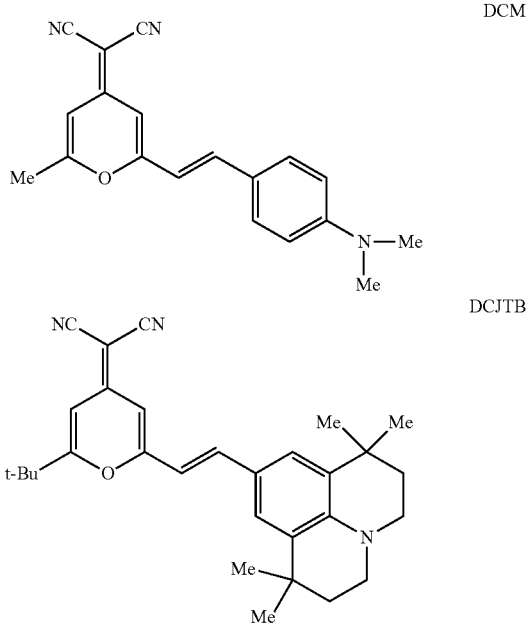

Pyran derivatives described in JP 2005-126399 A, JP 2005-097283 A, JP 2002-234892 A, JP 2001-220577 A, JP 2001-081090 A, JP 2001-052869 A, and the like may also be used.

<Electron Injection Layer and Electron Transport Layer in Organic Electroluminescent Element>

The electron injection layer 107 plays a role of efficiently injecting electrons migrating from the negative electrode 108 into the light emitting layer 105 or the electron transport layer 106. The electron transport layer 106 plays a role of efficiently transporting electrons injected from the negative electrode 108, or electrons injected from the negative electrode 108 through the electron injection layer 107 to the light emitting layer 105. The electron transport layer 106 and the electron injection layer 107 are each formed by laminating and mixing one or more kinds of electron transport/injection materials, or by a mixture of an electron transport/injection material and a polymer binder.

The electron injection/transport layer is a layer that manages injection of electrons from the negative electrode and transport of electrons, and is desirably a layer that has high electron injection efficiency and efficiently transports injected electrons. For this purpose, the electron injection/transport layer is preferably formed of a substance having high electron affinity, large electron mobility, and excellent stability, and hardly generating impurities that serve as traps at the time of manufacturing and at the time of use. However, when a transport balance between holes and electrons is considered, in a case where the electron injection/transport layer mainly plays a role of efficiently blocking holes coming from a positive electrode from flowing toward a negative electrode side without being recombined, even if electron transporting ability is not so high, an effect of enhancing light emission efficiency is equal to that of a material having high electron transporting ability. Therefore, the electron injection/transport layer in the present embodiment may also have a function of a layer that can efficiently block migration of holes.

As a material forming the electron transport layer 106 or the electron injection layer 107 (electron transport material), the polycyclic aromatic amino compound represented by the above general formula (1A) or (1B) can be used. Any compound can be selected for use from among compounds that have been conventionally used as an electron transferring compound in a photoconductive material, and known compounds used in an electron injection layer and an electron transport layer of an organic electroluminescent element.

A material used for the electron transport layer or the electron injection layer preferably contains at least one selected from a compound formed of an aromatic ring or a heteroaromatic ring constituted by one or more kinds of atoms selected from carbon, hydrogen, oxygen, sulfur, silicon, and phosphorus atoms, a pyrrole derivative and a fused ring derivative thereof, and a metal complex having an electron-accepting nitrogen atom. Specific examples of the material include a fused ring-based aromatic ring derivative such as naphthalene or anthracene, a styryl-based aromatic ring derivative represented by 4,4'-bis(diphenylethenyl)biphenyl, a perinone derivative, a coumarin derivative, a naphthalimide derivative, a quinone derivative such as anthraquinone or diphenoquinone, a phosphorus oxide derivative, a carbazole derivative, and an indole derivative. Examples of the metal complex having an electron-accepting nitrogen atom include a hydroxyazole complex such as a hydroxyphenyloxazole complex, an azomethine complex, a tropolone metal complex, a flavonol metal complex, and a benzoquinoline metal complex. These materials are used singly, but may also be used as a mixture with other materials.

Specific examples of other electron transferring compounds include a pyridine derivative, a naphthalene derivative, an anthracene derivative, a phenanthroline derivative, a perinone derivative, a coumarin derivative, a naphthalimide derivative, an anthraquinone derivative, a diphenoquinone derivative, a diphenylquinone derivative, a perylene derivative, an oxadiazole derivative (1,3-bis[(4-t-butylphenyl)-1,3,4-oxadiazolyl]phenylene, and the like), a thiophene derivative, a triazole derivative (N-naphthyl-2,5-diphenyl-1,3,4-triazole, and the like), a thiadiazole derivative, a metal complex of an oxine derivative, a quinolinol-based metal complex, a quinoxaline derivative, a polymer of a quinoxaline derivative, a benzazole compound, a gallium complex, a pyrazole derivative, a perfluorinated phenylene derivative, a triazine derivative, a pyrazine derivative, a benzoquinoline derivative (2,2'-bis(benzo[h]quinolin-2-yl)-9,9'-spirobifluorene, and the like), an imidazopyridine derivative, a borane derivative, a benzimidazole derivative (tris(N-phenylbenzimidazol-2-yl)benzene, and the like), a benzoxazole derivative, a benzothiazole derivative, a quinoline derivative, an oligopyridine derivative such as terpyridine, a bipyridine derivative, a terpyridine derivative (1,3-bis(4'-(2,2':6'2''-terpyridinyl))benzene, and the like), a naphthyridine derivative (bis(1-naphthyl)-4-(1,8-naphthyridin-2-yl)phenylphosphine oxide, and the like), an aldazine derivative, a carbazole derivative, an indole derivative, a phosphorus oxide derivative, and a bisstyryl derivative.

A metal complex having an electron-accepting nitrogen atom can also be used, and examples thereof include a quinolinol-based metal complex, a hydroxyazole complex such as a hydroxyphenyloxazole complex, an azomethine complex, a tropolone-metal complex, a flavonol-metal complex, and a benzoquinoline-metal complex.

The materials described above are used singly, but may also be used as a mixture with other materials.

Among the materials described above, a quinolinol-based metal complex, a bipyridine derivative, a phenanthroline derivative, and a borane derivative are preferable.

The quinolinol-based metal complex is a compound represented by the following general formula (E-1).

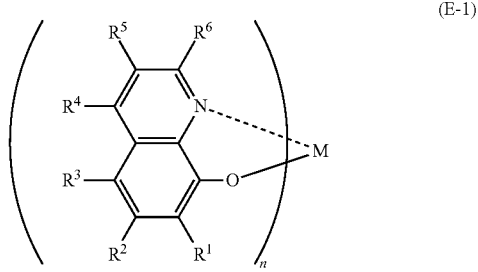

(E-1)

In the formula, $R^1$ to $R^6$ each independently represent a hydrogen atom, a fluorine atom, an alkyl, an aralkyl, an alkenyl, cyano, an alkoxy, or an aryl, M represents Li, Al, Ga, Be, or Zn, and n represents an integer of 1 to 3.

Specific examples of the quinolinol-based metal complex include 8-quinolinollithium, tris(8-quinolinolato)aluminum, tris(4-methyl-8-quinolinolato) aluminum, tris(5-methyl-8-quinolinolato)aluminum, tris(3,4-dimethyl-8-quiolinolato) aluminum, tris(4,5-dimethyl-8-quinolinolato)aluminum, tris (4,6-dimethyl-8-quinolinolato)aluminum, bis(2-methyl-8-quinolinolato) (phenolato)aluminum, bis(2-methyl-8-quinolinolato) (2-methylphenolato)aluminum, bis(2-methyl-8-quinolinolato) (3-methylphenolato)aluminum, bis (2-methyl-8-quinolinolato) (4-methylphenolato)aluminum, bis(2-methyl-8-quinolinolato) (2-phenylphenolato)aluminum, bis(2-methyl-8-quinolinolato) (3-phenylphenolato) aluminum, bis(2-methyl-8-quinolinolato) (4-phenylphenolato)aluminum, bis(2-methyl-8-quinolinolato) (2,3-dimethylphenolato)aluminum, bis(2-methyl-8-quinolinolato) (2,6-dimethylphenolato)aluminum, bis(2-methyl-8-quinolinolato) (3,4-dimethylphenolato)aluminum, bis(2-methyl-8-quinolinolato) (3,5-dimethylphenolato)aluminum, bis(2-methyl-8-quinolinolato) (3,5-di-t-butylphenolato)aluminum, bis(2-methyl-8-quinolinolato) (2,6-diphenylphenolato)aluminum, bis(2-methyl-8-quinolinolato) (2,4,6-triphenylphenolato)aluminum, bis(2-methyl-8-quinolinolato) (2,4,6-trimethylphenolato)aluminum, bis(2-methyl-8-quinolinolato) (2,4,5,6-tetramethylphenolato)aluminum, bis(2-methyl-8-quinolinolato) (1-naphtholato) aluminum, bis(2-methyl-8-quinolinolato) (2-naphtholato) aluminum, bis(2,4-dimethyl-8-quinolinolato) (2-phenylphenolato)aluminum, bis(2,4-dimethyl-8-quinolinolato) (3-phenylphenolato)aluminum, bis(2,4-dimethyl-8-quinolinolato) (4-phenylphenolato)aluminum, bis(2,4-dimethyl-8-quinolinolato) (3,5-dimethylphenolato)aluminum, bis(2,4-dimethyl-8-quinolinolato) (3,5-di-t-butylphenolato) aluminum, bis(2-methyl-8-quinolinolato)aluminum-μ-oxo-bis(2-methyl-8-quinolinolato)aluminum, bis(2,4-dimethyl-8-quinolinolato)aluminum-μ-oxo-bis(2,4-dimethyl-8-quinolinolato)aluminum, bis(2-methyl-4-ethyl-8-quinolinolato)aluminum-μ-oxo-bis(2-ethyl-4-ethyl-8-quinolinolato)aluminum, bis(2-methyl-4-methoxy-8-quinolinolato)aluminum-μ-oxo-bis(2-methyl-4-methoxy-8-quiniolinoato)aluminum, bis(2-methyl-5-cyano-8-quinolinolato)aluminum-μ-oxo-bis(2-methyl-5-cyano-8-quinolinolato)aluminum, bis(2-methyl-5-trifluoromethyl-8-quinolinolato)aluminum-μ-oxo-bis(2-methyl-5-trifluoromethyl-8-quiolinolato)aluminum, and bis(10-hydroxybenzo[h]quinoline)beryllium.

The bipyridine derivative is a compound represented by the following general formula (E-2).

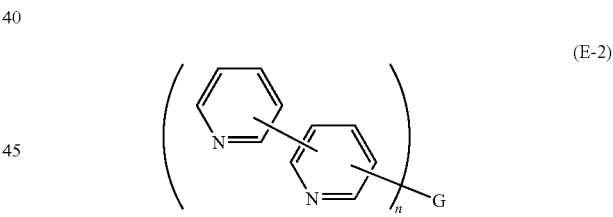

(E-2)

In the formula, G represents a simple bond or an n-valent linking group, and n represents an integer of 2 to 8. A carbon atom not used for bonding of pyridine-pyridine or pyridine-G may be substituted by an aryl, a heteroaryl, an alkyl, or cyano.

Examples of G in general formula (E-2) include groups represented by the following structural formulas. Note that Rs in the following structural formulas each independently represent a hydrogen atom, methyl, ethyl, isopropyl, cyclohexyl, phenyl, 1-naphthyl, 2-naphthyl, biphenylyl, or terphenylyl.

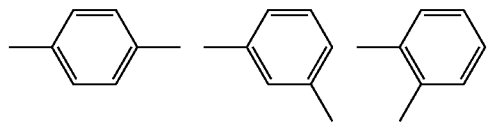

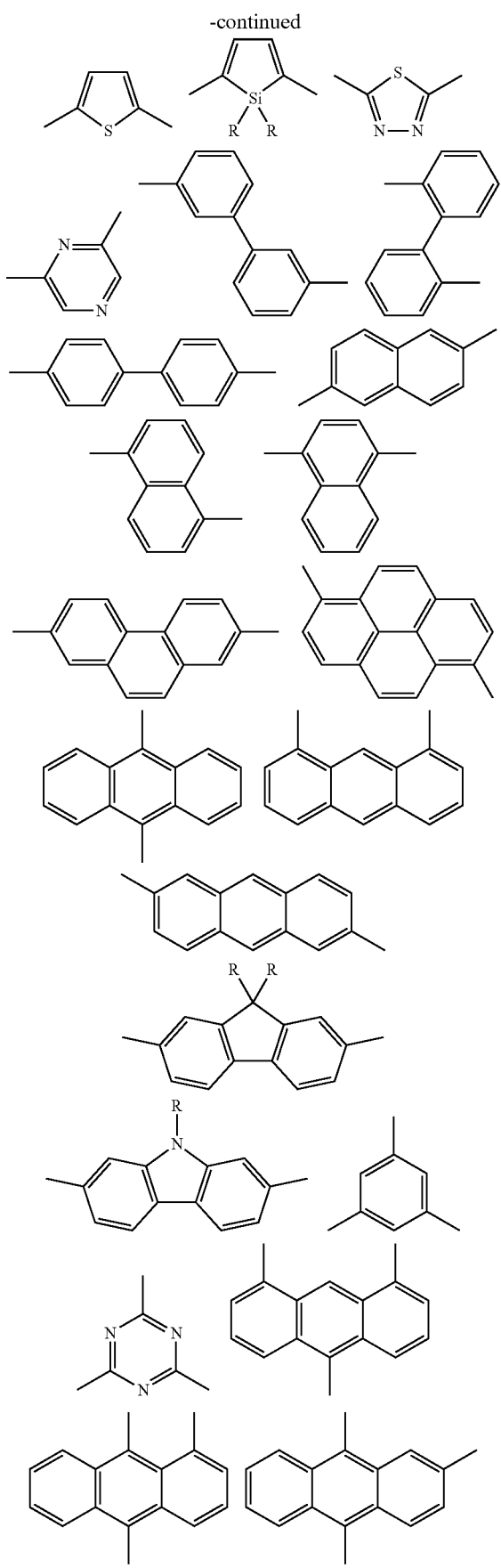
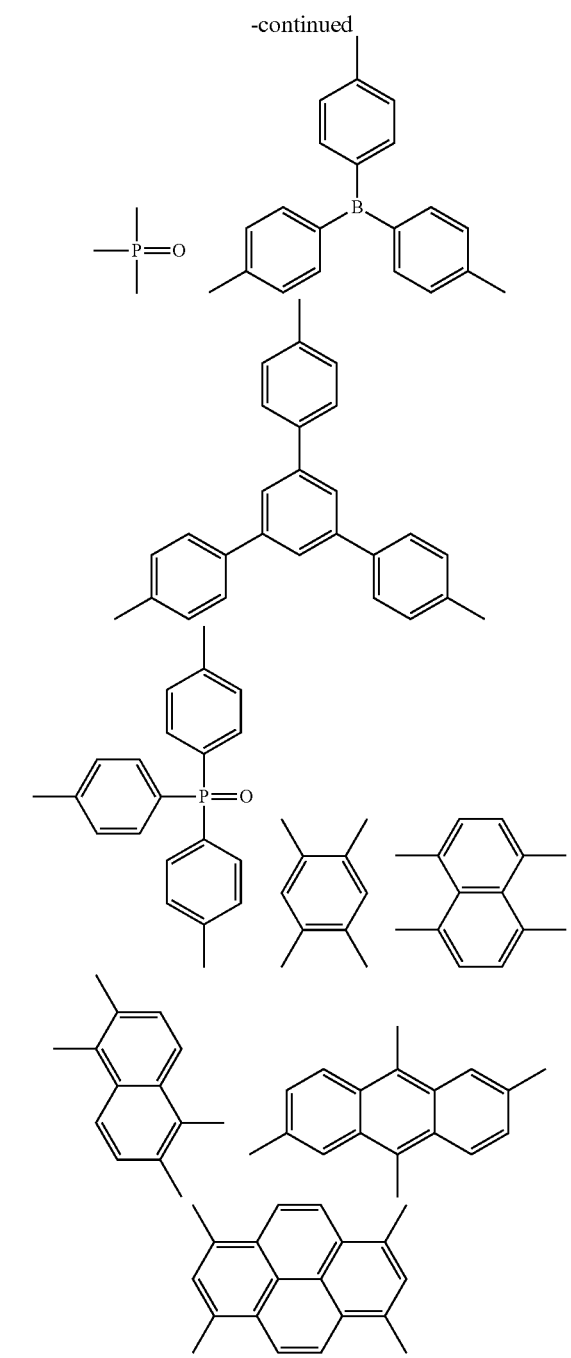

Specific examples of the pyridine derivative include 2,5-bis(2,2'-pyridin-6-yl)-1,1-dimethyl-3,4-diphenylsilole, 2,5-bis(2,2'-pyridin-6-yl)-1,1-dimethyl-3,4-dimesitylsilole, 2,5-bis(2,2'-pyridin-5-yl)-1,1-dimethyl-3,4-diphenylsilole, 2,5-bis(2,2'-pyridin-5-yl)-1,1-dimethyl-3,4-dimesitylsilole, 9,10-di(2,2'-pyridin-6-yl)anthracene, 9,10-di(2,2'-pyridin-5-yl)anthracene, 9,10-di(2,3'-pyridin-6-yl)anthracene, 9,10-di(2,3'-pyridin-5-yl)anthracene, 9,10-di(2,3'-pyridin-6-yl)-2-phenylanthracene, 9,10-di(2,3'-pyridin-5-yl)-2-phenylanthracene, 9,10-di(2,2'-pyridin-6-yl)-2-phenylanthracene, 9,10-di(2,2'-pyridin-5-yl)-2-phenylanthracene, 9,10-di(2,4'-pyridin-6-yl)-2-phenylanthracene, 9,10-di(2,4'-pyridin-5-yl)-2-phenylanthracene, 9,10-di(3,4'-pyridin-6-yl)-2- phenylanthracene, 9,10-di(3,4'-pyridin-5-yl)-2-phenylanthracene, 3,4-diphenyl-2,5-di(2,2'-pyridin-6-yl)thiophene, 3,4-diphenyl-2,5-di(2,3'-pyridin-5-yl)thiophene, and 6',6''-di(2-pyridyl)-2,2':4',4'':2'',2'''-quaterpyridine.

The phenanthroline derivative is a compound represented by the following general formula (E-3-1) or (E-3-2).

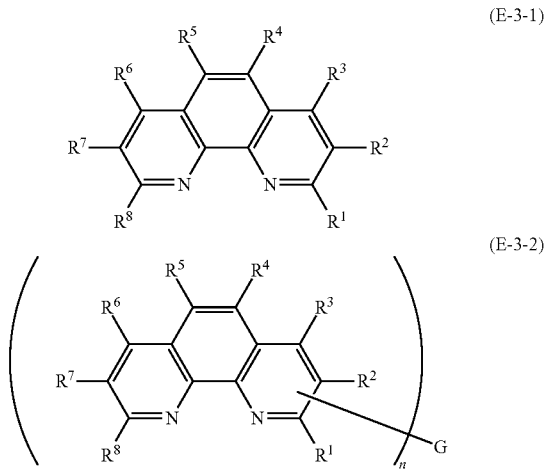

In the formula, $R^1$ to $R^8$ each independently represent a hydrogen atom, an alkyl (methyl, ethyl, isopropyl, hydroxyethyl, methoxymethyl, trifluoromethyl, t-butyl, cyclopentyl, cyclohexyl, benzyl, or the like), an alkyloxy (methoxy, ethoxy, isopropoxy, butoxy, or the like), an aryloxy (phenoxy, 1-naphthyloxy, 4-tolyloxy, or the like), a halogen atom (a fluorine atom, a chlorine atom, a bromine atom, an iodine atom, or the like), an aryl (phenyl, naphthyl, p-tolyl, p-chlorophenyl, or the like), an alkylthio (methylthio, ethylthio, isopropylthio, or the like), an arylthio (phenylthio or the like), cyano, nitro, a heterocyclic ring (pyrrole, pyrrolidyl, pyrazolyl, imidazolyl, pyridyl, benzimidazolyl, benzthiazolyl, benzoxazolyl, or the like), or the like. An alkyl and a halogen atom are preferable, and methyl, ethyl, isopropyl, and a fluorine atom are more preferable. Adjacent groups may be bonded to each other to form a fused ring. G represents a simple bond or an n-valent linking group. n represents an integer of 2 to 8. Examples of G in general formula (E-3-2) include the same groups as those described in the section of the bipyridine derivative.

Specific examples of the phenanthroline derivative include 4,7-diphenyl-1,10-phenanthroline, 2,9-dimethyl-4,7-diphenyl-1,10-phenanthroline, 9,10-di(1,10-phenanthrolin-2-yl) anthracene, 2,6-di(1,10-phenanthrolin-5-yl) pyridine, 1,3,5-tri(1,10-phenanthrolin-5-yl) benzene, 9,9'-difluoro-bi(1,10-phenanthrolin-5-yl), bathocuproine, and 1,3-bis(2-phenyl-1,10-phenanthrolin-9-yl) benzene.

Particularly, a case of using a phenanthroline derivative in the electron transport layer or the electron injection layer will be described. In order to obtain stable light emission over a long time, a material having excellent thermal stability or thin film formability is desired. Among phenanthroline derivatives, a phenanthroline derivative in which a substituent itself has a three-dimensional steric structure, a phenanthroline derivative having a three-dimensional steric structure as a result of steric repulsion between a substituent and a phenanthroline skeleton or between a substituent and an adjacent substituent, or a phenanthroline derivative having a plurality of phenanthroline skeletons linked together, is preferable. Furthermore, in a case of linking a plurality of phenanthroline skeletons, a compound containing a conjugated bond, a substituted or unsubstituted aromatic hydrocarbon, or a substituted or unsubstituted heterocyclic aromatic ring in a linked unit, is more preferable.

The borane derivative is a compound represented by the following general formula (E-4), and is specifically disclosed in JP 2007-27587 A.

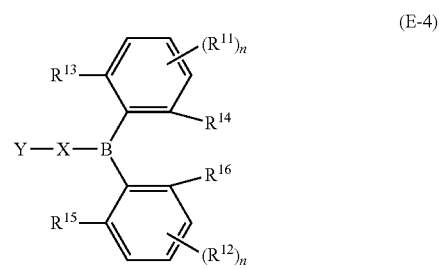

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl or an optionally substituted aryl, X represents an optionally substituted arylene, Y represents an optionally substituted aryl having 16 or fewer carbon atoms, a substituted boryl, or an optionally substituted carbazolyl, and n's each independently represent an integer of 0 to 3. Examples of a substituent in a case of being "optionally substituted" or "substituted" include an aryl, a heteroaryl, and an alkyl.

Among compounds represented by the above general formula (E-4), a compound represented by the following general formula (E-4-1) and compounds represented by the following general formulas (E-4-1-1) to (E-4-1-4), are preferable. Specific examples thereof include 9-[4-(4-dimesitylborylnaphthalen-1-yl)phenyl]carbazole and 9-[4-(4-dimesitylborylnaphthalen-1-yl)naphthalen-1-yl]carbazole.

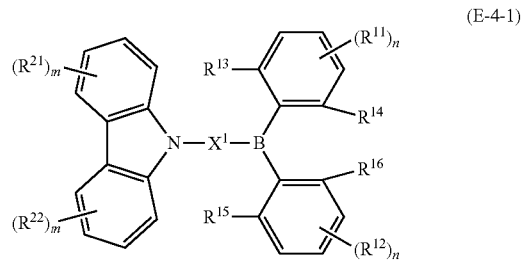

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl or an optionally substituted aryl, $R^{21}$ and $R^{22}$ each independently represent at least one of a hydrogen atom, an alkyl, an optionally substituted aryl, a substituted silyl, an optionally substituted nitrogen-containing heterocyclic ring, and cyano, $X^1$ represents an optionally substituted arylene having 20 or fewer carbon atoms, n's each independently represent an integer of 0 to 3, and m's each independently represent an integer of 0 to 4. Examples of a substituent in a case of being "optionally substituted" or "substituted" include an aryl, a heteroaryl, and an alkyl.

(E-4-1-1)

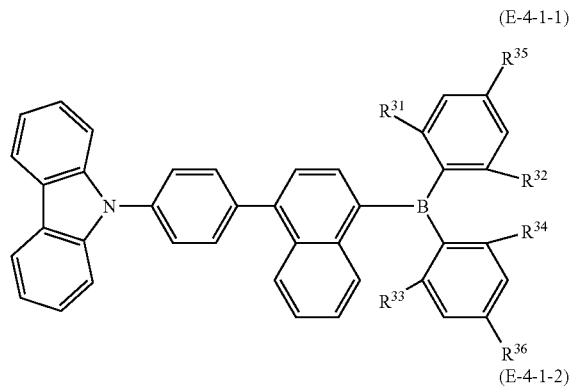

(E-4-1-2)

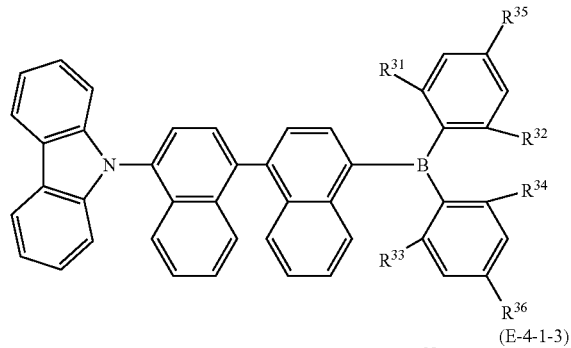

(E-4-1-3)

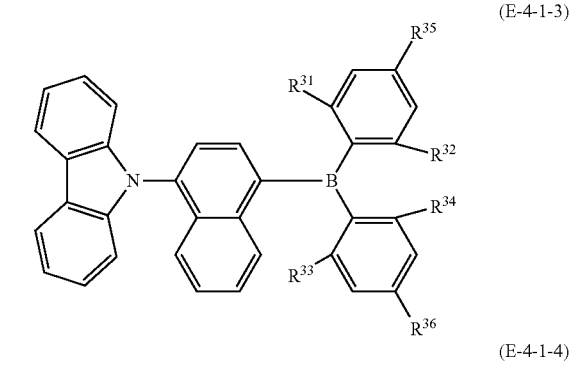

(E-4-1-4)

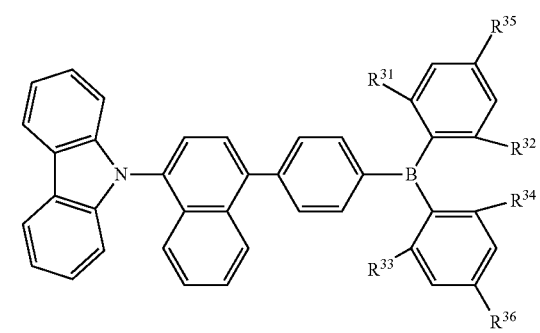

In each of the formulas, $R^{31}$ to $R^{34}$ each independently represent any one of methyl, isopropyl, and phenyl, and $R^{35}$ and $R^{36}$ each independently represent any one of a hydrogen atom, methyl, isopropyl, and phenyl.

Among compounds represented by the above general formula (E-4), a compound represented by the following general formula (E-4-2) and a compound represented by the following general formula (E-4-2-1) are preferable.

(E-4-2)

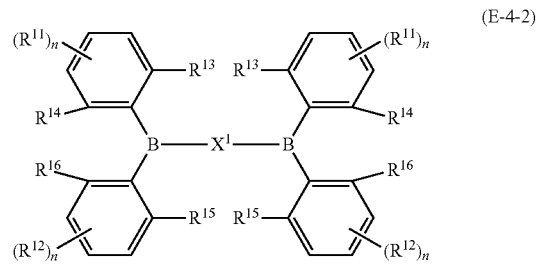

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl or an optionally substituted aryl, $X^1$ represents an optionally substituted arylene having 20 or fewer carbon atoms, and n's each independently represent an integer of 0 to 3. Examples of a substituent in a case of being "optionally substituted" or "substituted" include an aryl, a heteroaryl, and an alkyl.

(E-4-2-1)

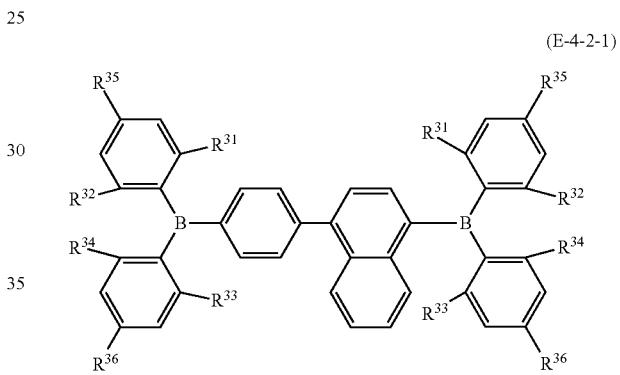

In the formula, $R^{31}$ to $R^{34}$ each independently represent any one of methyl, isopropyl, and phenyl, and $R^{35}$ and $R^{36}$ each independently represent any one of a hydrogen atom, methyl, isopropyl, and phenyl.

Among compounds represented by the above general formula (E-4), a compound represented by the following general formula (E-4-3) and compounds represented by the following general formulas (E-4-3-1) and (E-4-3-2) are preferable.

(E-4-3)

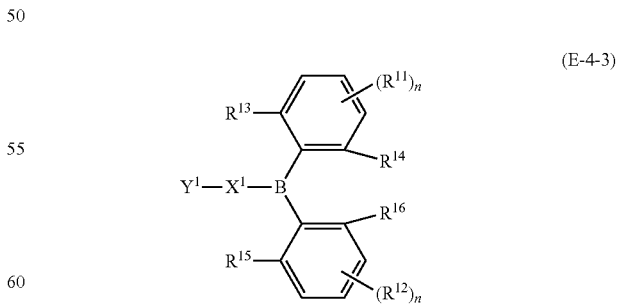

In the formula, $R^{11}$ and $R^{12}$ each independently represent at least one of a hydrogen atom, an alkyl, an optionally substituted aryl, a substituted silyl, an optionally substituted nitrogen-containing heterocyclic ring, and cyano, $R^{13}$ to $R^{16}$ each independently represent an optionally substituted alkyl or an optionally substituted aryl, $X^1$ represents an optionally substituted arylene having 10 or fewer carbon atoms, $Y^1$ represents an optionally substituted aryl having 14 or fewer carbon atoms, and n's each independently represent an integer of 0 to 3. Examples of a substituent in a case of being "optionally substituted" or "substituted" include an aryl, a heteroaryl, and an alkyl.

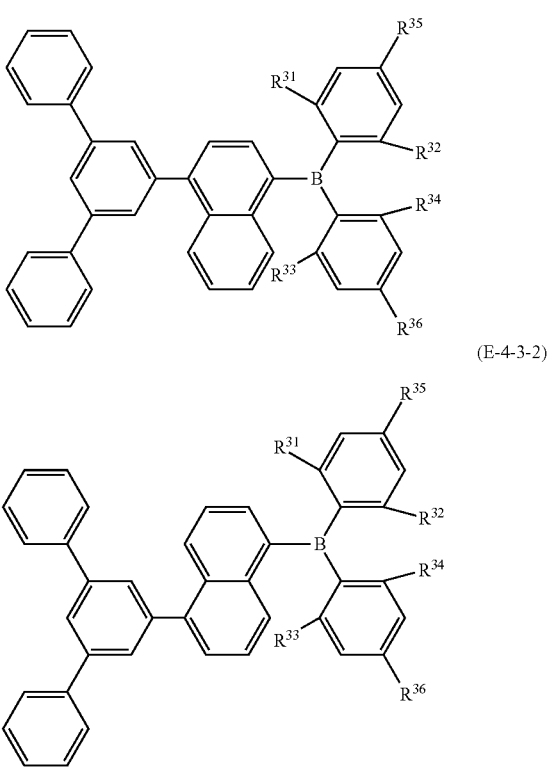

In each of the formulas, $R^{31}$ to $R^{34}$ each independently represent any one of methyl, isopropyl, and phenyl, and $R^{35}$ and $R^{36}$ each independently represent any one of a hydrogen atom, methyl, isopropyl, and phenyl.

The benzimidazole derivative is a compound represented by the following general formula (E-5).

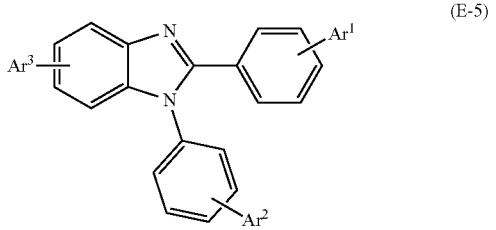

In the formula, $Ar^1$ to $Ar^3$ each independently represent a hydrogen atom or an optionally substituted aryl having 6 to 30 carbon atoms. Examples of a substituent in a case of being optionally substituted include an aryl, a heteroaryl, an alkyl, and cyano. In particular, a benzimidazole derivative in which $Ar^1$ represents anthryl optionally substituted by an aryl, a heteroaryl, an alkyl, or cyano is preferable.

Specific examples of the aryl having 6 to 30 carbon atoms include phenyl, 1-naphthyl, 2-naphthyl, acenaphthylen-1-yl, acenaphthylen-3-yl, acenaphthylen-4-yl, acenaphthylen-5-yl, fluoren-1-yl, fluoren-2-yl, fluoren-3-yl, fluoren-4-yl, fluoren-9-yl, phenalen-1-yl, phenalen-2-yl, 1-phenanthryl, 2-phenanthryl, 3-phenanthryl, 4-phenanthryl, 9-phenanthryl, 1-anthryl, 2-anthryl, 9-anthryl, fluoranthen-1-yl, fluoranthen-2-yl, fluoranthen-3-yl, fluoranthen-7-yl, fluoranthen-8-yl, triphenylen-1-yl, triphenylen-2-yl, pyren-1-yl, pyren-2-yl, pyren-4-yl, chrysen-1-yl, chrysen-2-yl, chrysen-3-yl, chrysen-4-yl, chrysen-5-yl, chrysen-6-yl, naphthacen-1-yl, naphthacen-2-yl, naphthacen-5-yl, perylen-1-yl, perylen-2-yl, perylen-3-yl, pentacen-1-yl, pentacen-2-yl, pentacen-5-yl, and pentacen-6-yl.

Specific examples of the benzimidazole derivative include 1-phenyl-2-(4-(10-phenylanthracen-9-yl)phenyl)-1H-benzo[d]imidazole, 2-(4-(10-(naphthalen-2-yl)anthracen-9-yl)phenyl)-1-phenyl-1H-benzo[d]imidazole, 2-(3-(10-(naphthalen-2-yl)anthracen-9-yl)phenyl)-1-phenyl-1H-benzo[d]imidazole, 5-(10-(naphthlen-2-yl)anthracen-9-yl)-1,2-diphenyl-1H-benzo[d]imidazole, 1-(4-(10-(naphthalen-2-yl)anthracen-9-yl)phenyl)-2-phenyl-1H-benzo[d]imidazole, 2-(4-(9,10-di(naphthalen-2-yl)anthracen-2-yl)phenyl)-1-phenyl-1H-benzo[d]imidazole, 1-(4-(9,10-di(naphthalen-2-yl)anthracen-2-yl)phenyl)-2-phenyl-1H-benzo[d]imidazole, and 5-(9,10-di(naphthalen-2-yl)anthracen-2-yl)-1,2-diph diphenyl-1H-benzo[d]imidazole.

The electron transport layer or the electron injection layer may further contain a substance that can reduce a material forming the electron transport layer or electron injection layer. Regarding this reducing substance, various substances may be used as long as having reducibility to a certain extent. For example, at least one selected from the group consisting of alkali metals, alkaline earth metals, rare earth metals, oxides of alkali metals, halides of alkali metals, oxides of alkaline earth metals, halides of alkaline earth metals, oxides of rare earth metals, halides of rare earth metals, organic complexes of alkali metals, organic complexes of alkaline earth metals, and organic complexes of rare earth metals, can be suitably used.

Preferable examples of the reducing substance include alkali metals such as Na (work function 2.36 eV), K (work function 2.28 eV), Rb (work function 2.16 eV), and Cs (work function 1.95 eV); and alkaline earth metals such as Ca (work function 2.9 eV), Sr (work function 2.0 to 2.5 eV), and Ba (work function 2.52 eV). A reducing substance having a work function of 2.9 eV or less is particularly preferable. Among these, more preferable examples of the reducing substance include alkali metals such as K, Rb and Cs, still more preferable examples include Rb and Cs, and the most preferable example is Cs. These alkali metals have particularly high reducing ability. By adding the alkali metals in a relatively small amount to a material forming the electron transport layer or electron injection layer, emission luminance is improved, and a lifetime is lengthened in an organic EL element. As the reducing substance having a work function of 2.9 eV or less, a combination of two or more kinds of these alkali metals is also preferable, and particularly, a combination including Cs, for example, a combination of Cs with Na, a combination of Cs with K, a combination of Cs with Rb, or a combination of Cs with Na and K, is preferable. By inclusion of Cs, the reducing ability can be efficiently exhibited. By adding Cs to a material forming the electron transport layer or electron injection layer, emission luminance is improved, and a lifetime is lengthened in an organic EL element.

<Negative Electrode in Organic Electroluminescent Element>

The negative electrode 108 plays a role of injecting electrons to the light emitting layer 105 through the electron injection layer 107 and the electron transport layer 106.

A material forming the negative electrode 108 is not particularly limited as long as being a substance capable of efficiently injecting electrons to an organic layer. However, a material similar to the material forming the positive electrode 102 can be used. Among these materials, a metal such as tin, indium, calcium, aluminum, silver, copper, nickel, chromium, gold, platinum, iron, zinc, lithium, sodium, potassium, cesium, or magnesium, and alloys thereof (a magnesium-silver alloy, a magnesium-indium alloy, an aluminum-lithium alloy such as lithium fluoride/aluminum, and the like) are preferable. In order to enhance element characteristics by increasing electron injection efficiency, lithium, sodium, potassium, cesium, calcium, magnesium, or an alloy containing these low work function-metals is effective. However, many of these low work function-metals are generally unstable in air. In order to ameliorate this problem, for example, a method using an electrode having high stability obtained by doping an organic layer with a trace amount of lithium, cesium, or magnesium is known. Other examples of the dopant that can be used include an inorganic salt such as lithium fluoride, cesium fluoride, lithium oxide, or cesium oxide. However, the dopant is not limited thereto.

Furthermore, in order to protect an electrode, preferably, for example, a metal such as platinum, gold, silver, copper, iron, tin, aluminum, or indium, an alloy using these metals, an inorganic substance such as silica, titania, or silicon nitride, polyvinyl alcohol, vinyl chloride, a hydrocarbon-based polymer compound, or the like may be laminated. A method for manufacturing these electrodes is not particularly limited as long as the method is capable of conduction, such as resistance heating, electron beam vapor deposition, sputtering, ion plating, or coating.

<Binder that may be used in Each Layer>

The above materials used for the hole injection layer, the hole transport layer, the light emitting layer, the electron transport layer, and the electron injection layer can form the layers by being used singly. However, it is also possible to use the materials by dispersing the materials in a solvent-soluble resin such as polyvinyl chloride, polycarbonate, polystyrene, poly(N-vinylcarbazole), polymethyl methacrylate, polybutyl methacrylate, polyester, polysulfone, polyphenylene oxide, polybutadiene, a hydrocarbon resin, a ketone resin, a phenoxy resin, polyamide, ethyl cellulose, a vinyl acetate resin, an ABS resin, or a polyurethane resin, or a curable resin such as a phenolic resin, a xylene resin, a petroleum resin, a urea resin, a melamine resin, an unsaturated polyester resin, an alkyd resin, an epoxy resin, or a silicone resin, as a polymer binder.

<Method for Manufacturing Organic Electroluminescent Element>

Each layer constituting an organic electroluminescent element can be formed by forming thin films of materials to constitute each layer by a method such as a vapor deposition method, resistance heating vapor deposition, electron beam vapor deposition, sputtering, a molecular lamination method, a printing method, a spin coating method, a casting method, or a coating method. The film thickness of each layer thus formed is not particularly limited, and can be appropriately set according to a property of a material, but is usually within a range of 2 nm to 5000 nm. The film thickness can be usually measured using a crystal oscillation type film thickness analyzer or the like. In the case of forming a thin film using a vapor deposition method, the deposition conditions vary with the kind of the material, the intended crystal structure and association structure of the film, and the like. It is preferable to appropriately set the vapor deposition conditions generally in ranges of a vapor deposition crucible of +50° C. to +400° C., a degree of vacuum of $10^{-6}$ to $10^{-3}$ Pa, a vapor deposition rate of 0.01 to 50 nm/second, a substrate temperature of −150° C. to +300° C., and a film thickness of 2 nm to 5 μm.

Next, as an example of a method for manufacturing an organic electroluminescent element, a method for manufacturing an organic electroluminescent element formed of positive electrode/hole injection layer/hole transport layer/light emitting layer formed of a host material and a dopant material/electron transport layer/electron injection layer/negative electrode will be described. A thin film of a positive electrode material is formed on an appropriate substrate by a vapor deposition method or the like to manufacture a positive electrode, and then thin films of a hole injection layer and a hole transport layer are formed on this positive electrode. A thin film is formed thereon by co-vapor depositing a host material and a dopant material to form a light emitting layer. An electron transport layer and an electron injection layer are formed on this light emitting layer, and a thin film formed of a substance for a negative electrode is further formed by a vapor deposition method or the like to form a negative electrode. An intended organic electroluminescent element is thereby obtained. Incidentally, in manufacturing an organic electroluminescent element described above, it is also possible to manufacture an organic electroluminescent element by reversing the manufacturing order, that is, in order of a negative electrode, an electron injection layer, an electron transport layer, a light emitting layer, a hole transport layer, a hole injection layer, and a positive electrode.

In a case where a direct current voltage is applied to an organic electroluminescent element obtained in this manner, it is only required to apply a positive polarity to the positive electrode and a negative polarity to the negative electrode. When a voltage of about 2 to 40 V is applied, light emission can be observed from a transparent or semitransparent electrode side (the positive electrode or the negative electrode, or both thereof). This organic electroluminescent element emits light also in a case where a pulse current or an alternating current is applied. Note that a waveform of the alternating current applied may be any waveform.

<Application Examples of Organic Electroluminescent Element>

The present invention can also be applied to a display apparatus including an organic electroluminescent element, a lighting apparatus including an organic electroluminescent element, or the like.

The display apparatus or lighting apparatus including an organic electroluminescent element can be manufactured by a known method such as connecting the organic electroluminescent element according to the present exemplary embodiment to a known driving apparatus, and can be driven by appropriately using a known driving method such as direct current driving, pulse driving or alternating current driving.

Examples of the display apparatus include a panel display such as a color flat panel display, and a flexible display such as a flexible color organic electroluminescent (EL) display (see, for example, JP 10-335066 A, JP 2003-321546 A, or JP 2004-281086 A). Examples of a display method of the display include a matrix method and/or a segment method. Note that a matrix display and a segment display may co-exist in the same panel.

The matrix has pixels for display arranged two-dimensionally as in a lattice form or a mosaic form, and characters or images are displayed by an assembly of pixels. The shape or size of a pixel depends on intended use. For example, for display of images and characters of a personal computer, a monitor, or a television, square pixels each having a size of 300 µm or less on each side are usually used, and in a case of a large-sized display such as a display panel, pixels each having a size in a millimeter order on each side are used. In a case of monochromic display, it is only required to arrange pixels of the same color. However, in a case of color display, display is performed by arranging pixels of red, green, and blue. In this case, typically, delta type display and stripe type display are available. As a method for driving this matrix, either a line sequential driving method or an active matrix method may be used. Line sequential driving has an advantage of having a simpler structure. However, when operation characteristics are taken into consideration, the active matrix method may be superior. Therefore, it is necessary to use the line sequential driving method or the active matrix method properly depending on intended use.

In the segment method (type), a pattern is formed so as to display predetermined information, and a determined region is induced to emit light. Examples thereof include display of time or temperature in a digital clock or a digital thermometer, display of a state of operation in an audio instrument or an electronic cooker, and panel display in an automobile.

Examples of the lighting apparatus include a lighting apparatus for indoor lighting or the like and a backlight of a liquid crystal display apparatus (see, for example, JP 2003-257621 A, JP 2003-277741 A, or JP 2004-119211 A). The backlight is mainly used for enhancing visibility of a display apparatus that is not self-luminous, and is used in a liquid crystal display apparatus, a timepiece, an audio apparatus, an automotive panel, a display panel, a sign, and the like. Particularly, regarding a backlight for use in a liquid crystal display apparatus, particularly for use in a personal computer where thickness reduction has been a problem to be solved, if it is considered that thickness reduction is difficult because a conventional backlight is formed by a fluorescent lamp or a light waveguide, a backlight using the luminescent element according to the present embodiment is characterized by its thinness and lightweightness.

4. Other Organic Devices

The polycyclic aromatic amino compound according to the present invention can be used in manufacturing an organic field effect transistor, an organic thin film solar cell, or the like in addition to the organic electroluminescent element described above.

The organic field effect transistor is a transistor that controls a current by an electric field generated by voltage input, and includes a gate electrode in addition to a source electrode and a drain electrode. When a voltage is applied to the gate electrode, an electric field is generated, and a current can be controlled by arbitrarily damming a flow of electrons (or holes) that flow between the source electrode and the drain electrode. The field effect transistor can be easily miniaturized compared with a simple transistor (bipolar transistor), and can be often used as an element constituting an integrated circuit or the like.

Usually, the organic field effect transistor only needs to have such a structure that a source electrode and a drain electrode are disposed in contact with an organic semiconductor active layer formed using the polycyclic aromatic amino compound according to the present invention, and a gate electrode is disposed so as to interpose an insulating layer (dielectric layer) in contact with the organic semiconductor active layer. Examples of the element structure include the following structures.

(1) Substrate/gate electrode/insulator layer/source electrode and drain electrode/organic semiconductor active layer
(2) Substrate/gate electrode/insulator layer/organic semiconductor active layer/source electrode and drain electrode
(3) Substrate/organic semiconductor active layer/source electrode and drain electrode/insulator layer/gate electrode
(4) Substrate/source electrode and drain electrode/organic semiconductor active layer/insulator layer/gate electrode An organic field effect transistor having such a configuration can be applied as a pixel driving switching element of an active matrix driving type liquid crystal display or organic electroluminescent display.

The organic thin film solar cell has a structure in which a positive electrode such as ITO, a hole transport layer, a photoelectric conversion layer, an electron transport layer, and a negative electrode are laminated on a transparent substrate such as glass. The photoelectric conversion layer has a p-type semiconductor layer on ae positive electrode side, and has an n-type semiconductor layer on a negative electrode side. The polycyclic aromatic compound according to the present invention can be used as materials of the hole transport layer, the p-type semiconductor layer, the n-type semiconductor layer, and the electron transport layer depending on physical properties thereof. The polycyclic aromatic amino compound according to the present invention can function as a hole transport material or an electron transport material in the organic thin film solar cell. The organic thin film solar cell may appropriately include a hole blocking layer, an electron blocking layer, an electron injection layer, a hole injection layer, a smoothing layer, and the like in addition to the members described above. For the organic thin film solar cell, known materials used for the organic thin film solar cell can be appropriately selected and used in combination.

EXAMPLES

Hereinafter, the present invention will be described more specifically by way of Examples, but the present invention is not limited thereto. First, Synthesis Examples of the polycyclic aromatic amino compound will be described below.

Synthesis Example (1)

Synthesis of compound of formula (1A-1): $N^5,N^5,N^{13},N^{13}$-tetraphenyl-7,11-dioxa-17c-boraphenanthro[2,3,4-no]tetraphen-5,13-diamine

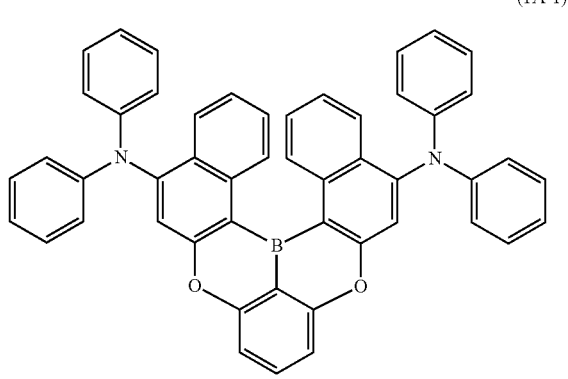

(1A-1)

Synthesis of 4-(diphenylamino) naphthalen-2-ol

In a nitrogen atmosphere, a flask containing diphenylamine (22.3 g), 4-bromonaphthalen-2-ol (28.0 g), Pd-132 (Johnsen Massey) (0.9 g), NaOtBu (30.0 g), and toluene (252 ml) was heated and refluxed for four hours. The reaction liquid was cooled to room temperature. Thereafter, water and ethyl acetate were added thereto, and the resulting mixture was subjected to liquid separation. Furthermore, purification was performed with a silica gel column (eluent: toluene) to obtain 35 g (yield: 89.5%) of 4-(diphenylamino) naphthalen-2-ol as an intermediate compound.

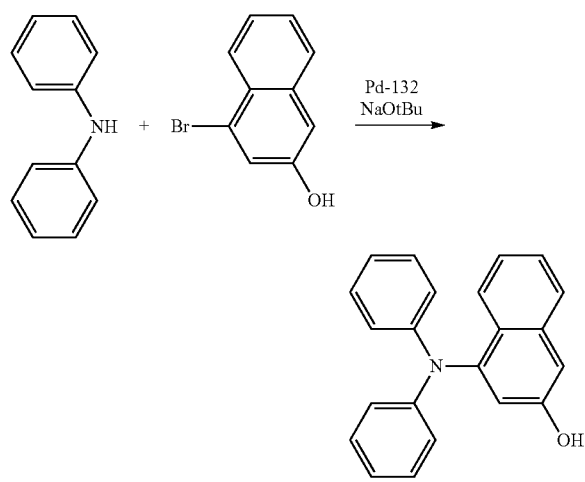 [SMILES: c1ccc(Nc2ccccc2)cc1 ; Oc1cc(Br)c2ccccc2c1 ; Oc1cc(N(c2ccccc2)c2ccccc2)c2ccccc2c1]

Synthesis of 3,3'-((2-bromo-1,3-phenylene) bis(oxy))bis(N,N-diphenylnaphthalen-1-amine)

In a nitrogen atmosphere, a flask containing 4-(diphenylamino) naphthalen-2-ol (16.0 g), 2-bromo-1,3-difluorobenzenn (5.0 g), potassium carbonate (17.8 g), and 1-methyl-2-pyrrolidone (30 ml) was heated and stirred at a reflux temperature for eight hours. After the reaction stopped, the reaction liquid was cooled to room temperature, and a precipitate precipitated by adding water thereto was collected by suction filtration. The obtained precipitate was washed with water and then with methanol and then purified with a silica gel column (eluent: heptane/toluene=2/1 (volume ratio)) to obtain 15.2 g (yield: 76.2%) of 3,3'-((2-bromo-1,3-phenylene)bis(oxy))bis(N,N-diphenylnaphthalen-1-amine) as an intermediate compound.

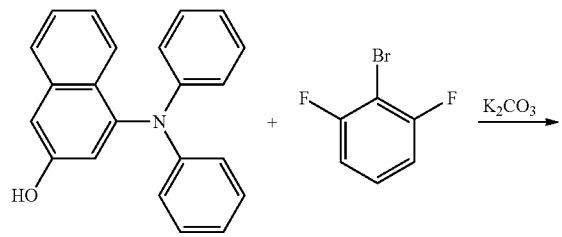

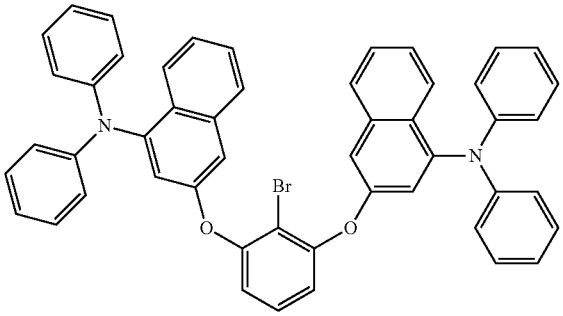

Synthesis of dimethyl (2,6-bis ((4-(diphenylamino) naphthalen-2-yl) oxy) phenyl) boronate In a nitrogen atmosphere, 3,3'-((2-bromo-1,3-phenylene) phenylene)bis(oxy))bis(N,N-diphenylnaphthalen-1-amine) (8.6 g) and tetrahydrofuran (52 ml) were put in a flask, and cooled to −40° C. A 1.6 M n-butyllithium hexane solution (8 ml) was added dropwise thereto. After completion of the dropwise addition, the resulting mixture was stirred at this temperature for one hour, and then trimethylborate (1.7 g) was added thereto. The temperature of the mixture was raised to room temperature, and the mixture was stirred for two hours. Thereafter, water (100 ml) was slowly added dropwise thereto. Next, the reaction mixture was extracted with ethyl acetate and dried with anhydrous sodium sulfate. Thereafter, the desiccant was removed to obtain 8.5 g (yield: 99.4%) of dimethyl (2,6-bis((4-diphenylamino) naphthalen-2-yl) oxy) phenyl) boronate as an intermediate compound.

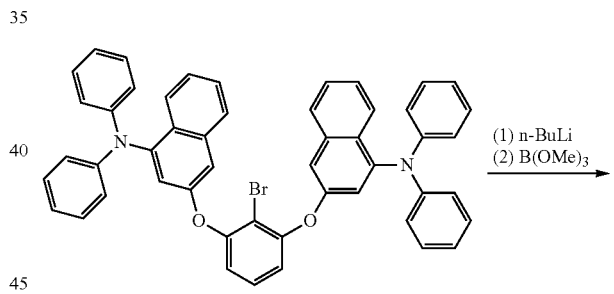

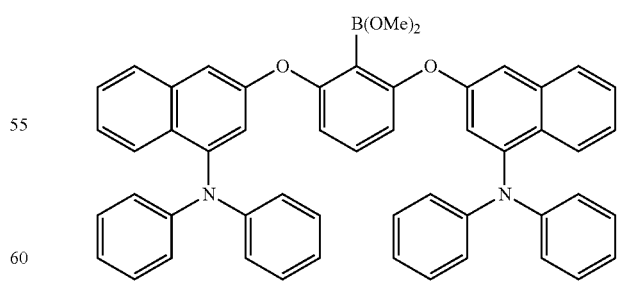

<Synthesis of Compound of Formula (1A-1)>

In a nitrogen atmosphere, dimethyl (2,6-bis((4-diphenylamino) naphthalen-2-yl) oxy) phenyl) boronate (7.9 g), aluminum chloride (AlCl$_3$) (13.7 g), and chlorobenzene (50 ml) were put in a flask, and the resulting mixture was stirred for five minutes. Thereafter, N-ethyldiisopropylamine (16.7 g) was added thereto, and the resulting mixture was heated and stirred at 125° C. for one hour. After completion of heating, the reaction liquid was cooled, and ice water (50 ml) was added thereto. Thereafter, the reaction mixture was extracted with toluene and dried with anhydrous sodium sulfate. Thereafter, the desiccant was removed, and the solvent was distilled off under reduced pressure to obtain a crude product. The crude product was subjected to column purification (eluent: heptane/toluene=3/1 (volume ratio)) with silica gel, and then reprecipitated with heptane. Next, the resulting product was subjected to column purification (eluent: heptane/toluene=1/1 (volume ratio)) with NH$_2$ silica gel and further subjected to sublimation purification to obtain 0.8 g (yield: 11%) of a target compound (1A-1).

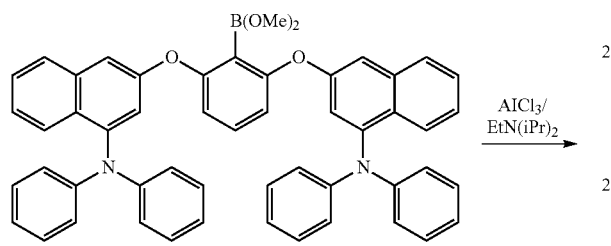

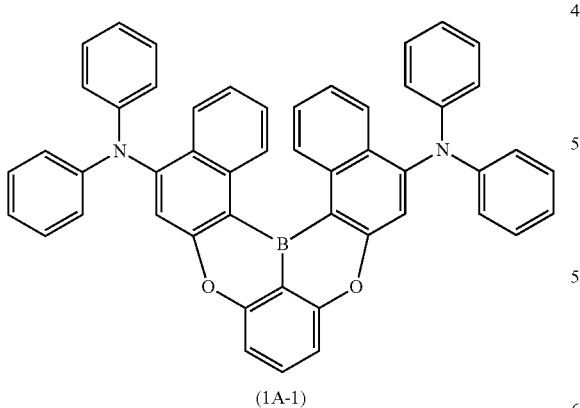

(1A-1)

The structure of a target compound (1A-1) was confirmed by MS spectrum and NMR measurement.

$^1$H-NMR(CDCl$_3$):δ=8.00(d,2H), 7.88(d,2H), 7.70(t,1H), 7.47(s,2H), 7.31-7.22(m,12H), 7.18-7.16(m,8H), 7.09-7.04 (m,6H).

Synthesis Example (2)

Compound of the formula (1A-173):N$^5$,N$^5$,N$^{13}$,N$^{13}$, 8, 10-hexaphenyl-7,11-dioxa-17c-boraphenanthro[2,3,4-no]tetraphen-5,13-diamine

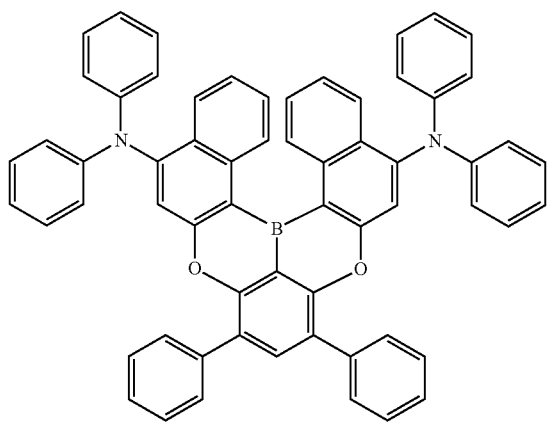

(1A-173)

Synthesis of 3,3'-((5'-bromo-[1,1':3',1''-terphenyl]-4', 6'-diyl)bis(oxy))bis(N,N-diphenylnaphthalen-1-amine)

In a nitrogen atmosphere, a flask containing 4-(diphenylamino) naphthalen-2-ol (16.1 g), 5'-bromo-4',6'-difluoro-1,1':3',1''-terphenyl (8.5 g), potassium carbonate (13.6 g), and 1-methyl-2-pyrrolidone (43 ml) was heated and stirred at a reflux temperature for three hours. After the reaction stopped, the reaction liquid was cooled to room temperature, and a precipitate precipitated by adding water thereto was collected by suction filtration. The obtained precipitate was washed with water and then with methanol and then purified with a silica gel short column (eluent: toluene). Next, the resulting product was subjected to reprecipitation with ethyl acetate to obtain 22.6 g (yield: 98.9%) of 3,3'-((5'-bromo-[1,1':3',1''-terphenyl]-4',6'-diyl)bis(oxy)) bis(N,N-diphenylnaphthalen-1-amine) as an intermediate compound.

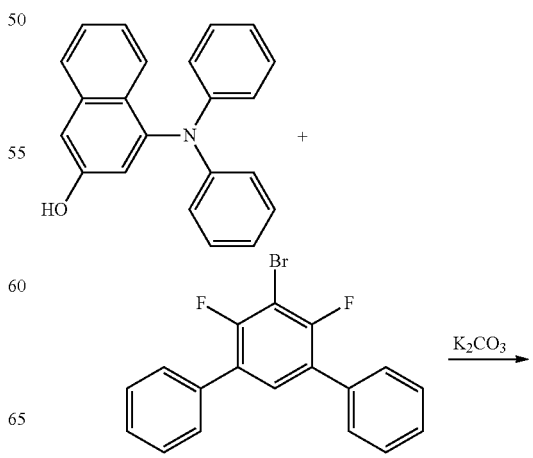

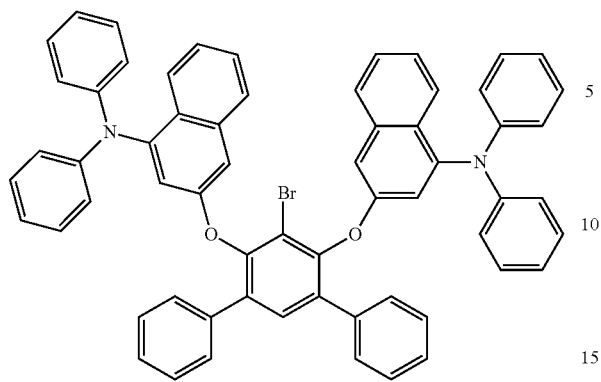

<Synthesis of Compound of Formula (1A-173)>

In a nitrogen atmosphere, a flask containing 3,3'-((5'-bromo-[1,1':3',1''-terphenyl]-4',6'-diyl)bis(oxy)) bis(N,N-diphenylnaphthalen-1-amine) (13.0 g) and xylene (65 ml) was cooled to −40° C., and a 2.6 M n-butyllithium hexane solution (6 ml) was added dropwise thereto. After completion of the dropwise addition, the resulting mixture was stirred at this temperature for 0.5 hours. Thereafter, the temperature of the mixture was raised to 60° C., and the mixture was stirred for two hours. Thereafter, the reaction liquid was depressurized to distill off a component having a low boiling point, and then cooled to −40° C. Boron tribromide (4.6 g) was added thereto. The temperature of the mixture was raised to room temperature. The mixture was stirred for 0.5 hours, and then cooled to 0° C. N-ethyldiisopropylamine (4.0 g) was added thereto, and the mixture was heated and stirred at 125° C. for five hours. The reaction liquid was cooled to room temperature, and a sodium acetate aqueous solution was added thereto to stop the reaction. Thereafter, toluene was added thereto, and the resulting mixture was subjected to liquid separation. The organic layer was purified with a silica gel short pass column (eluent: toluene) and then with a silica gel column (eluent: heptane/toluene=2/1 (volume ratio)). Thereafter, the resulting product was subjected to reprecipitation with heptane and further subjected to sublimation purification to obtain 2.5 g (yield: 21%) of a target compound (1A-173).

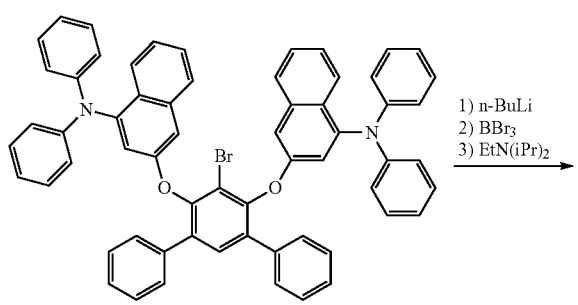

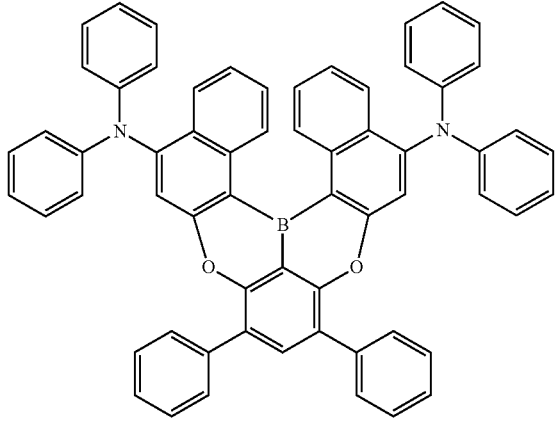

(1A-173)

The structure of a target compound (1A-173) was confirmed by MS spectrum and NMR measurement.
$^1$H-NMR(CDCL$_3$):δ=8.00(d,2H), 7.91(s,1H), 7.89(d,2H), 7.78(dd,4H), 7.49(t,4H), 7.43(s,2H), 7.39(t,2H), 7.29-7.23(m,10H), 7.17-7.14(m,8H), 7.09-7.01(m,6H).

Synthesis Example (3)

Compound of formula (1A-153):9-methyl-N$^5$,N$^5$, N$^{13}$,N$^{13}$-tetraphenyl-7,11-dioxa-17c-borafenanthro [2,3,4-no]tetraphen-5,13-diamine

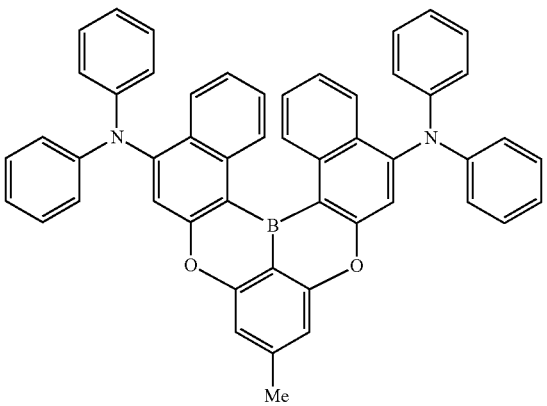

(1A-153)

Synthesis of 3,3'-((5-methyl-1,3-phenylene)bis(oxy))bis(N,N-diphenylnaphthalen-1-amine)

In a nitrogen atmosphere, a flask containing 4-(diphenylamino) naphthalen-2-ol (29.2 g), 1,3-difluoro-5-methylbenzene (6.0 g), tripotassium phosphate (49.7 g), and 1-methyl-2-pyrrolidone (60 ml) was heated and stirred at a reflux temperature for 18 hours. After the reaction stopped, the reaction liquid was cooled to room temperature, and a precipitate precipitated by adding water thereto was collected by suction filtration. The obtained precipitate was washed with water and then with methanol and then purified with a silica gel column (eluent: heptane/toluene=2/1 (volume ratio)) to obtain 20 g (yield: 60%) of 3,3'-((5-methyl- 1,3-phenylene)bis(oxy))bis(N,N-diphenylnaphthalen-1-amine) as an intermediate compound.

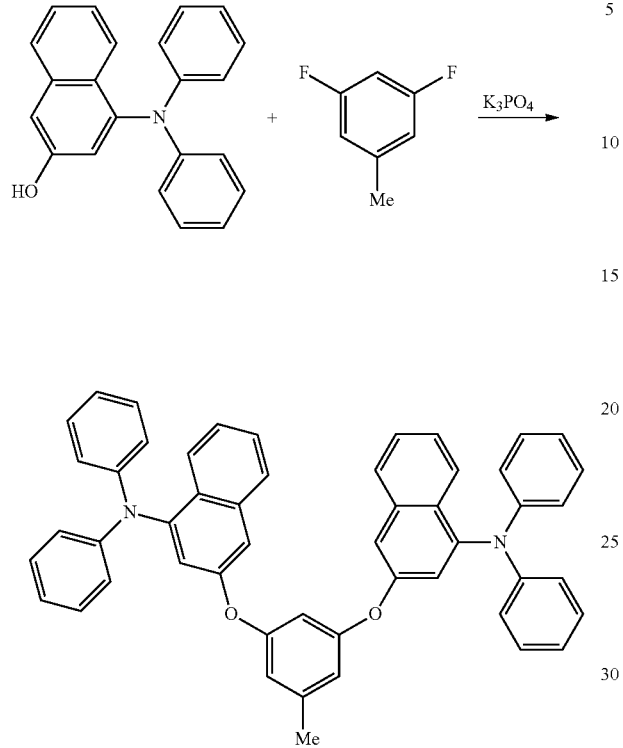

<Synthesis of Compound of Formula (1A-153)>

In a nitrogen atmosphere, a flask containing 3,3'-((5-methyl-1,3-phenylene)bis(oxy))bis(N,N-diphenylnaphthalen-1-amine) (19.0 g) and xylene (133 ml) was cooled to 0° C., and a 1.6 M n-butyllithium hexane solution (18.4 ml) was added dropwise thereto. After completion of the dropwise addition, the resulting mixture was stirred at this temperature for 0.5 hours. Thereafter, the temperature of the mixture was raised to 80° C., and the mixture was stirred for one hour. Thereafter, the reaction liquid was depressurized to distill off a component having a low boiling point, and then cooled to −30° C. Boron tribromide (10.0 g) was added thereto. The temperature of the mixture was raised to room temperature. The mixture was stirred for 0.5 hours, and then cooled to 0° C. N-ethyldiisopropylamine (4.0 g) was added thereto, and the mixture was stirred at room temperature for ten minutes. Next, aluminum chloride (7.1 g) was added thereto and heated at 100° C. for six hours. The reaction liquid was cooled to room temperature, and a potassium acetate aqueous solution was added thereto to stop the reaction. Thereafter, ethyl acetate was added thereto, and the resulting mixture was subjected to liquid separation. The organic layer dried with anhydrous sodium sulfate. Thereafter, the desiccant was removed, and the solvent was distilled off under reduced pressure to obtain a crude product. The crude product was subjected to column purification with NH$_2$ silica gel (eluent: ethyl acetat→toluene). Next, the resulting product was purified with a silica gel column (eluent: heptane/toluene=⅓ (volume ratio)) and was further subjected to sublimation purification to obtain 1.2 g (yield: 6%) of a target compound (1A-153).

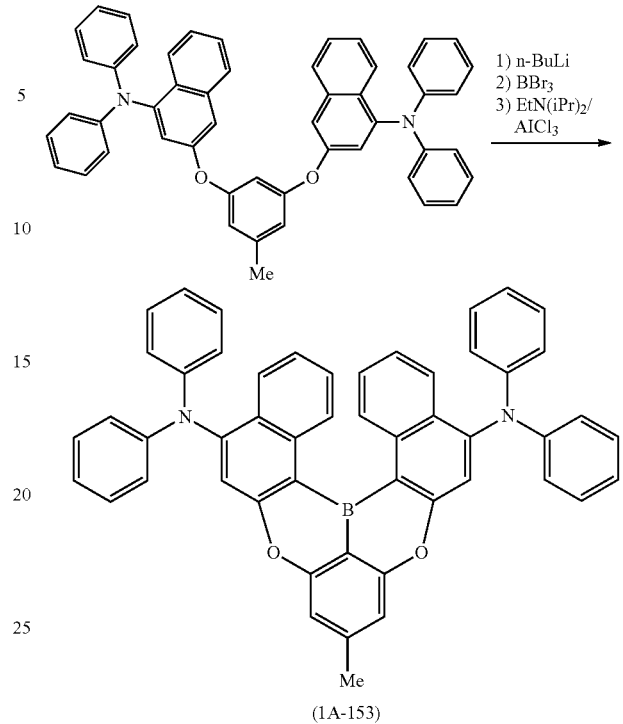

The structure of the target compound (1A-153) was confirmed by MS spectrum and NMR measurement.
$^1$H-NMR(CDCl$_3$):δ=8.00(d,2H), 7.89(d,2H), 7.45(s,2H), 7.30-7.16(m,18H), 7.08-7.03(m,8H), 2.55(s,3H).

Synthesis Example (4)

Synthesis of compound (1B-92): 7-([1,1'-biphenyl]-4-yl)-(N,N,10-triphenyl-7H-3-oxa-7-aza-11b-bora-phenanthro[3,2,1-no]tetraphen-1-amine

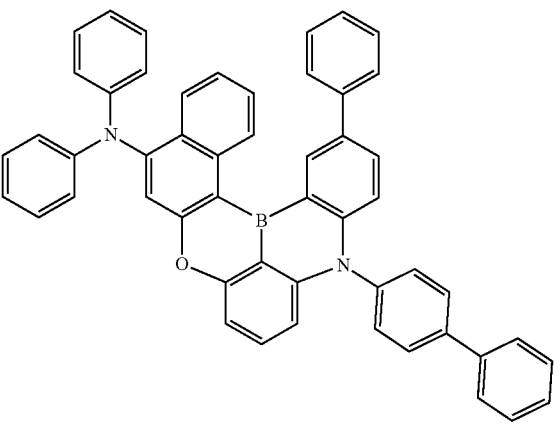

Synthesis of 3-(3-bromo-2-chlorophenoxy)-N,N-diphenylnaphthalen-1-amine

In a nitrogen atmosphere, a flask containing 4-(diphenylamino) naphthalen-2-ol (32.0 g), 1-bromo-2-chloro-3- fluorobenzene (23.7 g), potassium carbonate (35.5 g), and 1-methyl-2-pyrrolidone (160 ml) was heated and stirred at a reflux temperature for three hours. After the reaction stopped, the reaction liquid was cooled to room temperature, and a precipitate precipitated by adding water thereto was collected by suction filtration. The obtained precipitate was washed with water and then with methanol and then purified with a silica gel column (eluent: toluene/heptane=⅕ (volume ratio)) to obtain 46.5 g (yield: 90.3%) of 3-(3-bromo-2-chlorophenoxy)-N,N-diphenylnaphthalen-1-amine as an intermediate compound.

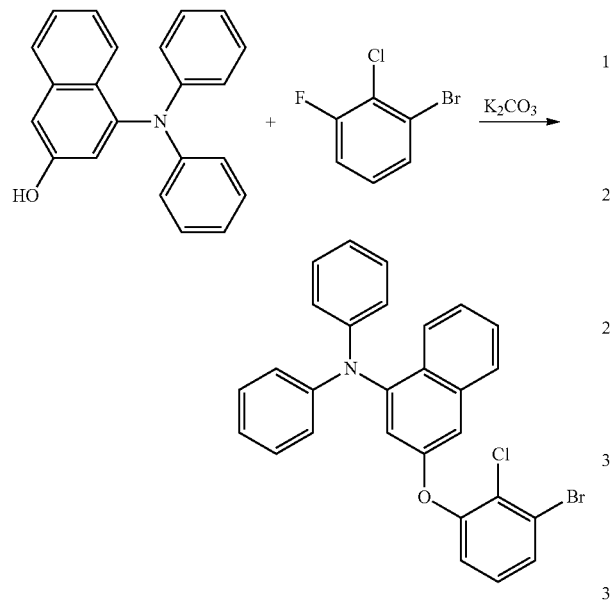

Synthesis of 3-(2-chloro-3-(di([1,1'-biphenyl]-4-yl)amino) phenoxy)-N,N-diphenylnaphthalen-1-amine In a nitrogen atmosphere, a flask containing 3-(3-bromo-2-chlorophenoxy)-N,N-diphenylnaphthalen-1-amine (15.0 g), di([1,1'-biphenyl]-4-yl)amine (9.6 g), Pd-132 (Johnson Matthey) (0.64 g), NaOtBu (7.2 g), and xylene (75 ml) was heated at 100° C. for two hours. The reaction liquid was cooled to room temperature. Thereafter, water and toluene were added thereto, and the resulting mixture was subjected to liquid separation. Furthermore, purification was performed with a silica gel column (eluent: toluene/heptane=½ (volume ratio)) to obtain 19.6 g (yield: 88.3%) of 3-(2-chloro-3-(di([1,1'-biphenyl]-4-yl)amino) phenoxy)-N,N-diphenylnaphthalen-1-amine as an intermediate compound.

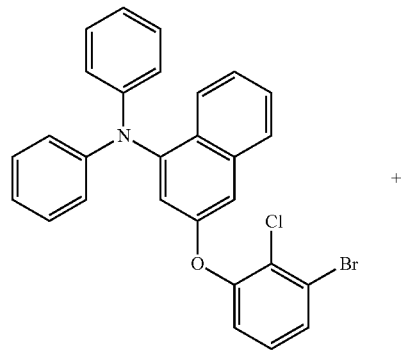

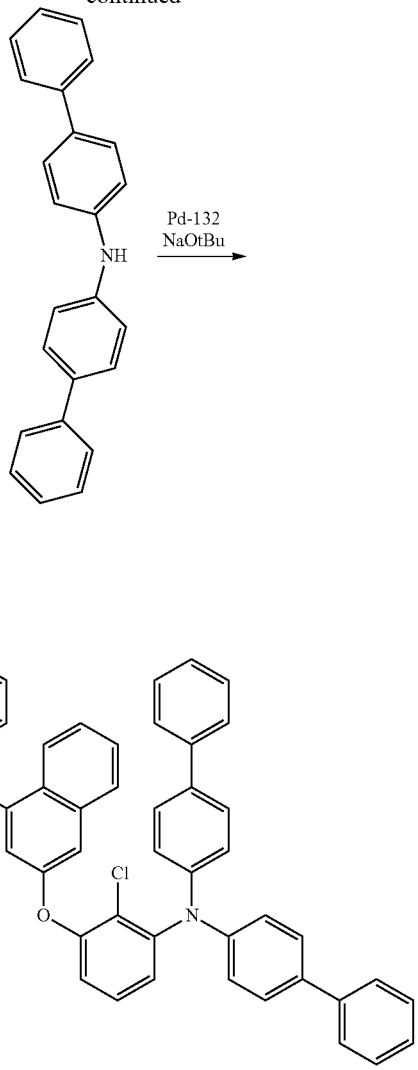

Synthesis of 4-(3-(di([1,1'-biphenyl]-4-yl)amino)-2-(4,4,5,5-tetramethyl-1,3,2-dioxaborolan-2-yl) phenoxy)-N,N-diphenylnaphthalen-1-amine In a nitrogen atmosphere, a flask containing 3-(2-chloro-3-(di([1,1'-biphenyl]-4-yl)amino) phenoxy)-N,N-diphenylnaphthalen-1-amine (4.0 g) and xylene (30 ml) was cooled to 0° C., and a 2.6 M n-butyllithium n-hexane solution (4.2 ml) was added thereto. The temperature of the mixture was raised to 70° C., and the mixture was stirred for one hour. Thereafter, the flask was cooled to −20° C. 2-isopropoxy-4,4,5,5-tetramethyl-1,3,2-dioxaborolane (iPrO-BPin) (3.0 g) was added thereto, and the resulting mixture was stirred at room temperature for two hours. Thereafter, water and toluene were added thereto, and the resulting mixture was subjected to liquid separation. Furthermore, purification was performed with a silica gel column (eluent: toluene/heptane=1/1 (volume ratio)) to obtain 3.1 g (yield: 69.0%) of 4-(3-(di([1,1'-biphenyl]-4-yl)amino)-2-(4,4,5,5-tetramethyl-1,3,2-dioxaborolan-2-yl) phenoxy)-N,N-diphenylnaphthalen-1-amine as an intermediate compound.

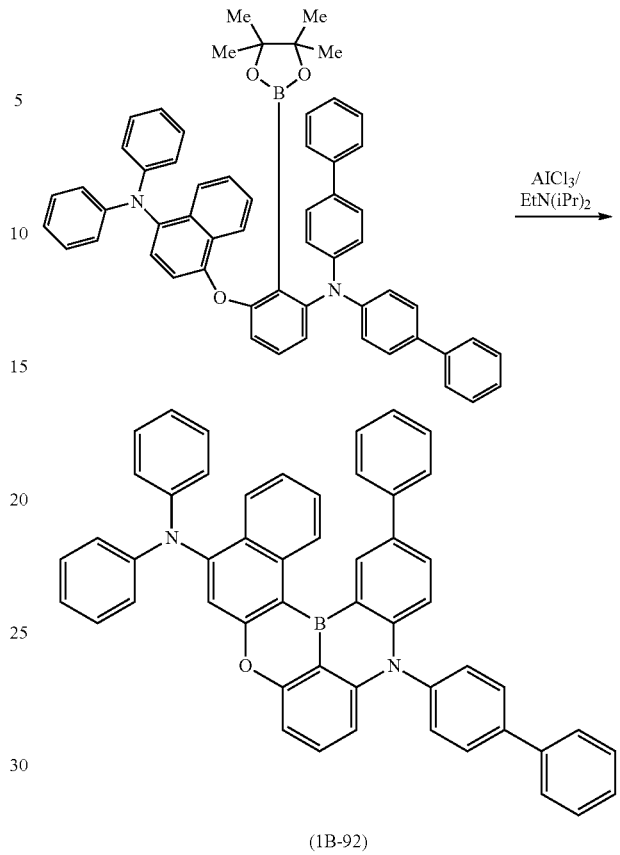

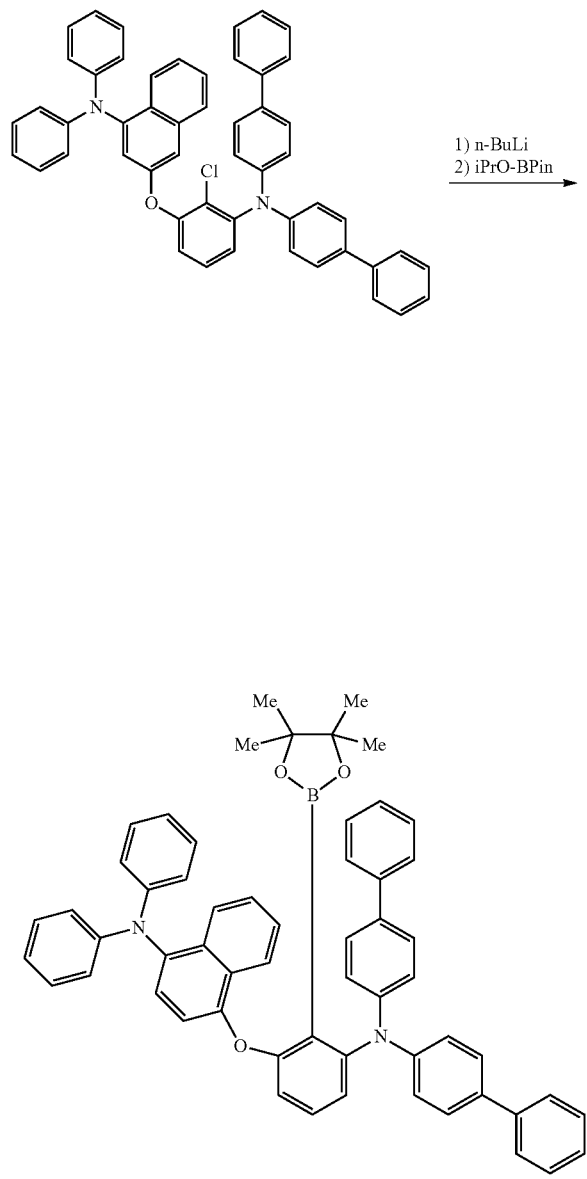

<Synthesis of Compound of Formula (1B-92)>

4-(3-(di([1,1'-biphenyl]-4-yl)amino)-2-(4,4,5,5-tetramethyl-1,3,2-dioxaborolan-2-yl) phenoxy)-N,N-diphenylnaphthalen-1-amine (0.8 g), aluminum chloride (1.3 g), and toluene (8 ml) were put in a flask and stirred for three minutes. Thereafter, N-ethyldiisopropylamine (0.25 g) was added thereto, and the resulting mixture was stirred at 120° C. for two hours. After completion of heating, the reaction liquid was cooled and then added to a mixed solution of ice water (20 ml) and ethyl acetate (20 ml) while being cooled in an ice bath, and the resulting mixture was stirred for 30 minutes. Thereafter, the organic layer of the reaction mixture was purified with a silica gel short pass column (eluent: toluene) and then with a silica gel column (eluent: toluene/heptane=½ (volume ratio)). Furthermore, the resulting product was subjected to column purification (eluent: heptane/toluene=2/1 (volume ratio)) with $NH_2$ silica gel to obtain 0.1 g (yield: 14.5%) of a target compound (1B-92).

The structure of the target compound (1B-92) was confirmed by MS spectrum and NMR measurement.

$^1$H-NMR(CDCl$_3$):δ=9.10(d,1H), 8.92(s,1H), 8.04(d,1H), 7.96(d,2H), 7.78-7.73(m,3H), 7.66(d,2H), 7.56-7.37(m,10H), 7.29-7.24(m,5H), 7.17-7.15(m,5H), 7.05-7.01(m,4H), 6.52(d,1H).

Other polycyclic aromatic amino compounds of the present invention can be synthesized by methods in accordance with those of the Synthesis Examples described above by appropriately changing the compounds of raw materials.

Hereinafter, Examples will be described in order to explain the present invention in more detail, but the present invention is not limited thereto.

<Measurement of Fluorescence Quantum Yield>

The fluorescence quantum yields of compounds represented by formulas (1A-1), (1A-173), and (1A-153) and compounds in Comparative Examples were measured. The fluorescence quantum yield was measured by a method for dispersing a compound to be evaluated in a commercially available polymethyl methacrylate (PMMA) resin, then forming a thin film, and evaluating the thin film.

First, a 3% by weight (sample:PMMA=3:97 [weight ratio]) PMMA dispersion film sample was prepared as follows. A sample was dissolved in a solution in which a PMMA resin (400 mg) was dissolved in toluene (2.4 mL) so as to be 3% by weight with respect to the PMMA resin. This solution was applied onto a synthetic quartz substrate (10 mm×10 mm×1 mmt) by a spin coating method (3000 rpm×20 seconds). This substrate was dried on a hot plate (90° C.×10 minutes) and then further heated in a vacuum desigator to remove a residual solvent under reduced pressure (1 kPa or less×90° C.×one hour) to obtain a PMMA dispersion film sample.

As a measurement apparatus, an absolute PL quantum yield measurement apparatus C9920-02G manufactured by Hamamatsu Photonics K.K. was used. A Xe lamp spectral light source 150 W was used as an excitation light source, and monochromatic light of 320 nm was used as excitation light.

According to Japanese Journal of Applied Physics Vol. 43, No. 11A, 2004, pp. 7729-7730., a fluorescence quantum yield $\eta_{PL}$ is given by the following formula.

$$\eta_{PL} = \frac{N_{emission}}{N_{Absorption}} = \frac{\alpha \int \frac{\lambda}{hc} I_{em}(\lambda) d\lambda}{\alpha \int \frac{\lambda}{hc} [I_{ex}(\lambda) - I'_{ex}(\lambda)] d\lambda}$$

[Numerical Formula 1]

$N_{emission}$ represents the number of photons emitted from a material, $N_{Abscrption}$ represents the number of photons absorbed by a material, and the fluorescence quantum yield is determined as a ratio therebetween. Here, a represents a correction coefficient of a measurement system, λ represents a wavelength, h represents Plank's constant, c represents the light velocity, $I_{em}(\lambda)$ represents the emission intensity of a sample, $I_{ex}(\lambda)$ represents an excitation light intensity before a sample is set, and $I'_{ex}(\lambda)$ is an excitation light intensity observed when the sample is irradiated with excitation light. by observing two spectra of $I_{em}$ and $I'_{ex}+I_{em}$, a fluorescence quantum yield can be measured.

For the measurement, a synthetic quartz substrate similar to the PMMA dispersion film sample was used as a blank substrate. The blank substrate was set in a sample holder for an absolute PL quantum yield, and $I_{ex}(\lambda)$ was measured. The blank substrate was removed from the sample holder, the PMMA dispersion film sample was set, and $I'_{ex}(\lambda)+I_{em}(\lambda)$ was observed.

A measurement result of the fluorescence quantum yield is illustrated in Table 1. Note that Tables 2A and 2B illustrate results of measuring the fluorescence quantum yields of compounds in Comparative Examples by the same method as the compound of the present invention, and also illustrate the structures of the compounds and the compound numbers thereof described in WO 2015/102118 A.

TABLE 1

| Compound to be measured | Quantum yield (%) |
| --- | --- |
| 1A-1 | 93.1 |
| 1A-173 | 89.0 |

TABLE 1-continued
| Compound to be measured | Quantum yield (%) |
|---|---|
| 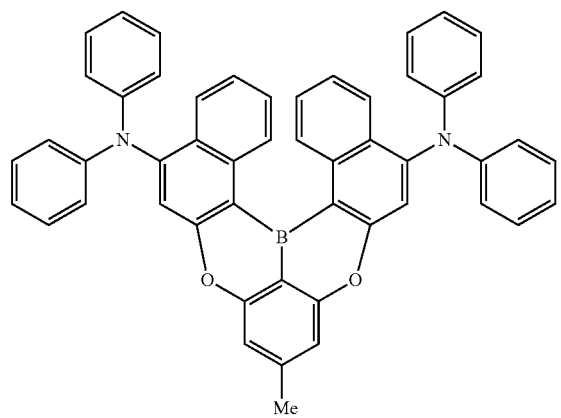<br>1A-153 | 83.1 |
TABLE 2A
| Compound to be measured | Quantum yield (%) |
|---|---|
| 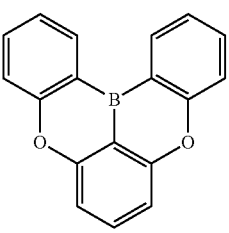<br>1-1 | 74.8 |
| 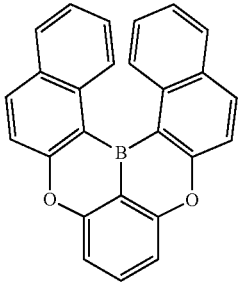<br>1-4 | 39.9 |

TABLE 2A-continued
| Compound to be measured | Quantum yield (%) |
|---|---|
| 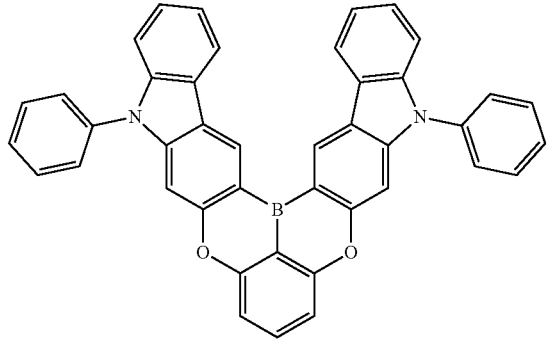<br>1-10 | 61.1 |
| 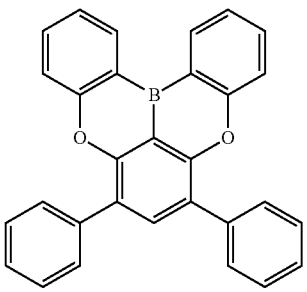<br>1-91 | 52.8 |
| 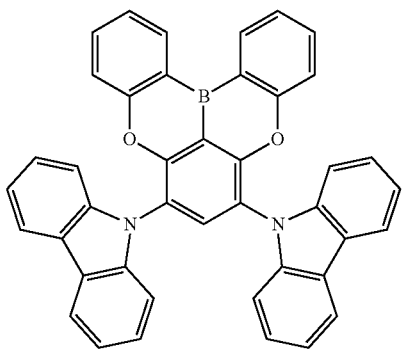<br>1-100 | 75.2 |
| 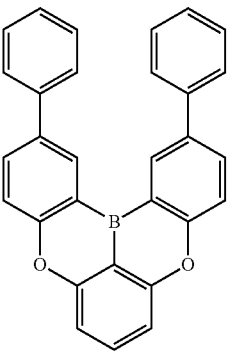<br>1-151 | 64.9 |

TABLE 2A-continued

| Compound to be measured | Quantum yield (%) |
|---|---|
| 1-176 | 70.6 |
| 1-50 | 46.8 |
| 1-152 | 54.3 |
| 1-401 | 77.8 |

TABLE 2A-continued
| Compound to be measured | Quantum yield (%) |
|---|---|
| 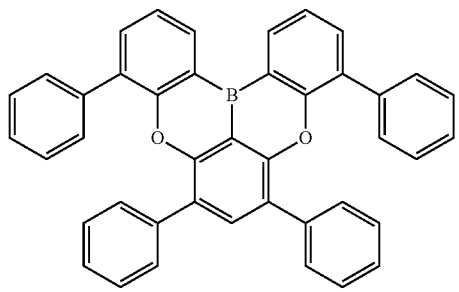<br>1-1050 | 65.9 |
| 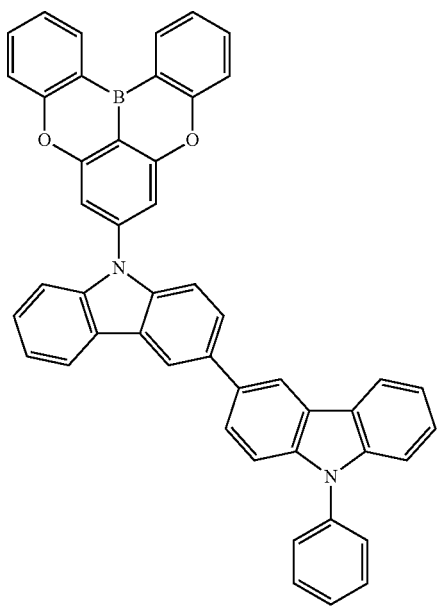<br>1-1069 | 74.9 |
| 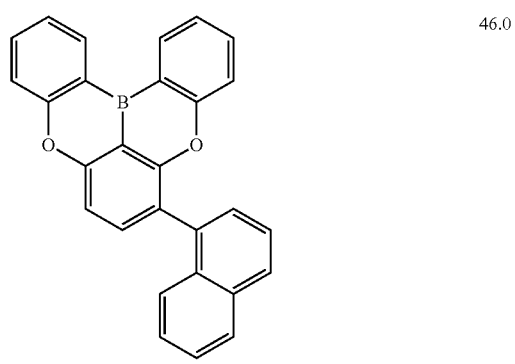<br>1-1084 | 46.0 |

TABLE 2A-continued
| Compound to be measured | Quantum yield (%) |
|---|---|
| 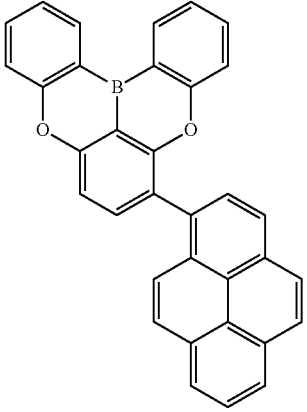<br>1-1090 | 64.5 |
| 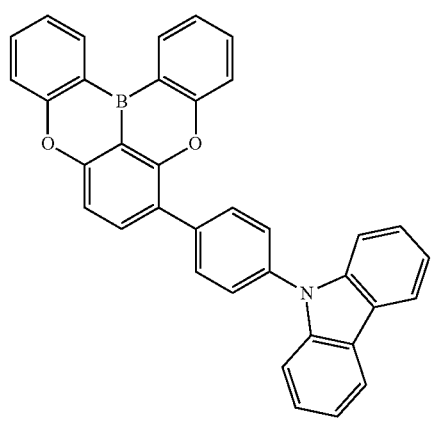<br>1-1092 | 41.7 |
TABLE 2B
| Compound to be measured | Quantum yield (%) |
|---|---|
| 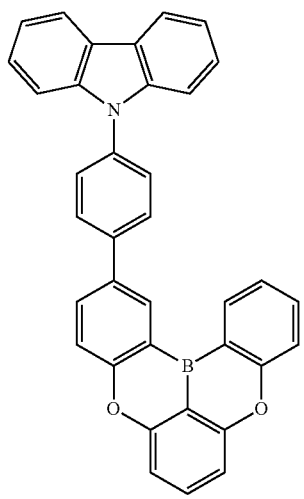<br>1-1101 | 57.1 |

TABLE 2B-continued
| Compound to be measured | Quantum yield (%) |
|---|---|
| 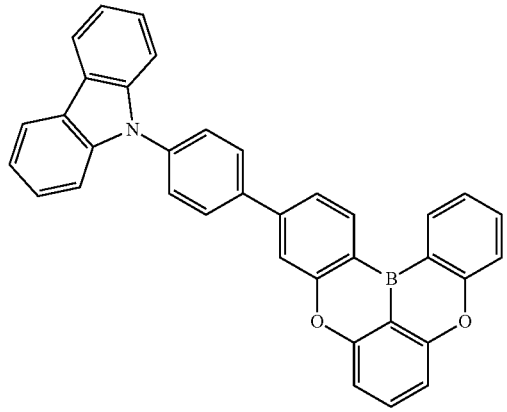<br>1-1102 | 62.6 |
| 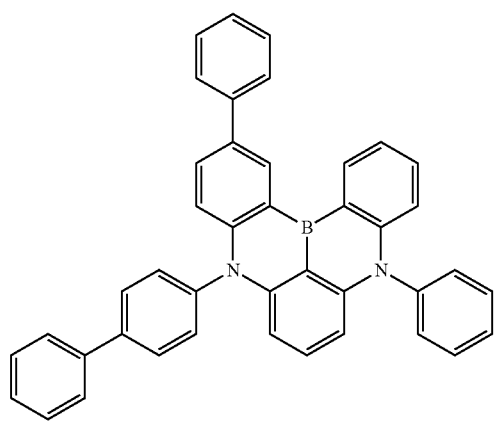<br>1-1152 | 78.6 |
| 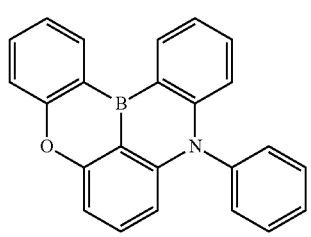<br>1-1201 | 61.9 |

TABLE 2B-continued
| Compound to be measured | Quantum yield (%) |
|---|---|
| 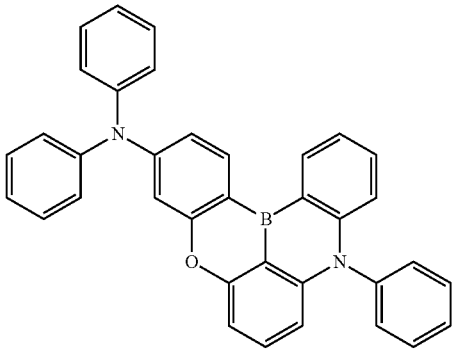 1-1210 | 79.2 |
| 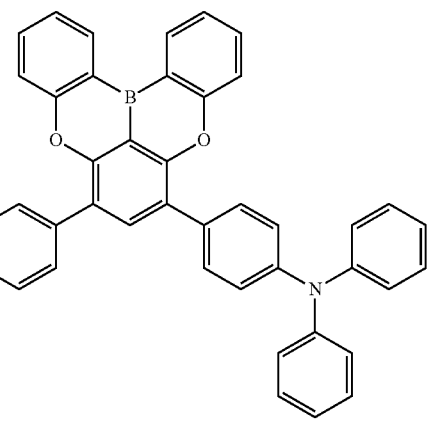 1-142 | 54.1 |
| 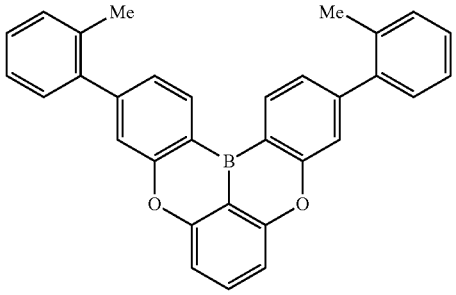 1-152-2 | 70.7 |
| 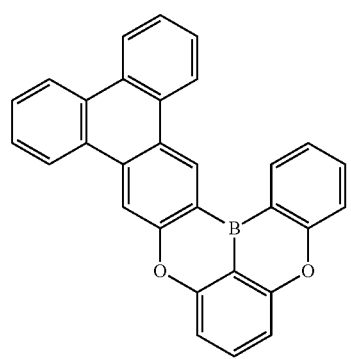 1-1006 | 50.6 |

TABLE 2B-continued
| Compound to be measured | Quantum yield (%) |
|---|---|
| 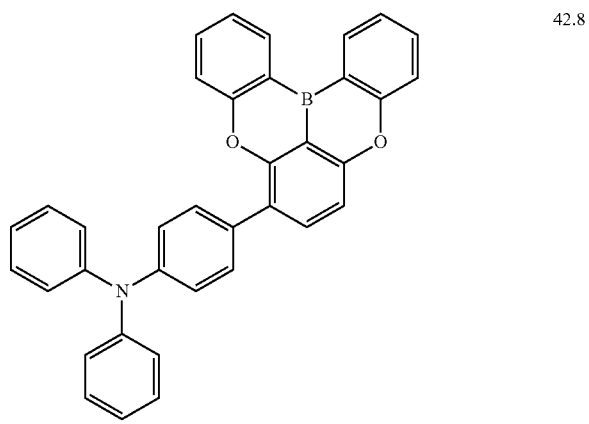<br>1-1104 | 42.8 |
| 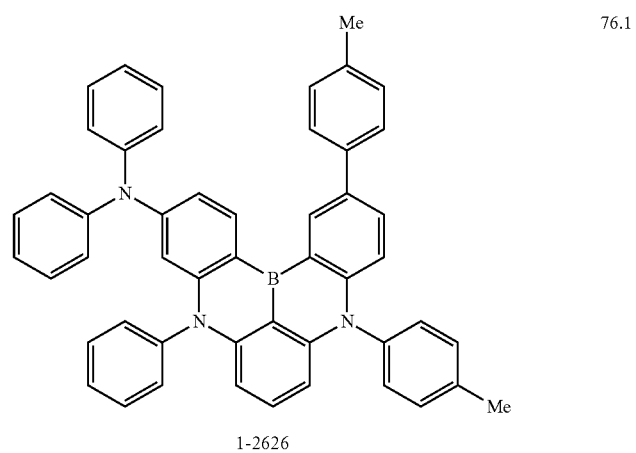<br>1-2626 | 76.1 |
| 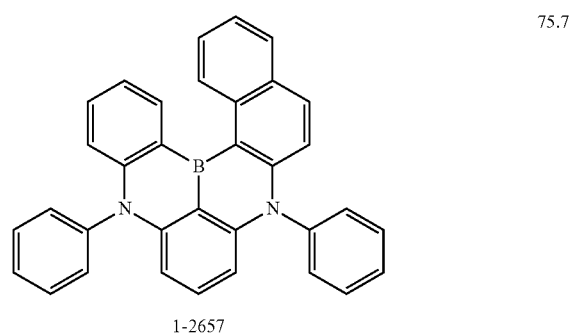<br>1-2657 | 75.7 |

TABLE 2B-continued
| Compound to be measured | Quantum yield (%) |
|---|---|
| 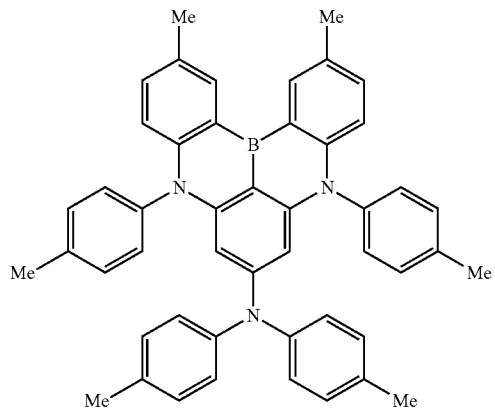<br>1-2662 | 76.4 |
| 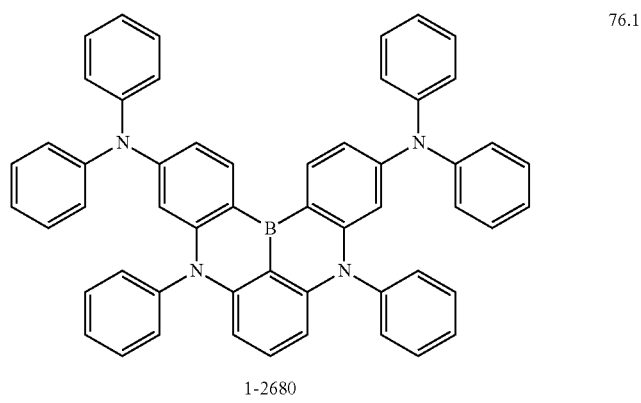<br>1-2680 | 76.1 |
| 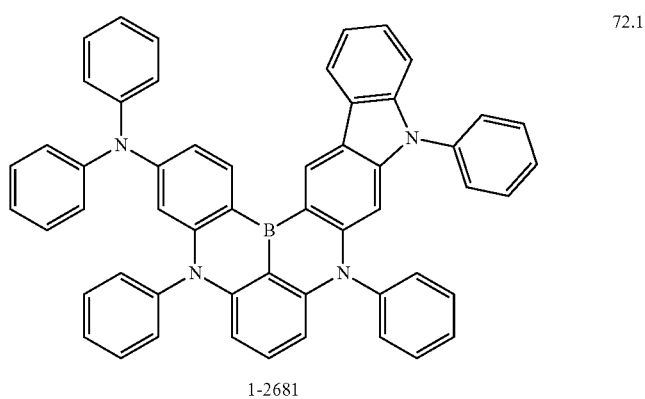<br>1-2681 | 72.1 |

TABLE 2B-continued

| Compound to be measured | Quantum yield (%) |
|---|---|
| 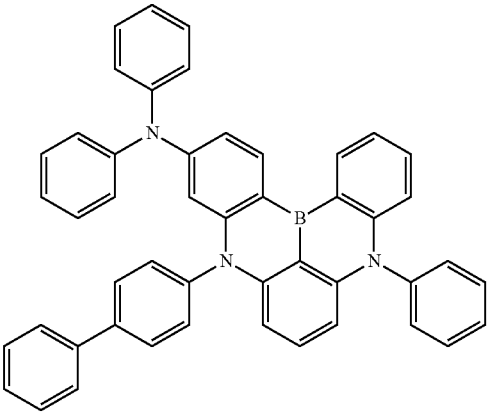1-2683 | 76.6 |
| 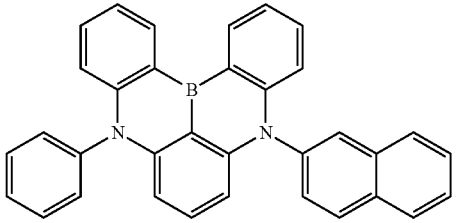1-2699 | 74.5 |
| 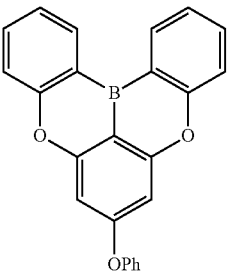1-4401 | 49.3 |

<Evaluation of Organic EL Element (1)>

Organic EL elements in Examples 1 to 3 and Comparative Examples 1 to 11 were manufactured. Voltages (V) thereof, EL emission wavelengths (nm) thereof, and external quantum efficiencies (%) thereof, which are characteristics at 1000 cd/m² emission, were measured. Subsequently, time for holding a luminance of 90% or more of an initial luminance at the time of driving with a constant current at a current density of 10 mA/cm² was measured.

Material configurations of the layers in the organic EL element thus manufactured are illustrated in the following Table 3. Note that the dopant materials in Comparative Examples 1 to 10 are all known compounds disclosed in WO 2015/102118 A.

TABLE 3

| | Hole injection layer | | Hole Transport layer | Light emitting layer (25 nm) | | Electron transport layer | | Negative electrode |
|---|---|---|---|---|---|---|---|---|
| | First layer (40 nm) | Second layer (5 nm) | (25 nm) | Host | Dopant | First layer (5 nm) | Second layer (25 nm) | (1 nm/ 100 nm) |
| Example 1 | HI | HAT-CN | HT | BH1 | Compound 1A-173 | ET5 | ET6 + Liq | Liq/MgAg |
| Example 2 | HI | HAT-CN | HT | BH1 | Compound 1A-173 | ET5 | ET6 + Liq | Liq/MgAg |
| Example 3 | HI | HAT-CN | HT | BH1 | Compound 1A-1 | ET5 | ET6 + Liq | Liq/MgAg |
| Comparative Example 1 | HI | HAT-CN | HT | BH1 | Compound 1-10 | ET5 | ET6 + Liq | Liq/MgAg |
| Comparative Example 2 | HI | HAT-CN | HT | BH1 | Compound 1-100 | ET5 | ET6 + Liq | Liq/MgAg |
| Comparative Example 3 | HI | HAT-CN | HT | BH1 | Compound 1-141 | ET5 | ET6 + Liq | Liq/MgAg |
| Comparative Example 4 | HI | HAT-CN | HT | BH1 | Compound 1-176 | ET5 | ET6 + Liq | Liq/MgAg |
| Comparative Example 5 | HI | HAT-CN | HT | BH1 | Compound 1-447 | ET5 | ET6 + Liq | Liq/MgAg |
| Comparative Example 6 | HI | HAT-CN | HT | BH1 | Compound 1-401 | ET5 | ET6 + Liq | Liq/MgAg |
| Comparative Example 7 | HI | HAT-CN | HT | BH1 | Compound 1-1201 | ET5 | ET6 + Liq | Liq/MgAg |
| Comparative Example 8 | HI | HAT-CN | HT | BH1 | Compound 1-1210 | ET5 | ET6 + Liq | Liq/MgAg |
| Comparative Example 9 | HI | HAT-CN | HT | BH1 | Compound 1-79 | ET5 | ET6 + Liq | Liq/MgAg |
| Comparative Example 10 | HI | HAT-CN | HT | BH1 | Compound 1-1006 | ET5 | ET6 + Liq | Liq/MgAg |
| Comparative Example 11 | HI | HAT-CN | HT | BH1 | Compound 1-2305 | ET5 | ET6 + Liq | Liq/MgAg |

In Tables, "HI" represents $N^4,N^{4'}$-diphenyl-$N^4,N^{4'}$-bis(9-phenyl-9H-carbazol-3-yl)-[1,1'-biphenyl]-4,4'-diamine, "HAT-CN" represents 1,4,5,8,9,12-hexaazatriphenylenehexacarbonitrile; "HT" represents N-([1,1'-biphenyl]-4-yl)-N-(4-(9-phenyl-9H-carbazol-3-yl)phenyl)-[1,1'-biphenyl]-4-amine, "BH1" represents 9-phenyl-10-(4-phenylnaphthalen-1-yl)anthracene; "ET5" represents 9-(7-(dimesitylboryl)-9,9-dimethyl-9H-fluoren-2-yl)-3,6-dimethyl-9H-carbazole, and "ET6" represents 5,5'-(2-phenylanthracene-9,10-diyl)bis(3,1-phenylene))bis(3-methylpyridine). The chemical structures thereof are indicated below together with "Liq".

HI

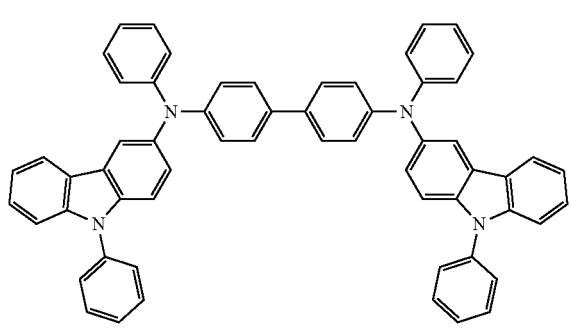

-continued

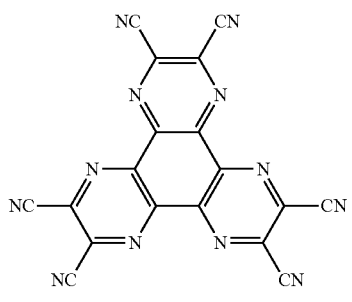

HAT-CN

HT

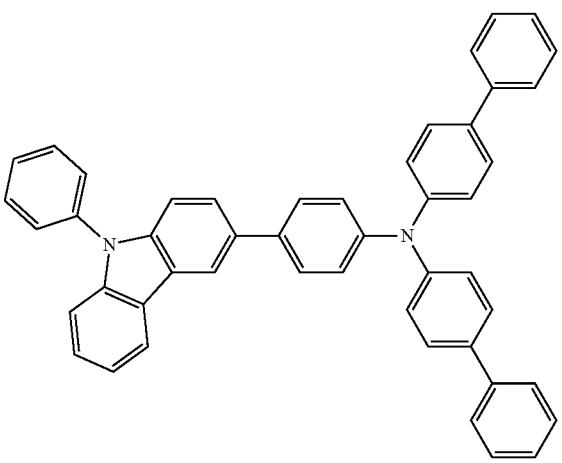

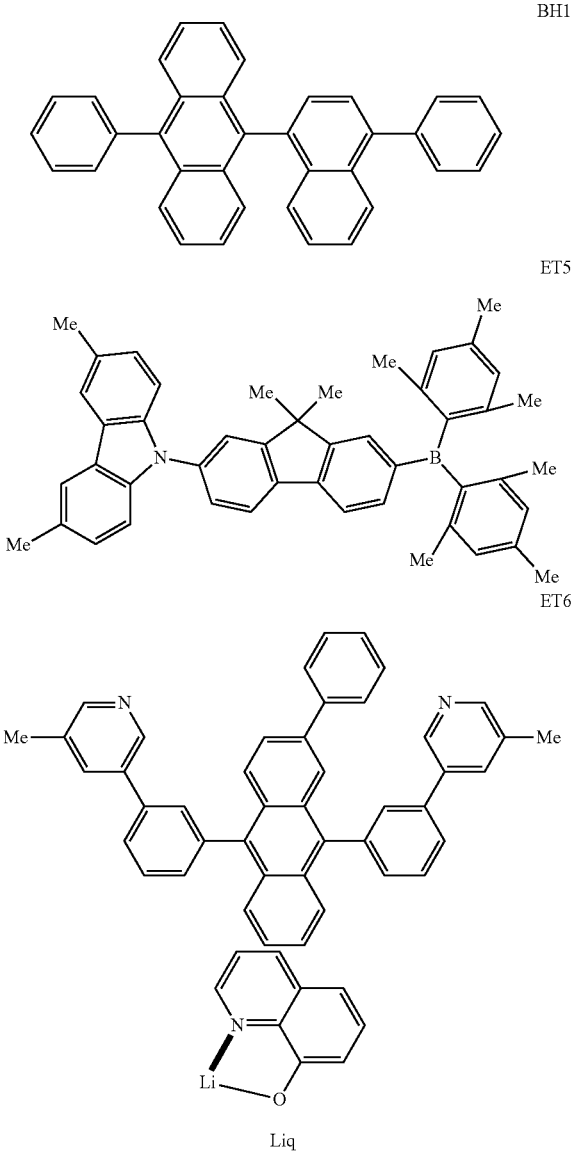

Example 1

Element Using Compound (1A-173) as Dopant of Light Emitting Layer

A glass substrate (manufactured by Opto Science, Inc.) having a size of 26 mm×28 mm×0.7 mm, obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Choshu Industry). Tantalum vapor deposition crucibles containing HI, HAT-CN, HT, BH1, compound (1A-173) of the present invention, ET5, and ET6, respectively, and aluminum nitride vapor deposition crucibles containing Liq, magnesium, and silver, respectively were attached thereto.

Layers described below were formed sequentially on the ITO film of the transparent supporting substrate. A vacuum chamber was depressurized to $2.0 \times 10^{-4}$ Pa. First, HI was heated and vapor-deposited so as to obtain a film thickness of 40 nm. Subsequently, HAT-CN was heated and vapor-deposited so as to obtain a film thickness of 5 nm. Furthermore, HT was heated and vapor-deposited so as to obtain a film thickness of 25 nm. Thus, a hole injection layer and hole transport layers each formed of three layers were formed. Subsequently, BH1 and compound (1A-173) of the present invention were simultaneously heated and vapor-deposited so as to obtain a film thickness of 25 nm. Thus, a light emitting layer was formed. A vapor deposition rate was adjusted such that a weight ratio between BH1 and compound (1A-173) of the present invention would be approximately 98:2. Subsequently, ET5 was heated and vapor-deposited so as to obtain a film thickness of 5 nm. Thus, the first layer of the electron transport layer was formed. Subsequently, ET6 and Liq were simultaneously heated and vapor-deposited so as to obtain a film thickness of 25 nm. Thus, the second layer of the electron transport layer was formed. The vapor deposition rate was adjusted such that a weight ratio between ET6 and Liq would be approximately 1:1. The vapor deposition rate for each layer was 0.01 to 1 nm/second.

Thereafter, Liq was heated and vapor-deposited at a vapor deposition rate of 0.01 to 0.1 nm/sec so as to obtain a film thickness of 1 nm. Subsequently, magnesium and silver were simultaneously heated and vapor-deposited so as to obtain a film thickness of 100 nm. Thus, a negative electrode was formed to obtain an organic electroluminescent element. At this time, the vapor deposition rate was adjusted in a range of 0.1 nm/sec to 10 nm/sec such that a ratio of the numbers of atoms between magnesium and silver would be 10:1.

When characteristics at the time of 1000 cd/m² emission were measured using an ITO electrode as a positive electrode and a Liq/magnesium+silver electrode as a negative electrode, a driving voltage was 4.25 V, an external quantum efficiency was 6.1% (blue light emission at a wavelength of about 468 nm), and CIE chromaticity at this time was (x, y)=(0.125, 0.170). As a result of performing a constant current drive test at a current density of 10 mA/cm², the time for holding a luminance of 90% or more of an initial luminance was 223 hours.

Example 2

Element Using Compound (1A-173) as Dopant of Light Emitting Layer

An organic EL element was obtained by a method in accordance with that of Example 1 except that in the light emitting layer, the vapor deposition rate was adjusted such that the weight ratio between BH1 and compound (1A-173) of the present invention would be about 95:5. When characteristics were measured similarly, a driving voltage was 3.95 V, an external quantum efficiency was 6.7% (blue light emission at a wavelength of about 470 nm), and CIE chromaticity at this time was (x, y)=(0.122, 0.181). The time for holding a luminance of 90% or more of an initial luminance was 270 hours.

Example 3

Element Using Compound (1A-1) as Dopant of Light Emitting Layer

An organic EL element was obtained by a method in accordance with that of Example 1 except that compound (1A-173) which was a dopant of the light emitting layer was changed to compound (1A-1). When characteristics were measured similarly, a driving voltage was 4.25 V, an external quantum efficiency was 6.0% (blue light emission at a wavelength of about 465 nm), and CIE chromaticity at this time was (x, y)=(0.128, 0.143). The time for holding a luminance of 90% or more of an initial luminance was 180 hours.

Comparative Example 1

Element Using Compound (1-10) as Dopant of Light Emitting Layer

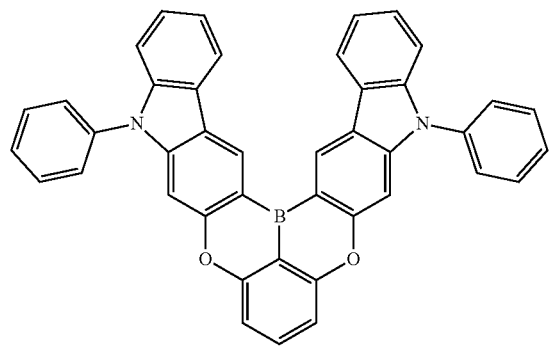
(1-10)

An organic EL element was obtained by a method in accordance with that of Example 1 except that compound (1A-173) which was a dopant of the light emitting layer was changed to a known compound (1-10). When characteristics were measured similarly, a driving voltage was 5.40 V, an external quantum efficiency was 2.0% (blue light emission at a wavelength of about 445 nm), and CIE chromaticity at this time was (x, y)=(0.151, 0.075). The time for holding a luminance of 90% or more of an initial luminance was 31 hours.

Comparative Example 2

Element Using Compound (1-100) as Dopant of Light Emitting Layer

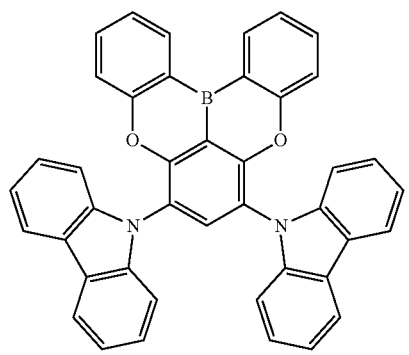
(1-100)

An organic EL element was obtained by a method in accordance with that of Example 1 except that compound (1A-173) which was a dopant of the light emitting layer was changed to a known compound (1-100). When characteristics were measured similarly, a driving voltage was 4.72 V, an external quantum efficiency was 2.8% (blue light emission at a wavelength of about 456 nm), and CIE chromaticity at this time was (x, y)=(0.144, 0.092). The time for holding a luminance of 90% or more of an initial luminance was 57 hours.

Comparative Example 3

Element Using Compound (1-141) as Dopant of Light Emitting Layer>

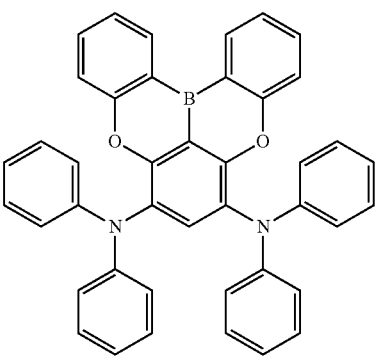
(1-141)

An organic EL element was obtained by a method in accordance with that of Example 1 except that compound (1A-173) which was a dopant of the light emitting layer was changed to a known compound (1-141). When characteristics were measured similarly, a driving voltage was 3.81 V, an external quantum efficiency was 4.3% (blue light emission at a wavelength of about 510 nm), and CIE chromaticity at this time was (x, y)=(0.217, 0.537). The time for holding a luminance of 90% or more of an initial luminance was 87 hours.

Comparative Example 4

Element Using Compound (1-176) as Dopant of Light Emitting Layer

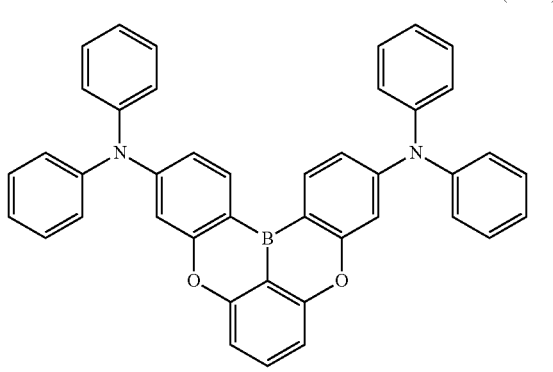
(1-176)

An organic EL element was obtained by a method in accordance with that of Example 1 except that compound (1A-173) which was a dopant of the light emitting layer was changed to a known compound (1-176). When characteristics were measured similarly, a driving voltage was 4.88 V, an external quantum efficiency was 2.9% (blue light emission at a wavelength of about 449 nm), and CIE chromaticity at this time was (x, y)=(0.150, 0.063). The time for holding a luminance of 90% or more of an initial luminance was 27 hours.

Comparative Example 5

Element Using Known Compound (1-447) as Dopant of Light Emitting Layer

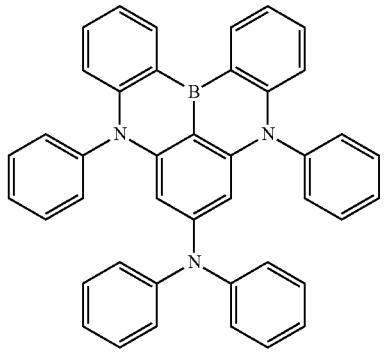

(1-447)

An organic EL element was obtained by a method in accordance with that of Example 1 except that compound (1A-173) which was a dopant of the light emitting layer was changed to a known compound (1-447). When characteristics were measured similarly, a driving voltage was 4.89 V, an external quantum efficiency was 4.2% (blue light emission at a wavelength of about 449 nm), and CIE chromaticity at this time was (x, y)=(0.146, 0.048). The time for holding a luminance of 90% or more of an initial luminance was 72 hours.

Comparative Example 6

Element Using Known Compound (1-401) as Dopant of Light Emitting Layer

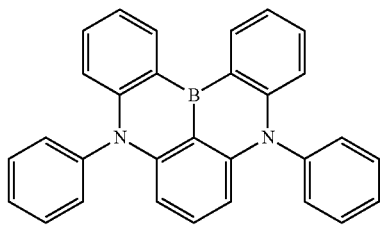

(1-401)

An organic EL element was obtained by a method in accordance with that of Example 1 except that compound (1A-173) which was a dopant of the light emitting layer was changed to a known compound (1-401). When characteristics were measured similarly, a driving voltage was 3.97 V, an external quantum efficiency was 4.5% (blue light emission at a wavelength of about 457 nm), and CIE chromaticity at this time was (x, y)=(0.138, 0.063). The time for holding a luminance of 90% or more of an initial luminance was 106 hours.

Comparative Example 7

Element Using Compound (1-1201) as Dopant of Light Emitting Layer

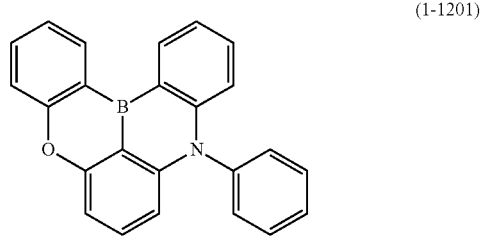 [SMILES: c1ccc(N2c3ccccc3B3c4ccccc4Oc4cccc2c43)cc1]

(1-1201)

An organic EL element was obtained by a method in accordance with that of Example 1 except that compound (1A-173) which was a dopant of the light emitting layer was changed to a known compound (1-1201). When characteristics were measured similarly, a driving voltage was 4.38 V, an external quantum efficiency was 3.6% (blue light emission at a wavelength of about 439 nm), and CIE chromaticity at this time was (x, y)=(0.153, 0.042). The time for holding a luminance of 90% or more of an initial luminance was 57 hours.

Comparative Example 8

Element Using Compound (1-1210) as Dopant of Light Emitting Layer

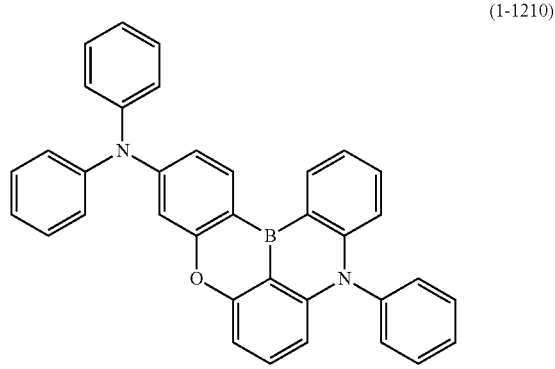 [SMILES: c1ccc(N(c2ccccc2)c2ccc3c(c2)Oc2cccc4c2B3c2ccccc2N4c2ccccc2)cc1]

(1-1210)

An organic EL element was obtained by a method in accordance with that of Example 1 except that compound (1A-173) which was a dopant of the light emitting layer was changed to a known compound (1-1210). When characteristics were measured similarly, a driving voltage was 4.20 V, an external quantum efficiency was 4.4% (blue light emission at a wavelength of about 439 nm), and CIE chromaticity at this time was (x, y)=(0.155, 0.029). The time for holding a luminance of 90% or more of an initial luminance was 47 hours.

Comparative Example 9

Element Using Compound (1-79) as Dopant of Light Emitting Layer

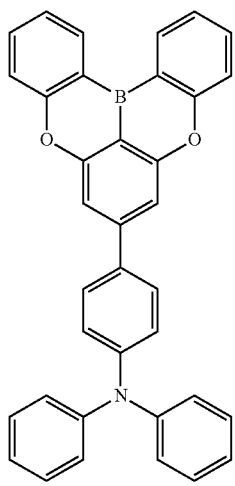

(1-79)

An organic EL element was obtained by a method in accordance with that of Example 1 except that compound (1A-173) which was a dopant of the light emitting layer was changed to a known compound (1-79). When characteristics were measured similarly, a driving voltage was 4.20 V, an external quantum efficiency was 3.5% (blue light emission at a wavelength of about 445 nm), and CIE chromaticity at this time was (x, y)=(0.148, 0.065). The time for holding a luminance of 90% or more of an initial luminance was 54 hours.

Comparative Example 10

Element Using Compound (1-1006) as Dopant of Light Emitting Layer

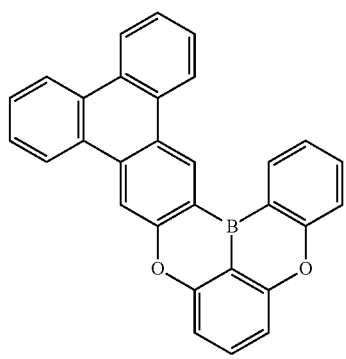

(1-1006)

An organic EL element was obtained by a method in accordance with that of Example 1 except that compound (1A-173) which was a dopant of the light emitting layer was changed to a known compound (1-1006). When characteristics were measured similarly, a driving voltage was 4.81 V, an external quantum efficiency was 2.0% (blue light emission at a wavelength of about 457 nm), and CIE chromaticity at this time was (x, y)=(0.148, 0.117). The time for holding a luminance of 90% or more of an initial luminance was 49 hours.

Comparative Example 11

Element Using Compound (1-2305) as Dopant of Light Emitting Layer

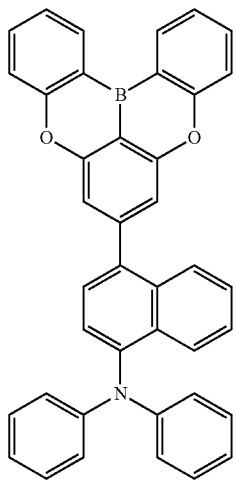

(1-2305)

An organic EL element was obtained by a method in accordance with that of Example 1 except that compound (1A-173) which was a dopant of the light emitting layer was changed to a known compound (1-2305). When characteristics were measured similarly, a driving voltage was 3.89 V, an external quantum efficiency was 4.5% (blue light emission at a wavelength of about 459 nm), and CIE chromaticity at this time was (x, y)=(0.142, 0.113). The time for holding a luminance of 90% or more of an initial luminance was 79 hours.

The above results are summarized in Table 4.

TABLE 4

| | Dopant | External quantum efficiency (%) | Time for holding luminance of 90% or more of initial luminance (hour) |
|---|---|---|---|
| Example 1 | Compound (1A-173) | 6.1 | 223 |
| Example 2 | Compound (1A-173) | 6.7 | 270 |
| Example 3 | Compound (1A-1) | 6.0 | 180 |
| Comparative Example 1 | Compound (1-10) | 2.0 | 31 |
| Comparative Example 2 | Compound (1-100) | 2.8 | 57 |
| Comparative Example 3 | Compound (1-141) | 4.3 | 87 |

TABLE 4-continued

|  | Dopant | External quantum efficiency (%) | Time for holding luminance of 90% or more of initial luminance (hour) |
|---|---|---|---|
| Comparative Example 4 | Compound (1-176) | 2.9 | 27 |
| Comparative Example 5 | Compound (1-447) | 4.2 | 72 |
| Comparative Example 6 | Compound (1-401) | 4.5 | 106 |
| Comparative Example 7 | Compound (1-1201) | 3.6 | 57 |
| Comparative Example 8 | Compound (1-1210) | 4.4 | 47 |
| Comparative Example 9 | Compound (1-79) | 3.5 | 54 |
| Comparative Example 10 | Compound (1-1006) | 2.0 | 49 |
| Comparative Example 11 | Compound (1-2305) | 4.5 | 79 |

<Evaluation of Organic EL Element (2)>

Organic EL elements in Example 4 and Comparative Example 12 were manufactured. Voltages (V) thereof, EL emission wavelengths (nm) thereof, and external quantum efficiencies (%) thereof, which are characteristics at 1000 cd/m2 emission, were measured. Subsequently, time for holding a luminance of 90% or more of an initial luminance at the time of driving with a constant current at a current density of 10 mA/cm$^2$ was measured.

Material configurations of the layers in the organic EL element thus manufactured are illustrated in the following Table 5. Note that the dopant material in Comparative Example 12 is a compound disclosed in WO 2015/102118 A.

TABLE 5

|  | Hole injection layer | | Hole | Light emitting layer (25 nm) | | Electron transport layer | | Negative electrode (1 nm/ |
|---|---|---|---|---|---|---|---|---|
|  | First layer | Second layer | Transport layer | | | First layer | Second layer |  |
|  | (40 nm) | (5 nm) | (25 nm) | Host | Dopant | (5 nm) | (25 nm) | 100 nm) |
| Example 4 | HI | HAT-CN | HT | BH1 | Compound 1A-153 | ET5 | ET6 + Liq | Liq/MgAg |
| Comparative Example 12 | HI | HAT-CN | HT | BH1 | Compound 1-2680 | ET5 | ET6 + Liq | Liq/MgAg |

Example 4

Element Using Compound (1A-153) as Dopant of Light Emitting Layer

A glass substrate (manufactured by Opto Science, Inc.) having a size of 26 mm×28 mm×0.7 mm, obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Choshu Industry). Tantalum vapor deposition crucibles containing HI, HAT-CN, HT, BH1, compound (1A-153) of the present invention, ET5, and ET6, respectively, and aluminum nitride vapor deposition crucibles containing Liq, magnesium, and silver, respectively were attached thereto.

Layers described below were formed sequentially on the ITO film of the transparent supporting substrate. A vacuum chamber was depressurized to 2.0×10$^{-4}$ Pa. First, HI was heated and vapor-deposited so as to obtain a film thickness of 40 nm. Subsequently, HAT-CN was heated and vapor-deposited so as to obtain a film thickness of 5 nm. Furthermore, HT was heated and vapor-deposited so as to obtain a film thickness of 25 nm. Thus, a hole injection layer and hole transport layers each formed of three layers were formed. Subsequently, BH1 and compound (1A-153) of the present invention were simultaneously heated and vapor-deposited so as to obtain a film thickness of 25 nm. Thus, a light emitting layer was formed. A vapor deposition rate was adjusted such that a weight ratio between BH1 and compound (1A-153) of the present invention would be approximately 98:2. Subsequently, ET5 was heated and vapor-deposited so as to obtain a film thickness of 5 nm. Thus, the first layer of the electron transport layer was formed. Subsequently, ET6 and Liq were simultaneously heated and vapor-deposited so as to obtain a film thickness of 25 nm. Thus, the second layer of the electron transport layer was formed. The vapor deposition rate was adjusted such that a weight ratio between ET6 and Liq would be approximately 1:1. The vapor deposition rate for each layer was 0.01 to 1 nm/second.

Thereafter, Liq was heated and vapor-deposited at a vapor deposition rate of 0.01 to 0.1 nm/sec so as to obtain a film thickness of 1 nm. Subsequently, magnesium and silver were simultaneously heated and vapor-deposited so as to obtain a film thickness of 100 nm. Thus, a negative electrode was formed to obtain an organic electroluminescent element. At this time, the vapor deposition rate was adjusted in a range of 0.1 nm/sec to 10 nm/sec such that a ratio of the numbers of atoms between magnesium and silver would be 10:1.

When characteristics at the time of 1000 cd/m$^2$ emission were measured using an ITO electrode as a positive electrode and a Liq/magnesium+silver electrode as a negative electrode, a driving voltage was 3.94 V, an external quantum efficiency was 6.8% (blue light emission at a wavelength of about 460 nm), and CIE chromaticity at this time was (x, y)=(0.134, 0.107). As a result of performing a constant current drive test at a current density of 10 mA/cm$^2$, the time for holding a luminance of 90% or more of an initial luminance was 161 hours.

Comparative Example 12

Element Using Compound (1-2680) as Dopant of Light Emitting Layer

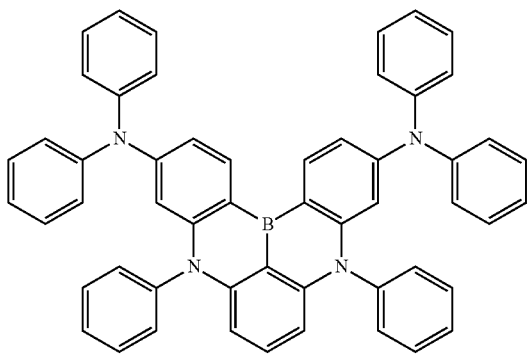

(1-2680)

An organic EL element was obtained by a method in accordance with that of Example 4 except that compound (1A-153) which was a dopant of the light emitting layer was changed to a known compound (1-2680). When characteristics were measured similarly, a driving voltage was 3.99 V, an external quantum efficiency was 5.9% (blue light emission at a wavelength of about 455 nm), and CIE chromaticity at this time was (x, y)=(0.142, 0.051). The time for holding a luminance of 90% or more of an initial luminance was 103 hours.

The above results are summarized in Table 6.

TABLE 6

|  | Dopant | External quantum efficiency (%) | Time for holding luminance of 90% or more of initial luminance (hour) |
|---|---|---|---|
| Example 4 | Compound (1A-153) | 6.8 | 161 |
| Comparative Example 12 | Compound (1-2680) | 5.9 | 103 |

<Evaluation of Organic EL Element (3)>

Organic EL elements in Example 5 and Comparative Example 13 were manufactured. Voltages (V) thereof, EL emission wavelengths (nm) thereof, and external quantum efficiencies (%) thereof, which are characteristics at 1000 cd/m2 emission, were measured. Subsequently, time for holding a luminance of 90% or more of an initial luminance at the time of driving with a constant current at a current density of 10 mA/cm2 was measured.

Material configurations of the layers in the organic EL element thus manufactured are illustrated in the following Table 7. Note that the dopant material in Comparative Example 13 is a compound disclosed in WO 2015/102118 A.

TABLE 7

| | Hole injection layer | | Hole transport layer | | Light emitting layer (25 nm) | | Electron transport layer | | Negative electrode (1 nm/ |
|---|---|---|---|---|---|---|---|---|---|
| | First layer (40 nm) | Second layer (5 nm) | First layer (15 nm) | Second layer (10 nm) | Host | Dopant | First layer (5 nm) | Second layer (25 nm) | 100 nm) |
| Example 5 | HI | HAT-CN | HT | HT2 | BH2 | Compound 1A-1 | ET7 | ET8 + Liq | Liq/MgAg |
| Comparative Example 13 | HI | HAT-CN | HT | HT2 | BH2 | Compound 1-1152 | ET7 | ET8 + Liq | Liq/MgAg |

In Tables, "HT2" represents N,N-bis(4-dibenzo[b,d]furan-4-yl)phenyl)-[1, 1':4 ', 1"-terphenyl]-4-amine, "BH2" represents 2-(10-phenylanthracen-9-yl) naphtho[2,3-b]benzofuran, "ET7" represents 4,6,8,10-tetraphenyl-5,9-dioxa-13b-borane naphtho[3,2,1-de] anthracene, "ET8" represents 3,3'-((2-phenylanthracene-9,10-diyl)bis(4,1-phenylene))bis(4-methylpyridine). Chemical structures thereof are illustrated below.

HT2

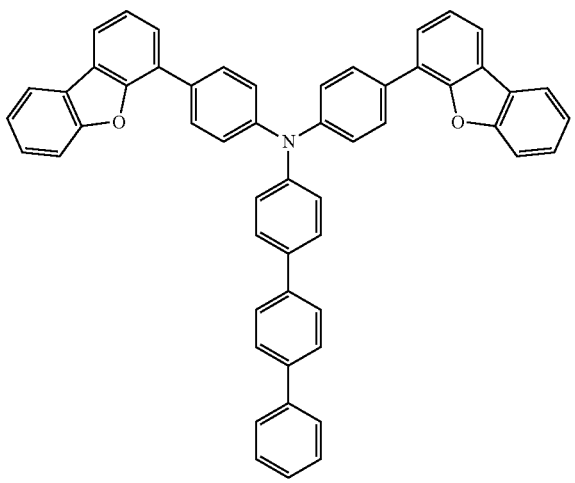

BH2

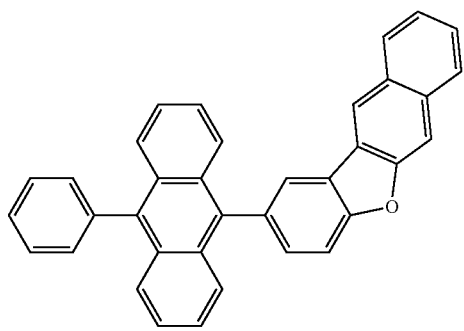

ET7

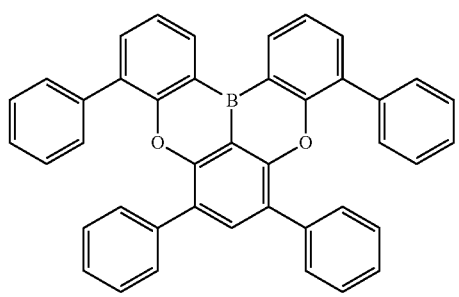

ET8

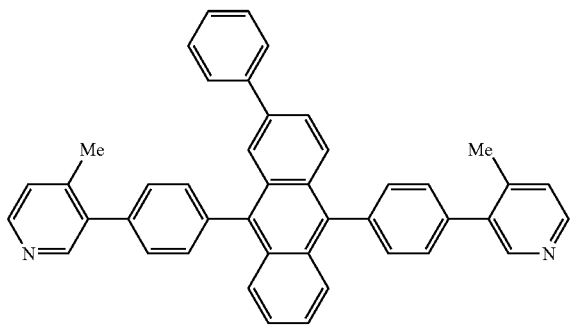

Example 5

Element Using Compound (1A-1) as Dopant of Light Emitting Layer

A glass substrate (manufactured by Opto Science, Inc.) having a size of 26 mm×28 mm×0.7 mm, obtained by forming a film of ITO having a thickness of 180 nm by sputtering, and polishing the ITO film to 150 nm, was used as a transparent supporting substrate. This transparent supporting substrate was fixed to a substrate holder of a commercially available vapor deposition apparatus (manufactured by Choshu Industry). Tantalum vapor deposition crucibles containing HI, HAT-CN, HT, HT2, BH2, compound (1A-1) of the present invention, ET7, and ET8, respectively, and aluminum nitride vapor deposition crucibles containing Liq, magnesium, and silver, respectively were attached thereto.

Layers described below were formed sequentially on the ITO film of the transparent supporting substrate. A vacuum chamber was depressurized to $2.0 \times 10^{-4}$ Pa. First, HI was heated and vapor-deposited so as to obtain a film thickness of 40 nm. Subsequently, HAT-CN was heated and vapor-deposited so as to obtain a film thickness of 5 nm. Thus, a hole injection layer formed of two layers was formed. Next, HT was heated and vapor-deposited so as to obtain a film thickness of 15 nm. Subsequently, HT2 was heated and vapor-deposited so as to obtain a film thickness of 10 nm. Thus, a hole transport layer formed of two layers was formed. Subsequently, BH2 and compound (1A-1) of the present invention were simultaneously heated and vapor-deposited so as to obtain a film thickness of 25 nm. Thus, a light emitting layer was formed. A vapor deposition rate was adjusted such that a weight ratio between BH2 and compound (1A-1) of the present invention would be approximately 98:2. Subsequently, ET7 was heated and vapor-deposited so as to obtain a film thickness of 5 nm. Thus, the first layer of the electron transport layer was formed. Subsequently, ET8 and Liq were simultaneously heated and vapor-deposited so as to obtain a film thickness of 25 nm. Thus, the second layer of the electron transport layer was formed. The vapor deposition rate was adjusted such that a weight ratio between ET8 and Liq would be approximately 1:1. The vapor deposition rate for each layer was 0.01 to 1 nm/second.

Thereafter, Liq was heated and vapor-deposited at a vapor deposition rate of 0.01 to 0.1 nm/sec so as to obtain a film thickness of 1 nm. Subsequently, magnesium and silver were simultaneously heated and vapor-deposited so as to obtain a film thickness of 100 nm. Thus, a negative electrode was formed to obtain an organic electroluminescent element. At this time, the vapor deposition rate was adjusted in a range of 0.1 nm/sec to 10 nm/sec such that a ratio of the numbers of atoms between magnesium and silver would be 10:1.

When characteristics at the time of 1000 cd/m$^2$ emission were measured using an ITO electrode as a positive electrode and a Liq/magnesium+silver electrode as a negative electrode, a driving voltage was 3.33 V, an external quantum efficiency was 6.4% (blue light emission at a wavelength of about 463 nm), and CIE chromaticity at this time was (x, y)=(0.132, 0.122). As a result of performing a constant current drive test at a current density of 10 mA/cm2, the time for holding a luminance of 90% or more of an initial luminance was 655 hours.

Comparative Example 13

Element Using Compound (1-1152) as Dopant of Light Emitting Layer

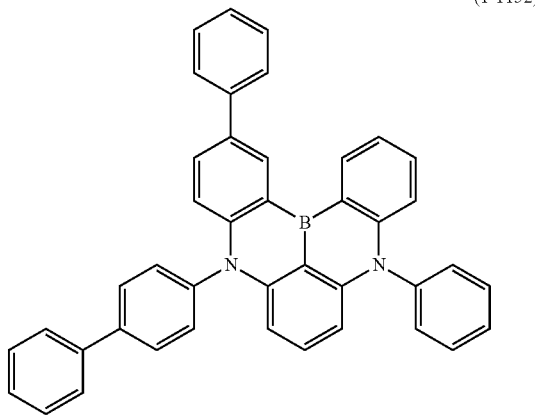
(1-1152)

An organic EL element was obtained by a method in accordance with that of Example 5 except that compound (1A-1) which was a dopant of the light emitting layer was changed to a known compound (1-1152). When characteristics were measured similarly, a driving voltage was 3.59 V, an external quantum efficiency was 5.9% (blue light emission at a wavelength of about 465 nm), and CIE chromaticity at this time was (x, y)=(0.126, 0.099). The time for holding a luminance of 90% or more of an initial luminance was 356 hours.

The above results are summarized in Table 8.

TABLE 8

| | Dopant | External quantum efficiency (%) | Time for holding luminance of 90% or more of initial luminance (hour) |
|---|---|---|---|
| Example 5 | Compound (1A-1) | 6.4 | 655 |
| Comparative Example 13 | Compound (1-1152) | 5.9 | 356 |

As described above, some of the polycyclic aromatic amino compounds represented by general formula (1A) or (1B) according to the present invention have been evaluated as a material for an organic EL element, and have been indicated to be excellent materials for an organic device. Other compounds that have not been evaluated have the same basic skeleton and similar structures as a whole, and can be understood similarly to be excellent materials for an organic device by a person skilled in the art.

INDUSTRIAL APPLICABILITY

According to the present invention, by providing a novel polycyclic aromatic amino compound, a selection range of a material for an organic EL element can be widened. In addition, by using a novel polycyclic aromatic amino compound as a material for an organic electroluminescent element, an excellent organic EL element, a display apparatus including the organic EL element, and a lighting apparatus including the organic EL element can be provided.

REFERENCE SIGNS LIST

100 Organic electroluminescent element
101 Substrate
102 Positive electrode
103 Hole injection layer
104 Hole transport layer
105 Light emitting layer
106 Electron transport layer
107 Electron injection layer
108 Negative electrode

The invention claimed is:

1. A polycyclic aromatic amino compound represented by the following general formula (1A):

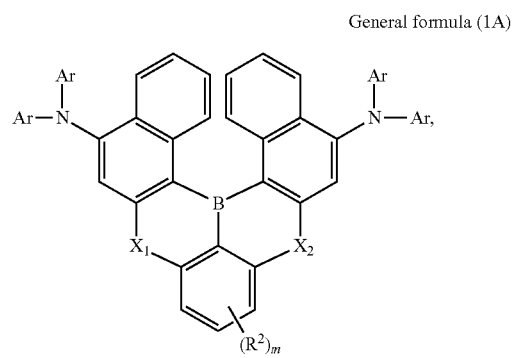
General formula (1A)

wherein in the formula (1A), each Ar represents an unsubstituted phenyl, $R^2$ each independently represents a phenyl or an alkyl having 1 to 4 carbon atoms, m represents an integer of 0 to 2, and $X^1$ and $X^2$ represent O.

2. The polycyclic aromatic amino compound according to claim 1, wherein m represents 0 or 1.

3. The polycyclic aromatic amino compound according to claim 1, represented by the following formula (1A-1), (1A-153), or (1A-173):

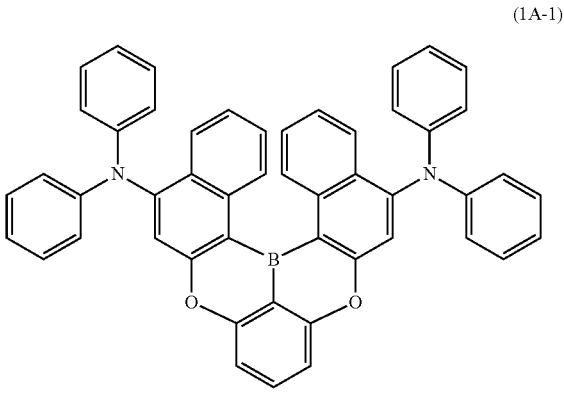
(1A-1)

-continued

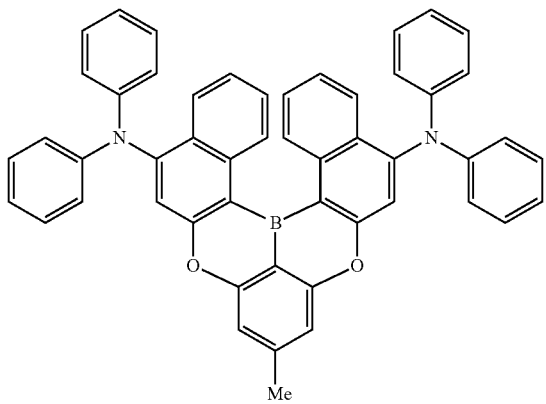
(1A-153)

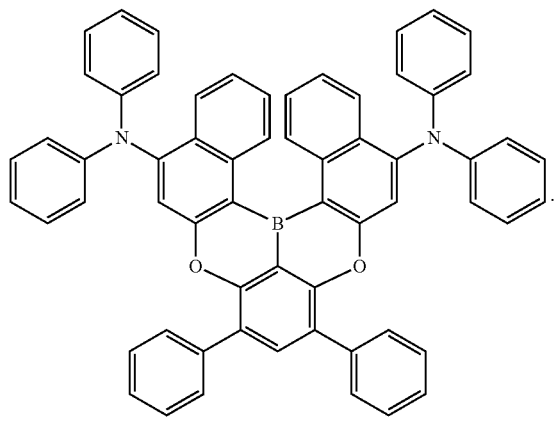
(1A-173)

4. A material for an organic device, comprising the polycyclic aromatic amino compound according to claim 1.

5. The material for an organic device according to claim 4, wherein the material for an organic device is a material for an organic electroluminescent element, a material for an organic field effect transistor, or a material for an organic thin film solar cell.

6. The material for an organic electroluminescent element according to claim 5, wherein the material for an organic electroluminescent element is a material for a light emitting layer.

7. An organic electroluminescent element comprising: a pair of electrodes composed of a positive electrode and a negative electrode; and a light emitting layer disposed between the pair of electrodes and containing the material for a light emitting layer according to claim 6.

8. The organic electroluminescent element according to claim 7, further comprising an electron transport layer and/or an electron injection layer disposed between the negative electrode and the light emitting layer, wherein at least one of the electron transport layer and the electron injection layer contains at least one selected from the group consisting of a quinolinol-based metal complex, a pyridine derivative, a phenanthroline derivative, a borane derivative, and a benzimidazole derivative.

9. The organic electroluminescent element according to claim 8, wherein the electron transport layer and/or the electron injection layer further include/includes at least one selected from the group consisting of an alkali metal, an alkaline earth metal, a rare earth metal, an oxide of an alkali metal, a halide of an alkali metal, an oxide of an alkaline earth metal, a halide of an alkaline earth metal, an oxide of a rare earth metal, a halide of a rare earth metal, an organic complex of an alkali metal, an organic complex of an alkaline earth metal, and an organic complex of a rare earth metal.

10. A display apparatus comprising the organic electroluminescent element according to claim 7.

11. A lighting apparatus comprising the organic electroluminescent element according to claim 7.

12. The material for an organic electroluminescent element according to claim 5, wherein the material for an organic electroluminescent element is a material for an electron injection layer or a material for an electron transport layer.

13. An organic electroluminescent element comprising: a pair of electrodes composed of a positive electrode and a negative electrode; a light emitting layer disposed between the pair of electrodes; and an electron injection layer and/or an electron transport layer disposed between the negative electrode and the light emitting layer and containing the material for an electron injection layer and/or the material for an electron transport layer according to claim 12.

14. The material for an organic electroluminescent element according to claim 5, wherein the material for an organic electroluminescent element is a material for a hole injection layer or a material for a hole transport layer.

15. An organic electroluminescent element comprising: a pair of electrodes composed of a positive electrode and a negative electrode; a light emitting layer disposed between the pair of electrodes; and a hole injection layer and/or a hole transport layer disposed between the positive electrode and the light emitting layer and containing the material for a hole injection layer and/or the material for a hole transport layer according to claim 14.

* * * * *